US011604411B2

(12) United States Patent
Hatakeyama et al.

(10) Patent No.: US 11,604,411 B2
(45) **Date of Patent: *Mar. 14, 2023**

(54) RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Masaki Ohashi, Joetsu (JP); Takayuki Fujiwara, Joetsu (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 261 days.

This patent is subject to a terminal disclaimer.

(21) Appl. No.: 16/871,648

(22) Filed: May 11, 2020

(65) Prior Publication Data

US 2021/0048746 A1 Feb. 18, 2021

(30) Foreign Application Priority Data

Aug. 14, 2019 (JP) ............................ JP2019-148857

(51) Int. Cl.

*G03F 7/039* (2006.01)
*G03F 7/20* (2006.01)
*G03F 7/004* (2006.01)

(52) U.S. Cl.

CPC .......... *G03F 7/0045* (2013.01); *G03F 7/0046* (2013.01); *G03F 7/0395* (2013.01); *G03F 7/2041* (2013.01)

(58) Field of Classification Search

None

See application file for complete search history.

(56) References Cited

U.S. PATENT DOCUMENTS

| | | | | |
|---|---|---|---|---|
| 4,533,773 | A | 8/1985 | Michaelson et al. | |
| 6,294,693 | B1 | 9/2001 | Asakawa et al. | |
| 7,960,091 | B2 | 6/2011 | Shimizu et al. | |
| 9,005,874 | B2 | 4/2015 | Komuro et al. | |
| 9,122,153 | B2 | 9/2015 | Echigo et al. | |
| 9,176,379 | B2 | 11/2015 | Ichikawa et al. | |
| 9,250,518 | B2 | 2/2016 | Hatakeyama et al. | |
| 9,360,753 | B2 | 6/2016 | Hatakeyama | |
| 9,448,475 | B2 | 9/2016 | Masuyama et al. | |
| 9,563,123 | B2 | 2/2017 | Masuyama et al. | |
| 10,101,654 | B2 | 10/2018 | Hatakeyama et al. | |
| 10,295,904 | B2 | 5/2019 | Hatakeyama et al. | |
| 10,303,056 | B2 | 5/2019 | Hatakeyama et al. | |
| 10,474,030 | B2* | 11/2019 | Hatakeyama | C07C 51/00 |
| 2003/0152190 | A1* | 8/2003 | Watanabe | G21K 5/02 378/35 |
| 2003/0198894 | A1* | 10/2003 | Mizutani | G03F 7/0045 430/920 |
| 2007/0043234 | A1 | 2/2007 | Vaultier et al. | |
| 2007/0259773 | A1 | 11/2007 | Burdeniuc et al. | |
| 2012/0082936 | A1 | 4/2012 | Serizawa et al. | |
| 2012/0149916 | A1 | 6/2012 | Utsumi et al. | |
| 2012/0208127 | A1 | 8/2012 | Hatakeyama | |
| 2013/0029270 | A1 | 1/2013 | Hatakeyama | |
| 2013/0052588 | A1 | 2/2013 | Yoshida et al. | |
| 2014/0242526 | A1 | 8/2014 | Allen et al. | |
| 2015/0086926 | A1 | 3/2015 | Ohashi et al. | |
| 2016/0048076 | A1 | 2/2016 | Hatakeyama et al. | |
| 2017/0174801 | A1 | 6/2017 | Hirano | |
| 2017/0184962 | A1 | 6/2017 | Hatakeyama et al. | |
| 2017/0299963 | A1 | 10/2017 | Fujiwara | |
| 2017/0315442 | A1 | 11/2017 | Fukushima et al. | |
| 2017/0351177 | A1* | 12/2017 | Hatakeyama | G03F 7/0048 |
| 2018/0081267 | A1 | 3/2018 | Hatakeyama et al. | |
| 2018/0081268 | A1 | 3/2018 | Hatakeyama | |
| 2018/0088463 | A1 | 3/2018 | Hatakeyama et al. | |
| 2018/0101094 | A1* | 4/2018 | Hatakeyama | G03F 7/38 |
| 2018/0143532 | A1 | 5/2018 | Hatakeyama | |
| 2018/0364570 | A1* | 12/2018 | Hatakeyama | G03F 7/322 |
| 2018/0373148 | A1* | 12/2018 | Hatakeyama | G03F 7/0392 |
| 2019/0155155 | A1 | 5/2019 | Hatakeyama et al. | |
| 2020/0241414 | A1* | 7/2020 | Hatakeyama | G03F 7/0382 |
| 2020/0241418 | A1* | 7/2020 | Hatakeyama | G03F 7/2004 |
| 2020/0272048 | A1* | 8/2020 | Hatakeyama | G03F 7/0397 |
| 2020/0301274 | A1* | 9/2020 | Taniguchi | C08L 45/00 |
| 2021/0033970 | A1* | 2/2021 | Hatakeyama | G03F 7/0392 |
| 2021/0033971 | A1* | 2/2021 | Hatakeyama | C08F 220/1806 |
| 2021/0063879 | A1* | 3/2021 | Hatakeyama | G03F 7/0397 |
| 2021/0149301 | A1* | 5/2021 | Fujiwara | C08F 220/1806 |
| 2021/0179554 | A1* | 6/2021 | Fujiwara | C08L 33/14 |
| 2021/0188770 | A1* | 6/2021 | Fujiwara | C07C 69/65 |

FOREIGN PATENT DOCUMENTS

| | | | |
|---|---|---|---|
| JP | 11-102072 | * | 4/1999 |
| JP | 2001-194776 | A | 7/2001 |
| JP | 2002-226470 | A | 8/2002 |

(Continued)

OTHER PUBLICATIONS

Machine translation of JP 2009-145578 (2009).*

Wang et al., "Photobase generator and photo dcomposable quencher for high-resolution photoresist applications", Proc, of SPIE, (2010), vol. 7639, pp. 76390W. Cited in Specification. (15 pages).

Office Action dated Feb. 2, 2021, issued in counterpart TW Application No. 109127275. (10 pages).

Notice of Allowance dated Jun. 29, 2022, issued in U.S. Appl. No. 16/919,574. (13 pages).

Eckert et al., "CIDNP Investigation of Radical Decay Pathways in the Sensitized Photolysis of Triphenylsulfonium Salts", J. Am. Chern. Soc., 1999, 121, 10, pp. 2274-2280. (7 pages).

(Continued)

*Primary Examiner* — Martin J Angebranndt

(74) *Attorney, Agent, or Firm* — WHDA, LLP

(57) ABSTRACT

A resist composition comprising a base polymer and a sulfonium salt of a carboxylic acid having an iodine or bromine-substituted hydrocarbyl group offers a high sensitivity, minimal LWR and improved CDU, independent of whether it is of positive or negative tone.

13 Claims, No Drawings

(56) References Cited

FOREIGN PATENT DOCUMENTS

| | | | | |
|---|---|---|---|---|
| JP | 2002-363148 | A | | 12/2002 |
| JP | 2008-133312 | A | | 6/2008 |
| JP | 2009-145578 | | * | 7/2009 |
| JP | 2009-181062 | A | | 8/2009 |
| JP | 2010-061087 | A | | 3/2010 |
| JP | 2011-39266 | A | | 2/2011 |
| JP | 2011-039502 | | * | 2/2011 |
| JP | 2011039502 | A | * | 2/2011 |
| JP | 2011-530652 | A | | 12/2011 |
| JP | 2013-025211 | | * | 2/2013 |
| JP | 2013-025211 | A | | 2/2013 |
| JP | 2013-83957 | A | | 5/2013 |
| JP | 2015-90382 | A | | 5/2015 |
| JP | 2015-161823 | A | | 9/2015 |
| JP | 2015-172746 | A | | 10/2015 |
| JP | 2015-180928 | A | | 10/2015 |
| JP | 5852490 | B2 | | 2/2016 |
| JP | 2017-219836 | A | | 12/2017 |
| JP | 2018-4812 | A | | 1/2018 |
| JP | 2018-49264 | A | | 3/2018 |
| JP | 2018-060069 | | * | 4/2018 |
| JP | 2018-97356 | A | | 6/2018 |
| KR | 10-2012-0093777 | A | | 8/2012 |
| KR | 10-2016-0019860 | A | | 2/2016 |
| TW | 201241556 | A | | 10/2012 |
| TW | 201516024 | A | | 5/2015 |
| TW | 201730674 | A | | 9/2017 |
| WO | 2008/066011 | A1 | | 6/2008 |
| WO | 2010/059174 | A1 | | 5/2010 |
| WO | 2013/024777 | A1 | | 2/2013 |

OTHER PUBLICATIONS

Office Action dated Oct. 15, 2018, issued in TW Application 106134104 (counterpart to U.S. Appl. No. 15/725,404). (9 pages).

Office Action dated Oct. 2, 2018, issued in KR Application No. 10-2017-0128141 (counterpart to U.S. Appl. No. 15/725,404), with English translation. (13 pages).

Non-Final Office Action dated Mar. 22, 2019, issued in U.S. Appl. No. 15/725,404. (28 pages).

Office Action dated Apr. 16, 2021, issued in TW Application No. 109129970 (counterpart to U.S. Appl. No. 16/984,535). (8 pages).

* cited by examiner

RESIST COMPOSITION AND PATTERNING PROCESS

CROSS-REFERENCE TO RELATED APPLICATION

This non-provisional application claims priority under 35 U.S.C. § 119(a) on Patent Application No. 2019-148857 filed in Japan on Aug. 14, 2019, the entire contents of which are hereby incorporated by reference.

TECHNICAL FIELD

This invention relates to a resist composition and a pattern forming process.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, manufacturing of microelectronic devices at the 65-nm node by the ArF lithography has been implemented in a mass scale. Manufacturing of 45-nm node devices by the next generation ArF immersion lithography is approaching to the verge of high-volume application. The candidates for the next generation 32-nm node include ultra-high NA lens immersion lithography using a liquid having a higher refractive index than water in combination with a high refractive index lens and a high refractive index resist film, extreme ultraviolet (EUV) lithography of 13.5 nm wavelength, and double patterning version of the ArF lithography, on which active research efforts have been made.

Chemically amplified resist compositions comprising an acid generator capable of generating an acid upon exposure to light or EB include chemically amplified positive resist compositions wherein deprotection reaction takes place under the action of acid and chemically amplified negative resist compositions wherein crosslinking reaction takes place under the action of acid. Quenchers are often added to these resist compositions for the purpose of controlling the diffusion of the acid to unexposed region to improve the contrast. The addition of quenchers is fully effective to this purpose. A number of amine quenchers were proposed as disclosed in Patent Documents 1 to 3.

As the pattern feature size is reduced, approaching to the diffraction limit of light, light contrast lowers. In the case of positive resist film, a lowering of light contrast leads reductions of resolution and focus margin of hole and trench patterns. For mitigating the influence of reduced resolution of resist pattern due to a lowering of light contrast, an attempt is made to enhance the dissolution contrast of resist film.

One such attempt is a chemically amplified resist material utilizing an acid amplifying mechanism that a compound is decomposed with an acid to generate another acid. In general, the concentration of acid creeps up linearly with an increase of exposure dose. In the case of the acid amplifying mechanism, the concentration of acid jumps up non-linearly as the exposure dose increases. The acid amplifying system is beneficial for further enhancing the advantages of chemically amplified resist film including high contrast and high sensitivity, but worsens the drawbacks of chemically amplified resist film that environmental resistance is degraded by amine contamination and maximum resolution is reduced by an increase of acid diffusion distance. The acid amplifying system is very difficult to control when implemented in practice.

Another approach for enhanced contrast is by reducing the concentration of amine with an increasing exposure dose. This may be achieved by applying a compound which loses the quencher function upon light exposure.

With respect to the acid labile group used in methacrylate polymers for the ArF lithography resist material, deprotection reaction takes place when a photoacid generator capable of generating a sulfonic acid having fluorine substituted at α-position (referred to "α-fluorinated sulfonic acid") is used, but not when an acid generator capable of generating a sulfonic acid not having fluorine substituted at α-position (referred to "α-non-fluorinated sulfonic acid") or carboxylic acid is used. If a sulfonium or iodonium salt capable of generating an α-fluorinated sulfonic acid is combined with a sulfonium or iodonium salt capable of generating an α-non-fluorinated sulfonic acid, the sulfonium or iodonium salt capable of generating an α-non-fluorinated sulfonic acid undergoes ion exchange with the α-fluorinated sulfonic acid. Through the ion exchange, the α-fluorinated sulfonic acid thus generated by light exposure is converted back to the sulfonium or iodonium salt while the sulfonium or iodonium salt of an α-non-fluorinated sulfonic acid or carboxylic acid functions as a quencher.

Further, the sulfonium or iodonium salt capable of generating an α-non-fluorinated sulfonic acid also functions as a photodegradable quencher since it loses the quencher function by photodegradation. Non-Patent Document 1 points out that the addition of a photodegradable quencher expands the margin of a trench pattern although the structural formula is not illustrated. However, it has only a little influence on performance improvement. There is a desire to have a quencher for further improving contrast.

Patent Document 4 discloses a quencher of onium salt type which reduces its basicity to through a mechanism that it generates an amino-containing carboxylic acid upon light exposure, which in turn forms a lactam in the presence of acid. Due to the mechanism that basicity is reduced under the action of acid, acid diffusion is controlled by high basicity in the unexposed region where the amount of acid generated is minimal, whereas acid diffusion is promoted due to reduced basicity of the quencher in the overexposed region where the amount of acid generated is large. This expands the difference in acid amount between the exposed and unexposed regions, from which an improvement in contrast is expected. Despite the advantage of improved contrast, the acid diffusion controlling effect is rather reduced.

As the pattern feature size is reduced, the edge roughness (LWR) of line patterns or the critical dimension uniformity (CDU) of hole patterns is regarded significant. It is pointed out that LWR is affected by the segregation or agglomeration of a base polymer and acid generator and the diffusion of generated acid. There is a tendency that as the resist film becomes thinner, LWR becomes greater. A film thickness reduction to comply with the progress of size reduction causes a degradation of LWR, which becomes a serious problem.

The EUV lithography resist material must meet high sensitivity, high resolution, low LWR and good CDU at the same time. As the acid diffusion distance is reduced, LWR or CDU is improved, but sensitivity becomes lower. For example, as the PEB temperature is lowered, the outcome is an improved LWR or CDU, but a lower sensitivity. As the amount of quencher added is increased, the outcome is an improved LWR or CDU, but a lower sensitivity. It is necessary to overcome the tradeoff relation between sensitivity and LWR or CDU.

Patent Document 5 discloses a resist material comprising a sulfonium salt of iodized benzoic acid as a quencher. By taking advantage of strong EUV absorption of iodine atoms, the preceding invention intends to increase the number of photons absorbed for thereby achieving improvements in both sensitivity and LWR. There is the desire for further improvements in sensitivity, LWR and CDU.

CITATION LIST

Patent Document 1: JP-A 2001-194776
Patent Document 2: JP-A 2002-226470
Patent Document 3: JP-A 2002-363148
Patent Document 4: JP-A 2015-090382
Patent Document 5: JP-A 2017-219836 (U.S. Pat. No. 10,295,904)
Non-Patent Document 1: SPIE Vol. 7639 p76390 W (2010)

DISCLOSURE OF INVENTION

For the acid-catalyzed chemically amplified resist, it is desired to develop a quencher capable of providing a high sensitivity and reducing LWR or improving CDU.

An object of the invention is to provide a resist composition which exhibits a high sensitivity and a reduced LWR or improved CDU, independent of whether it is of positive tone or negative tone; and a pattern forming process using the same.

The inventors have found that using a sulfonium salt of a carboxylic acid having an iodine or bromine-substituted hydrocarbyl group (exclusive of an iodine or bromine-substituted aromatic ring) as the quencher, a photoresist material having a reduced LWR, improved CDU, high contrast, improved resolution, and wide process margin is obtainable.

In one aspect, the invention provides a resist composition comprising a sulfonium salt of a carboxylic acid having an iodine or bromine-substituted hydrocarbyl group (exclusive of iodine or bromine-substituted aromatic ring).

In a preferred embodiment, the resist composition further comprises a base polymer, and the sulfonium salt has the formula (A).

(A)

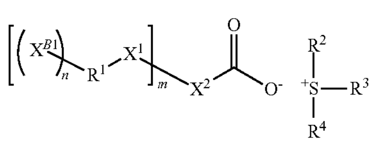

Herein m and n are each independently an integer of 1 to 3. $X^{BI}$ is iodine or bromine. $X^1$ is a single bond, ether bond, ester bond, amide bond, carbonyl group or carbonate group. $X^2$ is a single bond or a $C_1$-$C_{20}$ (m+1)-valent hydrocarbon group which may contain a heteroatom exclusive of iodine and bromine. $R^1$ is a $C_1$-$C_{20}$ (n+1)-valent aliphatic hydrocarbon group which may contain at least one moiety selected from the group consisting of fluorine, chlorine, hydroxyl, carboxyl, $C_6$-$C_{12}$ aryl, ether bond, ester bond, carbonyl, amide bond, carbonate, urethane bond and urea bond. $R^2$, $R^3$ and $R^4$ are each independently fluorine, chlorine, bromine, iodine, or a $C_1$-$C_{20}$ hydrocarbyl group which may contain a heteroatom, $R^2$ and $R^3$ may bond together to form a ring with the sulfur atom to which they are attached, and m is an integer of 1 to 3.

The resist composition may further comprise an acid generator capable of generating a sulfonic acid, imide acid or methide acid.

In a preferred embodiment, the base polymer comprises recurring units having the formula (a1) or recurring units having the formula (a2).

(a1)

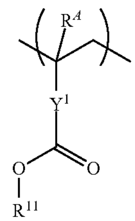

(a2)

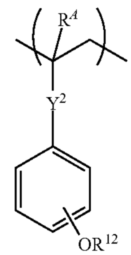

Herein $R^A$ is each independently hydrogen or methyl, $R^{11}$ and $R^{12}$ each are an acid labile group, $Y^1$ is a single bond, phenylene group, naphthylene group, or $C_1$-$C_{12}$ linking group containing ester bond or lactone ring, $Y^2$ is a single bond or ester bond.

Typically, the resist composition is a chemically amplified positive resist composition.

In another preferred embodiment, the base polymer is free of an acid labile group. The resist composition is typically a chemically amplified negative resist composition.

In a preferred embodiment, the base polymer comprises recurring units of at least one type selected from recurring units having the formulae (f1) to (f3).

(f1)

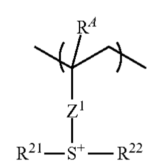

(f2)

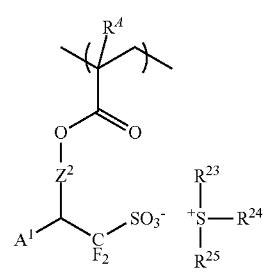

-continued (f3)

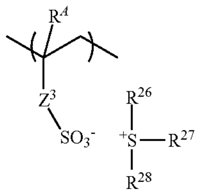

Herein $R^A$ is each independently hydrogen or methyl. $Z^1$ is a single bond, phenylene group, —O—$Z^{11}$—, —C(═O)—O—$Z^{11}$—, or —C(═O)—NH—$Z^{11}$—, wherein $Z^{11}$ is a $C_1$-$C_6$ aliphatic hydrocarbylene group or phenylene group, which may contain a carbonyl, ester bond, ether bond or hydroxyl moiety. $Z^2$ is a single bond, —$Z^{21}$—C(═O)—O—, —$Z^{21}$—O— or —$Z^{21}$—O—C(═O)—, wherein $Z^{21}$ is a $C_1$-$C_{12}$ saturated hydrocarbylene group which may contain a carbonyl moiety, ester bond or ether bond. $Z^3$ is a single bond, methylene, ethylene, phenylene, fluorinated phenylene, —C(═O)—O—$R^{31}$—, or —C(═O)—NH—$Z^{31}$—, wherein $Z^{31}$ is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxyl moiety. $R^{21}$ to $R^{28}$ are each independently a $C_1$-$C_{20}$ hydrocarbyl group which may contain a heteroatom, any two of $R^{23}$, $R^{24}$ and $R^{25}$ or any two of $R^{26}$, $R^{27}$ and $R^{28}$ may bond together to form a ring with the sulfur atom to which they are attached. $A^1$ is hydrogen or trifluoromethyl. $M^-$ is a non-nucleophilic counter ion.

In a preferred embodiment, the resist composition further comprises an organic solvent and/or a surfactant.

In another aspect, the invention provides a process for forming a pattern comprising the steps of applying the resist composition defined above onto a substrate to form a resist film, exposing the resist film to high-energy radiation, and developing the exposed resist film in a developer.

Typically, the high-energy radiation is i-line of wavelength 365 nm, ArF excimer laser radiation of wavelength 193 nm, KrF excimer laser radiation of wavelength 248 nm, EB, or EUV of wavelength 3 to 15 nm.

Advantageous Effects of Invention

A sulfonium salt of iodized or brominated hydrocarbyl-containing carboxylic acid is fully effective for suppressing acid diffusion because iodine or bromine has a relatively large atomic weight. Then LWR is reduced or CDU is improved. Since iodine atoms are highly absorptive to EUV of wavelength 13.5 nm, or bromine atoms are likely to ionize, iodine or bromine atoms generate a large amount of secondary electrons or radicals during exposure, leading to a high sensitivity. There can be formulated a resist composition exhibiting a high sensitivity, a reduced LWR and an improved CDU.

DESCRIPTION OF EMBODIMENTS

As used herein, the singular forms "a," "an" and "the" include plural referents unless the context clearly dictates otherwise. The notation (Cn-Cm) means a group containing from n to m carbon atoms per group. As used herein, the term "iodized" or "brominated" compound means an iodine or bromine-containing compound. In chemical formulae, Me stands for methyl, and Ac for acetyl.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity

Resist Composition

The resist composition of the invention is defined as comprising a sulfonium salt of a carboxylic acid having an iodine or bromine-substituted hydrocarbyl group (exclusive of an iodine or bromine-substituted aromatic ring). The carboxylic acid having an iodine or bromine-substituted hydrocarbyl group is referred to as "iodized or brominated hydrocarbyl-containing carboxylic acid," hereinafter. The sulfonium salt is an acid generator capable of generating iodized or brominated hydrocarbyl-containing carboxylic acid upon light exposure, and it also functions as a quencher because it has a strongly basic sulfonium cation. Since the iodized or brominated hydrocarbyl-containing carboxylic acid does not possess a sufficient acidity to induce deprotection reaction of an acid labile group, it is recommended to separately add an acid generator capable of generating a strong acid such as α-fluorinated sulfonic acid, imide acid or methide acid, as will be described later, in order to induce deprotection reaction of an acid labile group. Notably, the acid generator capable of generating α-fluorinated sulfonic acid, imide acid or methide acid may be either of addition type which is added to the base polymer or of bound type which is bound in the base polymer.

When a resist composition containing the sulfonium salt of iodized or brominated hydrocarbyl-containing carboxylic acid in admixture with an acid generator capable of generating a perfluoroalkylsulfonic acid or superstrong acid is exposed to radiation, iodized or brominated hydrocarbyl-containing carboxylic acid and perfluoroalkylsulfonic acid generate. Since the acid generator is not entirely decomposed, the undecomposed acid generator is present nearby. When the sulfonium salt of iodized or brominated hydrocarbyl-containing carboxylic acid co-exists with the perfluoroalkylsulfonic acid, first the perfluoroalkylsulfonic acid undergoes ion exchange with the sulfonium salt of iodized or brominated hydrocarbyl-containing carboxylic acid, whereby a sulfonium salt of perfluoroalkylsulfonic acid is created and iodized or brominated hydrocarbyl-containing carboxylic acid is released. This is because the salt of perfluoroalkylsulfonic acid having a high acid strength is more stable. In contrast, when a sulfonium salt of perfluoroalkylsulfonic acid co-exists with iodized or brominated hydrocarbyl-containing carboxylic acid, no ion exchange takes place. The ion exchange takes place not only with the perfluoroalkylsulfonic acid, but also similarly with arylsulfonic acid, alkylsulfonic acid, imide acid and methide acid having a higher acid strength than the iodized or brominated hydrocarbyl-containing carboxylic acid.

The iodized or brominated hydrocarbyl-containing carboxylic acid has a higher molecular weight than unsubstituted alkane carboxylic acid and hence, a higher ability to suppress acid diffusion. Iodine atoms are highly absorptive to EUV of wavelength 13.5 nm, and bromine atoms are likely to ionize. Then more secondary electrons are generated upon exposure, or more radicals are generated from iodized alkyl through cleavage of iodine. The energy transfer from secondary electrons or radicals to the acid generator promotes decomposition of the acid generator, leading to a high sensitivity.

While the resist composition of the invention should essentially contain the sulfonium salt of iodized or brominated hydrocarbyl-containing carboxylic acid, another sulfonium or iodonium salt may be separately added as the quencher. Examples of the sulfonium or iodonium salt to be added as the quencher include sulfonium or iodonium salts of carboxylic acid, sulfonic acid, imide acid and saccharin. The carboxylic acid used herein may or may not be fluorinated at α-position.

For the LWR or CDU improving purpose, it is effective to prevent a polymer and/or acid generator from agglomeration as indicated above. Effective means for preventing agglomeration of a polymer is by reducing the difference between hydrophobic and hydrophilic properties or by lowering the glass transition temperature (Tg) thereof. Specifically, it is effective to reduce the polarity difference between a hydrophobic acid labile group and a hydrophilic adhesive group or to lower the Tg by using a compact adhesive group like monocyclic lactone. One effective means for preventing agglomeration of an acid generator is by introducing a substituent into the triphenylsulfonium cation. In particular, with respect to a methacrylate polymer containing an alicyclic protective group and a lactone adhesive group for ArF lithography, a triphenylsulfonium composed solely of aromatic groups has a heterogeneous structure and low compatibility. As the substituent to be introduced into triphenylsulfonium, an alicyclic group or lactone similar to those used in the base polymer is regarded adequate. When lactone is introduced in a sulfonium salt which is hydrophilic, the resulting sulfonium salt becomes too hydrophilic and thus less compatible with a polymer, with a likelihood that the sulfonium salt will agglomerate. When a hydrophobic alkyl group is introduced, the sulfonium salt may be uniformly dispersed within the resist film. WO 2011/048919 discloses the technique for improving LWR or CDU by introducing an alkyl group into a sulfonium salt capable of generating an α-fluorinated sulfone imide acid.

Another factor to be taken into account for the LWR or CDU improving purpose is the dispersibility of a quencher. Even when the dispersibility of an acid generator in a resist film is improved, the uneven distribution of a quencher can cause a degradation of LWR or CDU. For those quenchers of sulfonium salt type, the introduction of an alkyl or similar substituent into the triphenylsulfonium cation moiety is effective for LWR or CDU improvement. Further, the introduction of halogen atoms into the quencher of sulfonium salt type efficiently enhances hydrophobicity and improves dispersibility. The introduction of bulky halogen atoms such as iodine is effective not only in the cation moiety, but also in the anion moiety of the sulfonium salt. The sulfonium salt of iodized or brominated hydrocarbyl-containing carboxylic acid according to the invention has iodine introduced in the anion moiety, whereby the dispersibility of the quencher within the resist film is enhanced and LWR is reduced or CDU is improved.

The sulfonium salt of iodized or brominated hydrocarbyl-containing carboxylic acid exerts a LWR reducing or CDU improving effect, which may stand good either in positive and negative tone pattern formation by alkaline development or in negative tone pattern formation by organic solvent development.

Sulfonium Salt

The inventive resist composition contains the sulfonium salt of iodized or brominated hydrocarbyl-containing carboxylic acid, which typically has the formula (A).

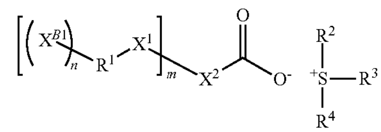

(A)

In formula (A), m and n are each independently an integer of 1 to 3.

$X^{BI}$ is iodine or bromine.

$X^1$ is a single bond, ether bond, ester bond, amide bond, carbonyl group or carbonate group.

$X^2$ is a single bond or a $C_1$-$C_{20}$ (m+1)-valent hydrocarbon group which may contain a heteroatom exclusive of iodine and bromine.

$R^1$ is a $C_1$-$C_{20}$ (n+1)-valent aliphatic hydrocarbon group. The aliphatic hydrocarbon group may be saturated or unsaturated, and straight, branched or cyclic. Examples include alkanediyl groups such as methanediyl, ethane-1,1-diyl, ethane-1,2-diyl, propane-1,1-diyl, propane-1,2-diyl, propane-1,3-diyl, propane-2,2-diyl, butane-1,1-diyl, butane-1,2-diyl, butane-1,3-diyl, butane-2,3-diyl, butane-1,4-diyl, 1,1-dimethylethane-1,2-diyl, pentane-1,5-diyl, 2-methylbutane-1,2-diyl, hexane-1,6-diyl, heptane-1,7-diyl, octane-1,8-diyl, nonane-1,9-diyl, decane-1,10-diyl, undecane-1,11-diyl, and dodecane-1,12-diyl; cycloalkanediyl groups such as cyclopropane-1,1-diyl, cyclopropane-1,2-diyl, cyclobutane-1,1-diyl, cyclobutane-1,2-diyl, cyclobutane-1,3-diyl, cyclopentane-1,1-diyl, cyclopentane-1,2-diyl, cyclopentane-1,3-diyl, cyclohexane-1,1-diyl, cyclohexane-1,2-diyl, cyclohexane-1,3-diyl, and cyclohexane-1,4-diyl; divalent polycyclic saturated hydrocarbon groups such as norbornane-2,3-diyl and norbornane-2,6-diyl; alkenediyl groups such as 2-propene-1,1-diyl; alkynediyl groups such as 2-propyne-1,1-diyl; cycloalkenediyl groups such as 2-cyclohexene-1,2-diyl, 2-cyclohexene-1,3-diyl, and 3-cyclohexene-1,2-diyl; divalent polycyclic unsaturated hydrocarbon groups such as 5-norbornene-2,3-diyl; and alicyclic hydrocarbon-substituted alkanediyl groups such as cyclopentylmethanediyl, cyclohexylmethanediyl, 2-cyclopentenylmethanediyl, 3-cyclopentenylmethanediyl, 2-cyclohexenylmethanediyl, and 3-cyclohexenylmethanediyl; and tri- or tetravalent forms of the foregoing groups with one or two hydrogen atoms being eliminated.

In these groups, some or all hydrogen atoms may be substituted by fluorine, chlorine, hydroxyl, carboxyl or $C_6$-$C_{12}$ aryl moieties or a mixture thereof; or an ether bond, ester bond, carbonyl moiety, amide bond, carbonate moiety, urethane bond or urea bond or a mixture thereof may intervene in a carbon-carbon bond. Suitable $C_6$-$C_{12}$ aryl moieties include phenyl, 2-methylphenyl, 3-methylphenyl, 4-methylphenyl, 1-naphthyl, 2-naphthyl, and fluorenyl.

Examples of the anion in the sulfonium salt having formula (A) are given below, but not limited thereto.

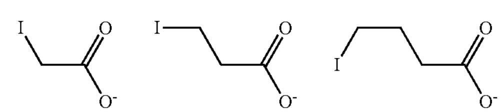

-continued
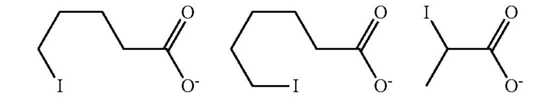
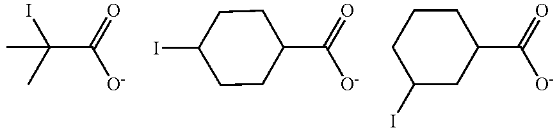
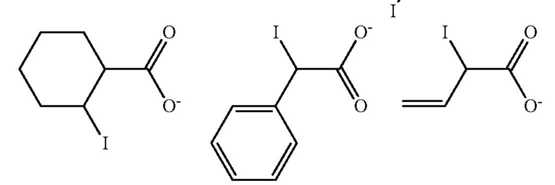
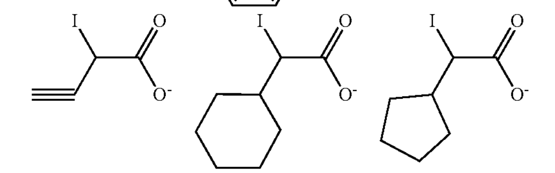
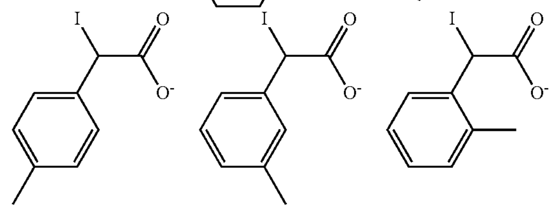
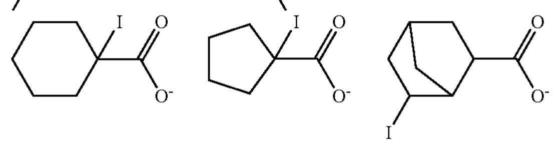
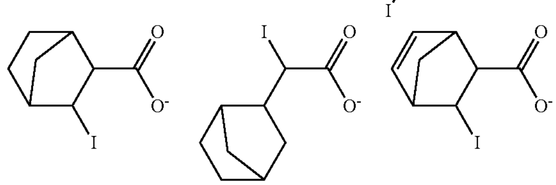
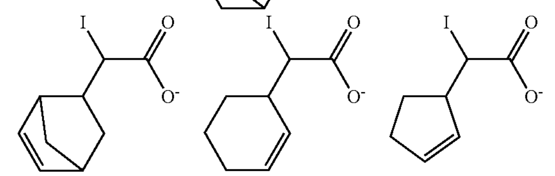
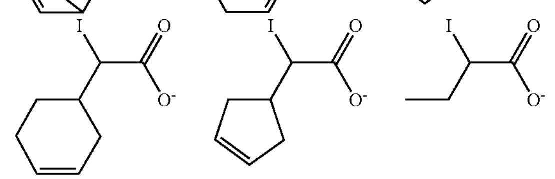
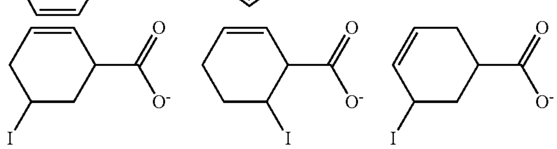
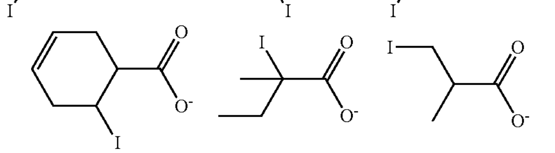
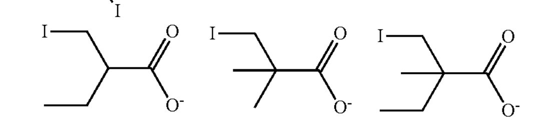
-continued
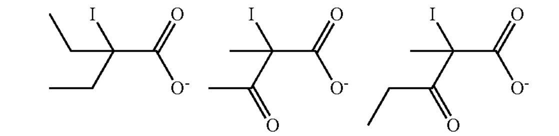
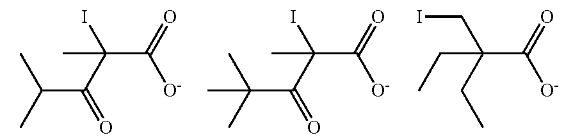
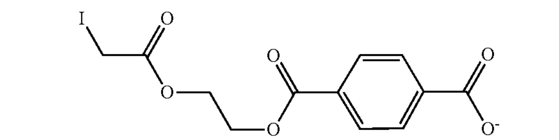
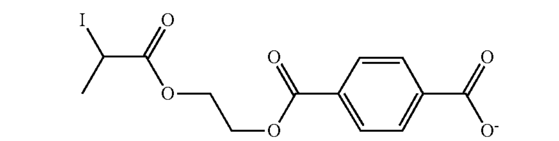
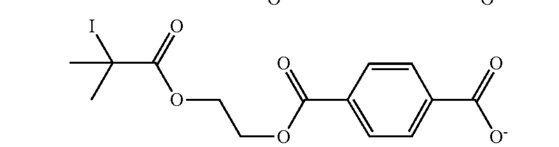
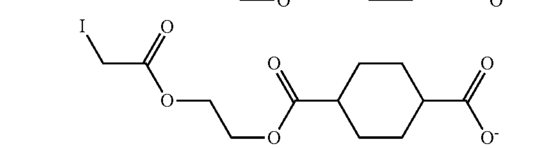
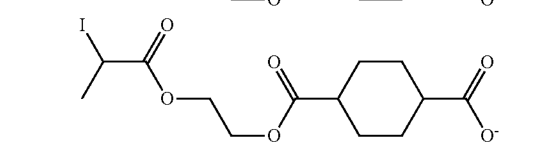
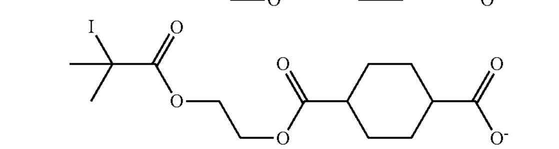
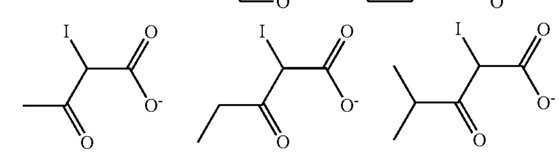
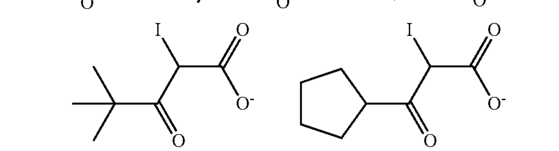
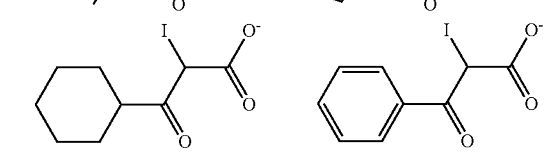
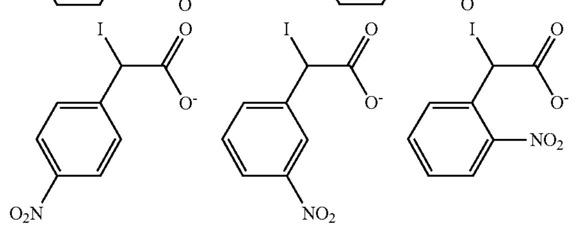

-continued
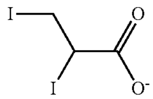
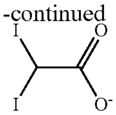
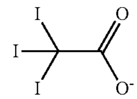
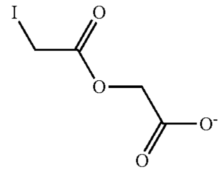
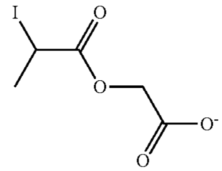
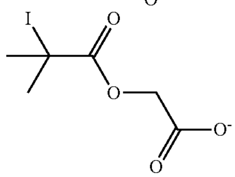
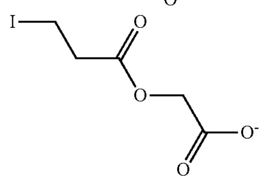
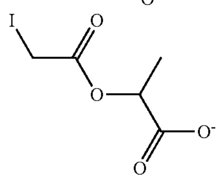
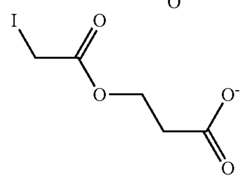
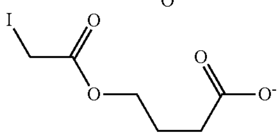
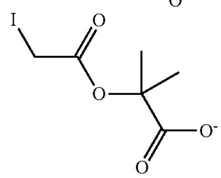
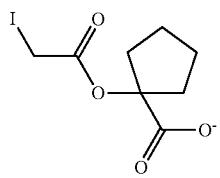
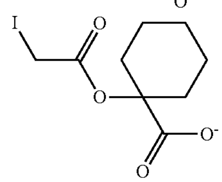
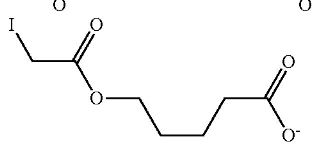
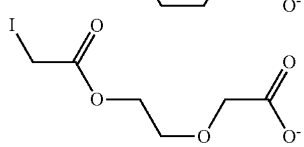
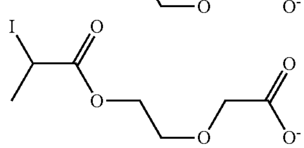
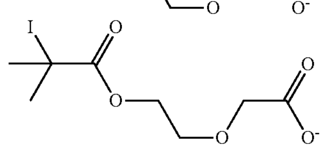
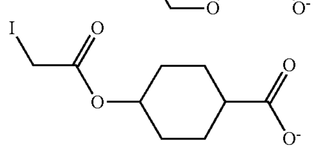
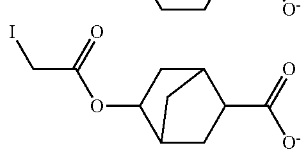
-continued
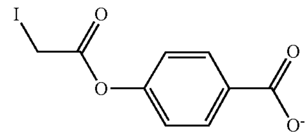
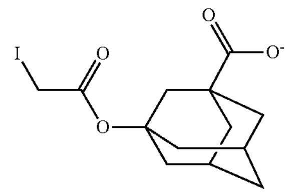
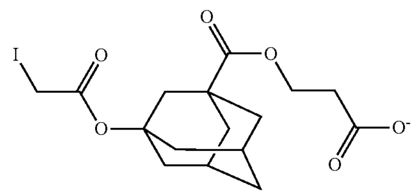
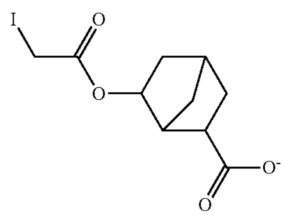
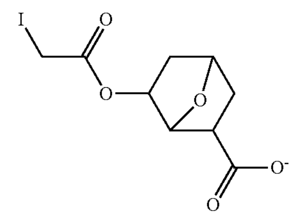
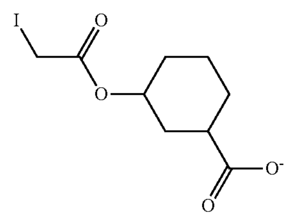
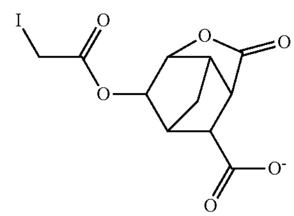
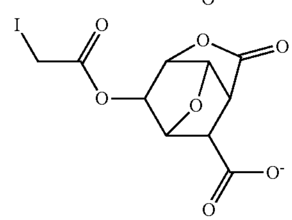
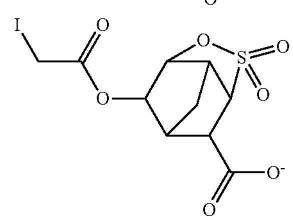
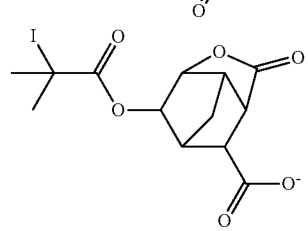
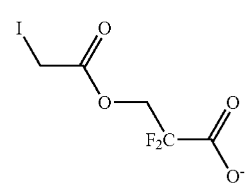
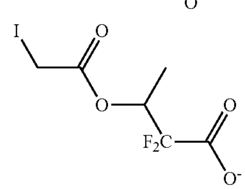
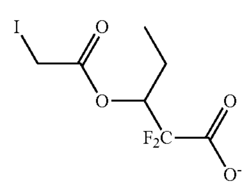
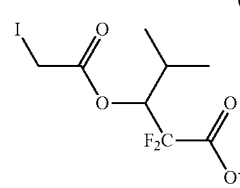
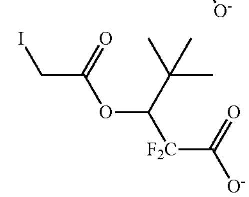

-continued
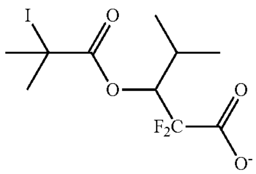
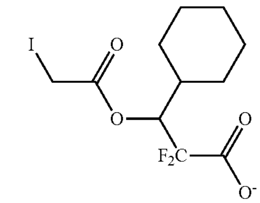
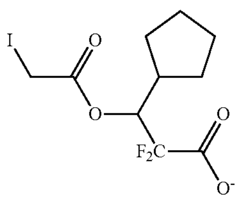
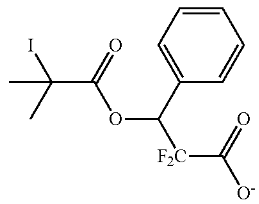
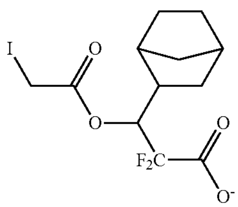
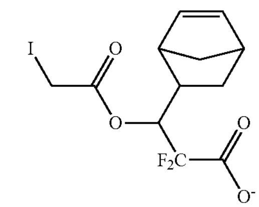
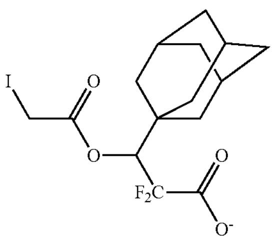
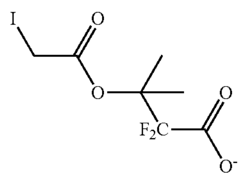
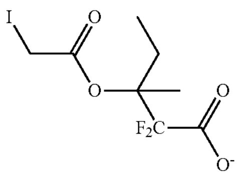
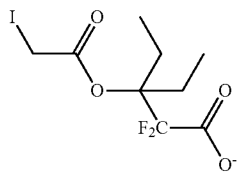
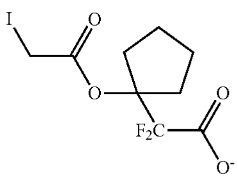
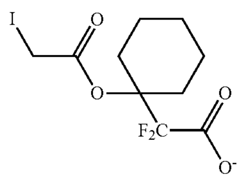
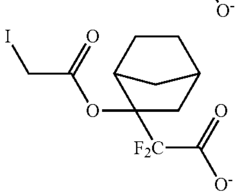
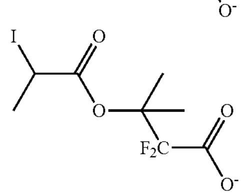
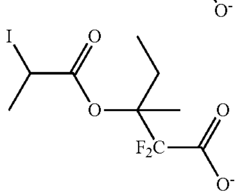
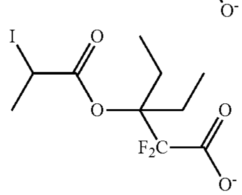
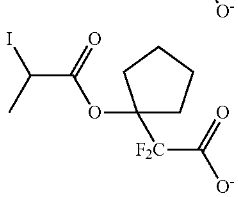
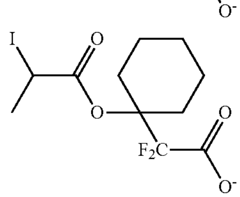
-continued
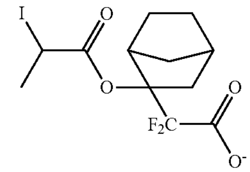
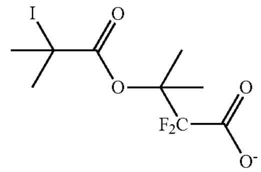
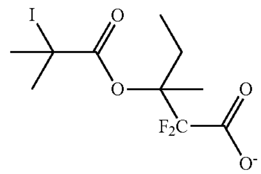
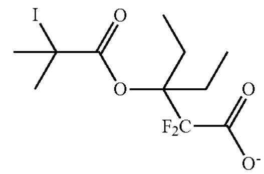
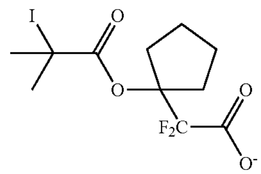
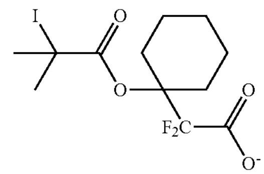
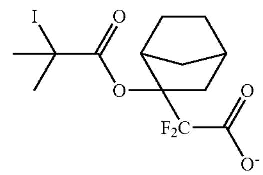
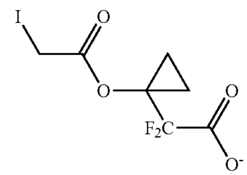
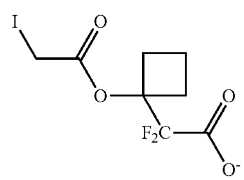
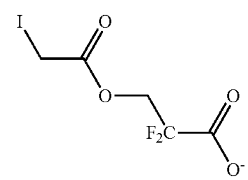
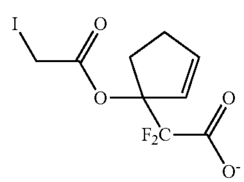
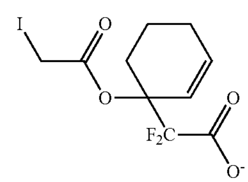
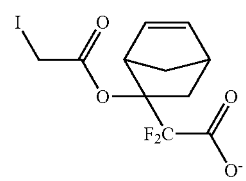
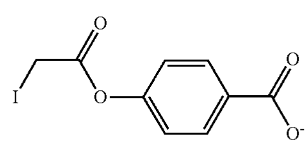
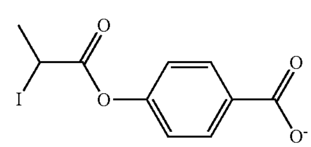
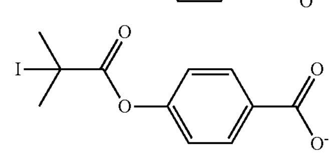
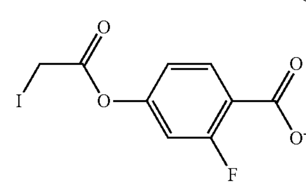

-continued
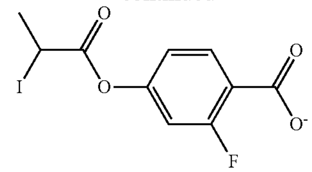
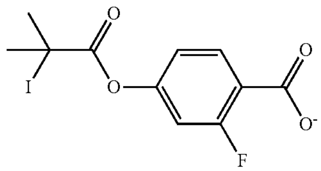
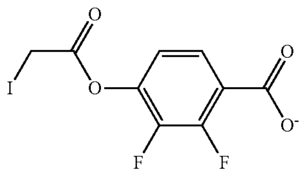
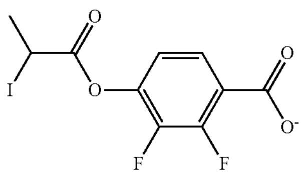
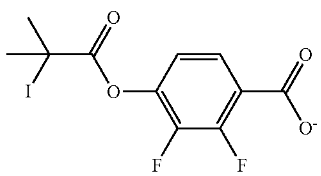
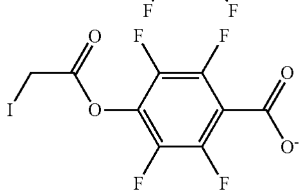
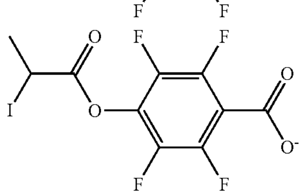
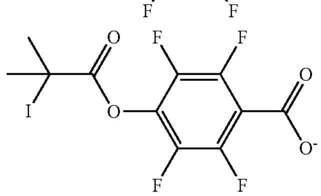
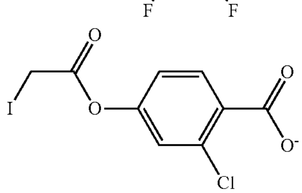
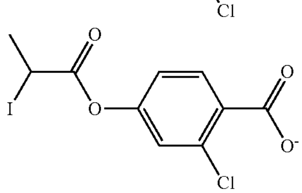
-continued
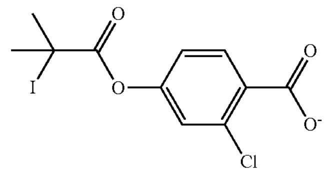
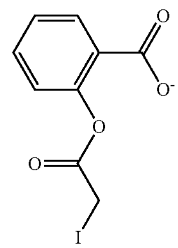
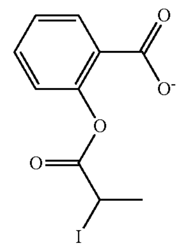
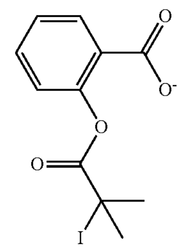
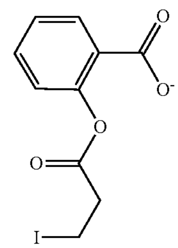
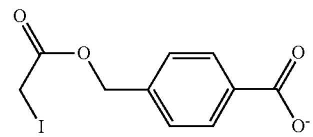
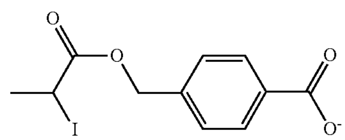
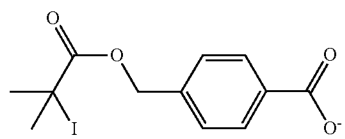
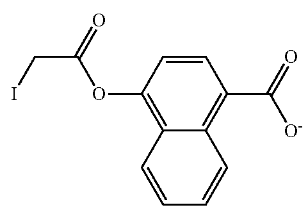
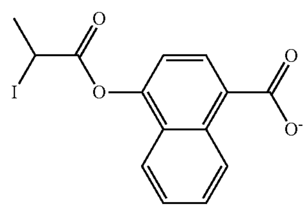
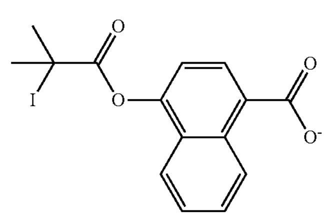

-continued
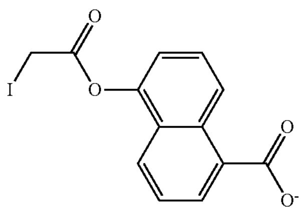
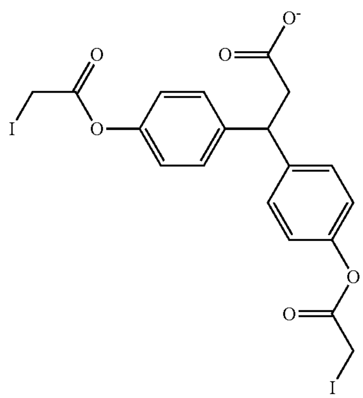
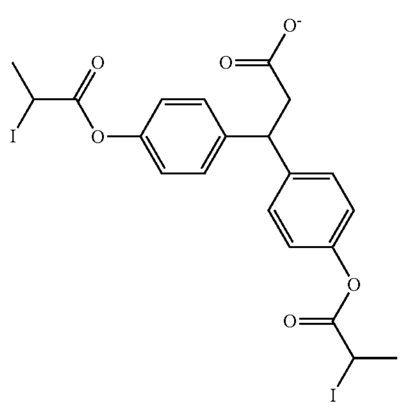
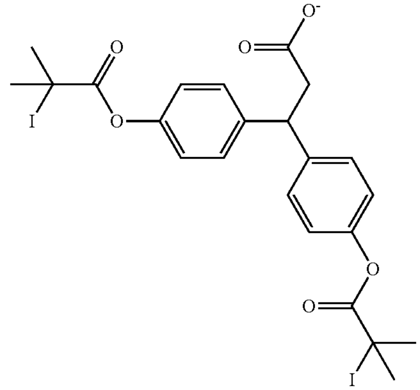
-continued
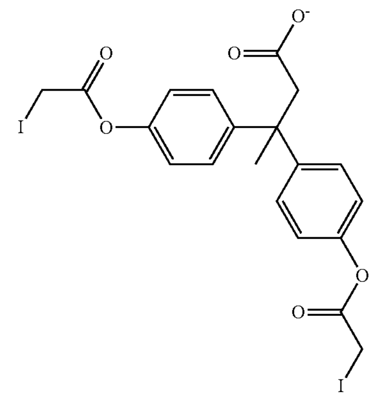
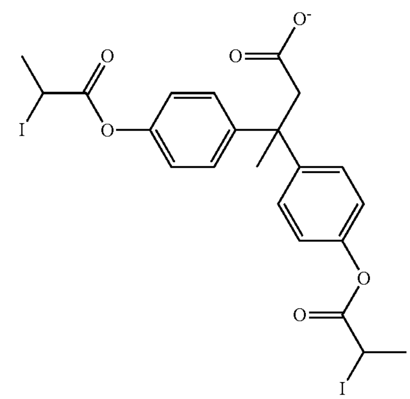
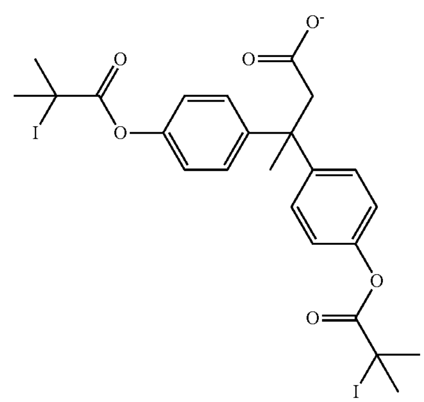
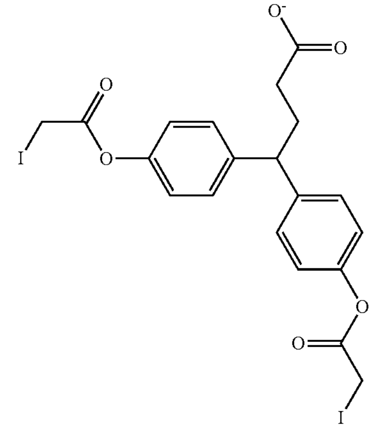

-continued
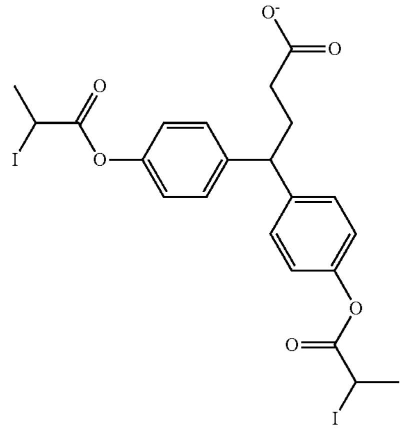
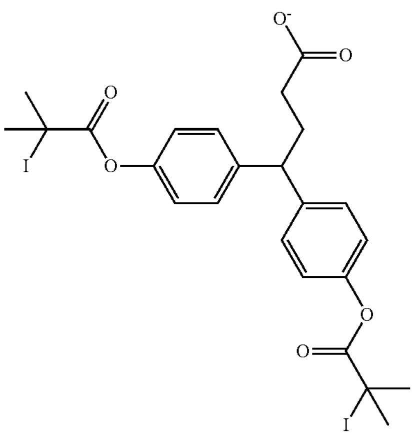
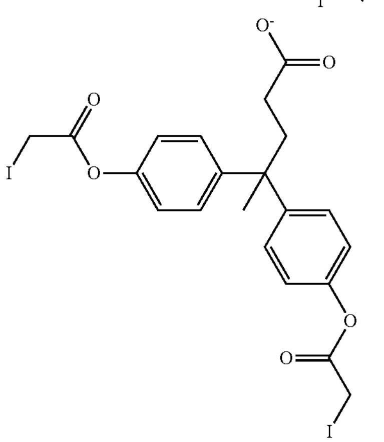
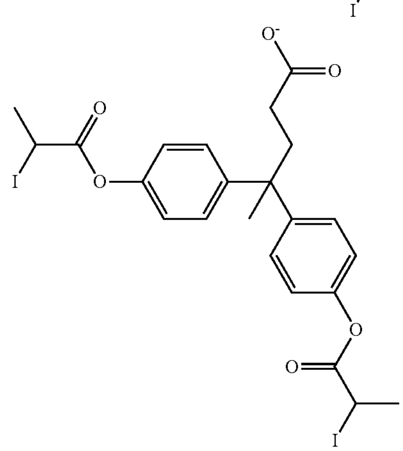
-continued
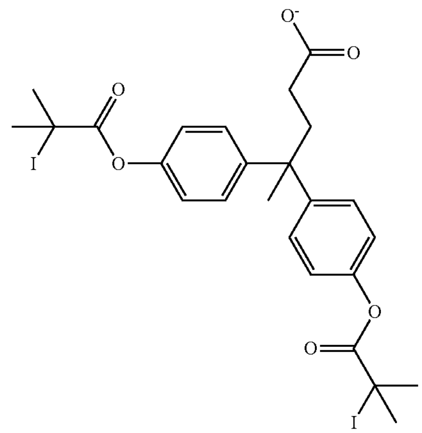
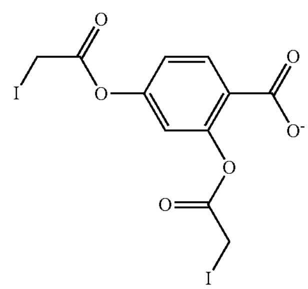
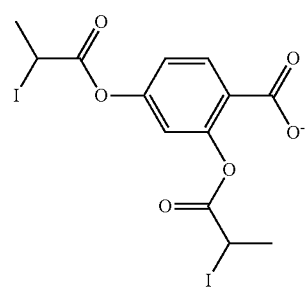
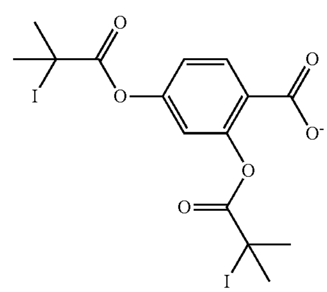
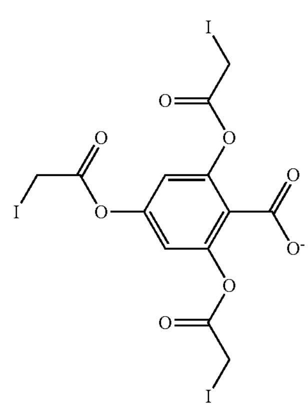

-continued
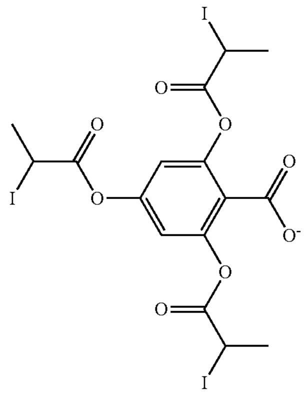
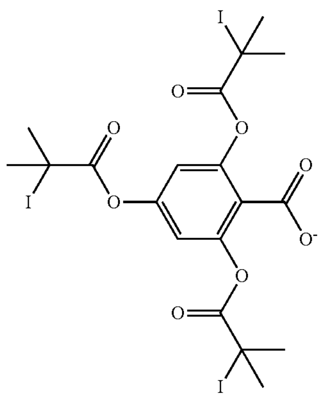
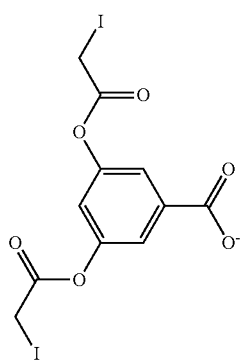
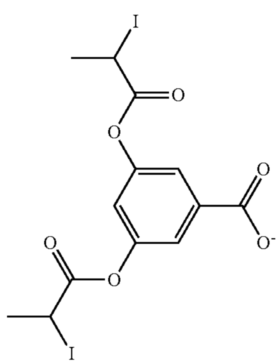
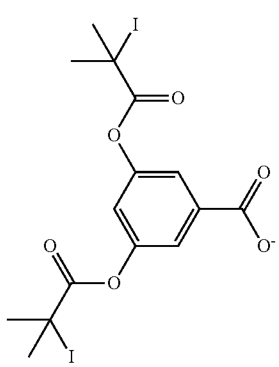
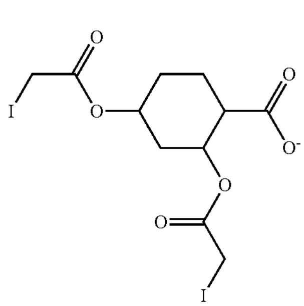
-continued
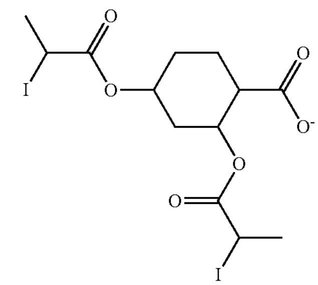
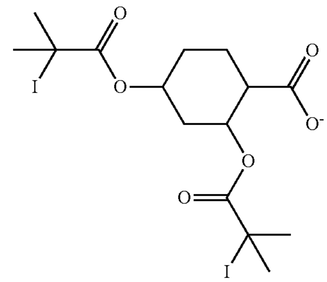
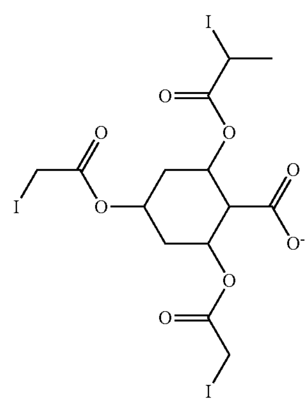 [SMILES: CC(I)C(=O)OC1CC(OC(=O)CI)CC(OC(=O)CI)C1C(=O)[O-]]
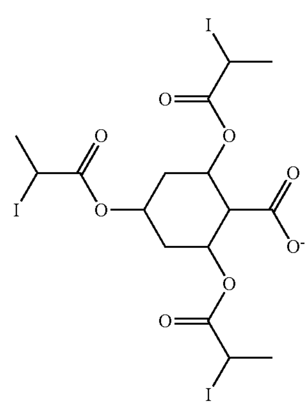

-continued
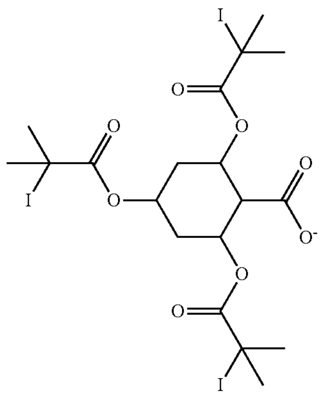
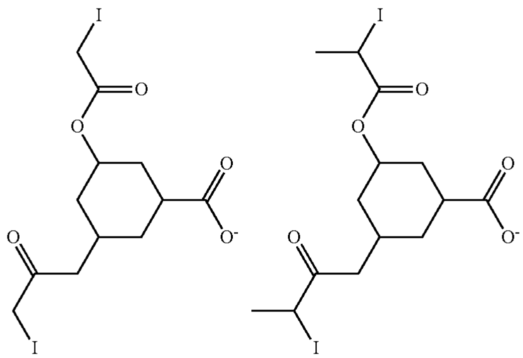
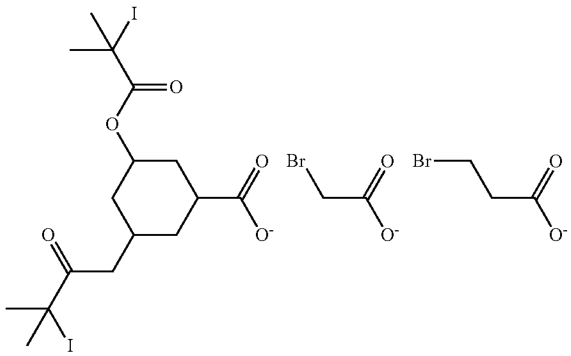
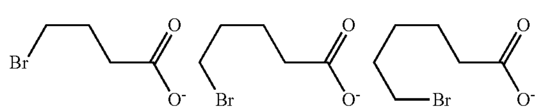
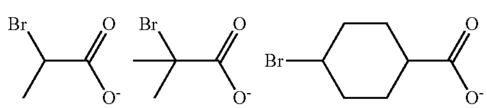
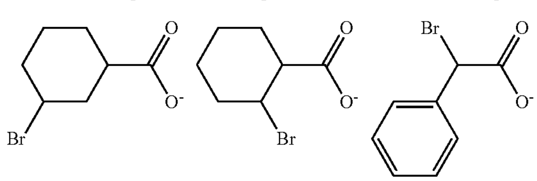
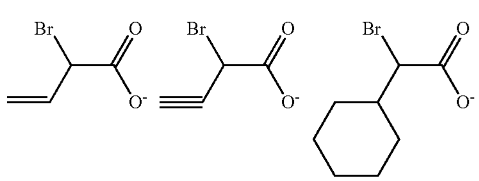
-continued
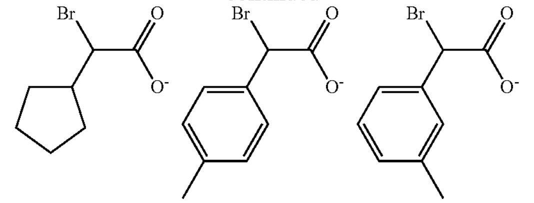
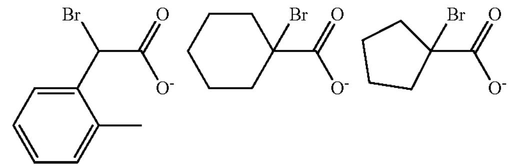
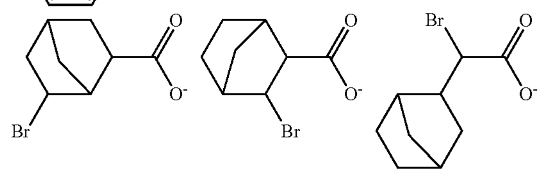
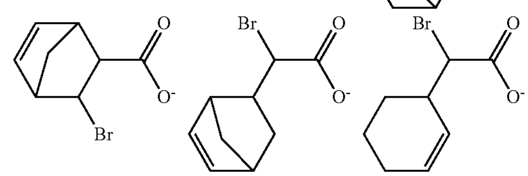
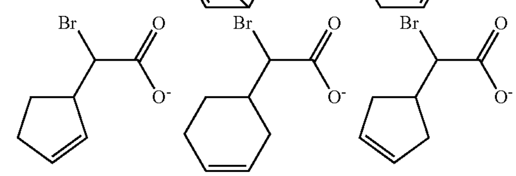
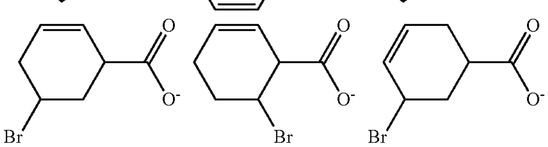
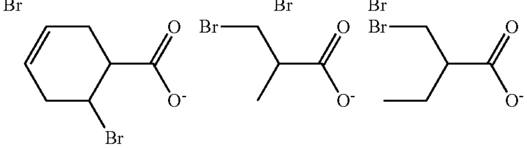
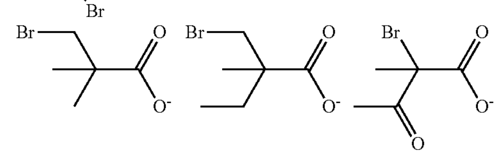
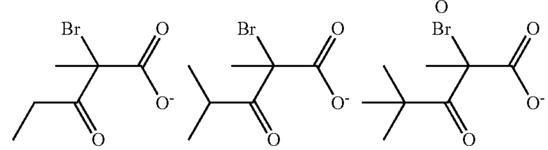
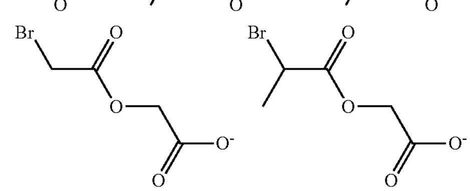
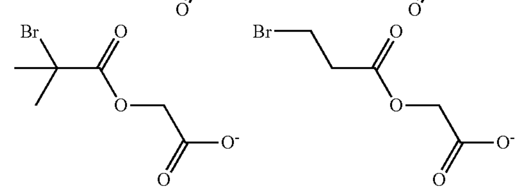

-continued
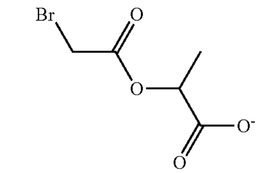
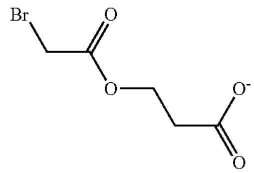
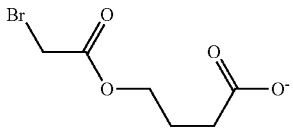
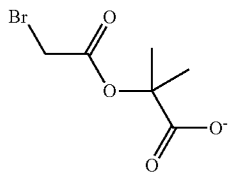
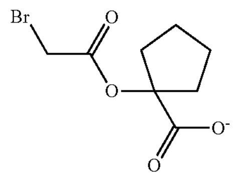
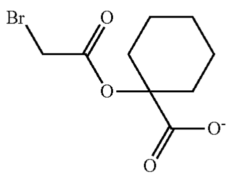
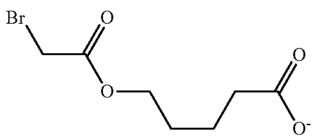
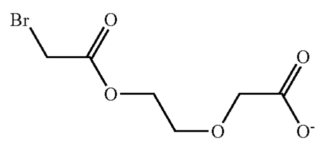
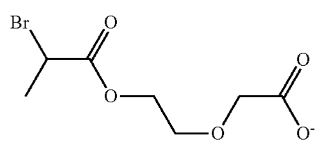
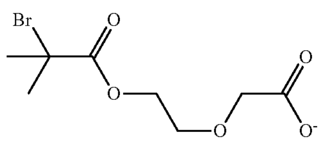
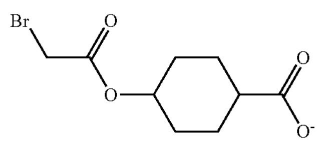
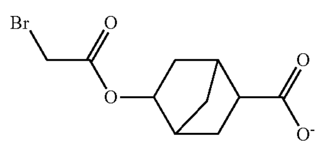
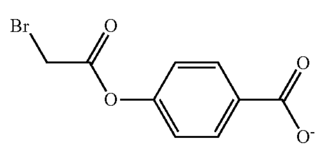
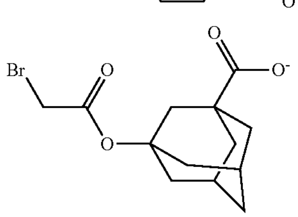
-continued
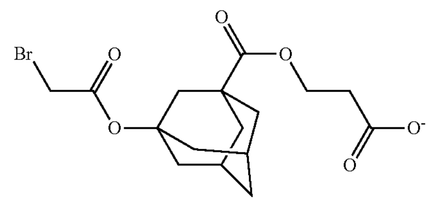
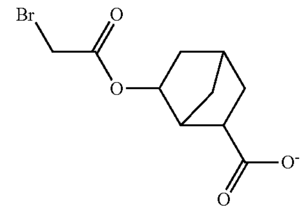
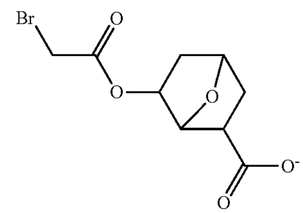
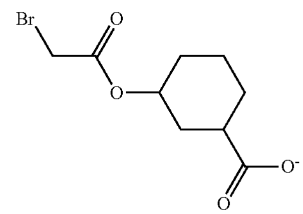
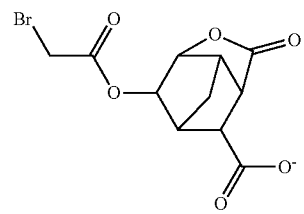
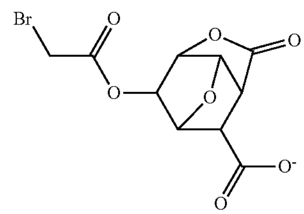
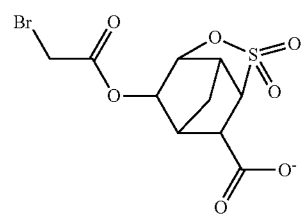
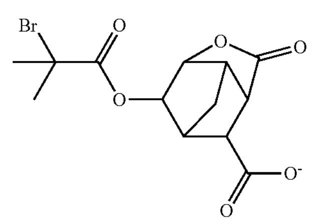
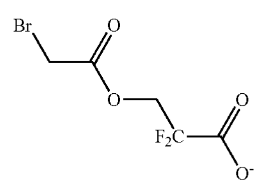

-continued
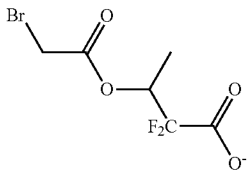
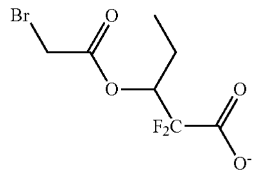
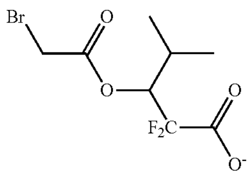
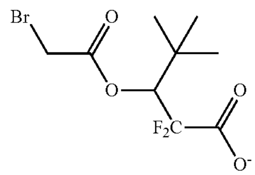
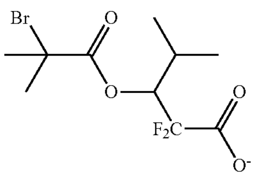
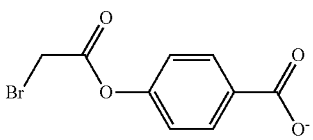
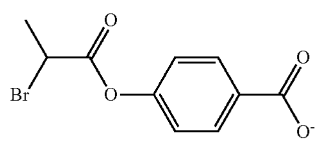
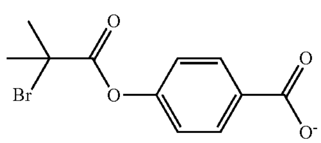
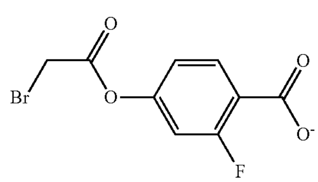
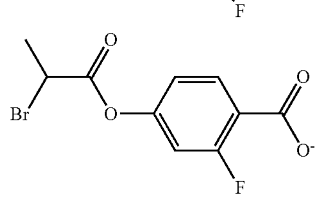
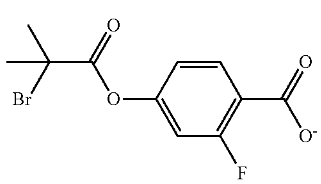
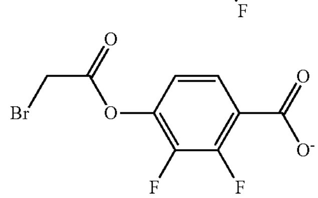
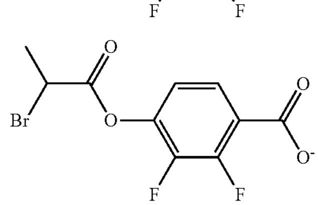
-continued
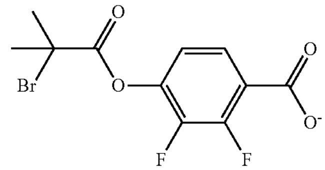
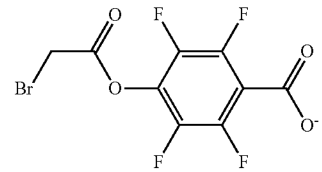
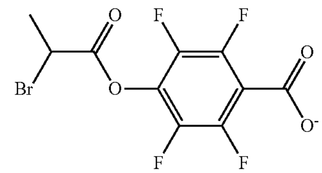
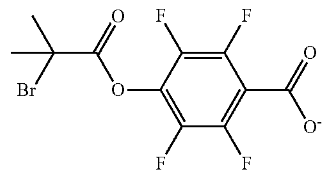
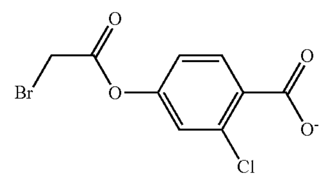
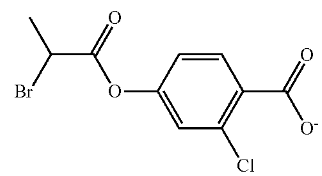
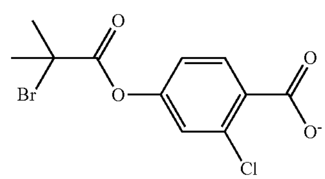
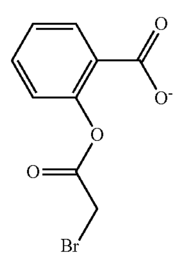
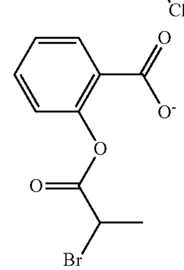
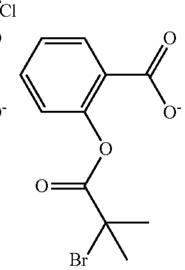
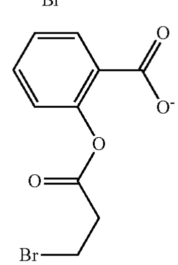
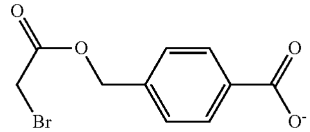

-continued

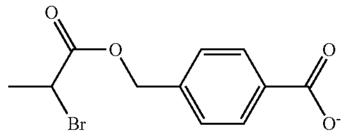
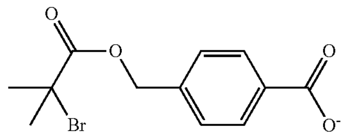
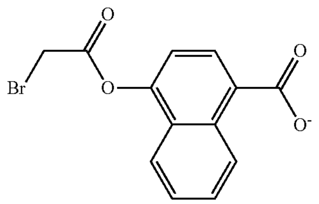
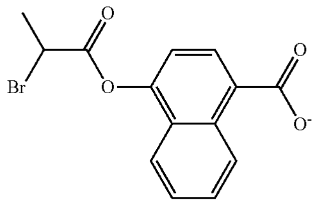
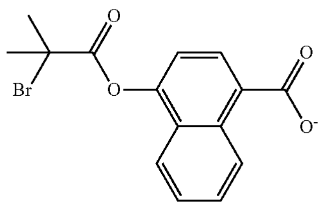
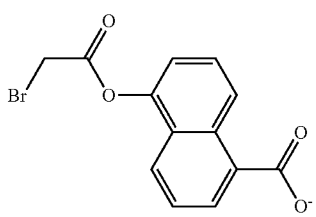
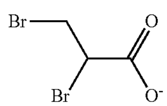
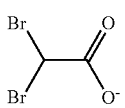
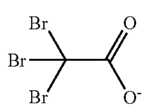
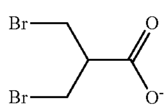
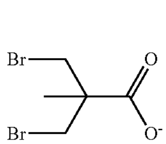
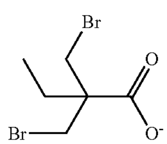
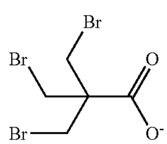
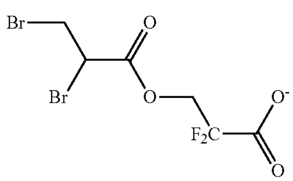
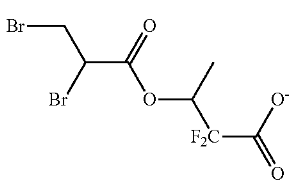

-continued

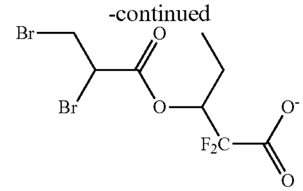
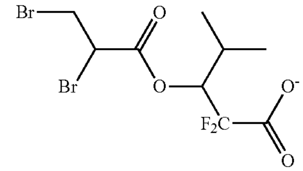
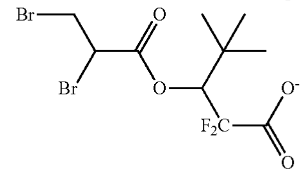
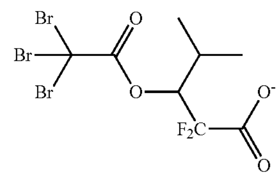
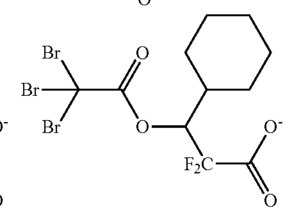
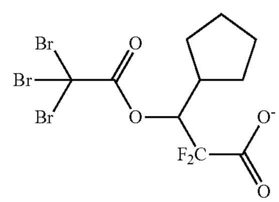
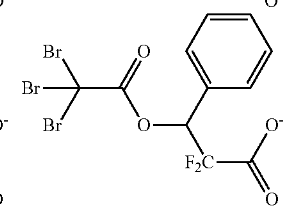

In formula (A), $R^2$, $R^3$ and $R^4$ are each independently fluorine, chlorine, bromine, iodine, or a $C_1$-$C_{20}$ hydrocarbyl group which may contain a heteroatom.

The hydrocarbyl group may be saturated or unsaturated and straight, branched or cyclic. Examples include $C_1$-$C_{20}$ alkyl groups such as methyl, ethyl, n-propyl, isopropyl, n-butyl, isobutyl, sec-butyl, tert-butyl, n-pentyl, n-hexyl, n-octyl, n-nonyl, n-decyl, undecyl, dodecyl, tridecyl, tetradecyl, pentadecyl, heptadecyl, octadecyl, nonadecyl, and icosyl; $C_3$-$C_{20}$ cyclic saturated hydrocarbyl groups such as cyclopropyl, cyclopentyl, cyclohexyl, cyclopropylmethyl, 4-methylcyclohexyl, cyclohexylmethyl, norbornyl, and adamantyl; $C_2$-$C_{20}$ alkenyl groups such as vinyl, propenyl, butenyl, and hexenyl; $C_2$-$C_{20}$ unsaturated alicyclic hydrocarbyl groups such as cyclohexenyl and norbornenyl; $C_2$-$C_{20}$ alkynyl groups such as ethynyl, propynyl and butynyl; $C_6$-$C_{20}$ aryl groups such as phenyl, methylphenyl, ethylphenyl, n-propylphenyl, isopropylphenyl, n-butylphenyl, isobutylphenyl, sec-butylphenyl, tert-butylphenyl, naphthyl, methylnaphthyl, ethylnaphthyl, n-propylnaphthyl, isopropylnaphthyl, n-butylnaphthyl, isobutylnaphthyl, sec-butylnaphthyl, and tert-butylnaphthyl; and $C_7$-$C_{20}$ aralkyl groups such as benzyl and phenethyl. In these groups, some hydrogen may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonic acid ester bond, carbonate, lactone ring, sultone ring, carboxylic anhydride or haloalkyl moiety.

$R^2$ and $R^3$ may bond together to form a ring with the sulfur atom to which they are attached. Preferred examples of the ring include the following structures.
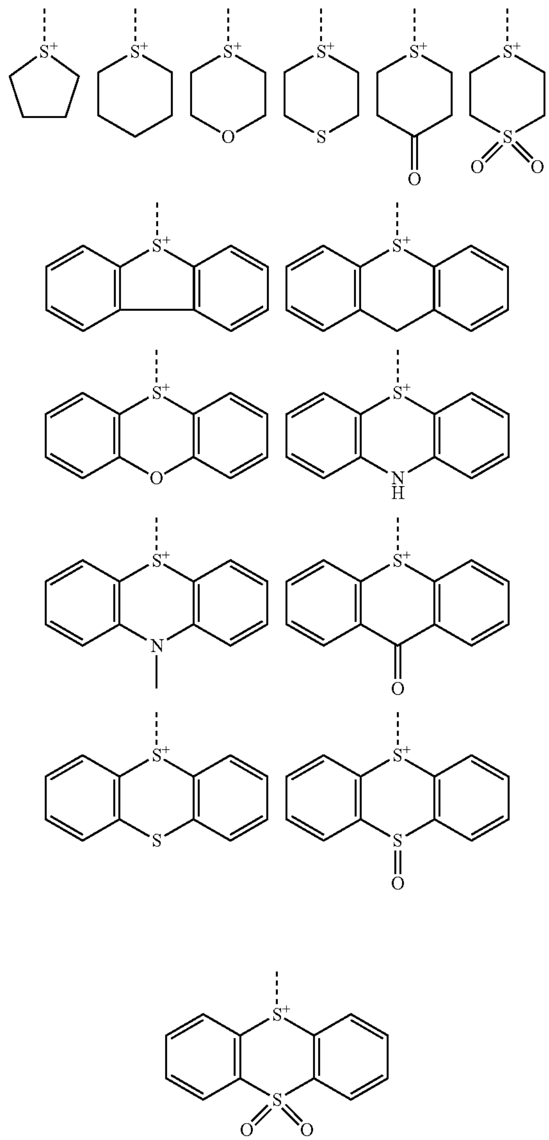
Notably, the broken line designates an attachment to $R^4$.
Examples of the cation in the sulfonium salt having formula (A) are given below, but not limited thereto.
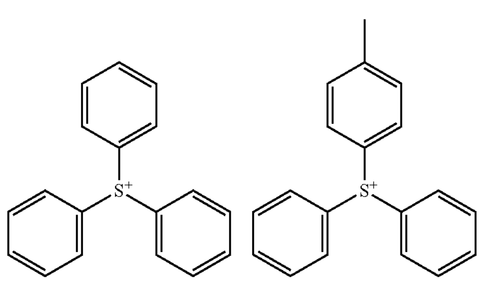
-continued
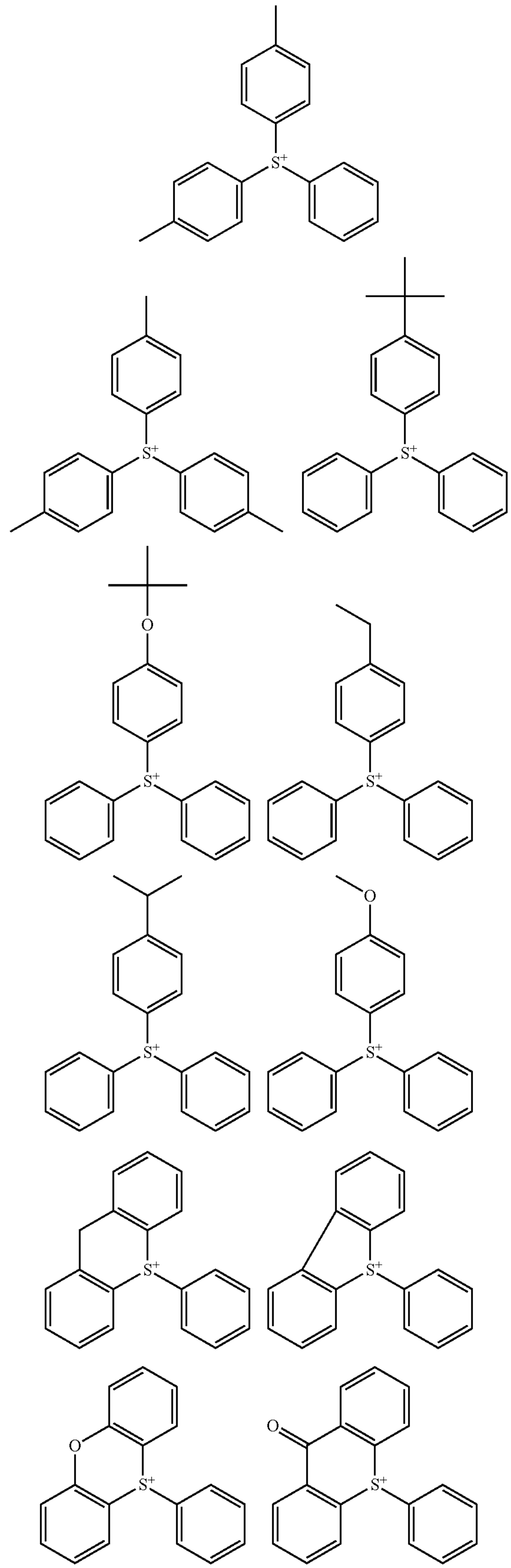

-continued
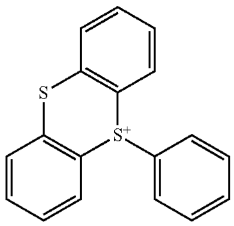
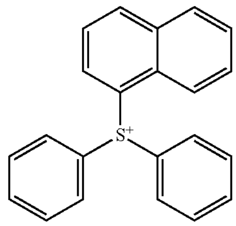
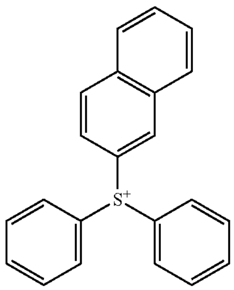
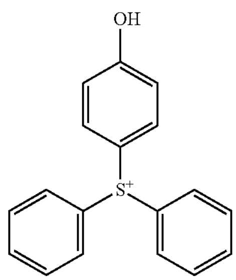
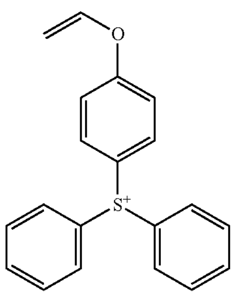
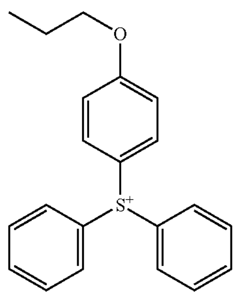
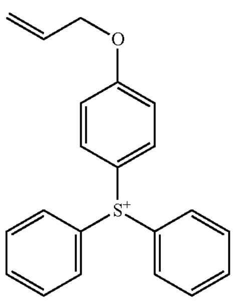
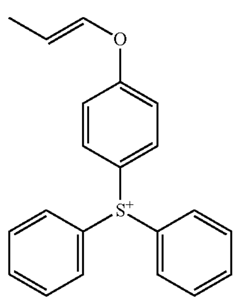
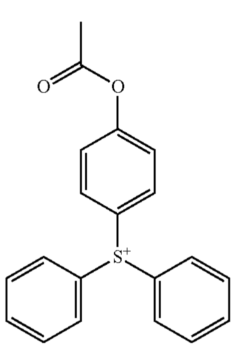
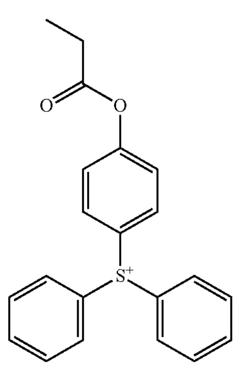
-continued
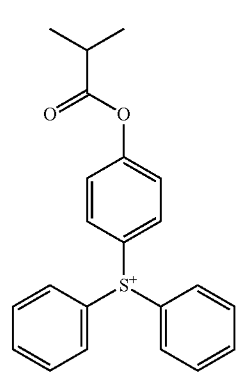
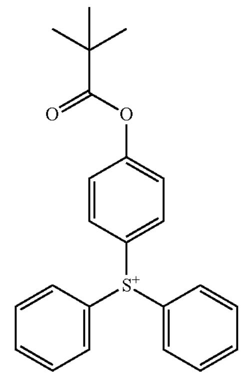
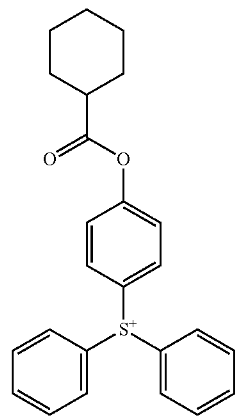
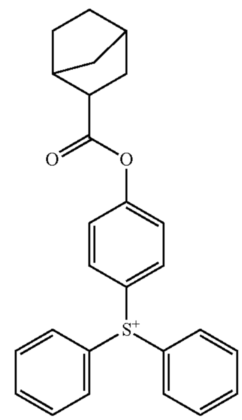
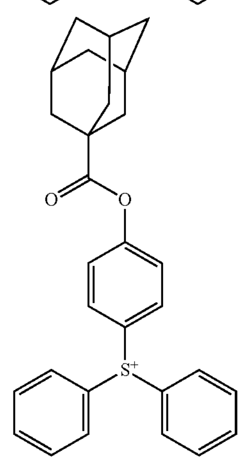
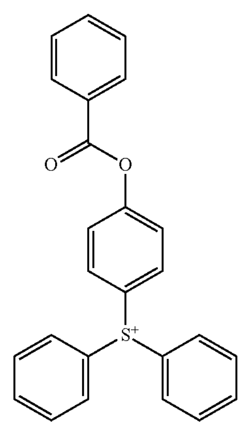
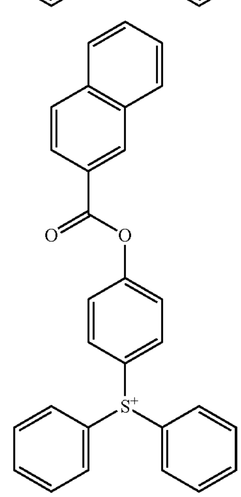
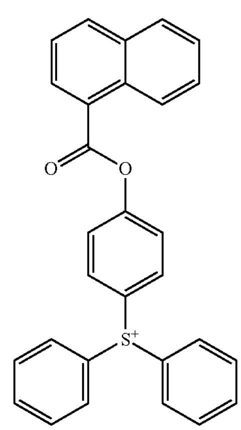

-continued
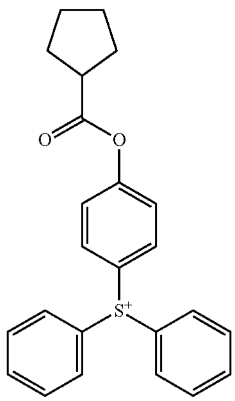
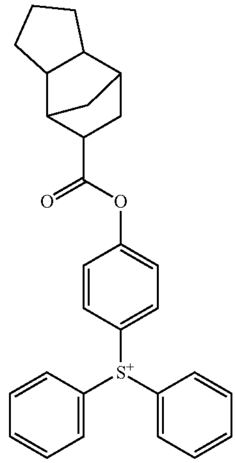
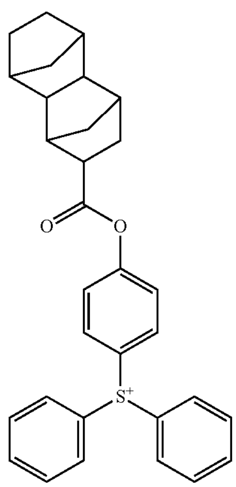
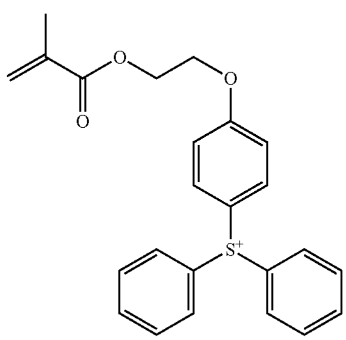
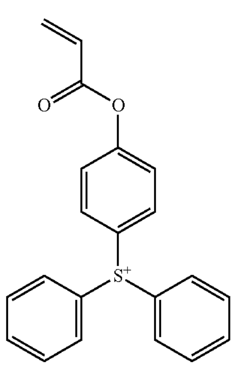
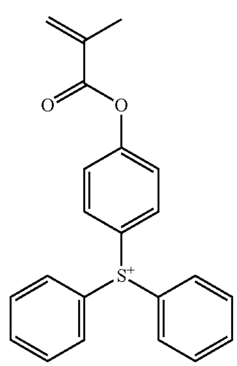
-continued
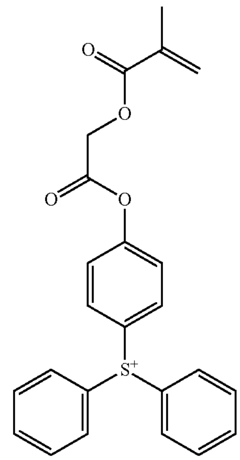
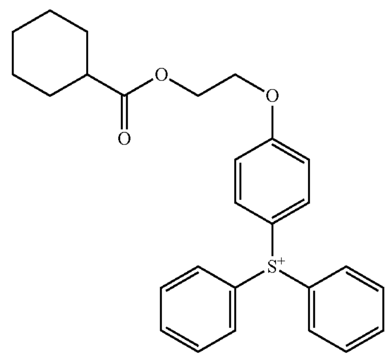
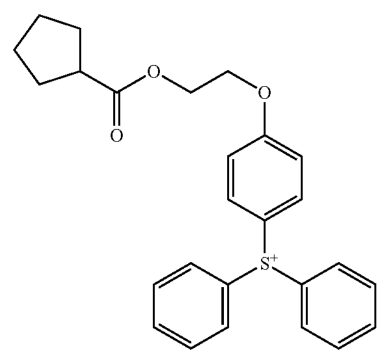
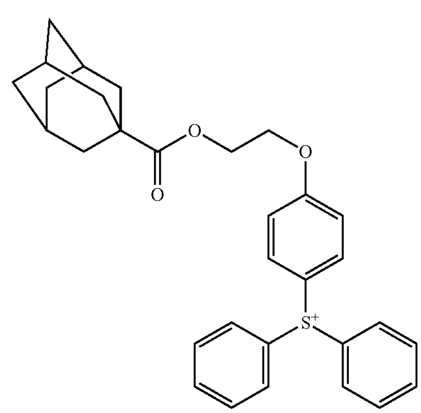

-continued
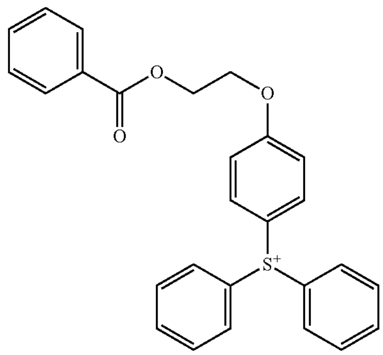
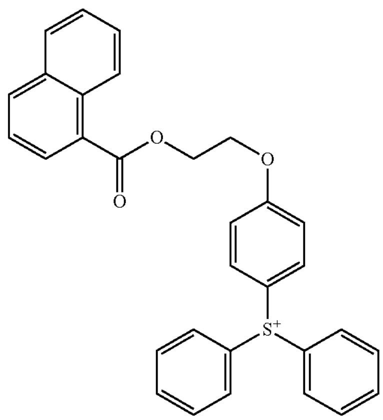
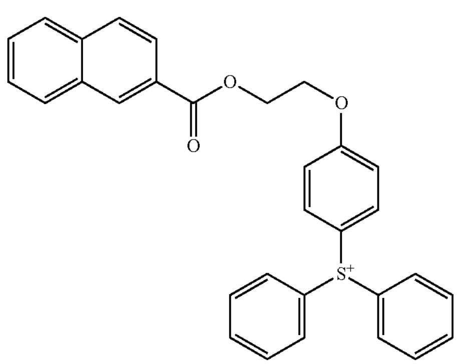
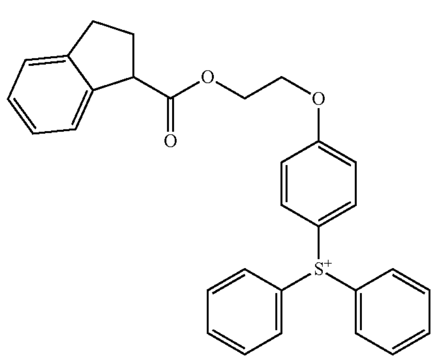
-continued
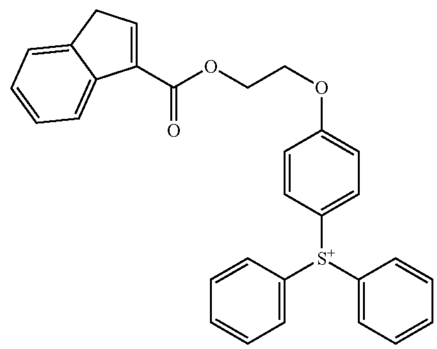
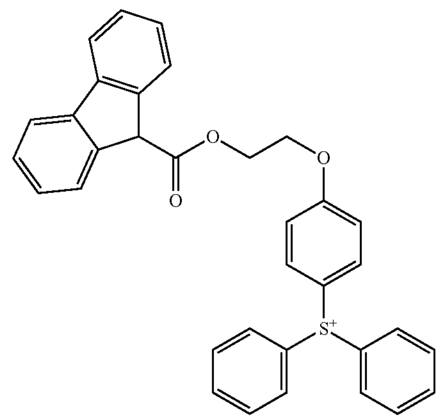
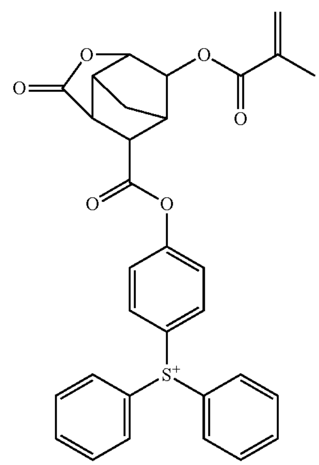
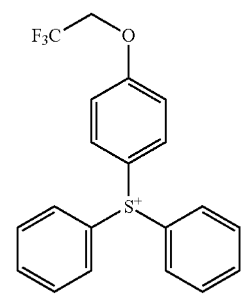
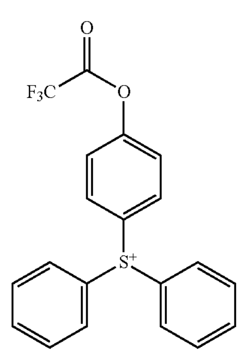
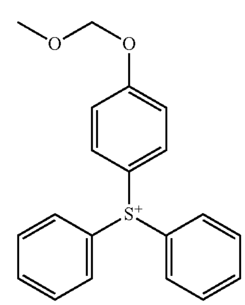

-continued
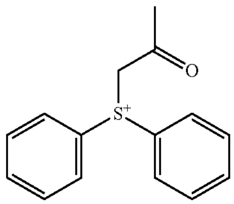
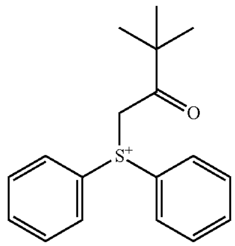
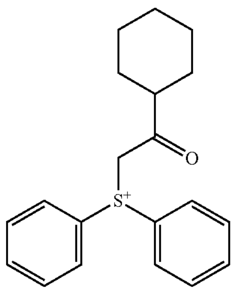
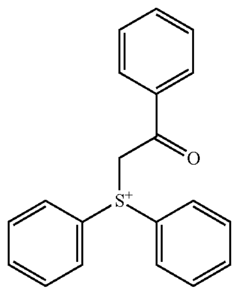
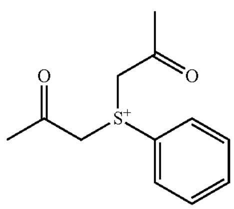
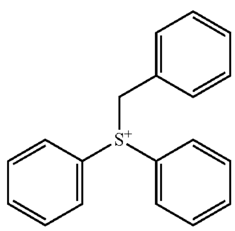
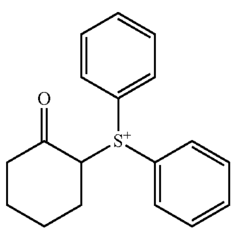
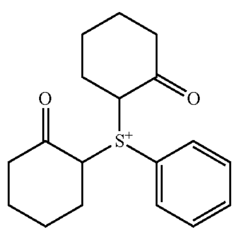
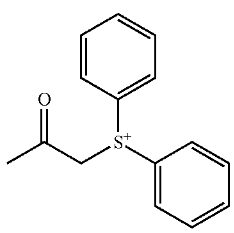
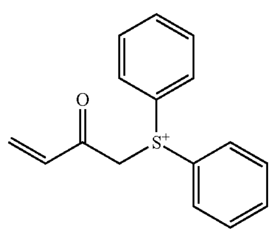
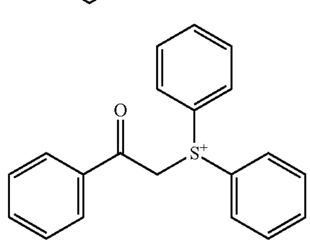
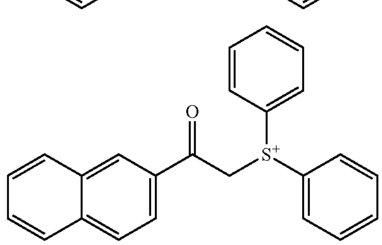
-continued
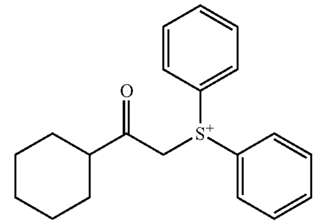
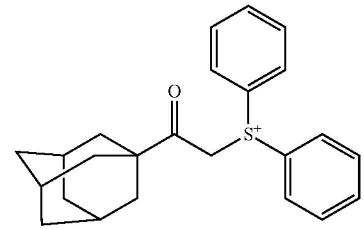
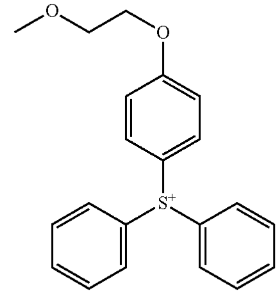
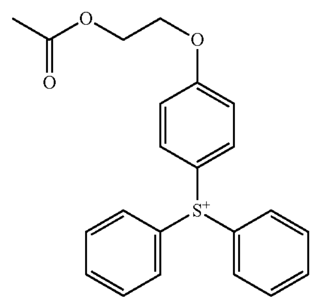
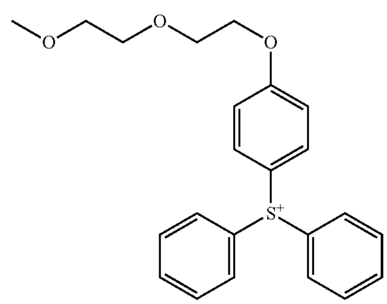
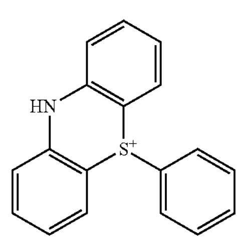
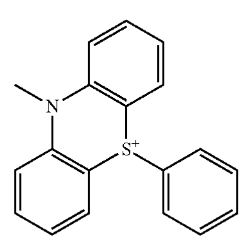

-continued
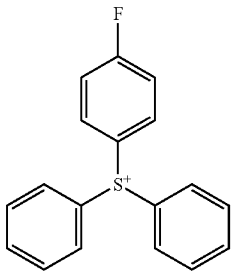
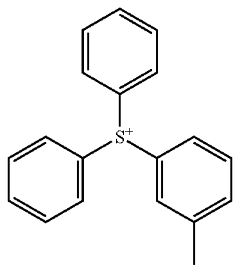
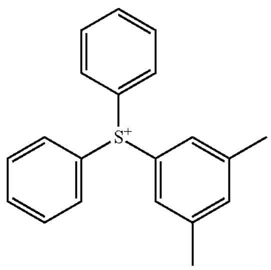
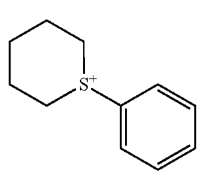
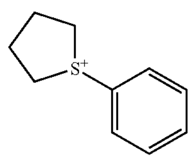
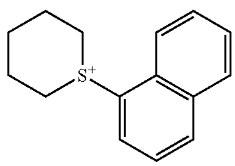
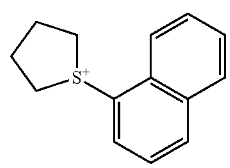
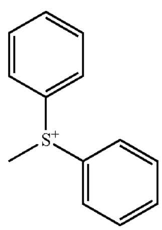
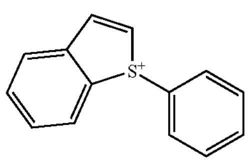
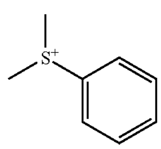
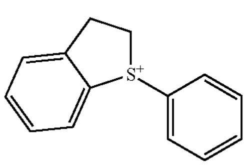
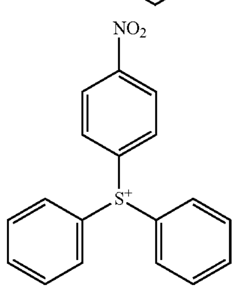
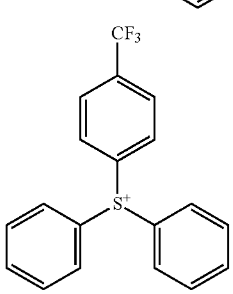
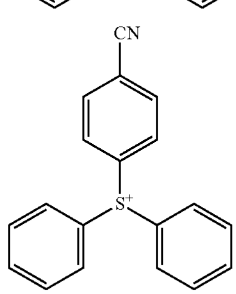
-continued
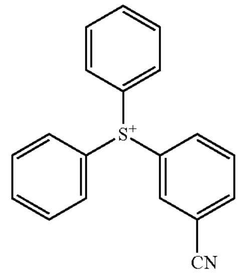
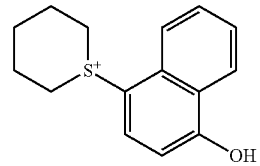
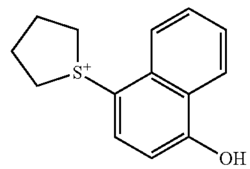
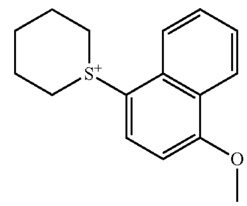
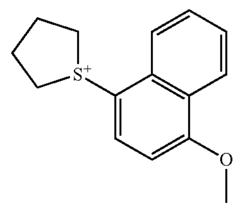
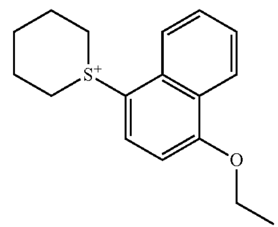
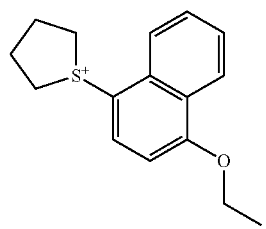
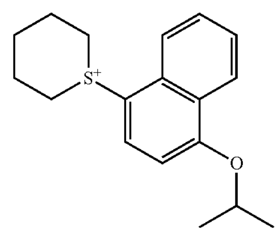
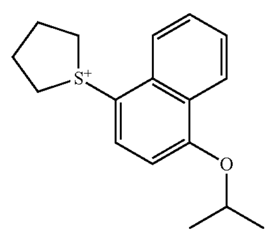
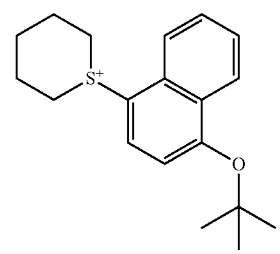
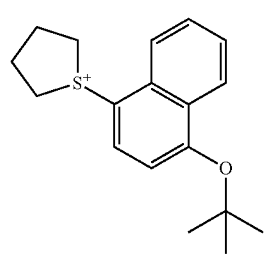
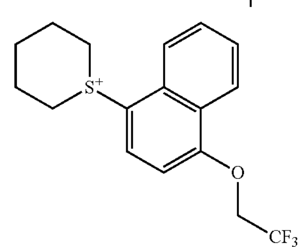
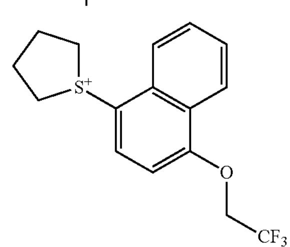

-continued
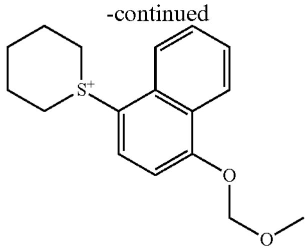
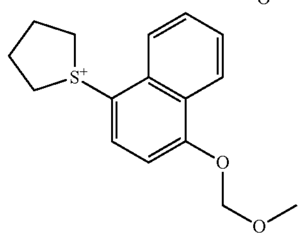
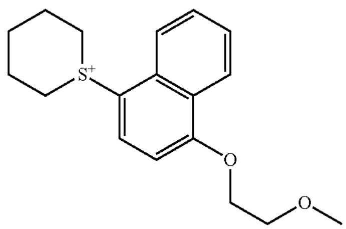
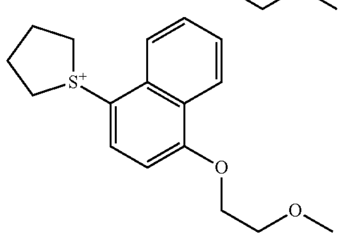
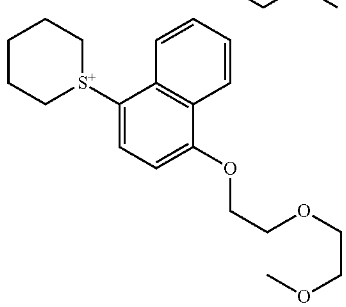
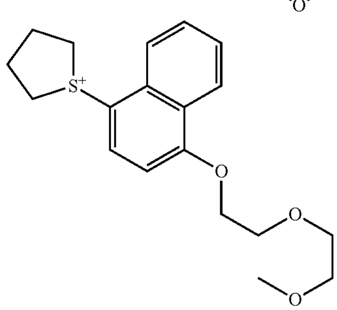
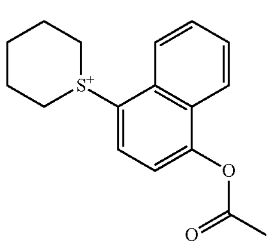
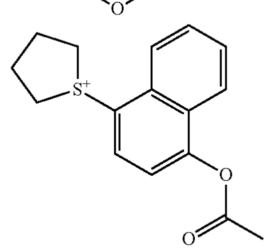
-continued
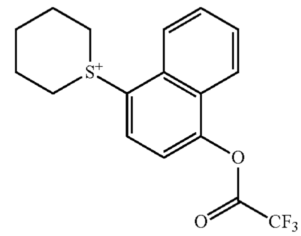
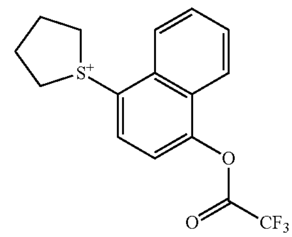
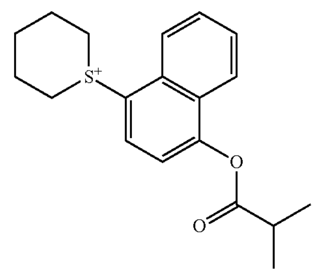
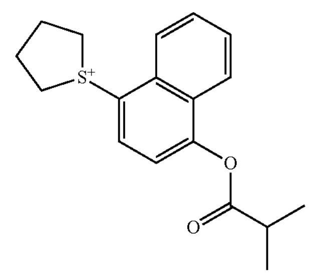
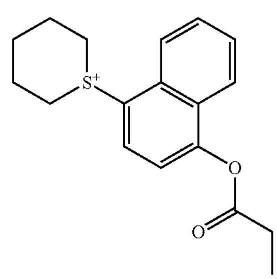
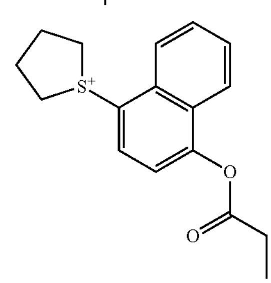
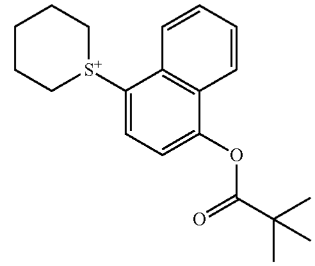

-continued
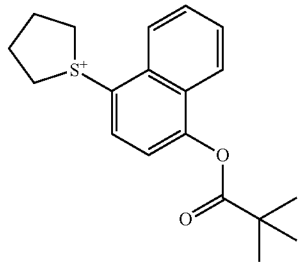
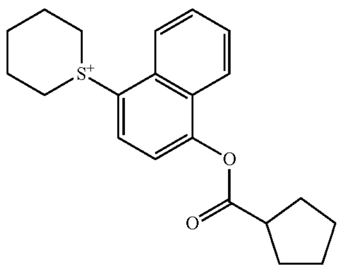
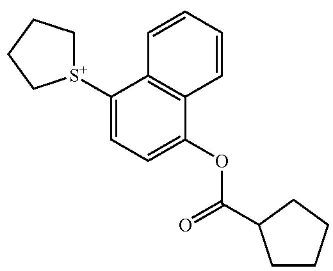
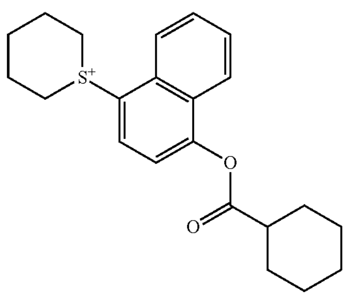
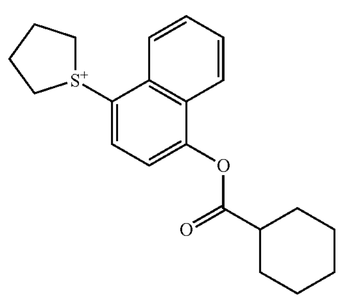
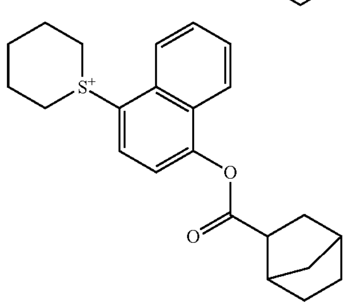
-continued
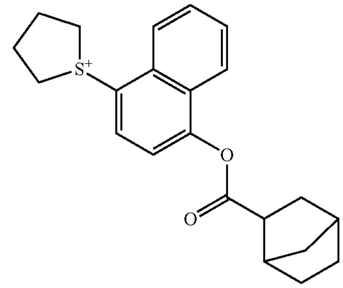
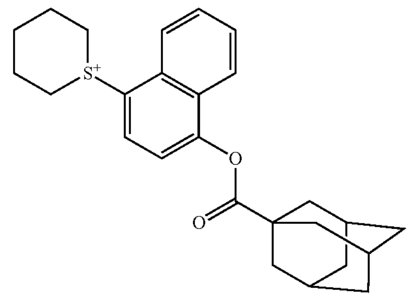
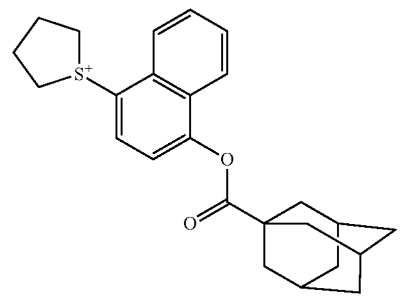
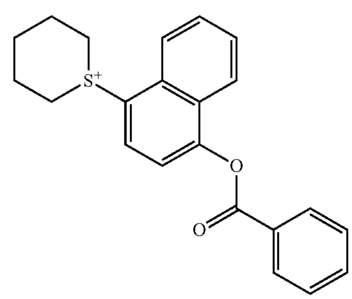
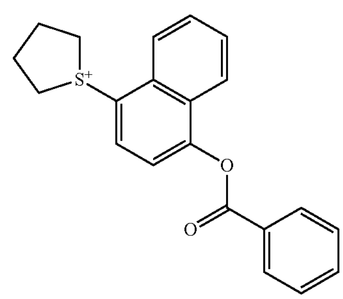

-continued
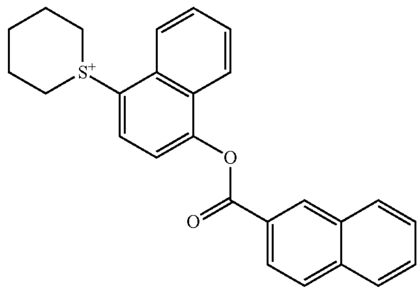
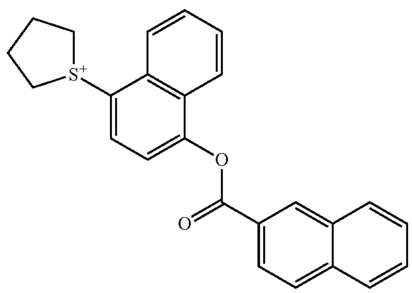
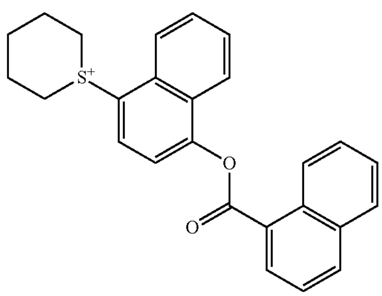
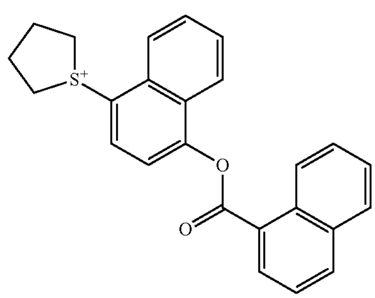
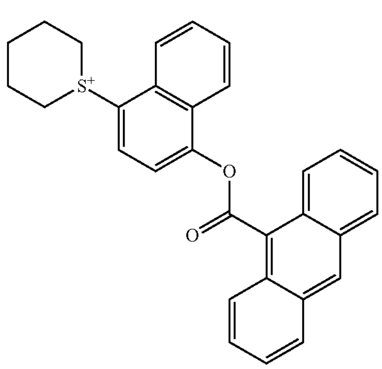
-continued
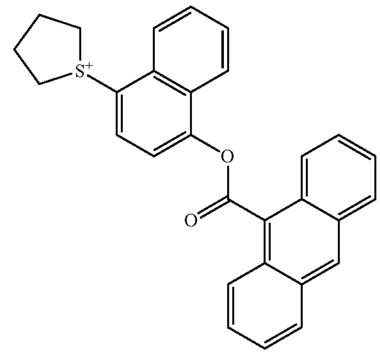
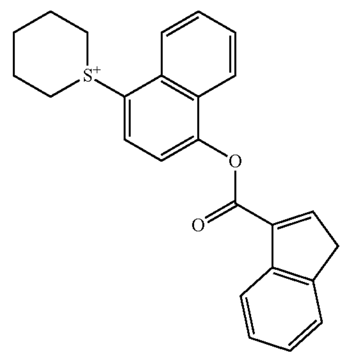
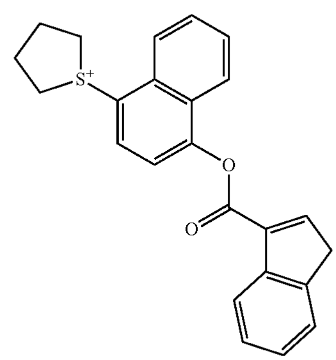
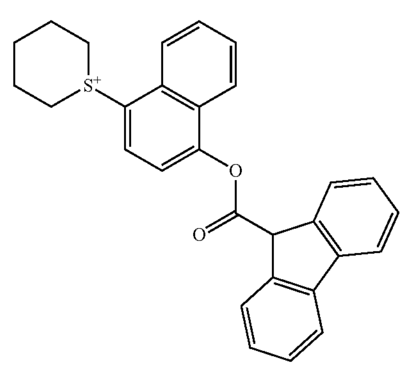

-continued
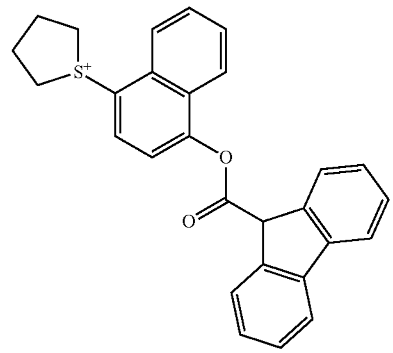
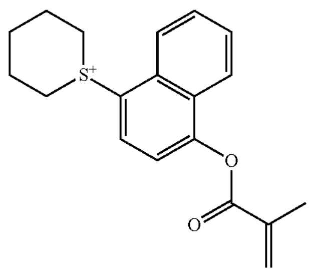
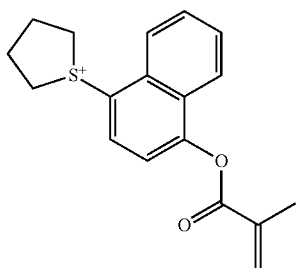
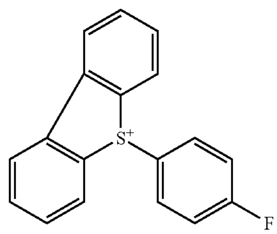
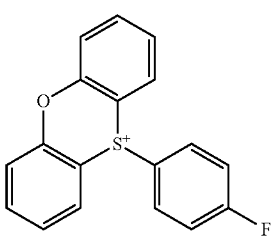
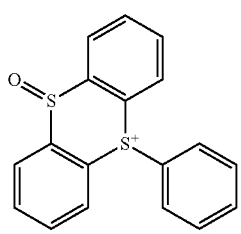
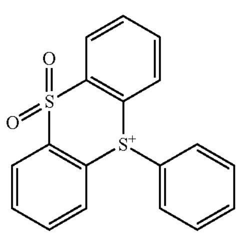
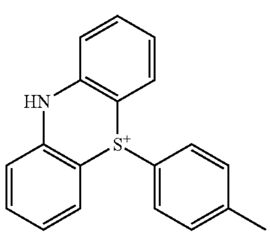
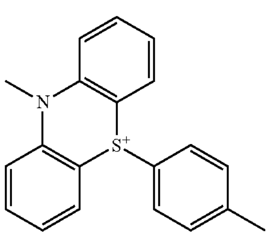
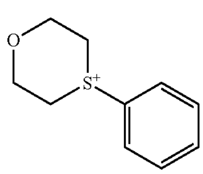
-continued
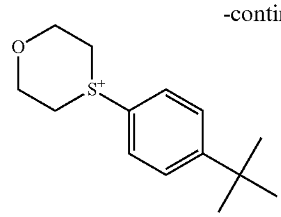
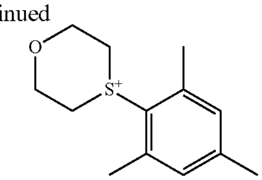
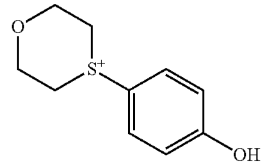
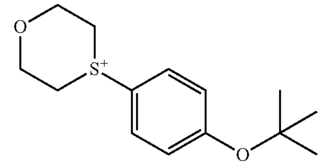
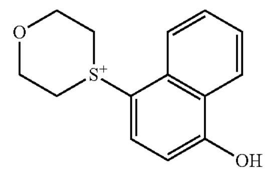
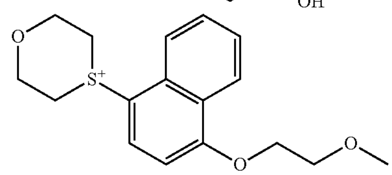
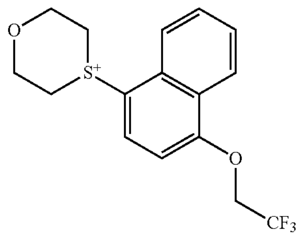
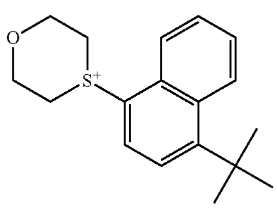
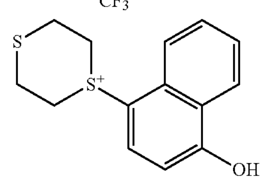
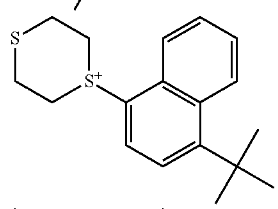
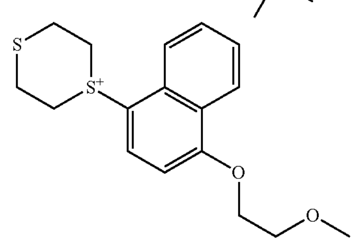
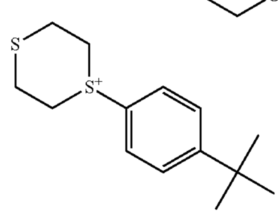

-continued
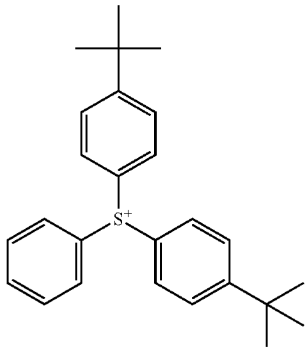
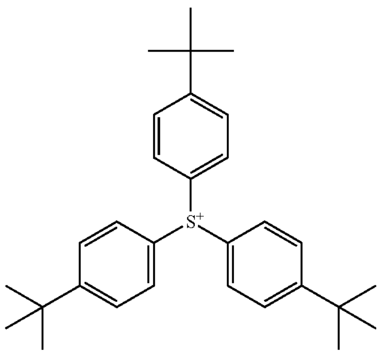
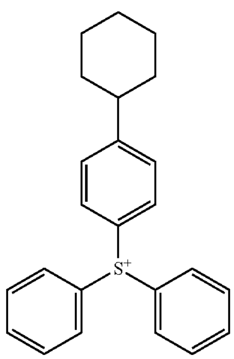
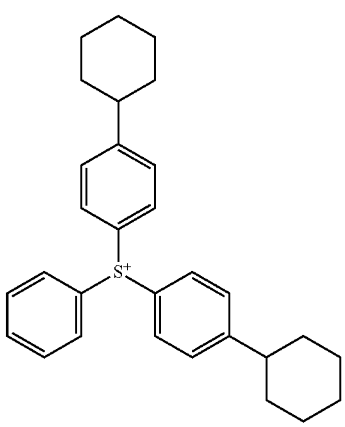
-continued
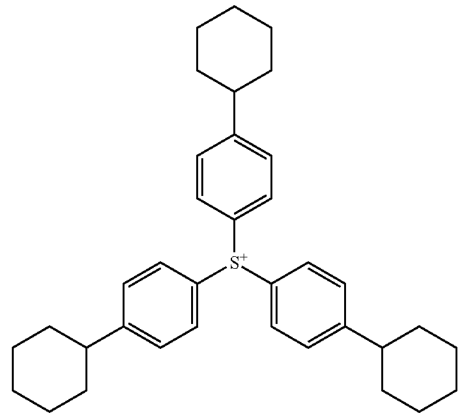
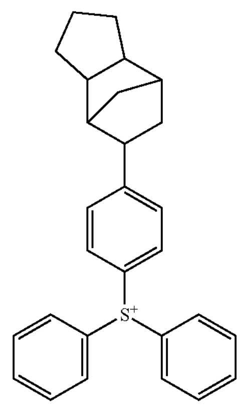
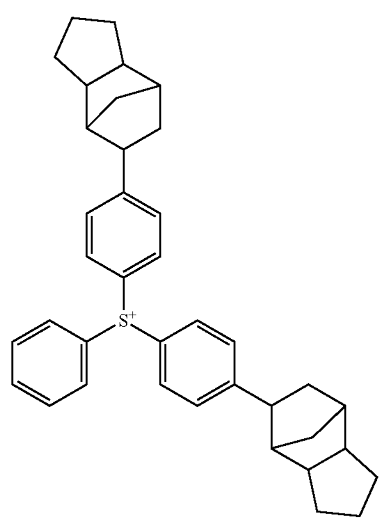

-continued
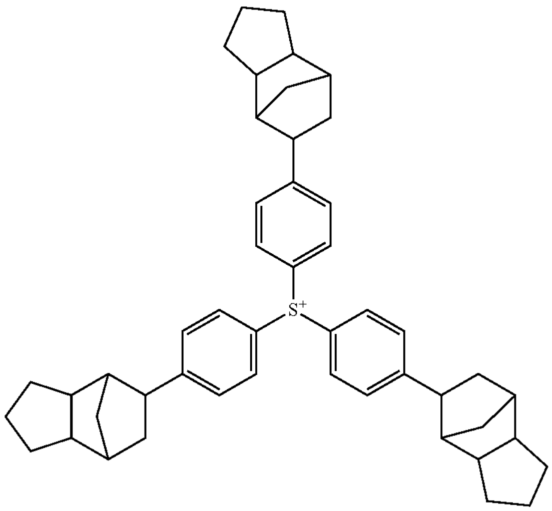
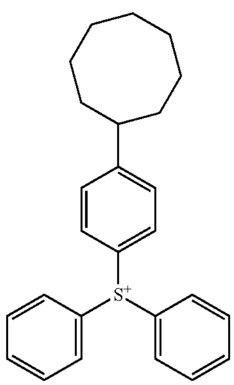
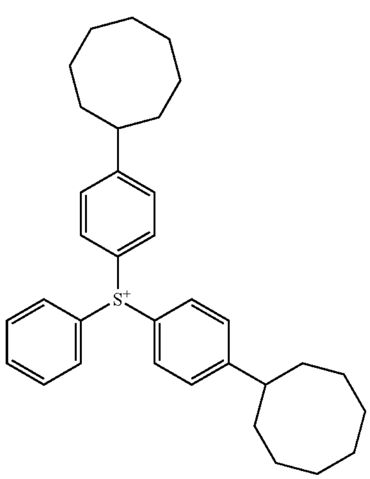
-continued
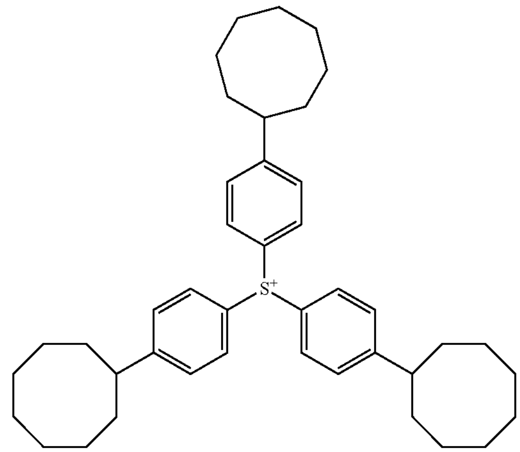
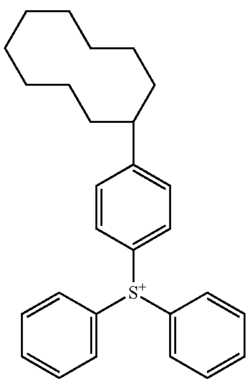
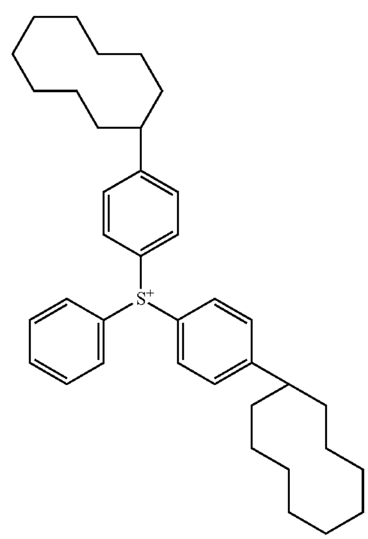

-continued
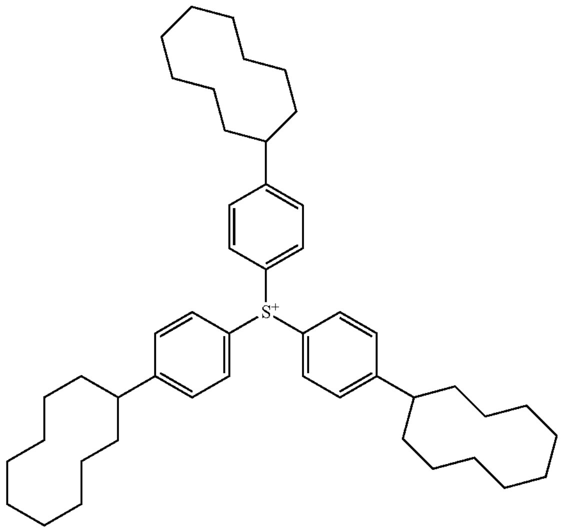
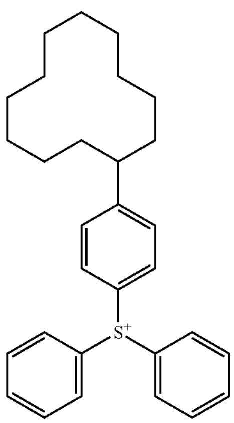
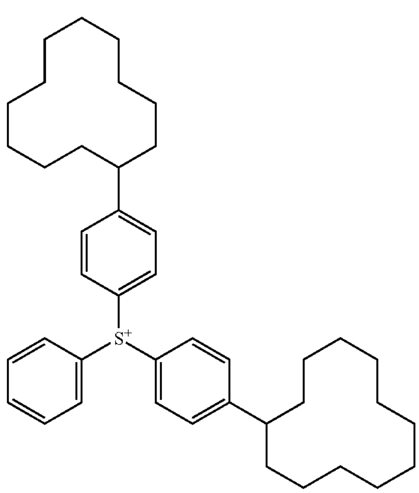
-continued
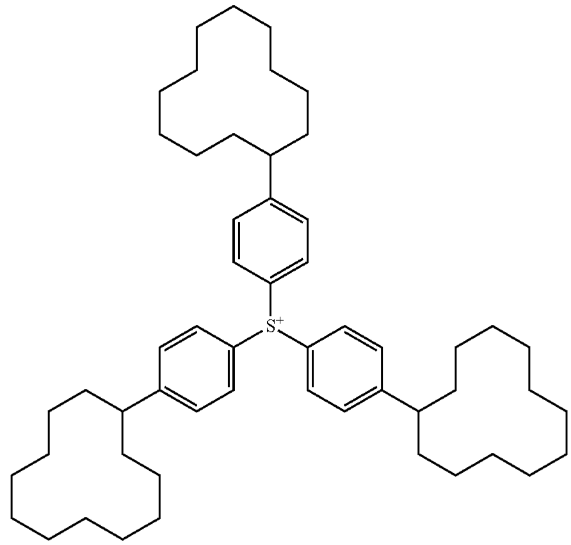
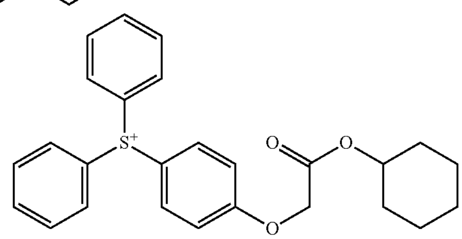
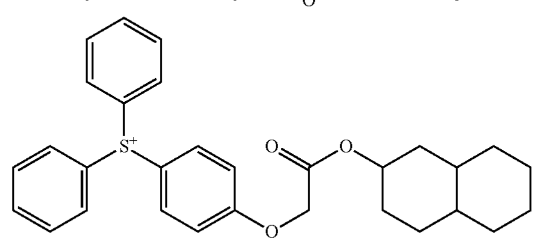
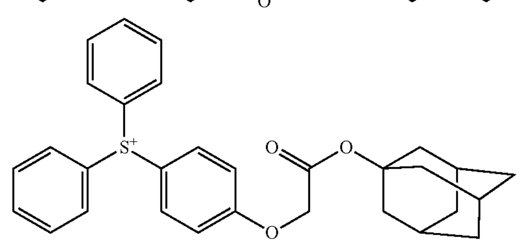
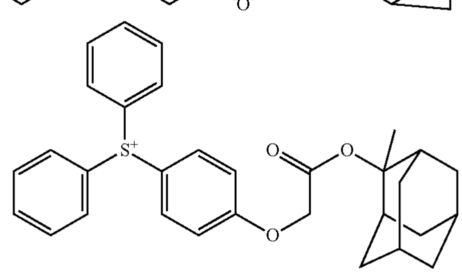
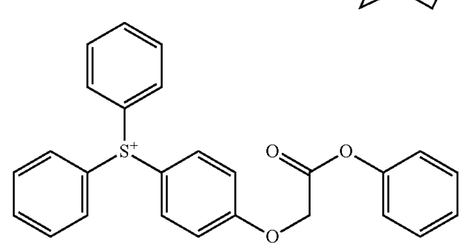

-continued
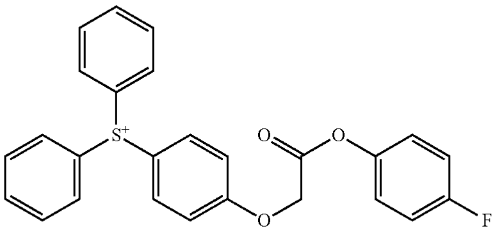
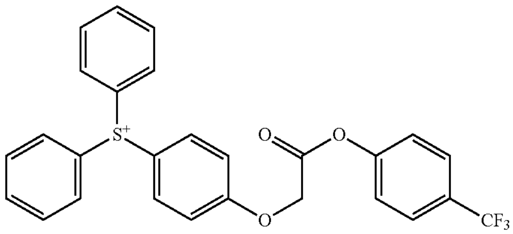
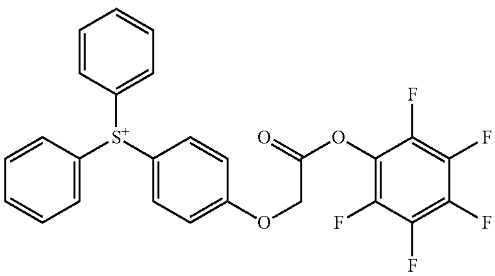
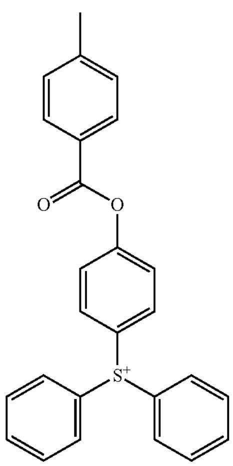
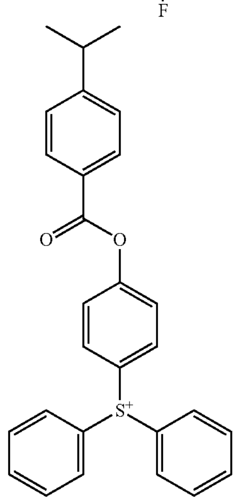
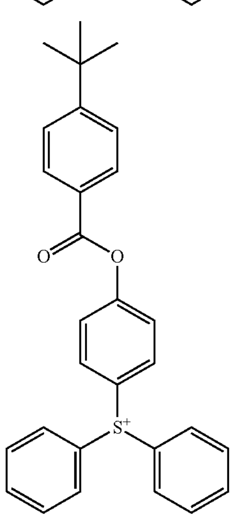
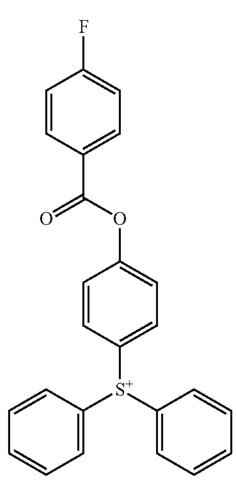
-continued
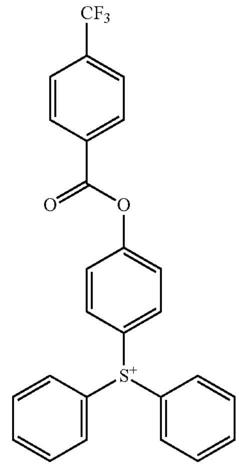
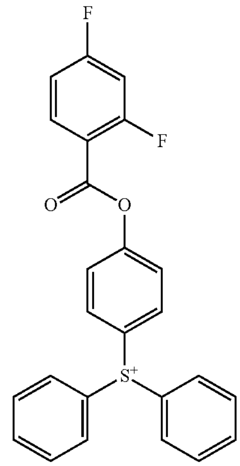
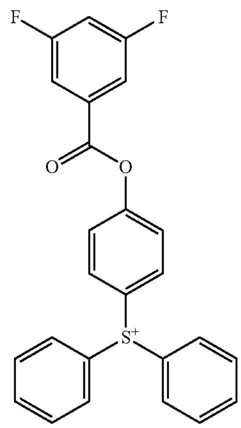
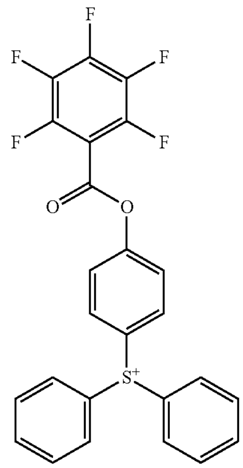
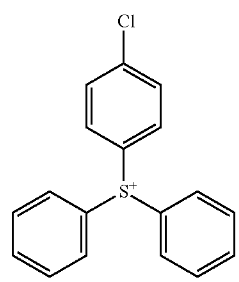
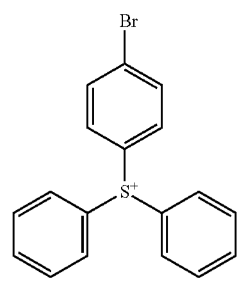
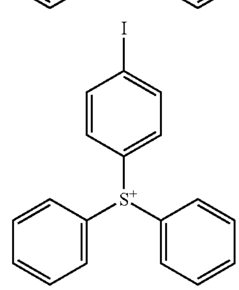
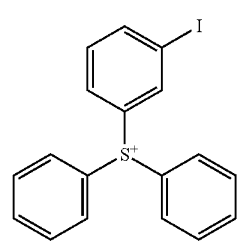
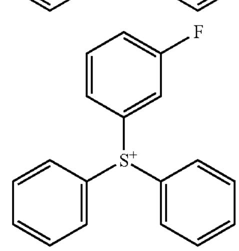
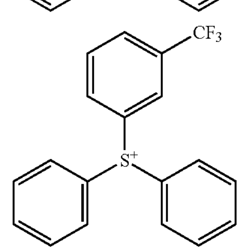

-continued
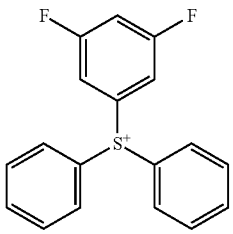
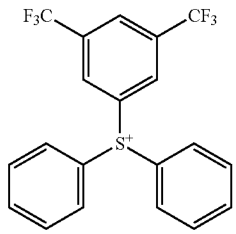
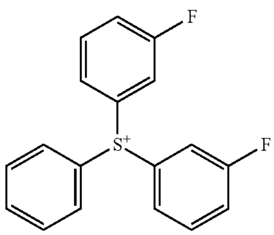
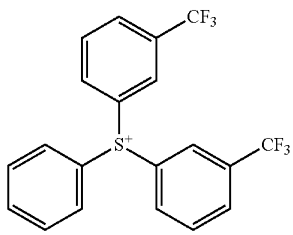
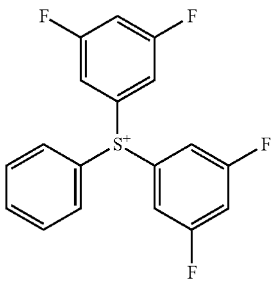
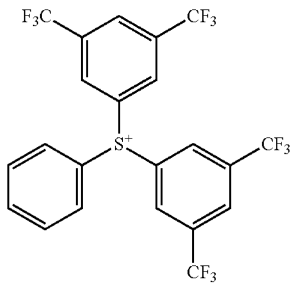
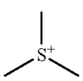
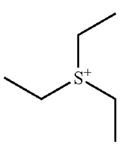
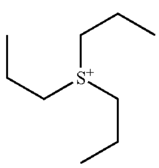
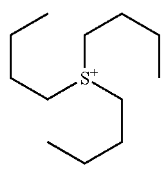
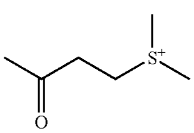
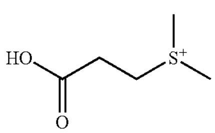
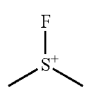
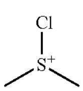
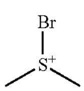
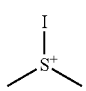
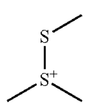
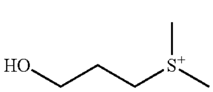
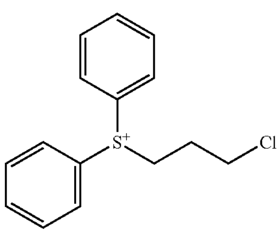
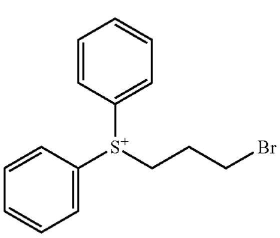
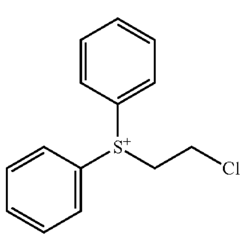
-continued
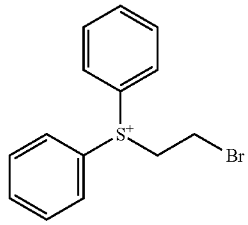
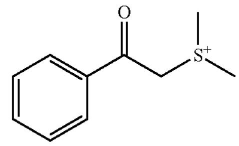
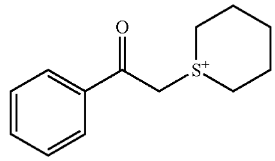
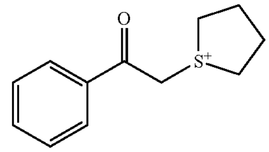
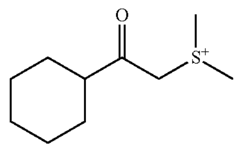
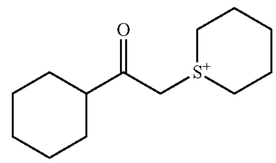
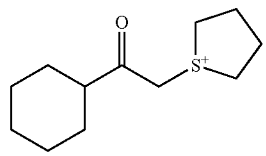
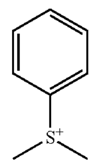
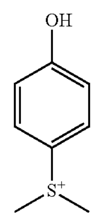
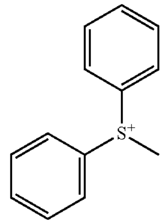
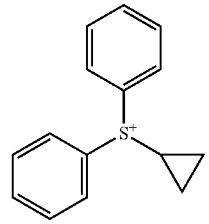
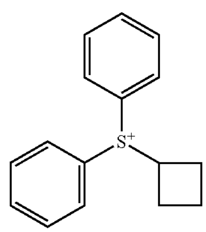
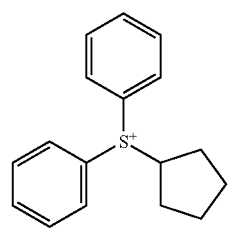
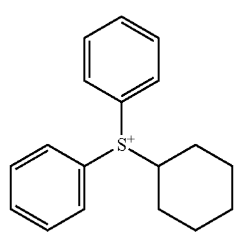
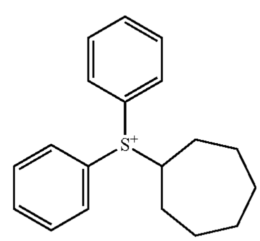
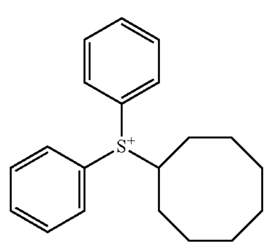
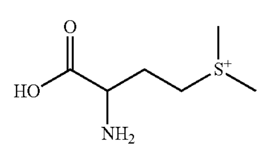

-continued

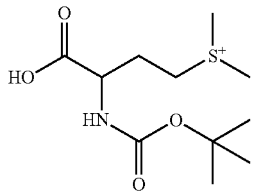

With respect to the synthesis of the sulfonium salt, one typical method is ion exchange of an iodized or brominated alkyl carboxylic acid with a sulfonium salt or sulfonium halide of a weaker acid. Typical of the weaker acid than the iodized or brominated alkyl carboxylic acid is carbonic acid. Alternatively, the sulfonium salt may be synthesized by ion exchange of a sodium salt of iodized or brominated alkyl carboxylic acid with a sulfonium halide.

In the resist composition, the sulfonium salt is preferably used in an amount of 0.001 to 50 parts, more preferably 0.01 to 20 parts by weight per 100 parts by weight of the base polymer, as viewed from sensitivity and acid diffusion suppressing effect.

Base Polymer

Where the resist composition is of positive tone, the base polymer comprises recurring units containing an acid labile group, preferably recurring units having the formula (a1) or recurring units having the formula (a2). These units are simply referred to as recurring units (a1) and (a2).

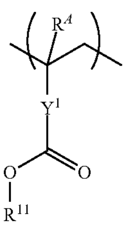

(a1)

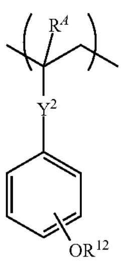

(a2)

Herein $R^A$ is each independently hydrogen or methyl. $R^{11}$ and $R^{12}$ each are an acid labile group. $Y^1$ is a single bond, phenylene or naphthylene group, or $C_1$-$C_{12}$ linking group containing an ester bond or lactone ring or both. $Y^2$ is a single bond or ester bond. When the base polymer contains both recurring units (a1) and (a2), $R^{11}$ and $R^{12}$ may be the same or different.

Examples of the monomer from which the recurring units (a1) are derived are shown below, but not limited thereto. $R^A$ and $R^{11}$ areas defined above.

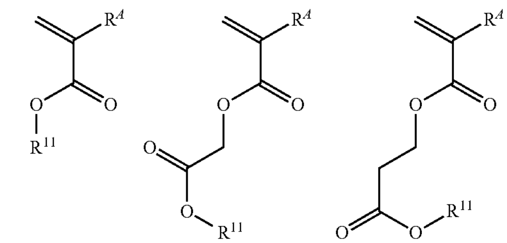

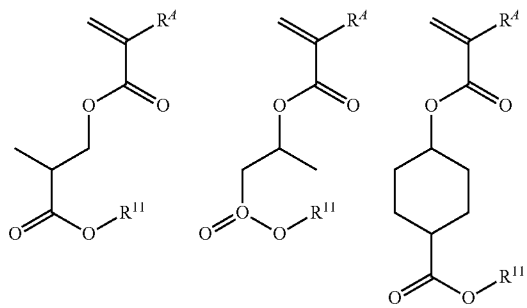

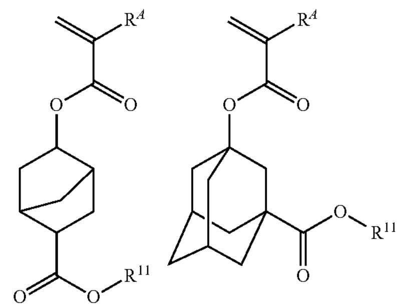

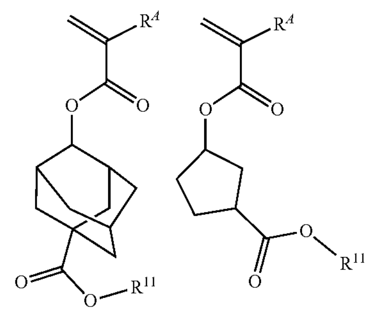

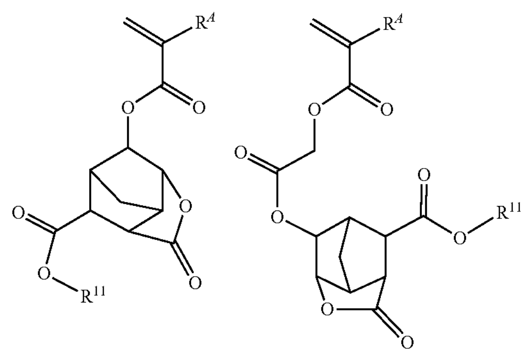

-continued

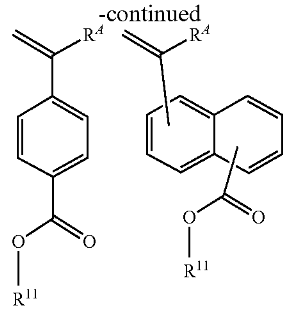

Examples of the monomer from which the recurring units (a2) are derived are shown below, but not limited thereto. $R^A$ and $R^{12}$ are as defined above.

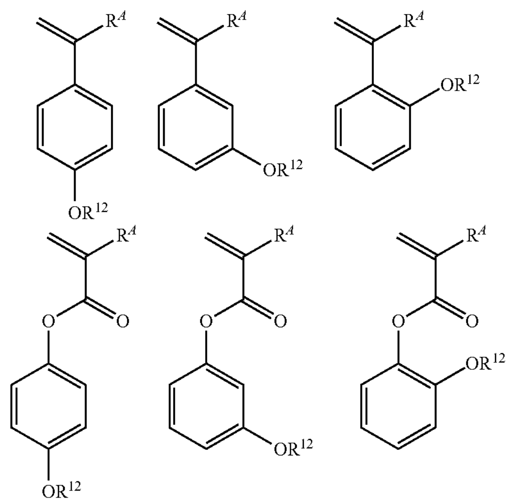

The acid labile groups represented by $R^{11}$ and $R^{12}$ in formulae (a1) and (a2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

$$—(CH_2)_a—C(=O)—O—R^{L1} \quad \text{(AL-1)}$$

$$—C(R^{L3})(R^{L4})—O—R^{L2} \quad \text{(AL-2)}$$

$$—C(R^{L5})(R^{L6})—R^{L7} \quad \text{(AL-3)}$$

In formulae (AL-1) and (AL-2), $R^{L1}$ and $R^{L2}$ are each independently a $C_1$-$C_{40}$ hydrocarbyl group which may contain a heteroatom such as oxygen, sulfur, nitrogen or fluorine. The hydrocarbyl groups may be saturated or unsaturated and straight, branched or cyclic. Inter alia, $C_1$-$C_{40}$ alkyl groups are preferred, with $C_1$-$C_{20}$ alkyl being more preferred. In formula (AL-1), "a" is an integer of 0 to 10, preferably 1 to 5.

In formula (AL-2), $R^{L3}$ and $R^{L4}$ are each independently hydrogen or a $C_1$-$C_{20}$ hydrocarbyl group which may contain a heteroatom such as oxygen, sulfur, nitrogen or fluorine. The hydrocarbyl groups may be saturated or unsaturated and straight, branched or cyclic. Inter alia, $C_1$-$C_{20}$ alkyl groups are preferred. Any two of $R^{L2}$, $R^{L3}$ and $R^{L4}$ may bond together to form a ring, typically alicyclic, with the carbon atom or carbon and oxygen atoms to which they are attached, the ring containing 3 to 20 carbon atoms, preferably 4 to 16 carbon atoms.

In formula (AL-3), $R^{L5}$, $R^{L6}$ and $R^{L7}$ are each independently a $C_1$-$C_{20}$ hydrocarbyl group which may contain a heteroatom such as oxygen, sulfur, nitrogen or fluorine. The hydrocarbyl groups may be saturated or unsaturated and straight, branched or cyclic. Inter alia, $C_1$-$C_{20}$ alkyl groups are preferred. Any two of $R^{L5}$, $R^{L6}$ and $R^{L7}$ may bond together to form a ring, typically alicyclic, with the carbon atom to which they are attached, the ring containing 3 to 20 carbon atoms, preferably 4 to 16 carbon atoms.

The base polymer may further comprise recurring units (b) having a phenolic hydroxyl group as an adhesive group. Examples of suitable monomers from which recurring units (b) are derived are given below, but not limited thereto. Herein $R^A$ is as defined above.

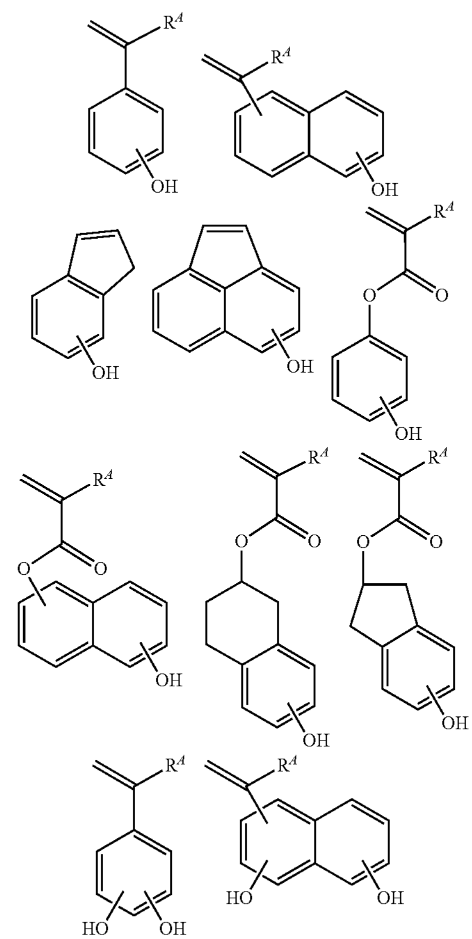

-continued

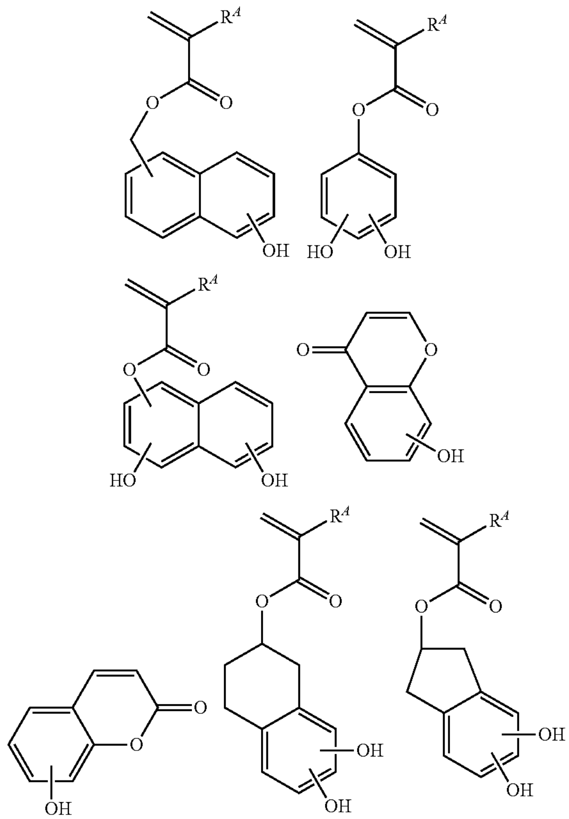

Further, recurring units (c) having another adhesive group selected from hydroxyl (other than the foregoing phenolic hydroxyl), lactone ring, sulfone ring, ether bond, ester bond, sulfonate bond, carbonyl, sulfonyl, cyano, and carboxyl groups may also be incorporated in the base polymer. Examples of suitable monomers from which recurring units (c) are derived are given below, but not limited thereto. Herein $R^A$ is as defined above.

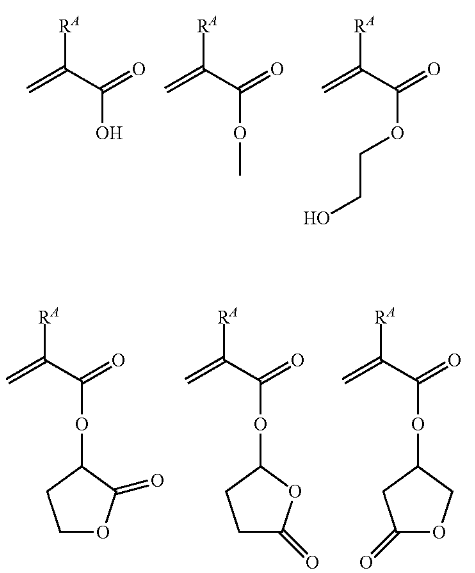

-continued

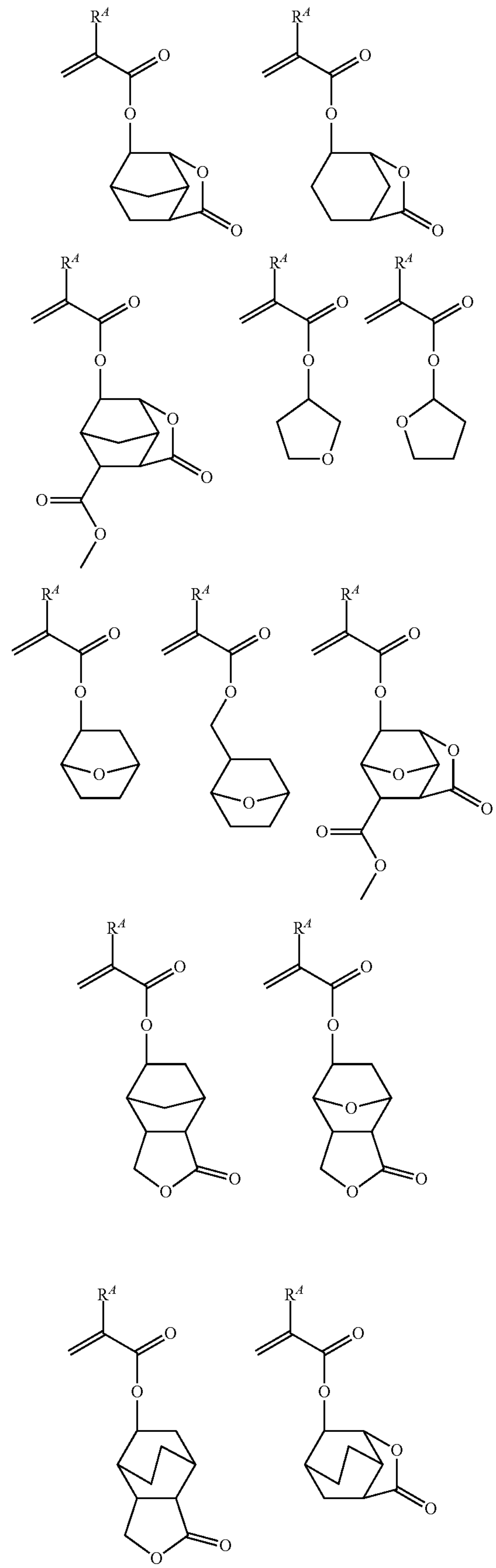

-continued
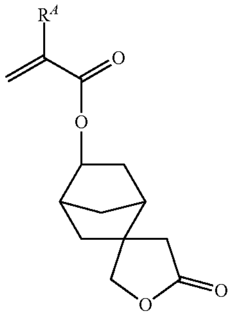
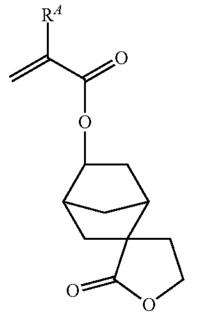
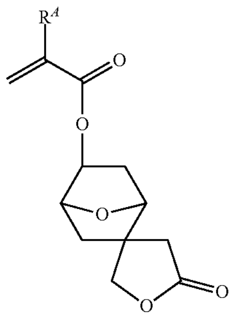
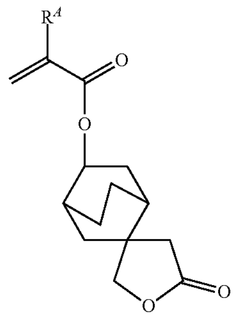
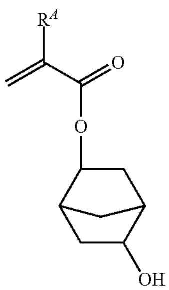
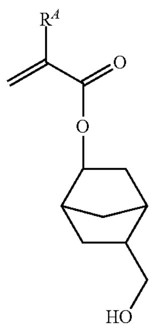
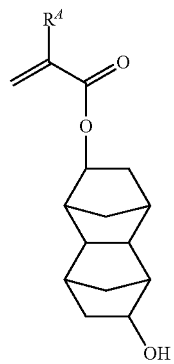
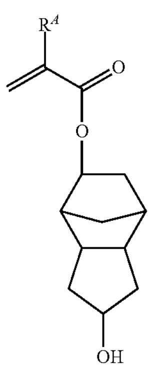
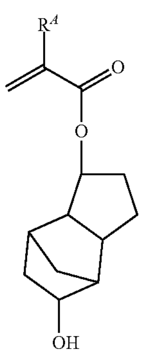
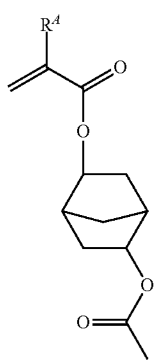
-continued
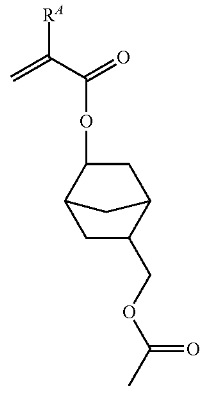
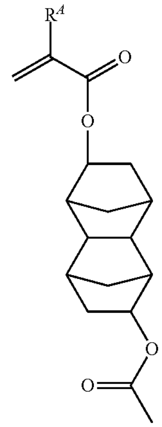
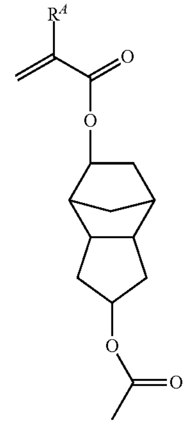
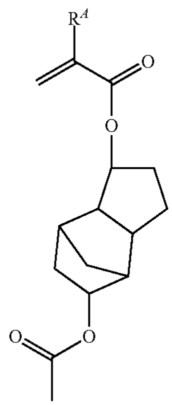
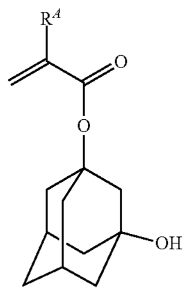
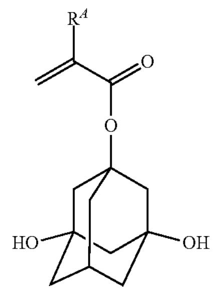
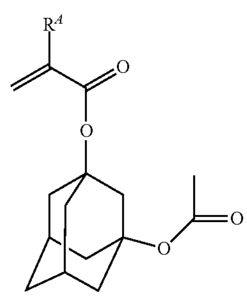
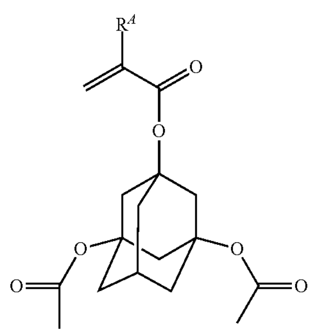
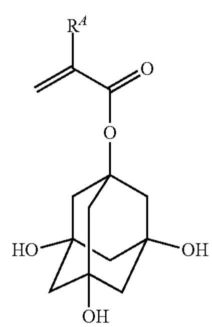
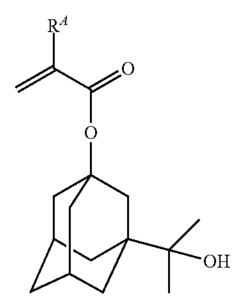

-continued
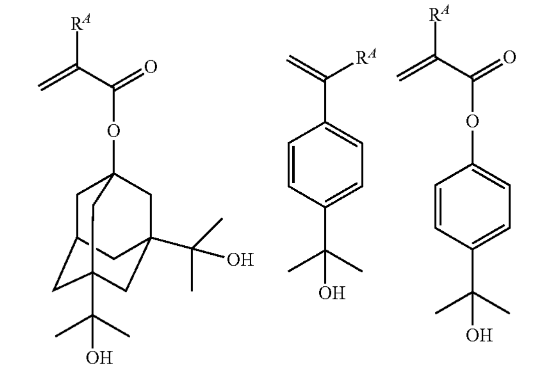
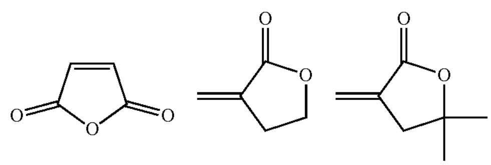
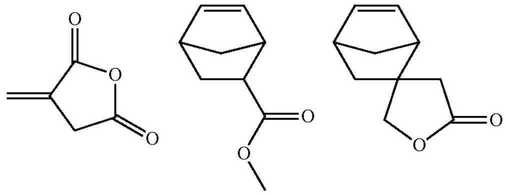
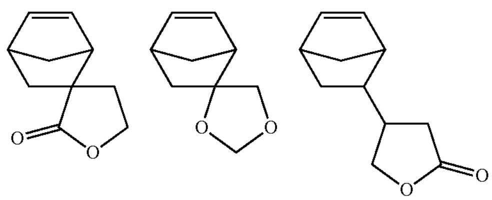
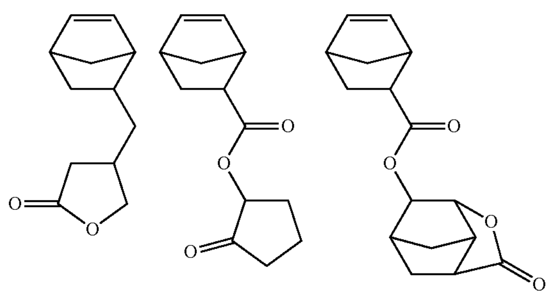
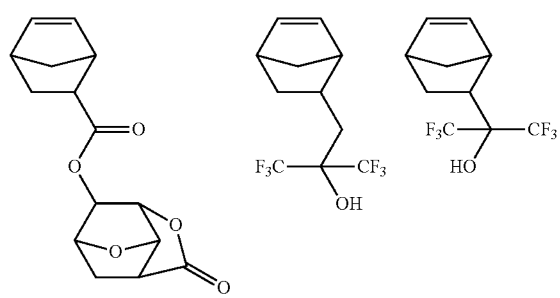
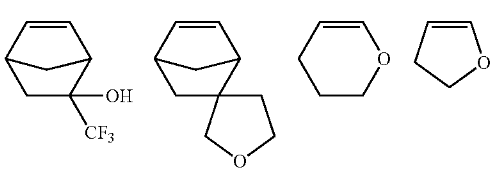
-continued
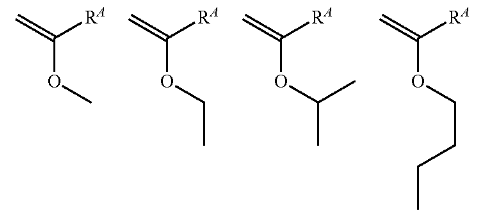
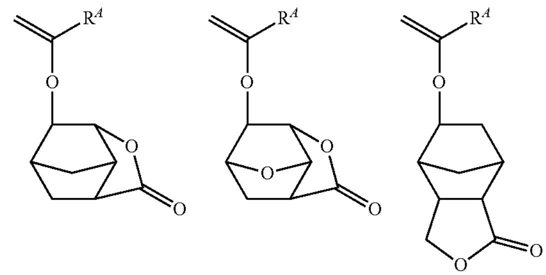
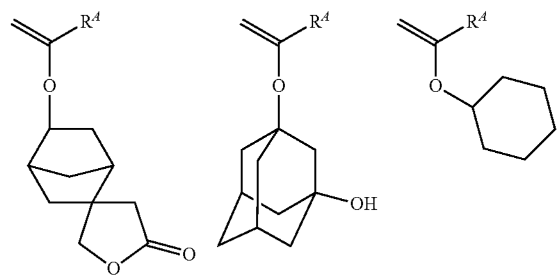
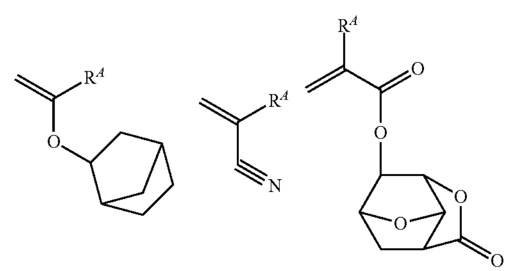
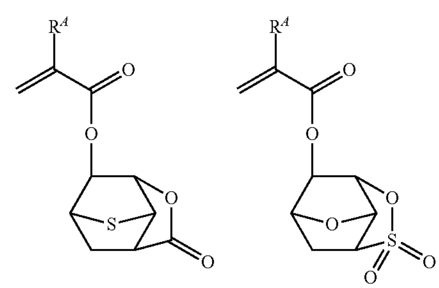
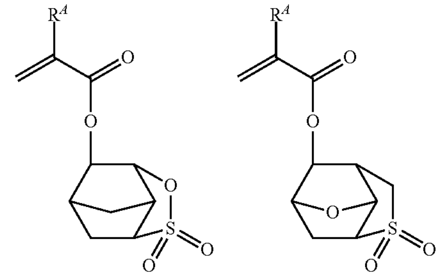

-continued
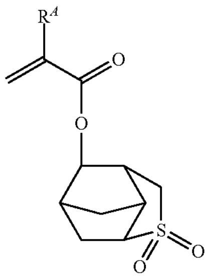
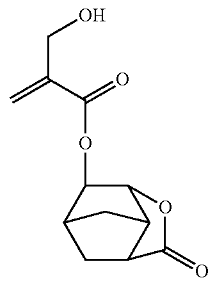
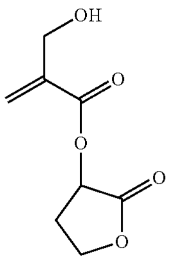
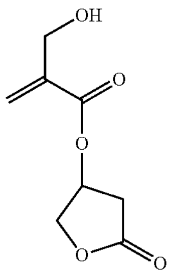
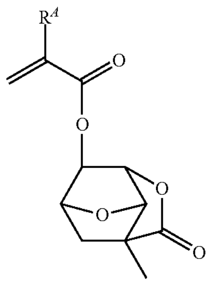
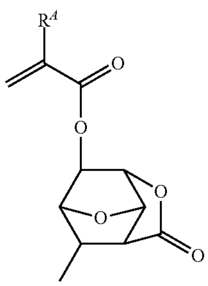
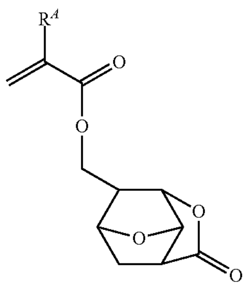
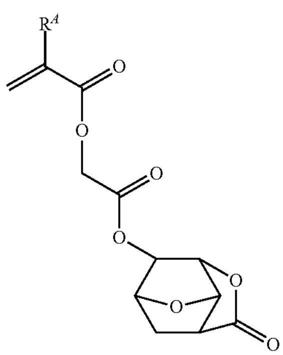
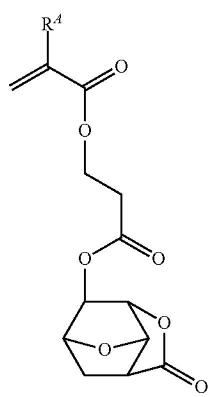
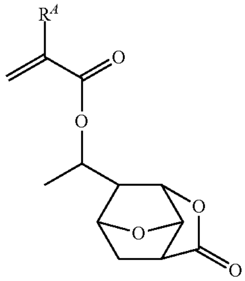
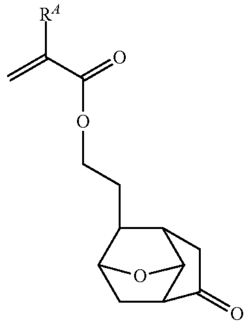
-continued
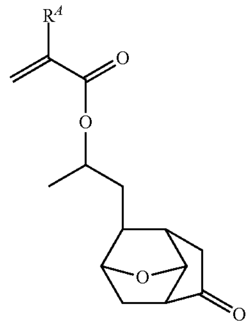
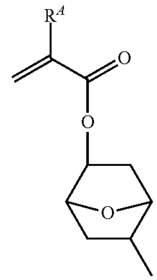
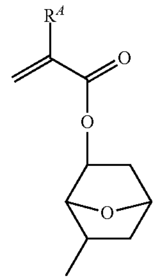
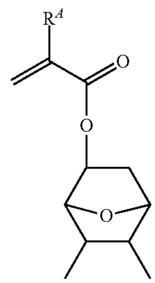
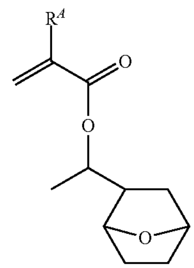
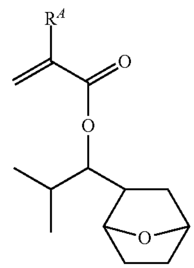
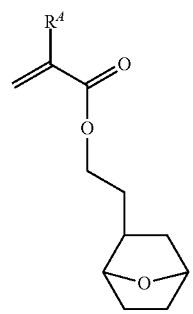
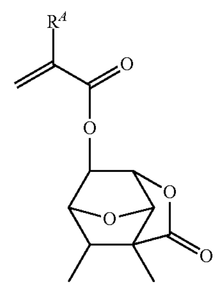
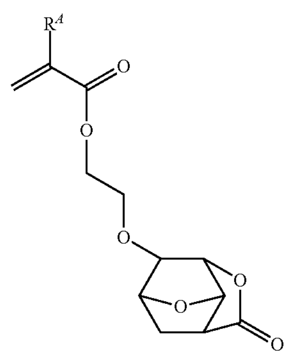
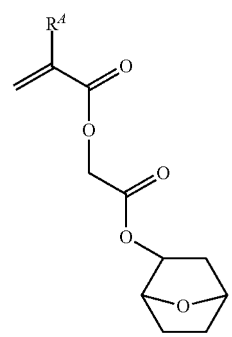
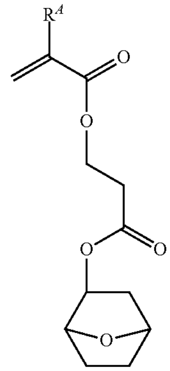
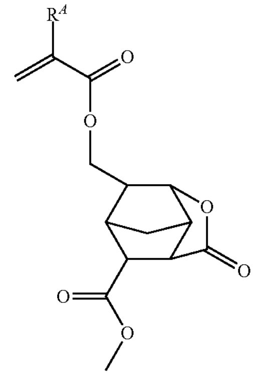

-continued
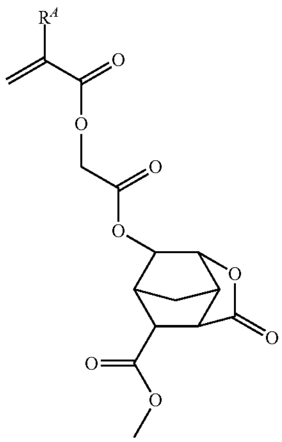
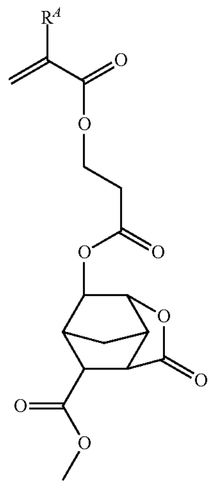
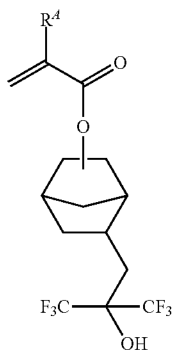
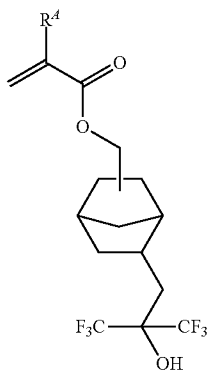
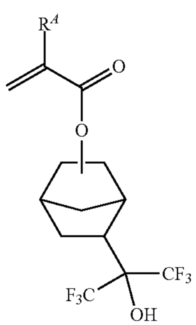
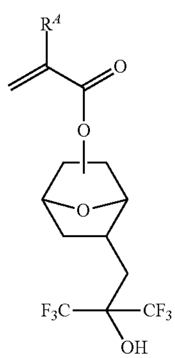
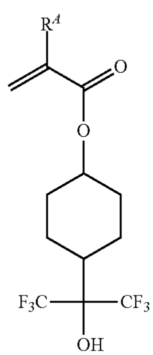
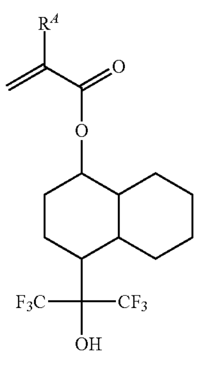
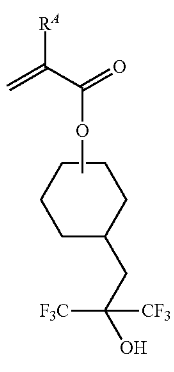
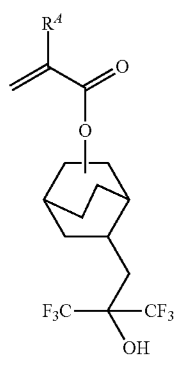
-continued
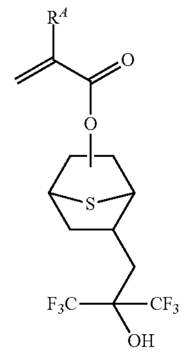
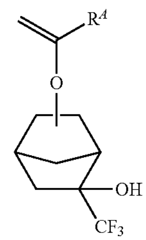
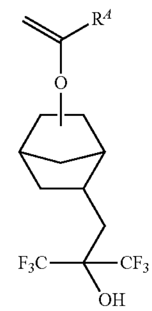
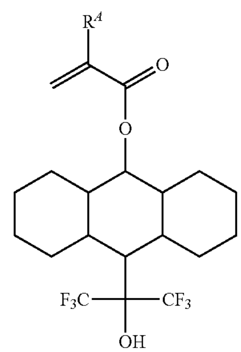
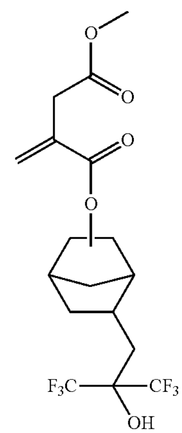
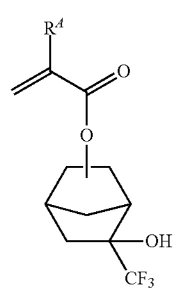
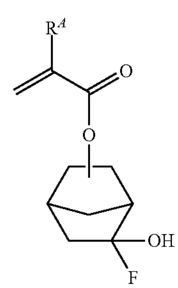
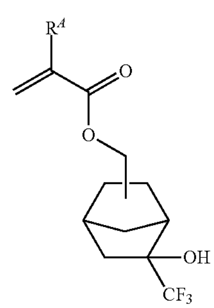
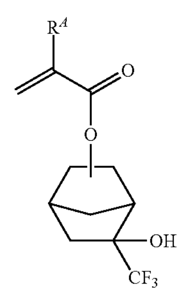
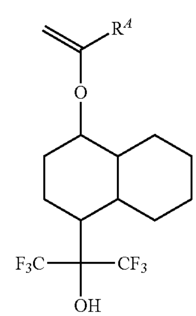

-continued
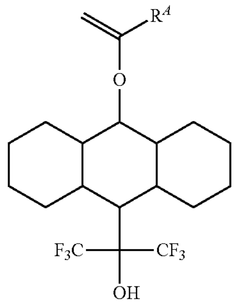
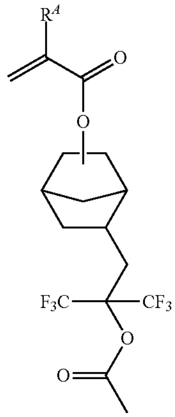
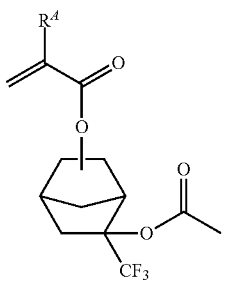
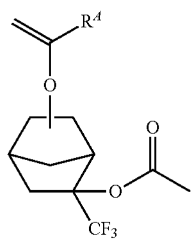
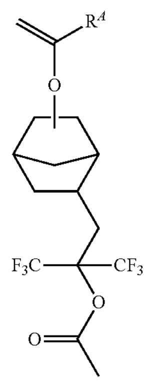
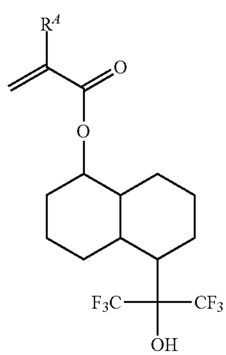
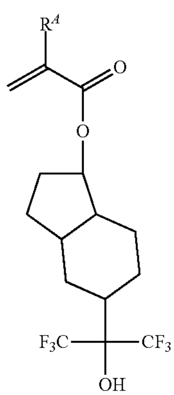
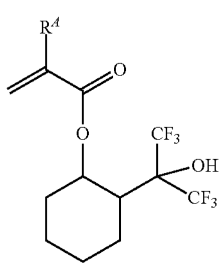
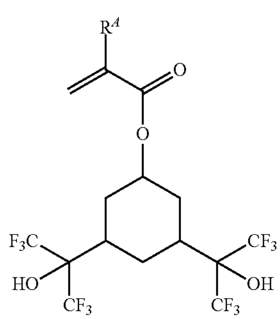
-continued
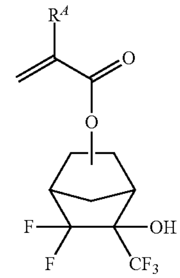
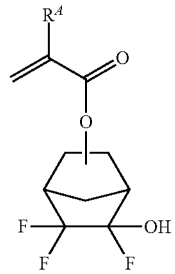
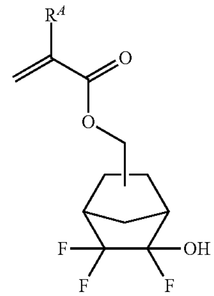
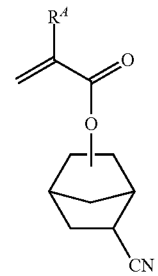
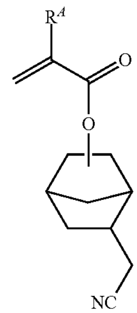
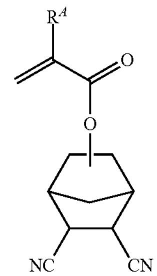
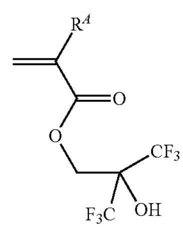
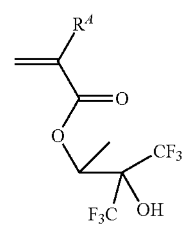
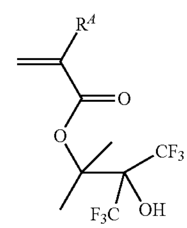
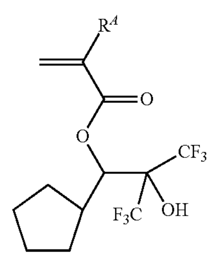
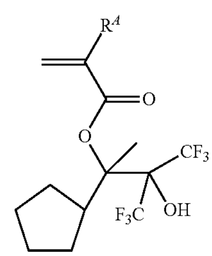
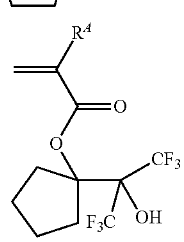
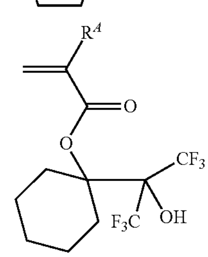
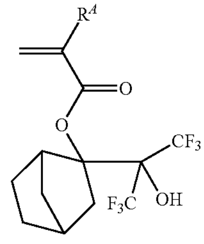
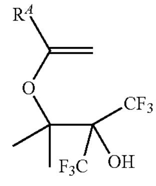
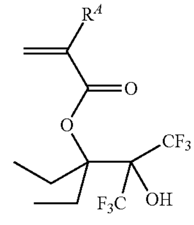

-continued
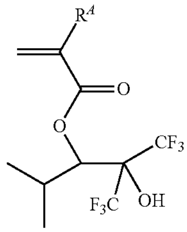
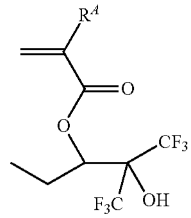
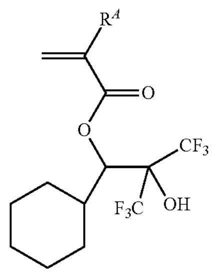
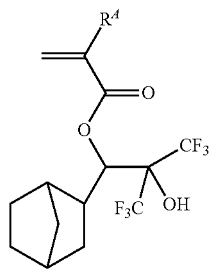
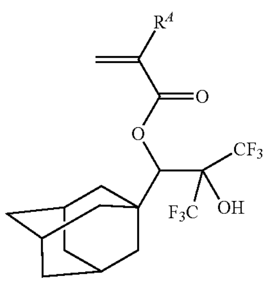
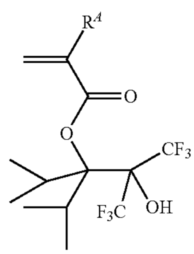
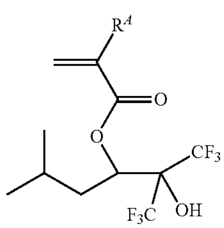
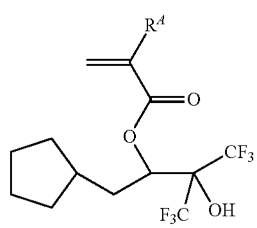
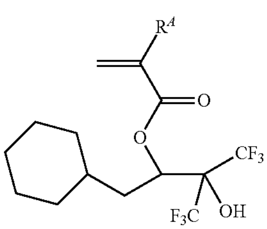
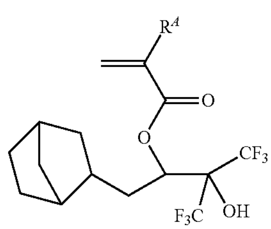
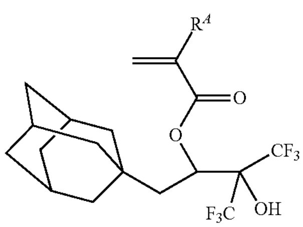
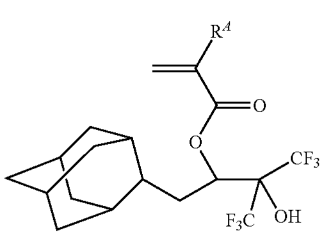
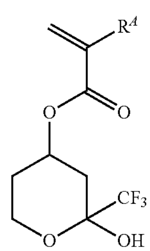
-continued
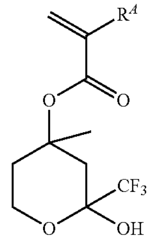
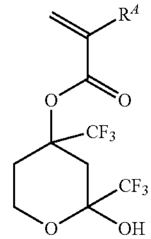
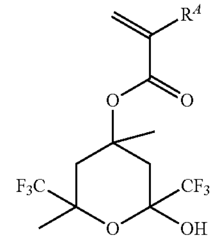
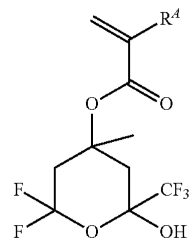
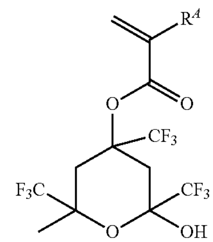
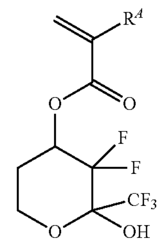
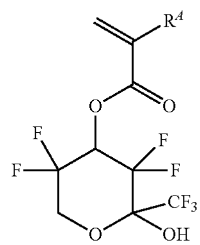
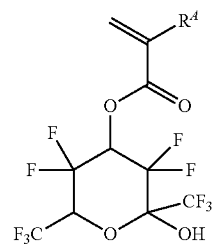
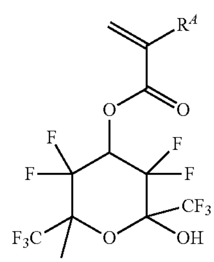
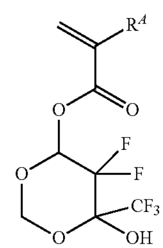
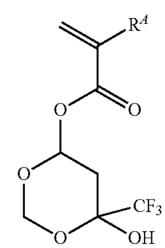
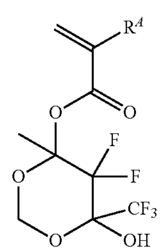
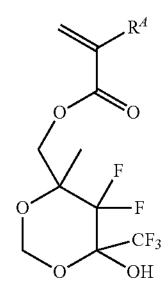
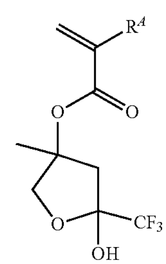
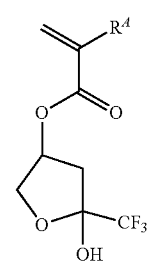
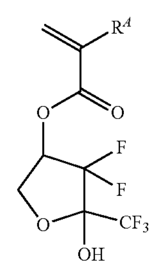
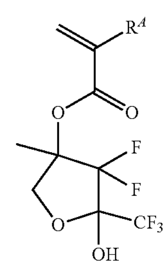

-continued
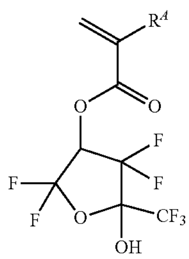
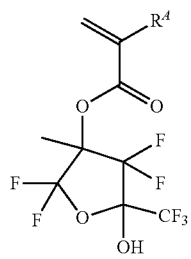
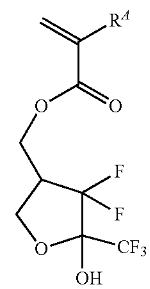
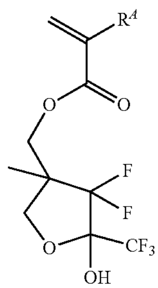
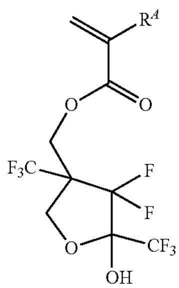
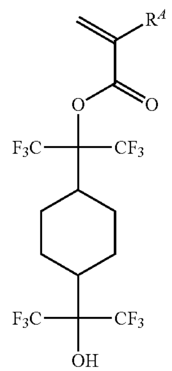
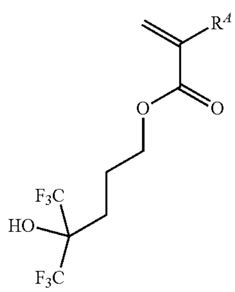
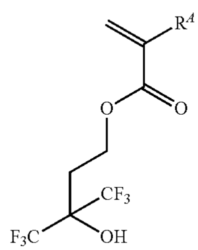
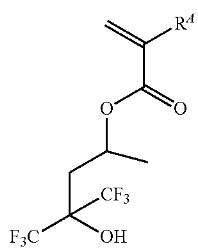
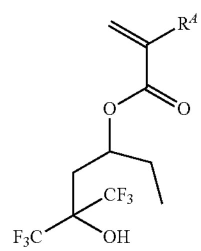
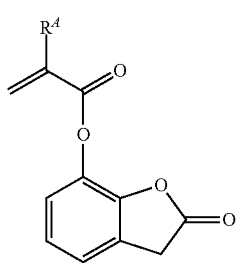
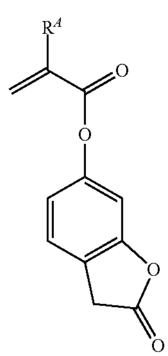
-continued
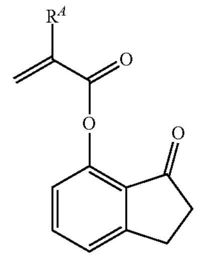
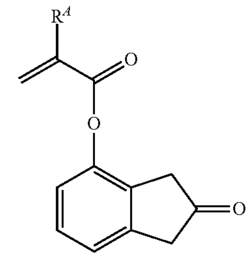
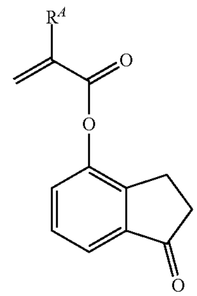
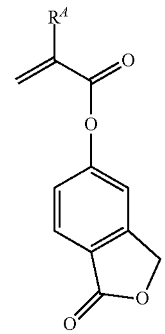
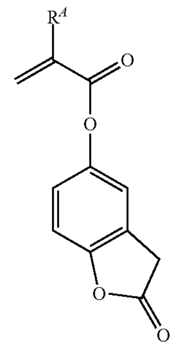
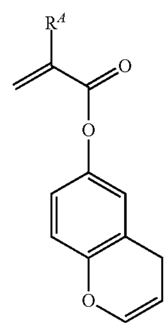
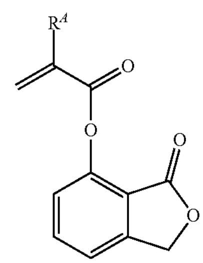
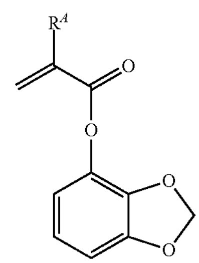
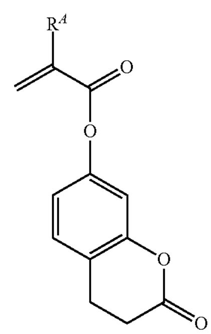
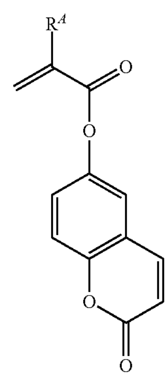
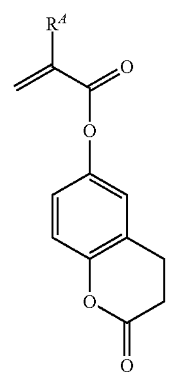
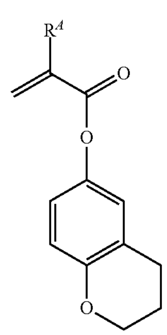
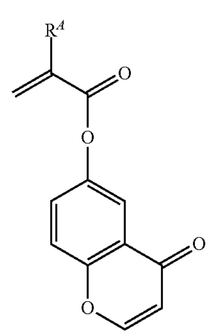
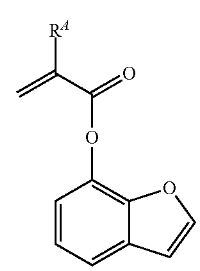

-continued
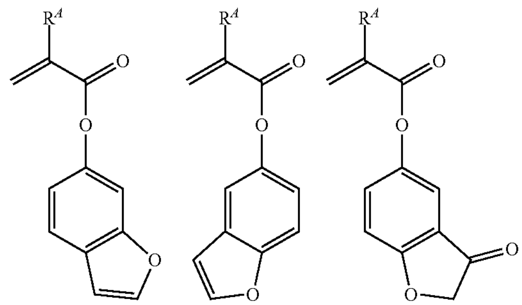
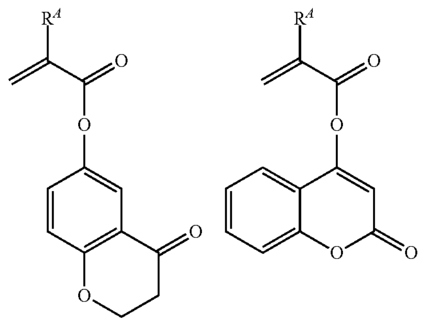
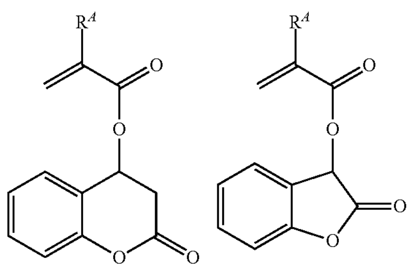
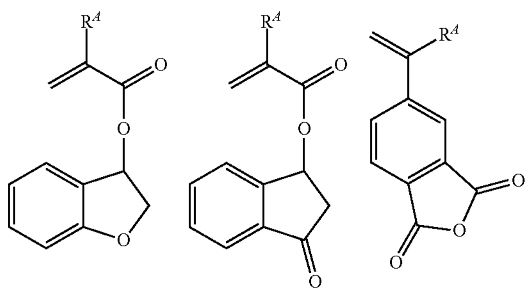
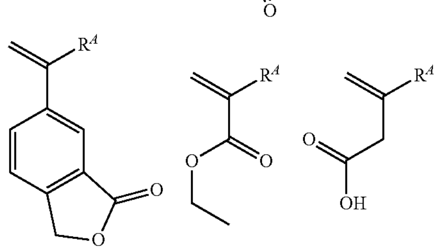
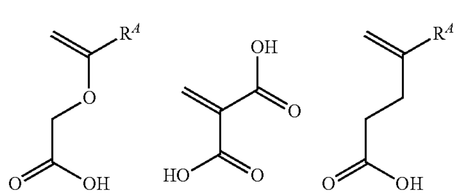
-continued
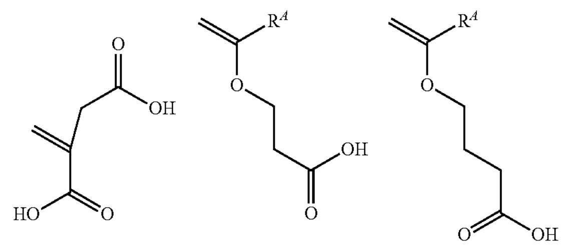
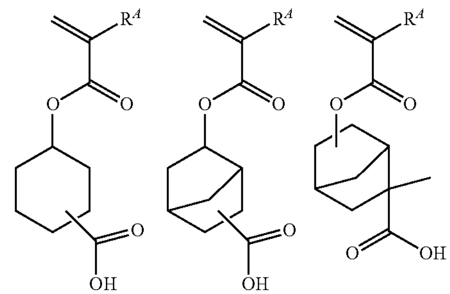
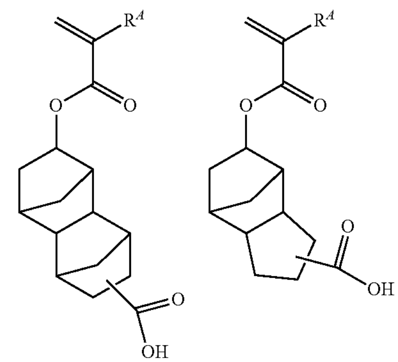
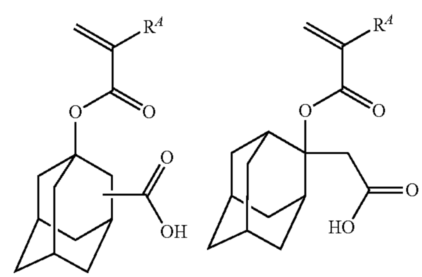
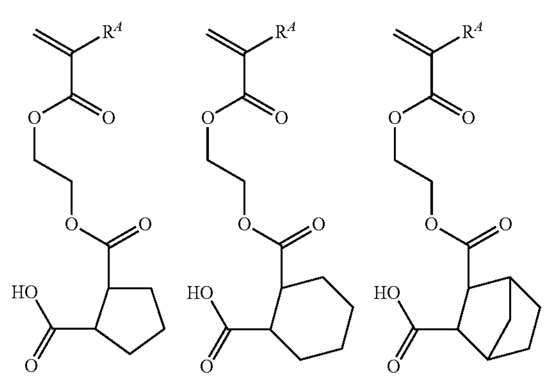

-continued

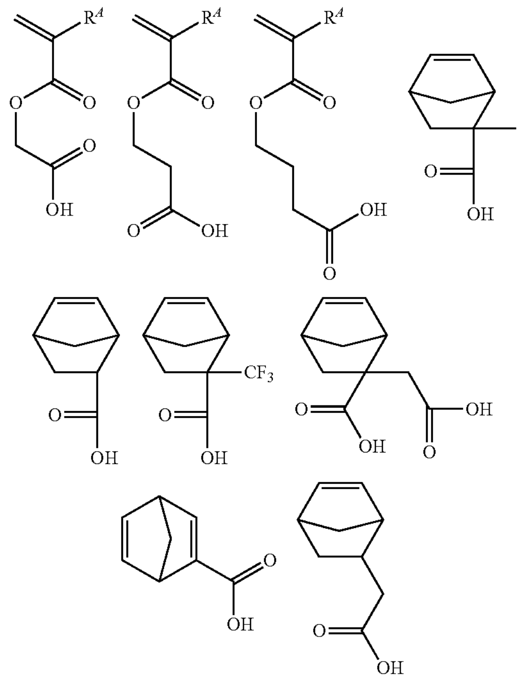

-continued

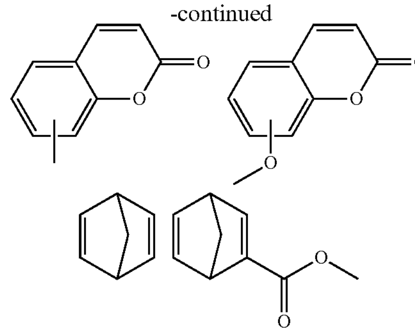

In another preferred embodiment, the base polymer may further comprise recurring units (d) selected from units of indene, benzofuran, benzothiophene, acenaphthylene, chromone, coumarin, and norbornadiene, or derivatives thereof. Suitable monomers are exemplified below.

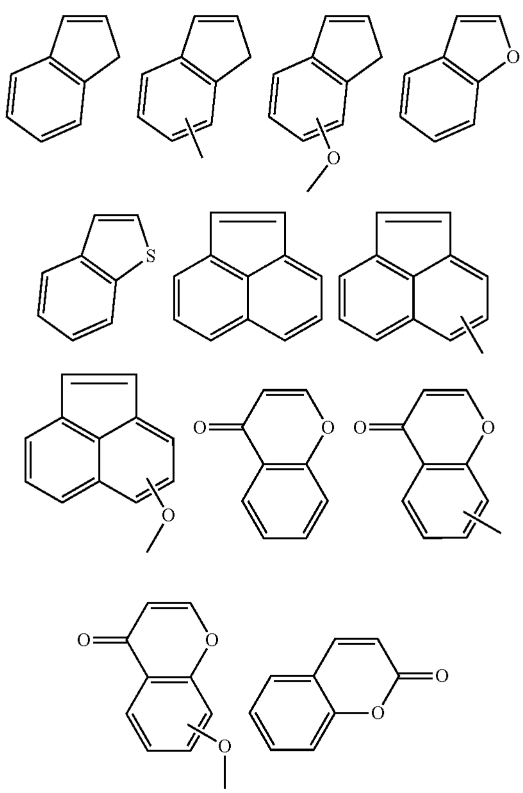

The base polymer may further comprise recurring units (e) which are derived from styrene, vinylnaphthalene, vinylanthracene, vinylpyrene, methyleneindene, vinylpyridine, vinylcarbazole, or derivatives thereof.

In a further embodiment, recurring units (f) derived from an onium salt having a polymerizable unsaturated bond may be incorporated in the base polymer. The recurring units (f) are preferably recurring units of at least one type selected from formulae (f1), (f2) and (f3). These units are simply referred to as recurring units (f1), (f2) and (f3), which may be used alone or in combination of two or more types.

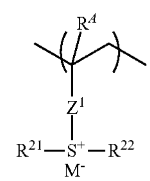

(f1)

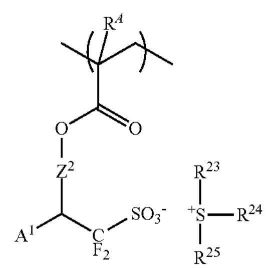

(f2)

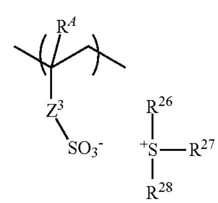

(f3)

In formulae (f1) to (f3), $R^A$ is each independently hydrogen or methyl. $Z^1$ is a single bond, phenylene group, —O—$Z^{11}$—, —C(═O)—O—$Z^{11}$—, or —C(═O)—NH—$Z^{11}$—, wherein $Z^{11}$ is a $C_1$-$C_6$ aliphatic hydrocarbylene group or phenylene group, which may contain a carbonyl, ester bond, ether bond or hydroxyl moiety. $Z^2$ is a single bond, —$Z^{21}$—C(═O)—O—, —$Z^{21}$—O— or —$Z^{21}$—O—C(═O)—, wherein $Z^{21}$ is a $C_1$-$C_{12}$ saturated hydrocarbylene group which may contain a carbonyl moiety, ester bond or ether bond. $Z^3$ is a single bond, methylene, ethylene, phenylene, fluorinated phenylene, —O—$Z^{31}$—, —C(═O)—O—$Z^{11}$—, or —C(═O)—NH—$Z^{11}$—, wherein $Z^{31}$ is a $C_1$-$C_6$ aliphatic hydrocarbylene group, phenylene group, fluorinated phenylene group, trifluoromethyl-substituted phenylene group, which may contain a carbonyl moiety, ester bond, ether bond or hydroxyl moiety. The aliphatic hydrocarbylene group may be saturated or unsaturated and straight, branched or cyclic. The saturated hydrocarbylene group may be straight, branched or cyclic.

In formulae (f1) to (f3), $R^{21}$ to $R^{28}$ are each independently a $C_1$-$C_{20}$ hydrocarbyl group which may contain a heteroatom. The hydrocarbyl group may be saturated or unsaturated and straight, branched or cyclic. Examples include $C_1$-$C_{20}$, preferably $C_1$-$C_{12}$ alkyl groups, $C_6$-$C_{20}$, preferably $C_6$-$C_{12}$ aryl groups, and $C_7$-$C_{20}$ aralkyl groups. In these groups, some or all hydrogen atoms may be substituted by $C_1$-$C_{10}$ saturated hydrocarbyl, halogen, trifluoromethyl, cyano, nitro, hydroxyl, mercapto, $C_1$-$C_{10}$ saturated hydrocarbyloxy, $C_2$-$C_{10}$ saturated hydrocarbyloxycarbonyl, or $C_2$-$C_{10}$ saturated hydrocarbylcarbonyloxy moieties, or some carbon may be replaced by a carbonyl moiety, ether bond or ester bond. Also, any two of $R^{23}$, $R^{24}$ and $R^{25}$ or any two of $R^{26}$, $R^{27}$ and $R^{28}$ may bond together to form a ring with the sulfur atom to which they are attached. Examples of the ring are as exemplified above as the ring that $R^2$ and $R^3$, taken together, form with the sulfur atom in formula (A).

In formula (f2), $A^1$ is hydrogen or trifluoromethyl.

In formula (f1), $M^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide; methide ions such as tris(trifluoromethylsulfonyl)methide and tris(perfluoroethylsulfonyl)methide.

Also included are sulfonate ions having fluorine substituted at α-position as represented by the formula (f1-1) and sulfonate ions having fluorine substituted at α-position and trifluoromethyl at β-position as represented by the formula (f1-2).

$$R^{31}—CF_2—SO_3^- \quad \text{(fl-1)}$$

(fl-2)

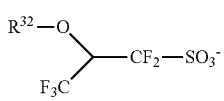

In formula (f1-1), $R^{31}$ is hydrogen or a $C_1$-$C_{20}$ hydrocarbyl group which may contain an ether bond, ester bond, carbonyl moiety, lactone ring, or fluorine atom. The hydrocarbyl group may be saturated or unsaturated and straight, branched or cyclic. Examples thereof are the same as will be exemplified below for the hydrocarbyl group $R^{105}$ in formula (1A').

In formula (f1-2), $R^{32}$ is hydrogen, or a $C_1$-$C_3$ hydrocarbyl group, $C_2$-$C_{30}$ hydrocarbylcarbonyl group, or $C_6$-$C_{30}$ aryloxy group, which may contain an ether bond, ester bond, carbonyl moiety or lactone ring. The hydrocarbyl group and hydrocarbyl moiety of the hydrocarbylcarbonyl group may be saturated or unsaturated and straight, branched or cyclic. Examples thereof are the same as will be exemplified below for the hydrocarbyl group $R^{105}$ in formula (1A').

Examples of the cation in the monomer from which recurring unit (f1) is derived are shown below, but not limited thereto. $R^A$ is as defined above.

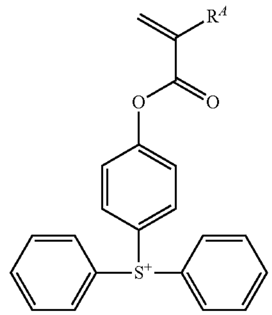

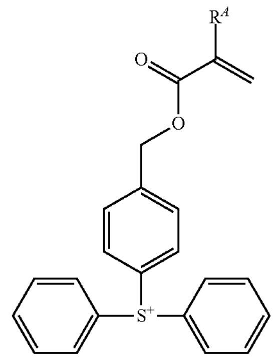

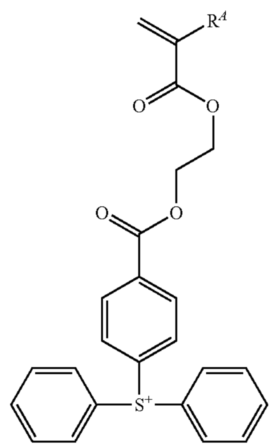

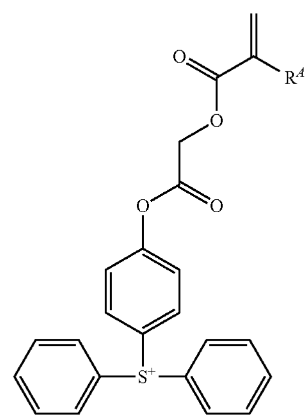

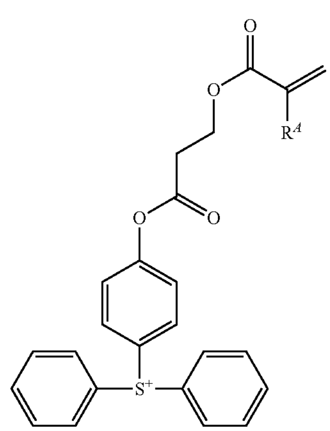

-continued
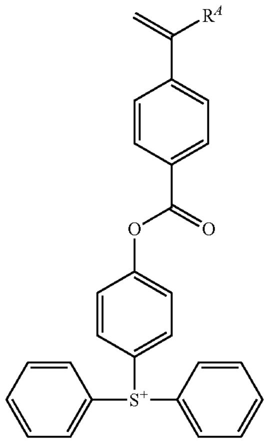
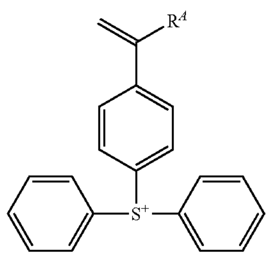
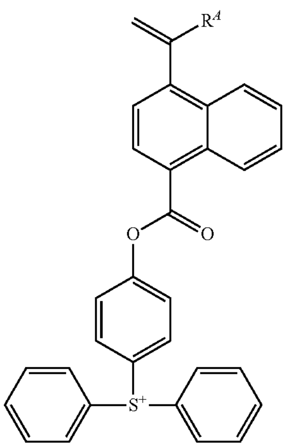
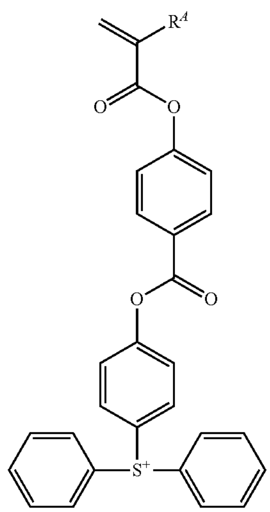
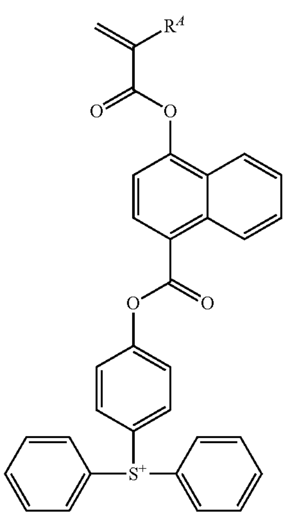
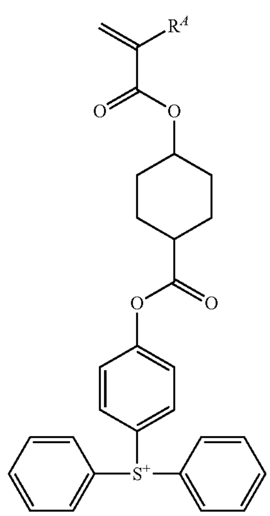
-continued
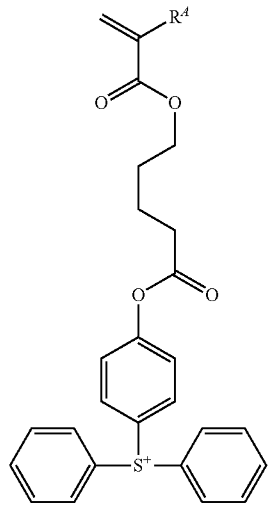
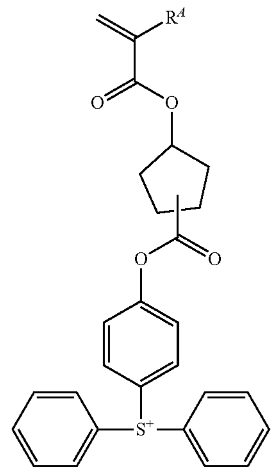
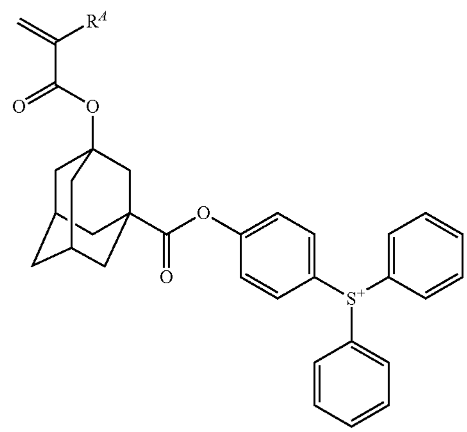
Examples of the cation in the monomer from which recurring unit (f2) or (f3) is derived are the same as will be exemplified below as a cation in a sulfonium salt having formula (1).
Examples of the anion in the monomer from which recurring unit (f2) is derived are shown below, but not limited thereto. $R^A$ is as defined above.
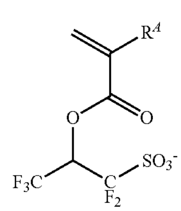
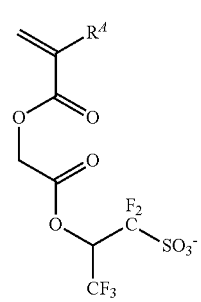
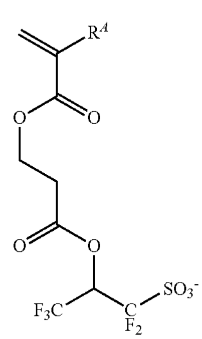

-continued
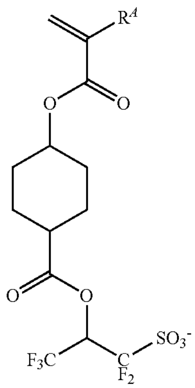
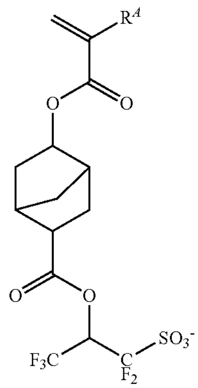
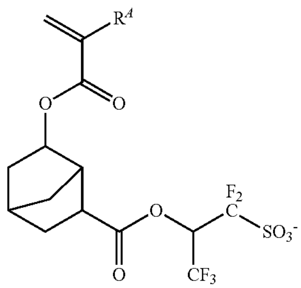
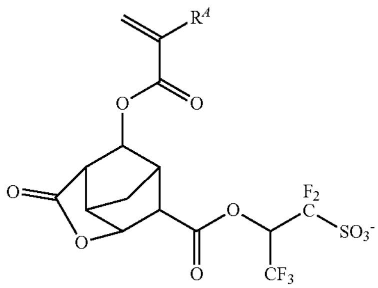
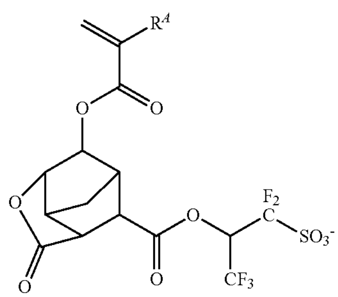
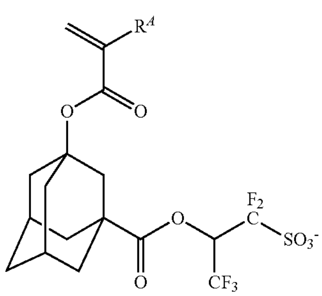
-continued
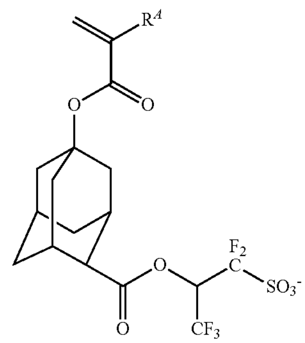
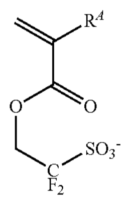
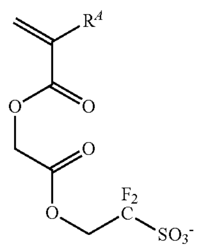
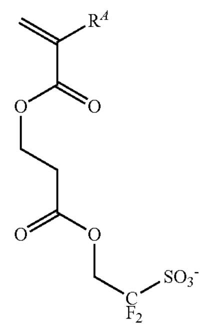
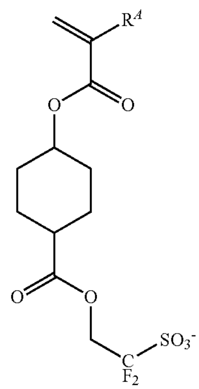
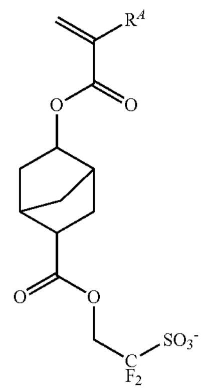
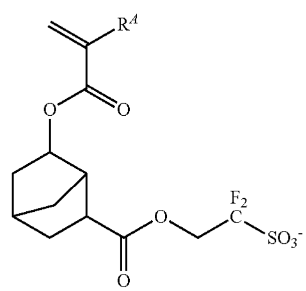
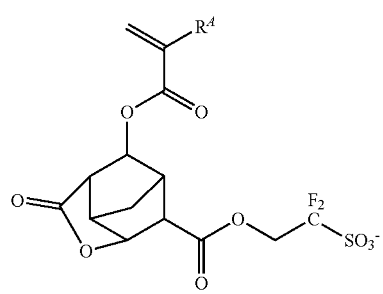

-continued
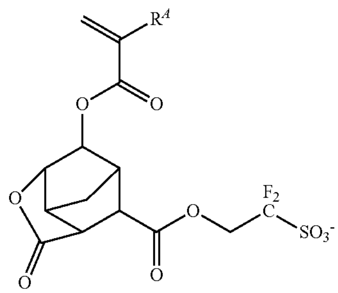
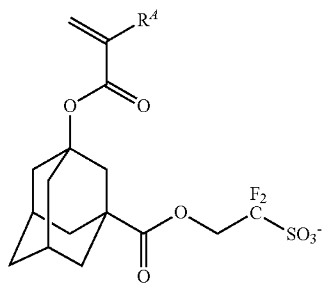
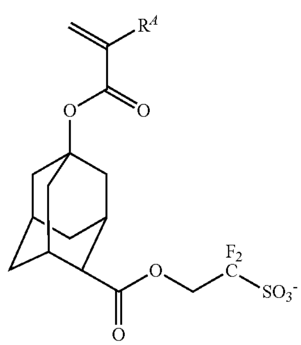
Examples of the anion in the monomer from which recurring unit (f3) is derived are shown below, but not limited thereto. $R^A$ is as defined above.
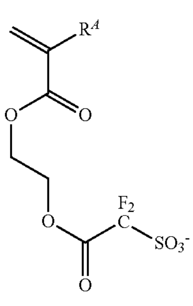
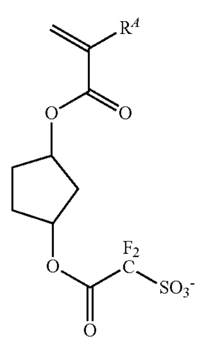
-continued
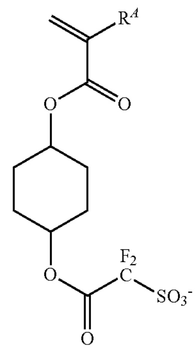
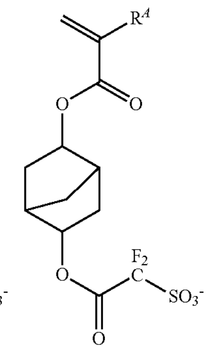
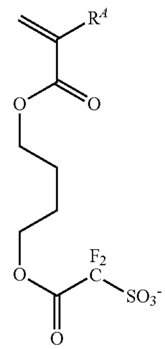
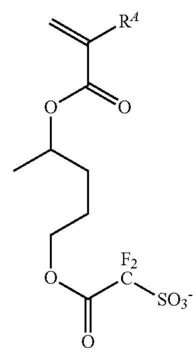
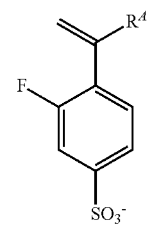
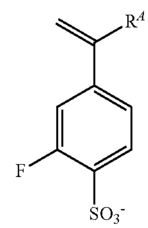
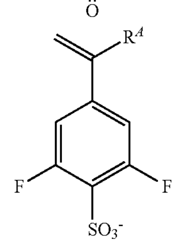
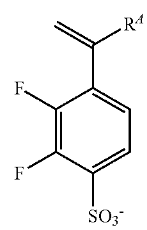
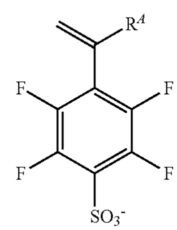
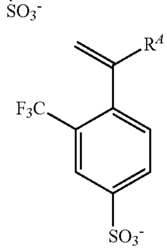
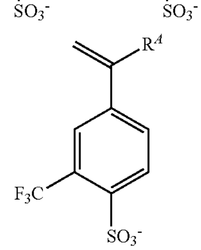
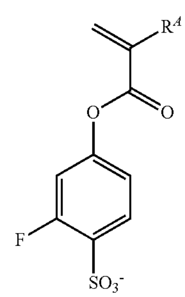
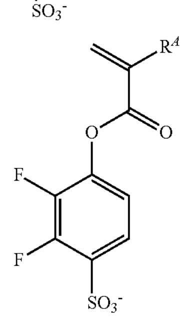
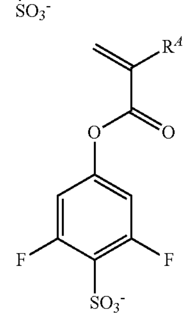
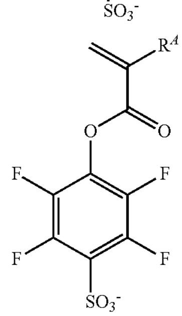
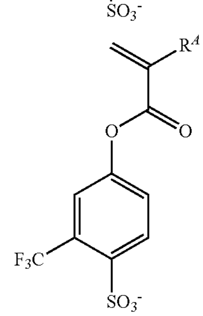
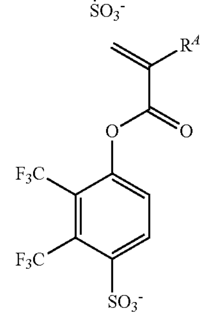

-continued

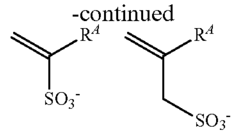

The attachment of an acid generator to the polymer main chain is effective in restraining acid diffusion, thereby preventing a reduction of resolution due to blur by acid diffusion. Also LWR or CDU is improved since the acid generator is uniformly distributed. Where a base polymer containing recurring units (f) is used, an acid generator of addition type may be omitted.

The base polymer for formulating the positive resist composition comprises recurring units (a1) or (a2) having an acid labile group as essential component and additional recurring units (b), (c), (d), (e), and (f) as optional components. A fraction of units (a1), (a2), (b), (c), (d), (e), and (f) is: preferably 0≤a1<1.0, 0≤a2<1.0, 0≤a1+a2<1.0, 0≤b≤0.9, 0≤c≤0.9, 0≤d≤0.8, 0≤e≤0.8, and 0≤f≤0.5; more preferably 0≤a1≤0.9, 0≤a2≤0.9, 0.1≤a1+a2≤0.9, 0≤b≤0.8, 0≤c≤0.8, 0≤d≤0.7, 0≤e≤0.7, and 0≤f≤0.4; and even more preferably 0≤a1≤0.8, 0≤a2≤5 0.8, 0.1≤a1+a2≤0.8, 0≤b≤0.75, 0≤c≤0.75, 0≤d≤0.6, 0≤e≤0.6, and 0≤f≤0.3. Notably, f=f1+f2+f3, meaning that unit (f) is at least one of units (f1) to (f3), and a1+a2+b+c+d+e+f=1.0.

For the base polymer for formulating the negative resist composition, an acid labile group is not necessarily essential. The base polymer comprises recurring units (b), and optionally recurring units (c), (d), (e), and/or (f). A fraction of these units is: preferably 0<b≤1.0, 0≤c≤0.9, 0≤d≤0.8, 0≤e≤0.8, and 0≤f≤0.5; more preferably 0.2≤b≤1.0, 0≤c≤0.8, 0≤d≤0.7, 0≤d≤0.7, and 0≤f≤0.4; and even more preferably 0.3≤b≤1.0, 0≤c≤0.75, 0≤d≤0.6, 0≤e≤0.6, and 0≤f≤0.3. Notably, f=f1+f2+f3, meaning that unit (f) is at least one of units (f1) to (f3), and b+c+d+e+f=1.0.

The base polymer may be synthesized by any desired methods, for example, by dissolving one or more monomers selected from the monomers corresponding to the foregoing recurring units in an organic solvent, adding a radical polymerization initiator thereto, and heating for polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably, the polymerization temperature is 50 to 80° C. and the reaction time is 2 to 100 hours, more preferably 5 to 20 hours.

Where a monomer having a hydroxyl group is copolymerized, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

The base polymer should preferably have a weight average molecular weight (Mw) in the range of 1,000 to 500,000, and more preferably 2,000 to 30,000, as measured by GPC versus polystyrene standards using tetrahydrofuran (THF) solvent. With too low a Mw, the resist composition may become less heat resistant. A polymer with too high a Mw may lose alkaline solubility and give rise to a footing phenomenon after pattern formation.

If a base polymer has a wide molecular weight distribution or dispersity (Mw/Mn), which indicates the presence of lower and higher molecular weight polymer fractions, there is a possibility that foreign matter is left on the pattern or the pattern profile is degraded. The influences of Mw and Mw/Mn become stronger as the pattern rule becomes finer. Therefore, the base polymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, Mw or Mw/Mn is acceptable.

Acid Generator

The resist composition may comprise an acid generator capable of generating a strong acid (referred to as acid generator of addition type, hereinafter). As used herein, the term "strong acid" refers to a compound having a sufficient acidity to induce deprotection reaction of an acid labile group on the base polymer in the case of a chemically amplified positive resist composition, or a compound having a sufficient acidity to induce acid-catalyzed polarity switch reaction or crosslinking reaction in the case of a chemically amplified negative resist composition. The inclusion of such an acid generator ensures that the inventive sulfonium salt functions as a quencher and the inventive resist composition functions as a chemically amplified positive or negative resist composition.

The acid generator is typically a compound (PAG) capable of generating an acid upon exposure to actinic ray or radiation. Although the PAG used herein may be any compound capable of generating an acid upon exposure to high-energy radiation, those compounds capable of generating sulfonic acid, imide acid (imidic acid) or methide acid are preferred. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880).

As the PAG used herein, those having the formula (1) are preferred.

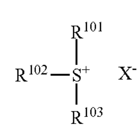

(1)

In formula (1), $R^{101}$, $R^{102}$ and $R^{103}$ are each independently fluorine, chlorine, bromine, iodine, or a $C_1$-$C_{20}$ hydrocarbyl group which may contain a heteroatom. Any two of $R^{101}$, $R^{102}$ and $R^{103}$ may bond together to form a ring with the sulfur atom to which they are attached. The hydrocarbyl group may be saturated or unsaturated and straight, branched or cyclic. Examples of the hydrocarbyl group and the ring are as exemplified above for $R^2$ to $R^4$ in formula (A).

In formula (1), $X^-$ is an anion of the following formula (1A), (1B), (1C) or (1D).

(1A)

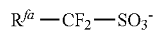

(1B)

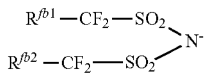

(1C)

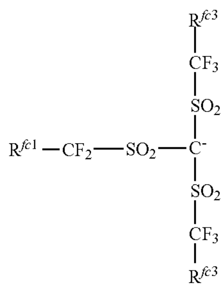

(1D)

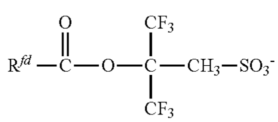

In formula (1A), $R^{fa}$ is fluorine or a $C_1$-$C_{40}$ hydrocarbyl group which may contain a heteroatom. The hydrocarbyl group may be saturated or unsaturated and straight, branched or cyclic. Examples thereof areas exemplified below for $R^{105}$ in formula (1A').

Of the anions of formula (1A), an anion having the formula (1A') is preferred.

(1A')

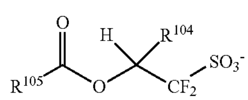

In formula (1A'), $R^{104}$ is hydrogen or trifluoromethyl, preferably trifluoromethyl.

$R^{105}$ is a $C_1$-$C_{38}$ hydrocarbyl group which may contain a heteroatom. As the heteroatom, oxygen, nitrogen, sulfur and halogen atoms are preferred, with oxygen being most preferred. Of the hydrocarbyl groups, those groups of 6 to 30 carbon atoms are preferred from the aspect of achieving a high resolution in forming patterns of fine feature size. The hydrocarbyl groups may be saturated or unsaturated and straight, branched or cyclic. Examples thereof include, but are not limited to, alkyl groups such as methyl, ethyl, propyl, isopropyl, butyl, isobutyl, sec-butyl, tert-butyl, pentyl, neopentyl, hexyl, heptyl, 2-ethylhexyl, nonyl, undecyl, tridecyl, pentadecyl, heptadecyl, and eicosanyl; cyclic saturated hydrocarbyl groups such as cyclopentyl, cyclohexyl, 1-adamantyl, 2-adamantyl, 1-adamantylmethyl, norbornyl, norbornylmethyl, tricyclodecanyl, tetracyclododecanyl, tetracyclododecanylmethyl, and dicyclohexylmethyl; unsaturated aliphatic hydrocarbyl groups such as allyl and 3-cyclohexenyl; aryl groups such as phenyl, 1-naphthyl and 2-naphthyl; and aralkyl groups such as benzyl and diphenylmethyl. In these groups, some or all hydrogen may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonic acid ester bond, carbonate bond, lactone ring, sultone ring, carboxylic anhydride or haloalkyl moiety. Examples of the heteroatom-containing hydrocarbyl group include tetrahydrofuryl, methoxymethyl, ethoxymethyl, methylthiomethyl, acetamidomethyl, trifluoroethyl, (2-methoxyethoxy)methyl, acetoxymethyl, 2-carboxy-1-cyclohexyl, 2-oxopropyl, 4-oxo-1-adamantyl, and 3-oxocyclohexyl.

With respect to the synthesis of the sulfonium salt having an anion of formula (1A'), reference may be made to JP-A 2007-145797, JP-A 2008-106045, JP-A 2009-007327, and JP-A2009-258695. Also useful are the sulfonium salts described in JP-A 2010-215608, JP-A 2012-041320, JP-A 2012-106986, and JP-A 2012-153644.

Examples of the anion having formula (1A) are shown below, but not limited thereto.

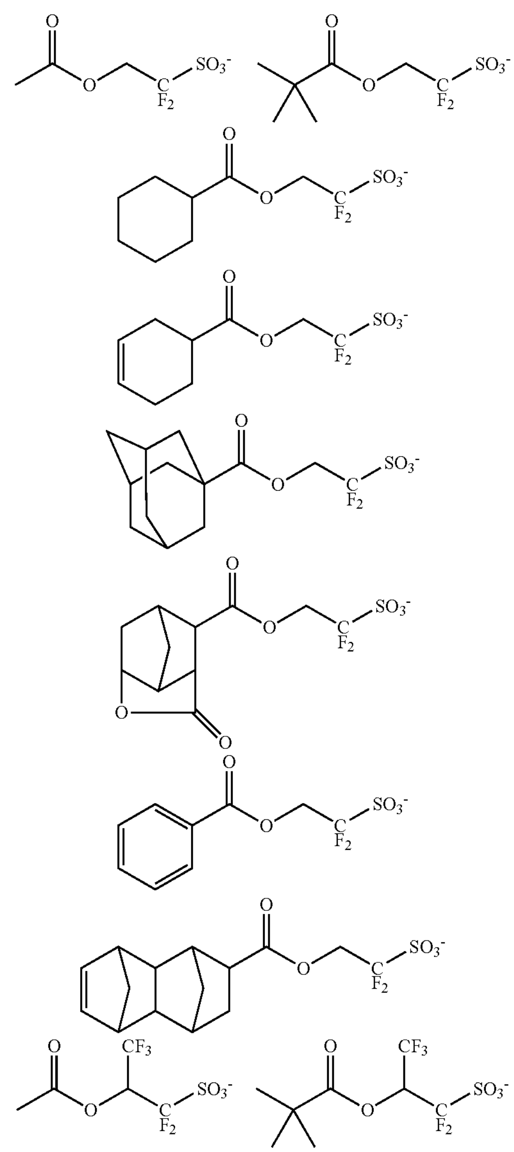

-continued
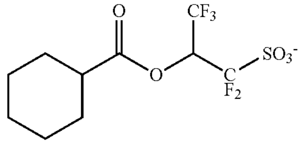
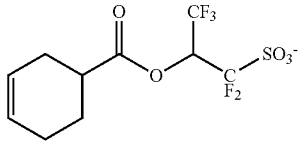
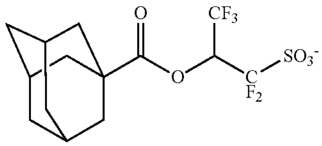
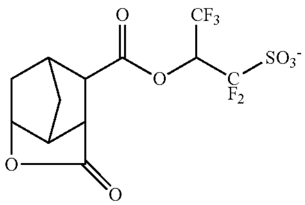
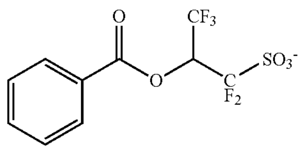
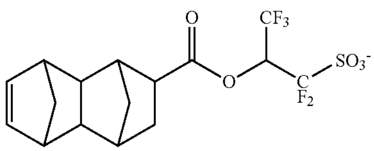
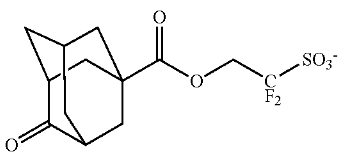
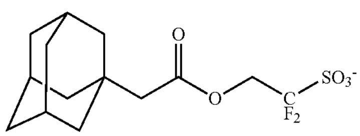
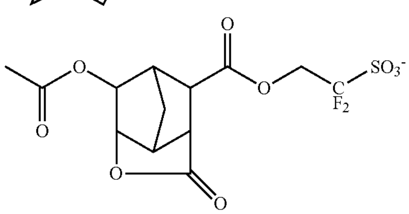
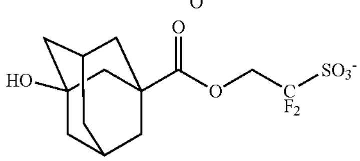
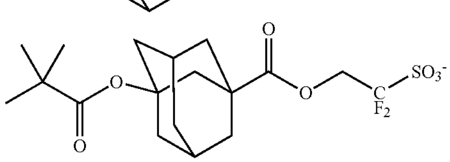
-continued
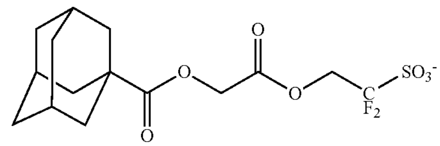
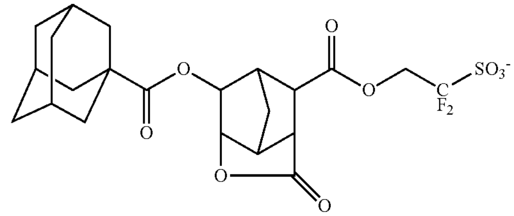
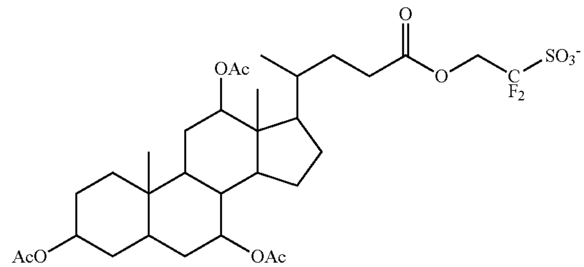
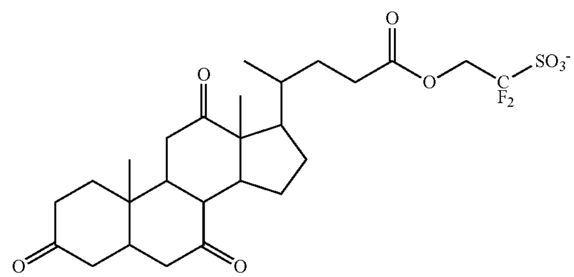
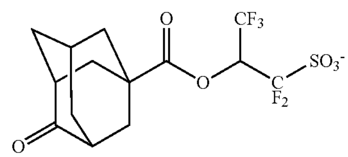
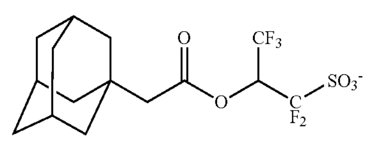
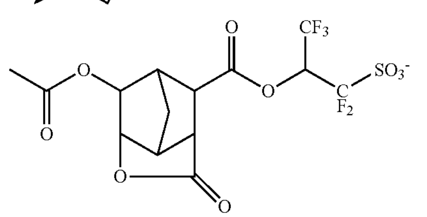
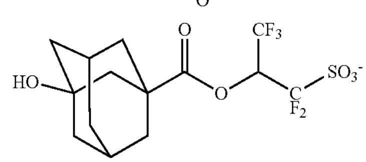
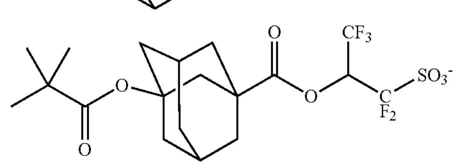

-continued

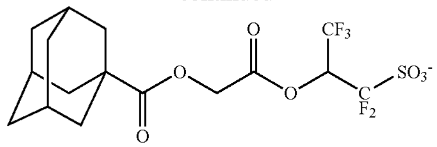

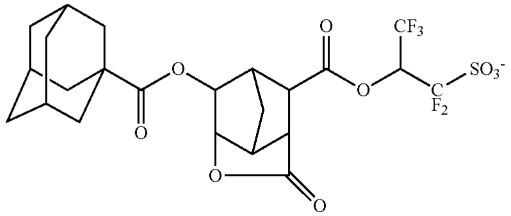

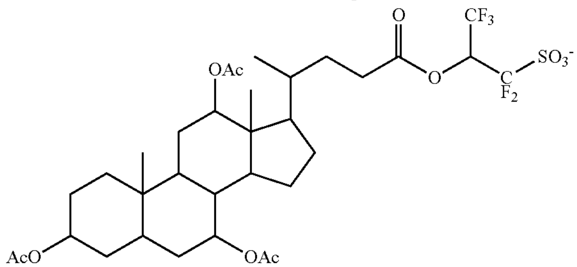

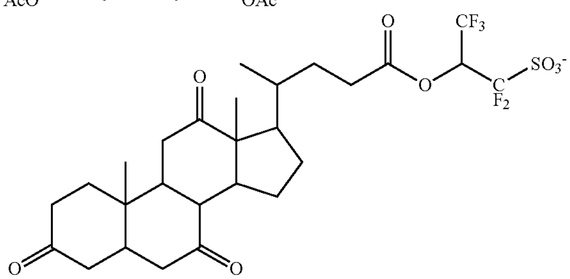

In formula (1B), $R^{fb1}$ and $R^{fb2}$ are each independently fluorine or a $C_1$-$C_{40}$ hydrocarbyl group which may contain a heteroatom. The hydrocarbyl group may be saturated or unsaturated and straight, branched or cyclic. Examples thereof are as exemplified above for $R^{105}$ in formula (1A'). Preferably $R^{fb1}$ and $R^{fb2}$ are fluorine or $C_1$-$C_4$ straight fluorinated alkyl groups. Also, $R^{fb1}$ and $R^{fb2}$ may bond together to forma ring with the linkage: —$CF_2$—$SO_2$—$N^-$—$SO_2$—$CF_2$— to which they are attached. It is preferred that a combination of $R^{fb1}$ and $R^{fb2}$ be a fluorinated ethylene or fluorinated propylene group.

In formula (1C), $R^{fc1}$, $R^{fc2}$ and $R^{fc3}$ are each independently fluorine or a $C_1$-$C_{40}$ hydrocarbyl group which may contain a heteroatom. The hydrocarbyl group may be saturated or unsaturated and straight, branched or cyclic. Examples thereof are as exemplified for $R^{105}$. Preferably $R^{fc1}$, $R^{fc2}$ and $R^{fc3}$ are fluorine or $C_1$-$C_4$ straight fluorinated alkyl groups. Also, $R^{fc1}$ and $R^{fc2}$ may bond together to form a ring with the linkage: —$CF_2$—$SO_2$—$C^-$—$SO_2$—$CF_2$— to which they are attached. It is preferred that a combination of $R^{fc1}$ and $R^{fc2}$ be a fluorinated ethylene or fluorinated propylene group.

In formula (1D), $R^{fd}$ is a $C_1$-$C_{40}$ hydrocarbyl group which may contain a heteroatom. The hydrocarbyl group may be saturated or unsaturated and straight, branched or cyclic. Examples thereof are as exemplified above for $R^{105}$.

With respect to the synthesis of the sulfonium salt having an anion of formula (1D), reference may be made to JP-A 2010-215608 and JP-A 2014-133723.

Examples of the anion having formula (1D) are shown below, but not limited thereto.

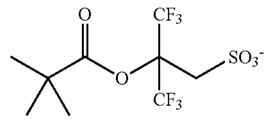

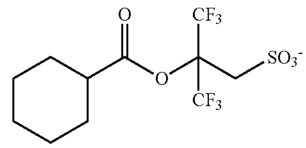

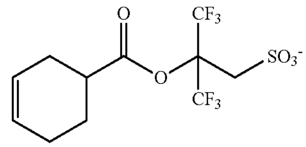

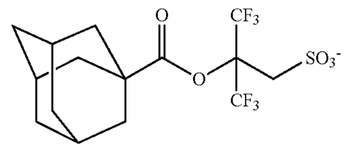

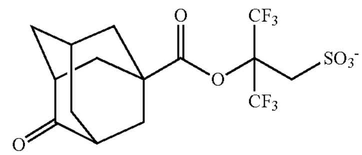

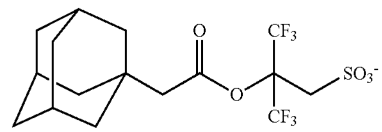

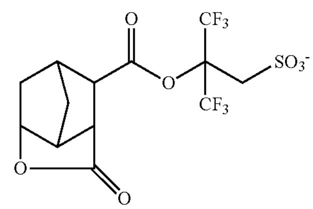

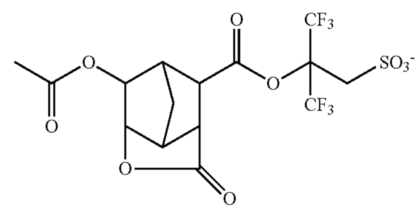

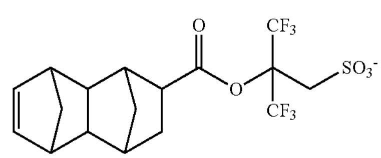

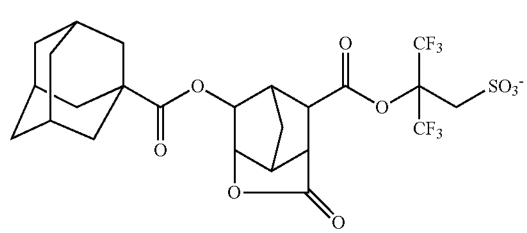

-continued

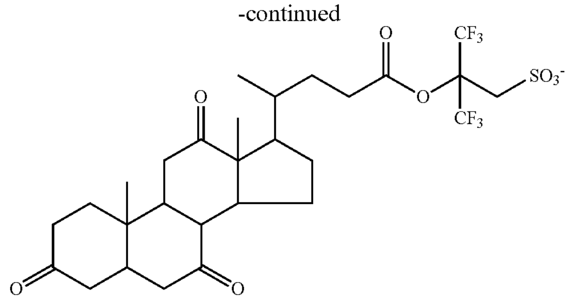

Notably, the compound having the anion of formula (1D) does not have fluorine at the α-position relative to the sulfo group, but two trifluoromethyl groups at the β-position. For this reason, it has a sufficient acidity to sever the acid labile groups in the resist polymer. Thus the compound is an effective PAG.

Another preferred PAG is a compound having the formula (2).

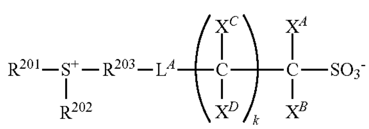

(2)

In formula (2), $R^{201}$ and $R^{202}$ are each independently a $C_1$-$C_3$ hydrocarbyl group which may contain a heteroatom. $R^{203}$ is a $C_1$-$C_{30}$ hydrocarbylene group which may contain a heteroatom. Any two of $R^{201}$, $R^{202}$ and $R^{203}$ may bond together to forma ring with the sulfur atom to which they are attached. Examples of the ring are as exemplified above as the ring that $R^2$ and $R^3$, taken together, form with the sulfur atom in formula (A).

The hydrocarbyl groups $R^{201}$ and $R^{202}$ may be saturated or unsaturated and straight, branched or cyclic. Examples thereof include, but are not limited to, alkyl groups such as methyl, ethyl, propyl, isopropyl, n-butyl, sec-butyl, tert-butyl, n-pentyl, tert-pentyl, n-hexyl, n-octyl, 2-ethylhexyl, n-nonyl, and n-decyl; cyclic saturated hydrocarbyl groups such as cyclopentyl, cyclohexyl, cyclopentylmethyl, cyclopentylethyl, cyclopentylbutyl, cyclohexylmethyl, cyclohexylethyl, cyclohexylbutyl, norbomyl, tricyclo[5.2.1.0$^{2,6}$]decanyl, and adamantyl; and aryl groups such as phenyl, naphthyl and anthracenyl. In these groups, some hydrogen may be substituted by a moiety containing a heteroatom such as oxygen, sulfur, nitrogen or halogen, or some carbon may be replaced by a moiety containing a heteroatom such as oxygen, sulfur or nitrogen, so that the group may contain a hydroxyl, cyano, carbonyl, ether bond, ester bond, sulfonic acid ester bond, carbonate bond, lactone ring, sultone ring, carboxylic anhydride or haloalkyl moiety.

The hydrocarbylene group $R^{203}$ may be saturated or unsaturated and straight, branched or cyclic. Examples thereof include alkanediyl groups such as methylene, ethylene, propane-1,3-diyl, butane-1,4-diyl, pentane-1,5-diyl, hexane-1,6-diyl, heptane-1,7-diyl, octane-1,8-diyl, nonane-1,9-diyl, decane-1,10-diyl, undecane-1,11-diyl, dodecane-1,12-diyl, tridecane-1,13-diyl, tetradecane-1,14-diyl, pentadecane-1,15-diyl, hexadecane-1,16-diyl, and heptadecane-1,17-diyl; cyclic saturated hydrocarbylene groups such as cyclopentanediyl, cyclohexanediyl, norbomanediyl and adamantanediyl; and arylene groups such as phenylene, methylphenylene, ethylphenylene, n-propylphenylene, isopropylphenylene, n-butylphenylene, isobutylphenylene, sec-butylphenylene, tert-butylphenylene, naphthylene, methylnaphthylene, ethylnaphthylene, n-propylnaphthylene, isopropylnaphthylene, n-butylnaphthylene, isobutylnaphthylene, sec-butylnaphthylene, and tert-butylnaphthylene. In these groups, some hydrogen may be substituted by a moiety containing a heteroatom such as oxygen, sulfur, nitrogen or halogen; or some carbon may be replaced by a moiety containing a heteroatom such as oxygen, sulfur or nitrogen, so that the group may contain a hydroxyl, cyano, carbonyl, ether bond, ester bond, sulfonic acid ester bond, carbonate bond, lactone ring, sultone ring, carboxylic anhydride or haloalkyl moiety. Of the heteroatoms, oxygen is preferred.

In formula (2), $L^A$ is a single bond, ether bond or a $C_1$-$C_{20}$ hydrocarbylene group which may contain a heteroatom. The hydrocarbylene group may be saturated or unsaturated and straight, branched or cyclic. Examples thereof are as exemplified above for the hydrocarbylene group $R^{203}$.

In formula (2), $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and k is an integer of 0 to 3.

Of the PAGs having formula (2), those having formula (2') are preferred.

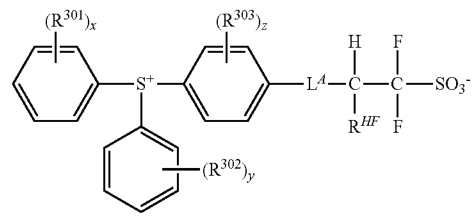

(2')

In formula (2'), $L^A$ is as defined above. $R^{HF}$ is hydrogen or trifluoromethyl, preferably trifluoromethyl. $R^{301}$, $R^{302}$ and $R^{303}$ are each independently a $C_1$-$C_{20}$ hydrocarbyl group which may contain a heteroatom. The hydrocarbyl group may be saturated or unsaturated and straight, branched or cyclic. Examples thereof are as exemplified above for $R^{105}$. The subscripts x and y are each independently an integer of 0 to 5, and z is an integer of 0 to 4.

Examples of the PAG having formula (2) include those described in JP-A 2017-026980.

Of the foregoing PAGs, those having an anion of formula (1A') or (1D) are especially preferred because of reduced acid diffusion and high solubility in the resist solvent. Also those of formula (2') are especially preferred because of extremely reduced acid diffusion.

Also a sulfonium or iodonium salt having an anion containing an iodized or brominated aromatic ring may be used as the PAG. Suitable salts have the formulae (3-1) and (3-2).

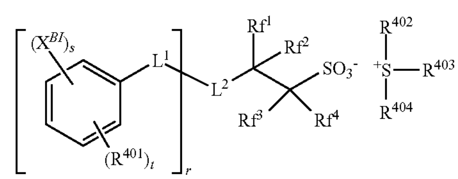

(3-1)

-continued (3-2)

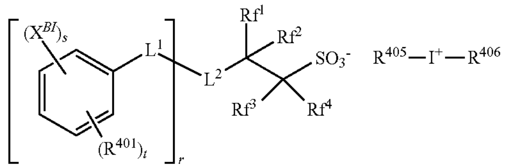

In formulae (3-1) and (3-2), r is an integer of 1 to 3, s is an integer of 1 to 5, t is an integer of 0 to 3, and 1≤s+t≤5. Preferably, s is an integer of 1 to 3, more preferably 2 or 3, and t is an integer of 0 to 2.

$X^{BI}$ is iodine or bromine, and may be identical or different when s and/or r are at least 2.

$L^1$ is a single bond, ether bond, ester bond, or a $C_1$-$C_6$ saturated hydrocarbylene group which may contain an ether bond or ester bond. The saturated hydrocarbylene group may be straight, branched or cyclic.

$L^2$ is a single bond or a $C_1$-$C_{20}$ divalent linking group when r=1, or a $C_1$-$C_{20}$ (r+1)-valent linking group when r=2 or 3. The linking group may contain an oxygen, sulfur or nitrogen atom.

In formulae (3-1) and (3-2), $R^{401}$ is hydroxyl, carboxyl, fluorine, chlorine, bromine, amino group, or a $C_1$-$C_{20}$ saturated hydrocarbyl, $C_1$-$C_{20}$ saturated hydrocarbyloxy, $C_2$-$C_{10}$ saturated hydrocarbyloxycarbonyl, $C_2$-$C_{20}$ saturated hydrocarbylcarbonyloxy, or $C_1$-$C_{20}$ saturated hydrocarbylsulfonyloxy group, which may contain fluorine, chlorine, bromine, hydroxyl, amino or ether bond, or —$NR^{401A}$—C(═O)—$R^{401B}$ or —$NR^{401A}$—C(═O)—O—$R^{401B}$. $R^{401A}$ is hydrogen, or a $C_1$-$C_6$ saturated hydrocarbyl group which may contain halogen, hydroxy, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. $R^{401B}$ is a $C_1$-$C_{16}$ aliphatic hydrocarbyl group or $C_6$-$C_{12}$ aryl group, which may contain halogen, hydroxyl, $C_1$-$C_6$ saturated hydrocarbyloxy, $C_2$-$C_6$ saturated hydrocarbylcarbonyl or $C_2$-$C_6$ saturated hydrocarbylcarbonyloxy moiety. The aliphatic hydrocarbyl group may be saturated or unsaturated and straight, branched or cyclic. The saturated hydrocarbyl, saturated hydrocarbyloxy, saturated hydrocarbyloxycarbonyl, saturated hydrocarbylcarbonyl, and saturated hydrocarbylcarbonyloxy groups may be straight, branched or cyclic. Groups $R^{401}$ may be identical or different when t and/or r are 2 or 3.

Of these, $R^{401}$ is preferably hydroxyl, —$NR^{401A}$—C(═O)—$R^{401B}$, —$NR^{401A}$—C(═O)—O—$R^{401B}$, fluorine, chlorine, bromine, methyl or methoxy.

$Rf^1$ to $Rf^4$ are each independently hydrogen, fluorine or trifluoromethyl, at least one of $Rf^1$ to $Rf^4$ is fluorine or trifluoromethyl, or $Rf^1$ and $Rf^2$, taken together, may form a carbonyl group. More preferably, both $Rf^3$ and $Rf^4$ are fluorine.

$R^{402}$, $R^{403}$, $R^{404}$, $R^{405}$ and $R^{406}$ are each independently a $C_1$-$C_{20}$ hydrocarbyl group which may contain a heteroatom. The hydrocarbyl group may be saturated or unsaturated and straight, branched or cyclic. Examples thereof include $C_1$-$C_{20}$ alkyl groups, $C_3$-$C_{20}$ cycloalkyl groups, $C_2$-$C_{20}$ alkenyl groups, $C_2$-$C_2$ alkynyl groups, $C_6$-$C_{20}$ aryl groups, and $C_7$-$C_{12}$ aralkyl groups. In these groups, some or all hydrogen may be substituted by a hydroxyl, carboxyl, halogen, cyano, nitro, mercapto, sultone, sulfone or sulfonium salt-containing moiety, or some carbon may be replaced by an ether bond, ester bond, carbonyl, amide bond, carbonate or sulfonic acid ester bond. Any two of $R^{402}$, $R^{403}$ and $R^{404}$ may bond together to form a ring with the sulfur atom to which they are attached. Examples of the ring are as exemplified above as the ring that $R^{101}$ and $R^{102}$, taken together, form with the sulfur atom in formula (1-1).

Examples of the cation in the sulfonium salt having formula (3-1) are as exemplified above as the cation in the sulfonium salt having formula (1-1). Examples of the cation in the iodonium salt having formula (3-2) are as exemplified above as the cation in the iodonium salt having formula (1-2).

Examples of the anion in the onium salts having formulae (3-1) and (3-2) are shown below, but not limited thereto. $X^{BI}$ is as defined above.

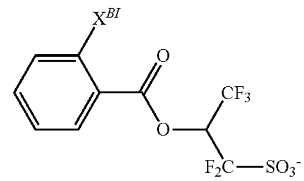

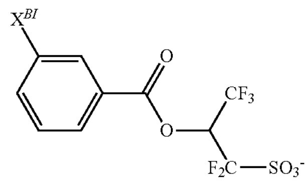

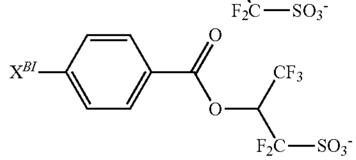

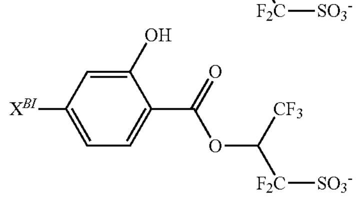

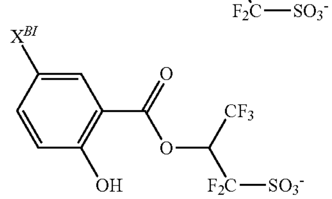

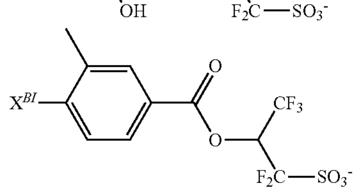

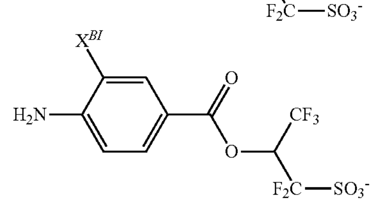

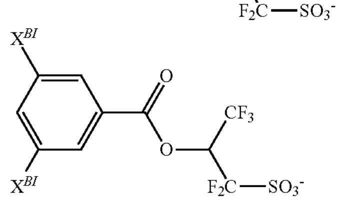

-continued
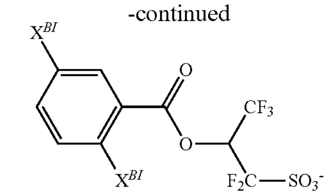
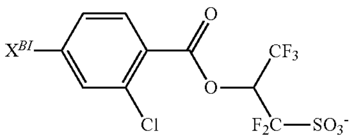
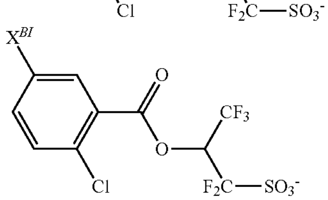
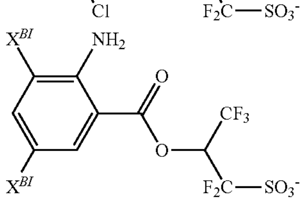
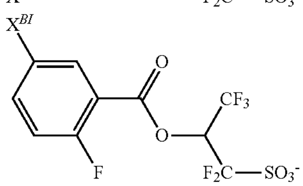
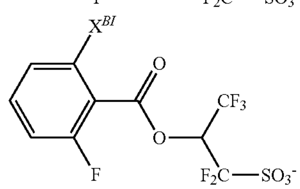
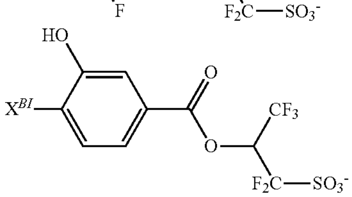
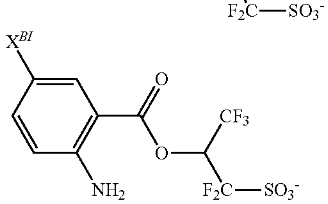
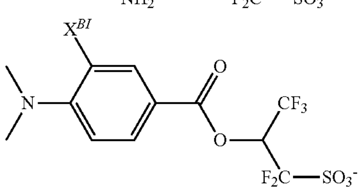
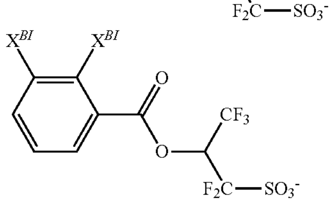
-continued
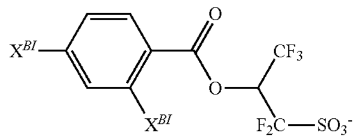
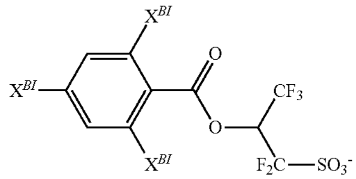
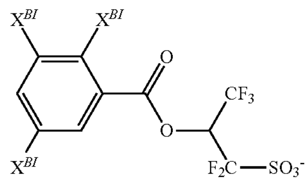
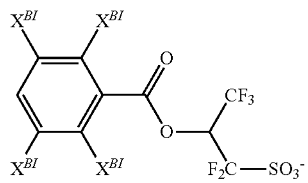
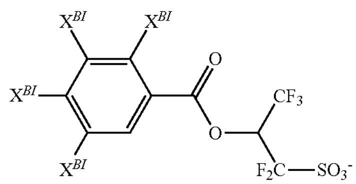
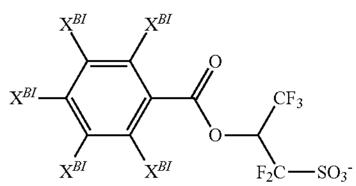
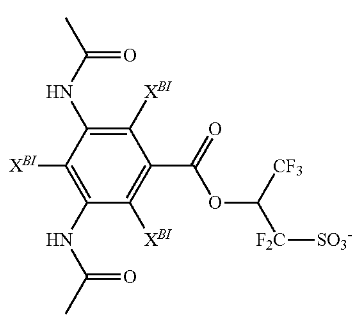
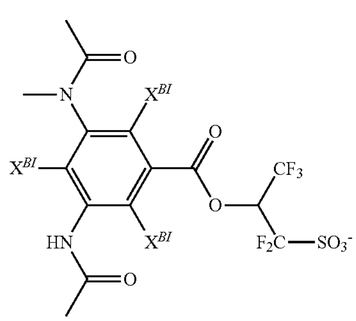

-continued
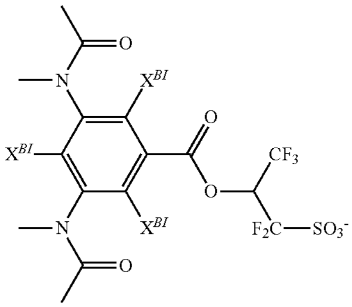
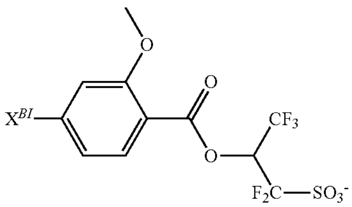
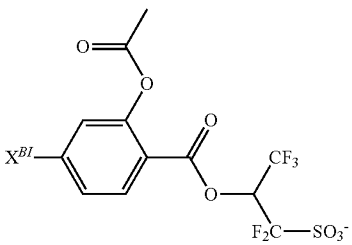
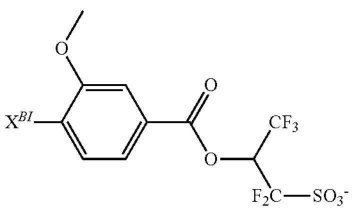
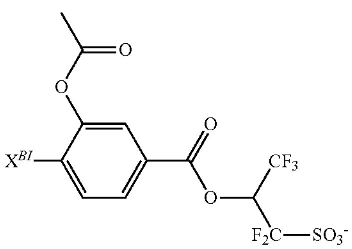
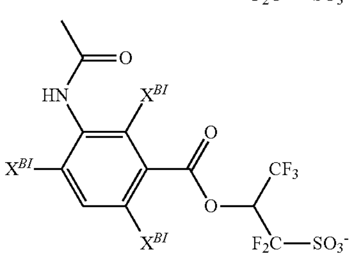
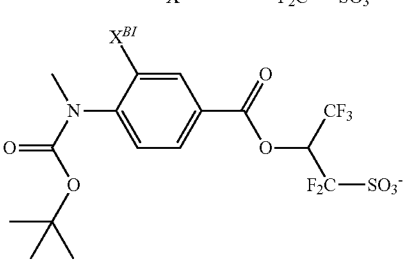
-continued
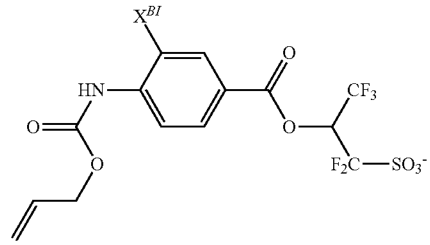
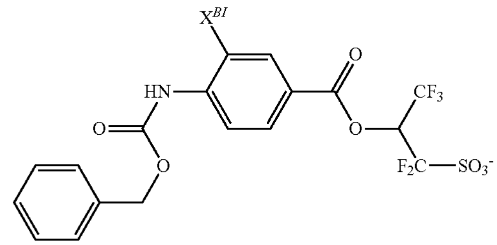
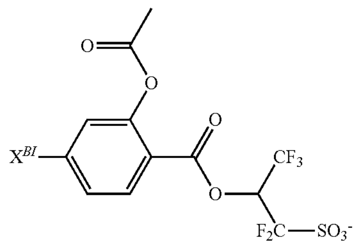
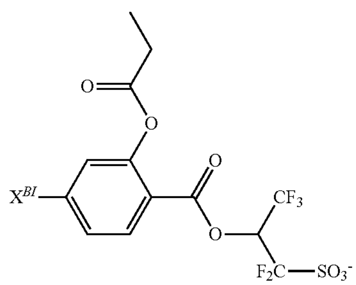
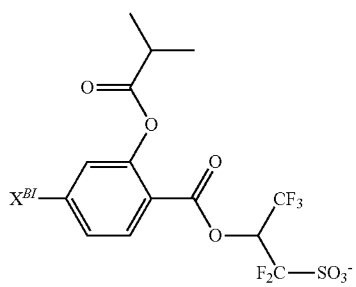
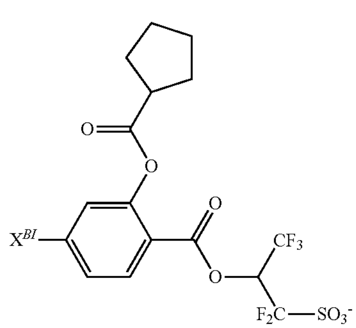

-continued
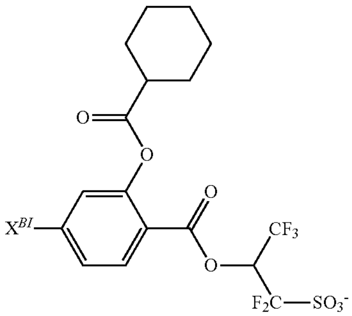
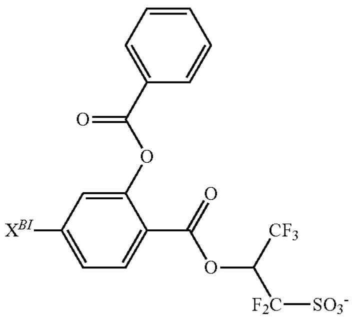
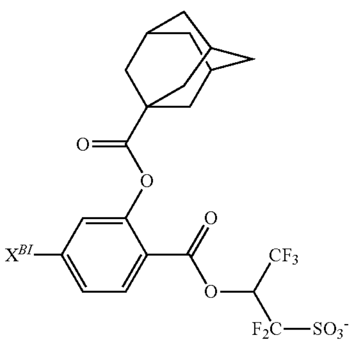
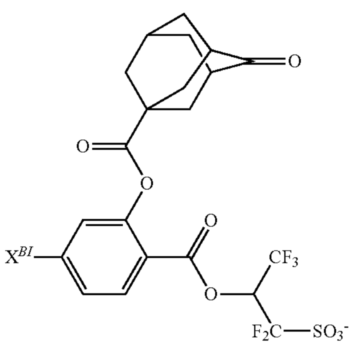
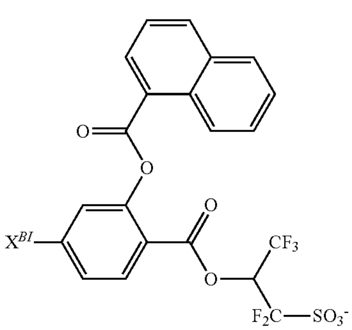
-continued
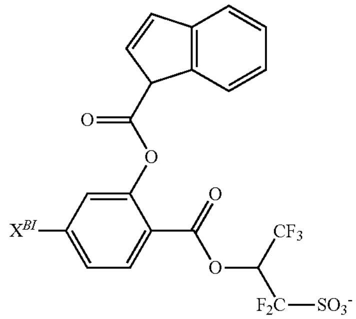
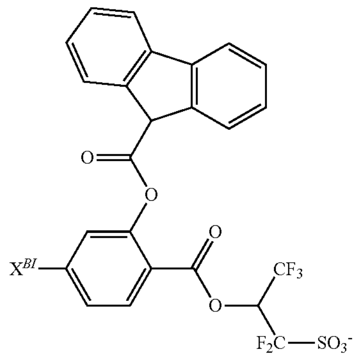
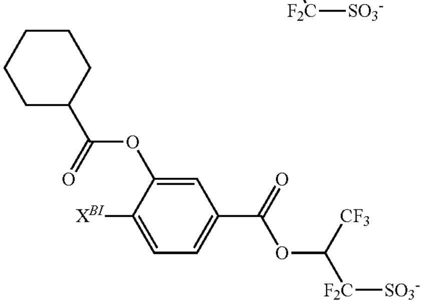
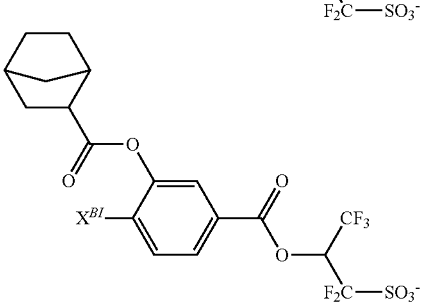
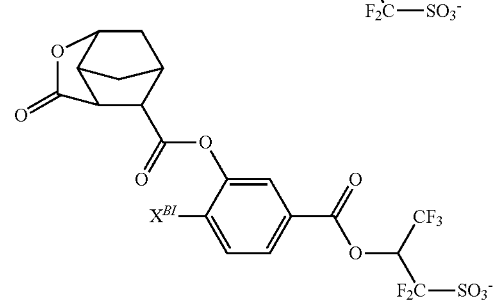
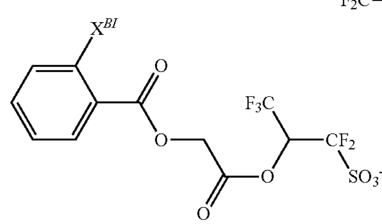

-continued
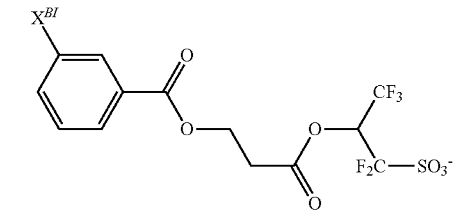
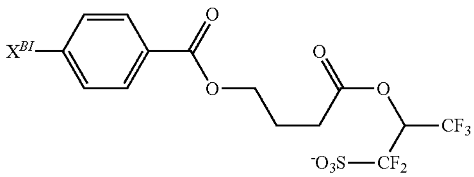
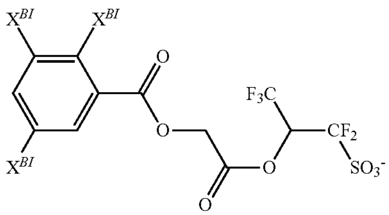
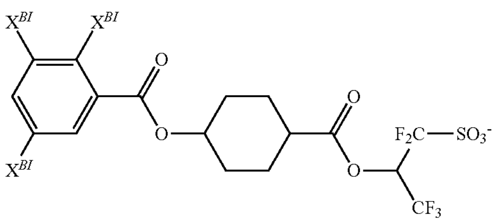
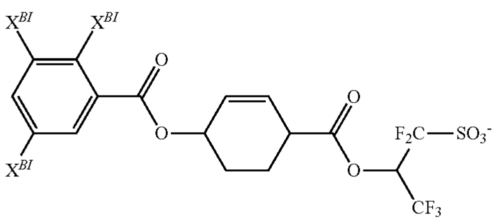
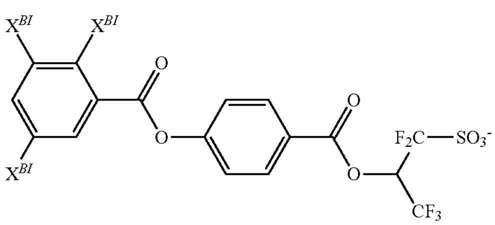
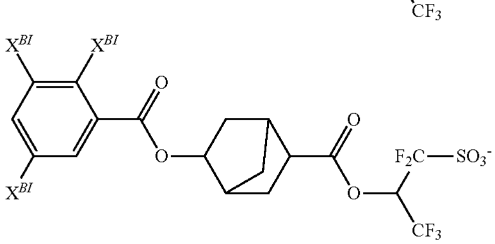
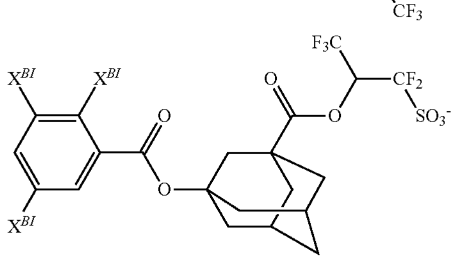
-continued
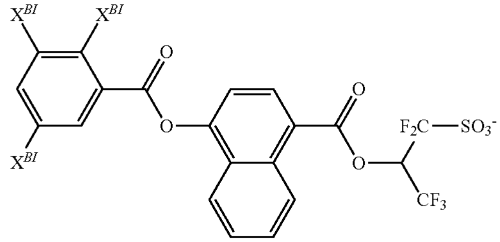
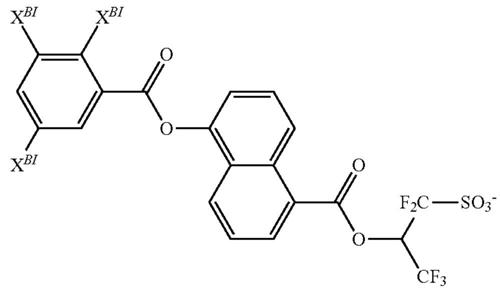
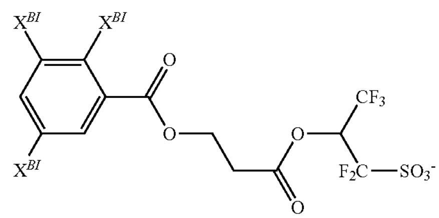
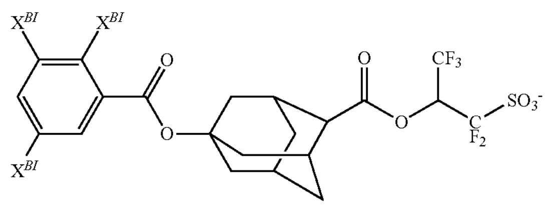
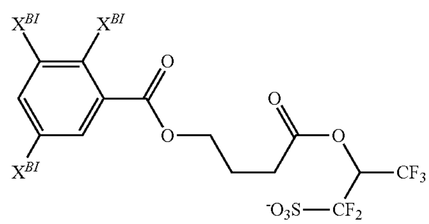
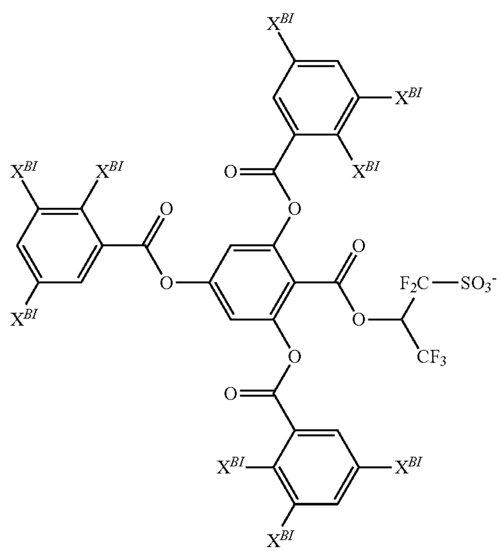

-continued
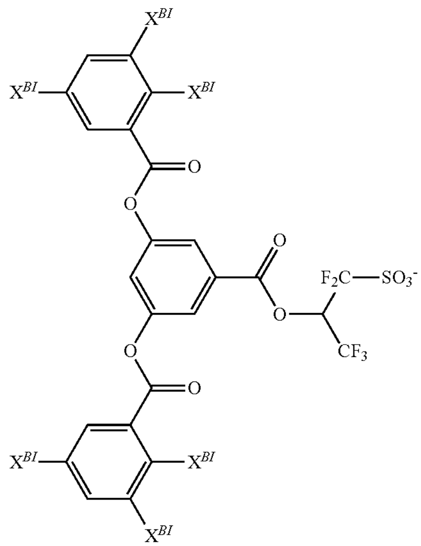
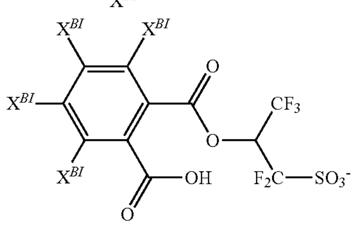
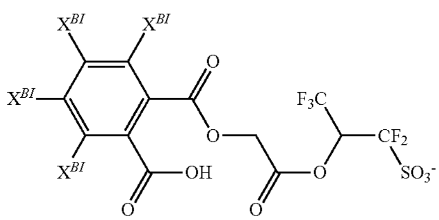
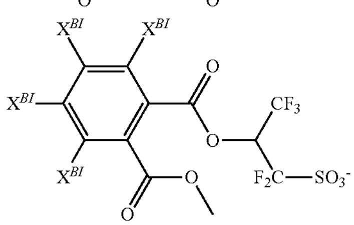
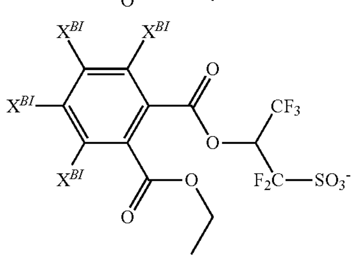
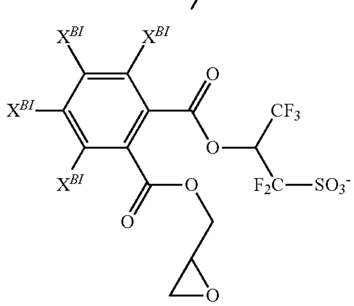
-continued
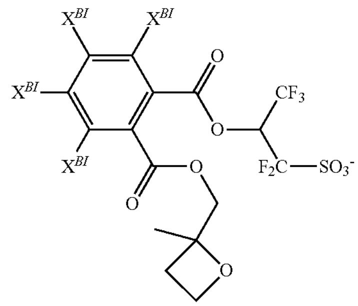
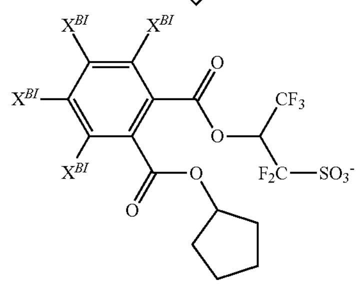
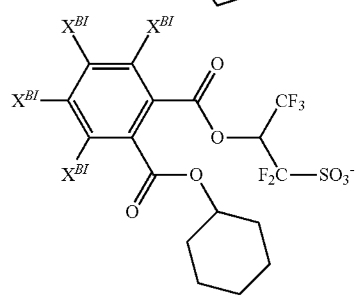
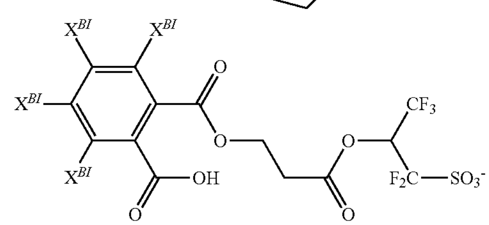
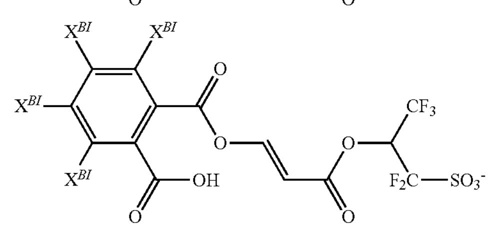
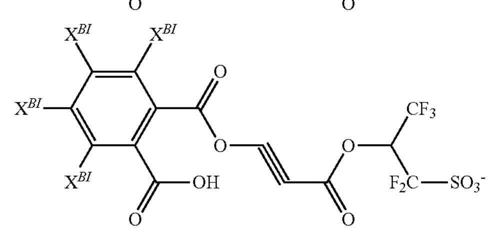
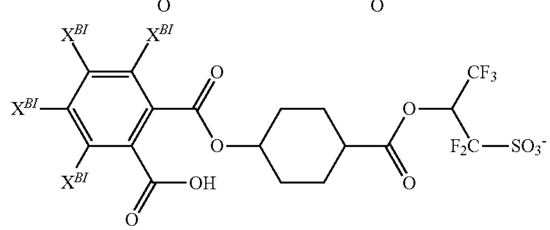

-continued
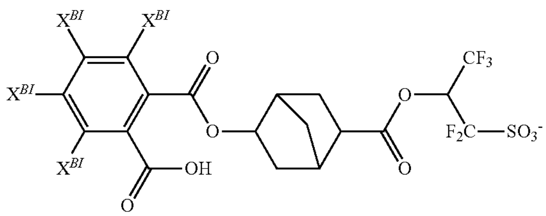
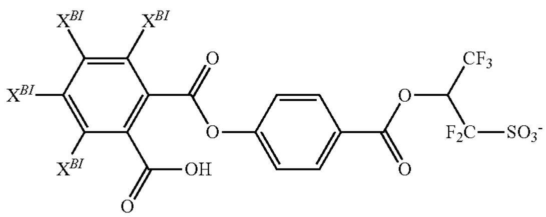
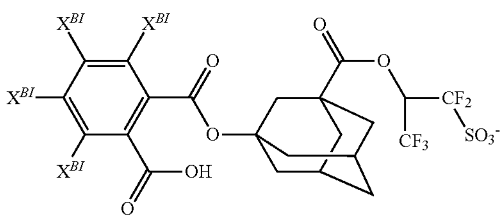
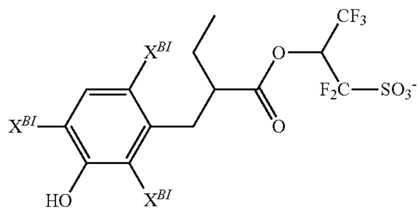
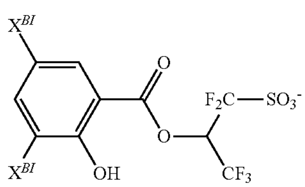
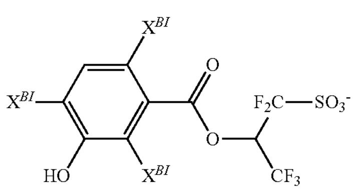
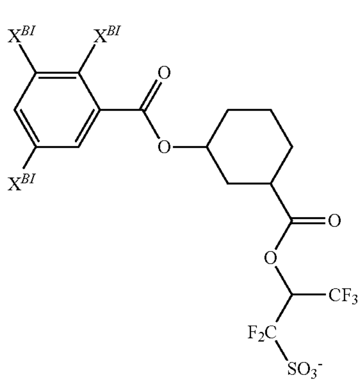
-continued
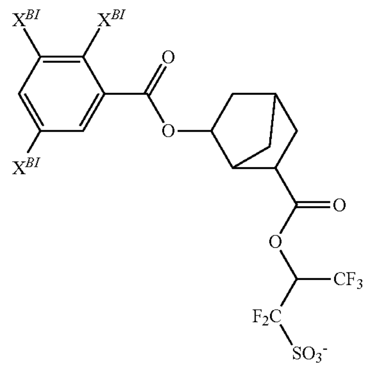
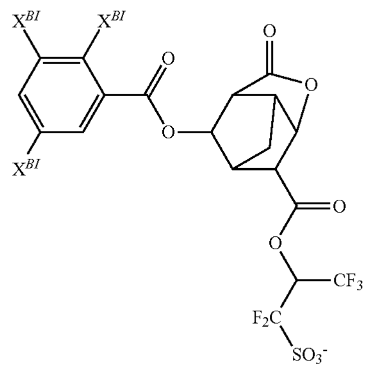
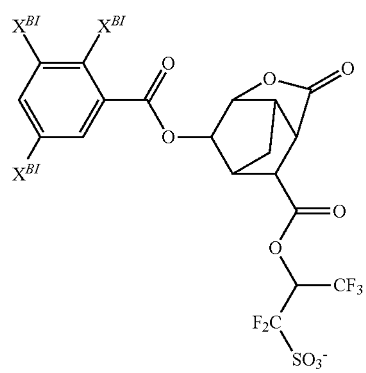
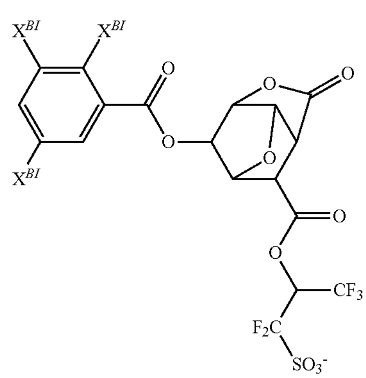

-continued
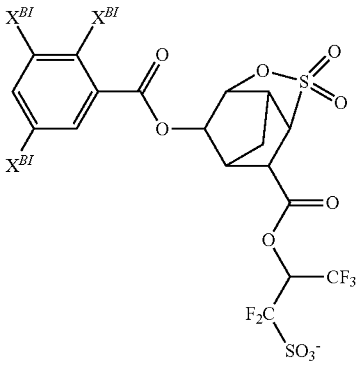
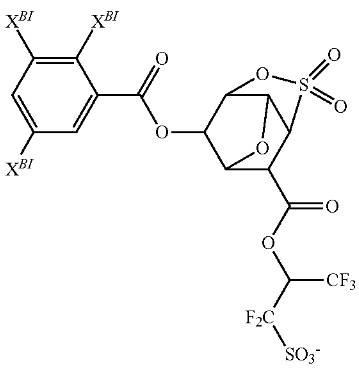
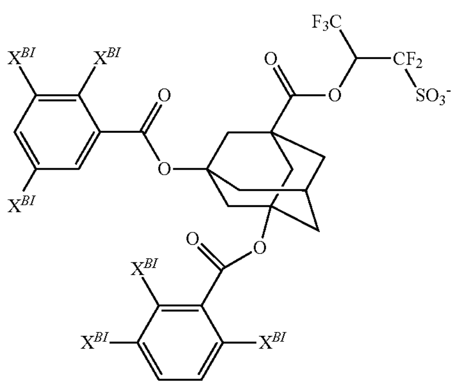
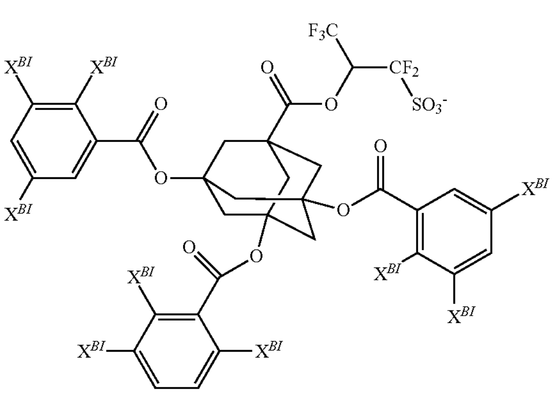
-continued
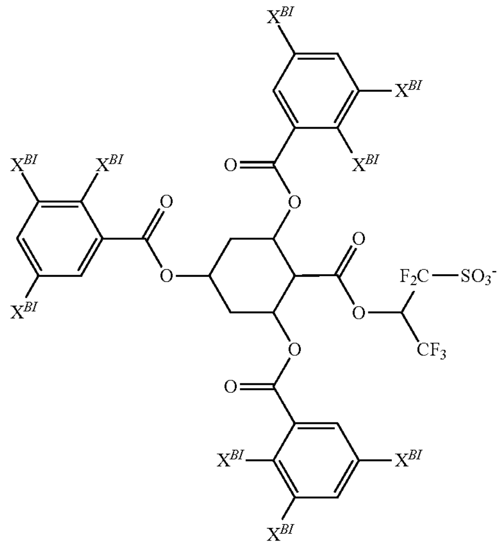
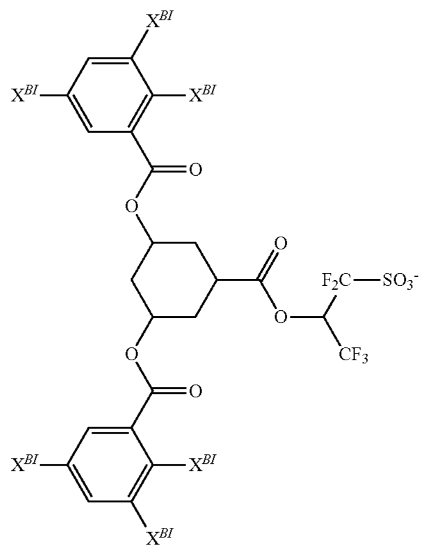
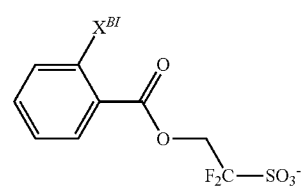
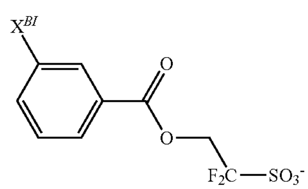
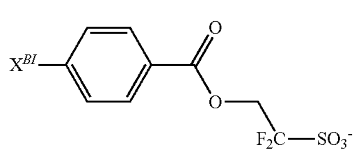

-continued
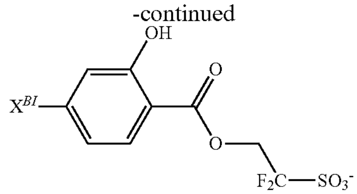
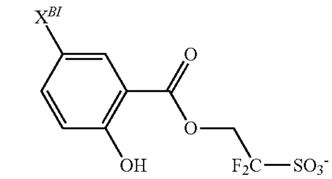
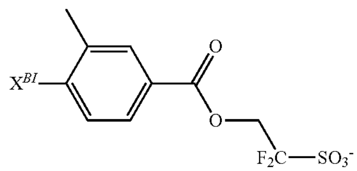
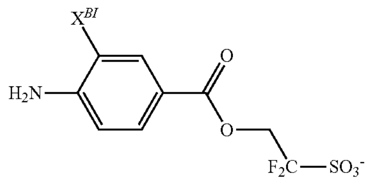
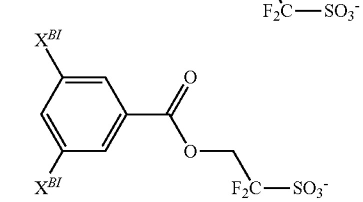
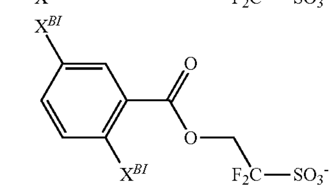
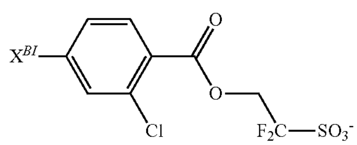
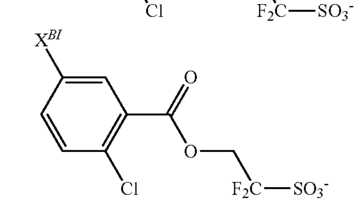
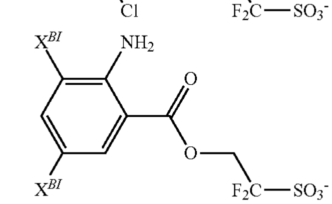
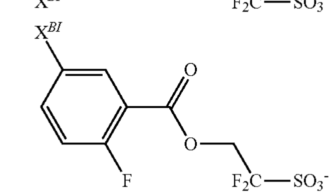
-continued
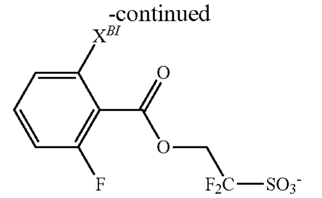
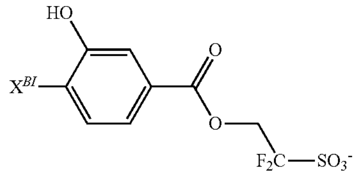
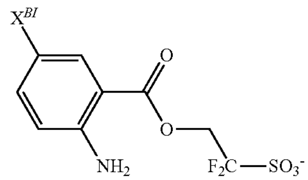
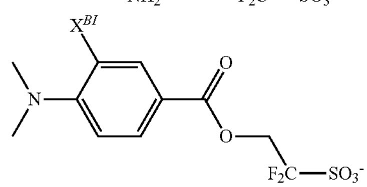
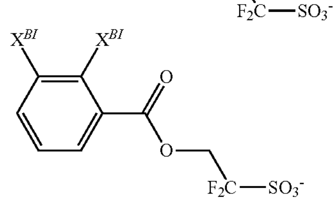
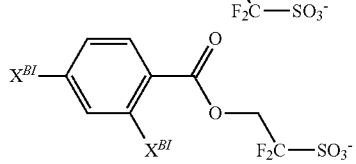
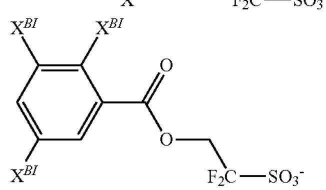
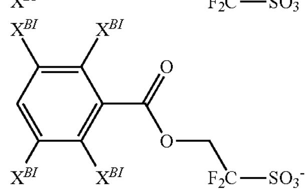
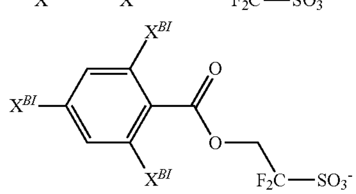
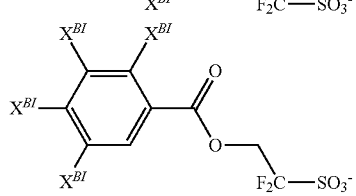

-continued
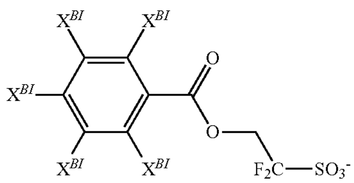
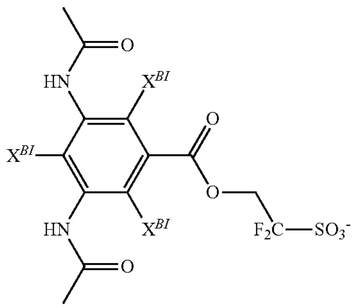
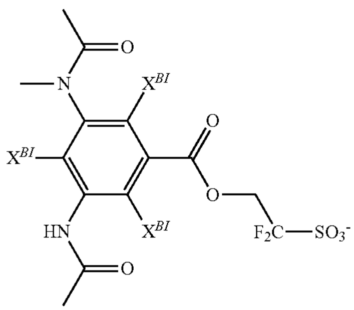
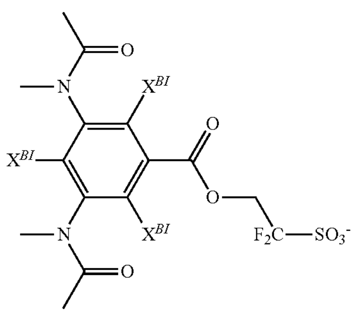
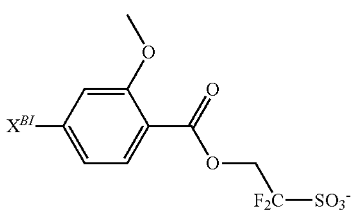
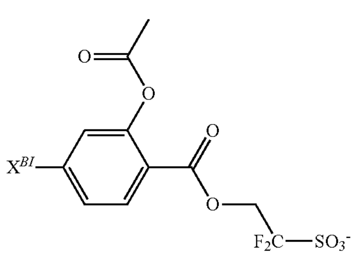
-continued
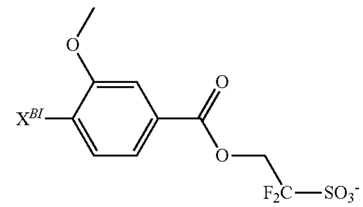
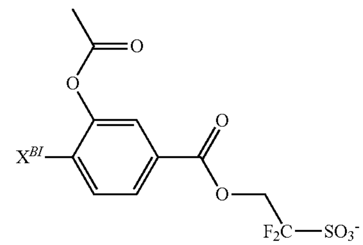
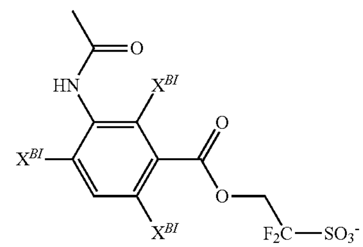
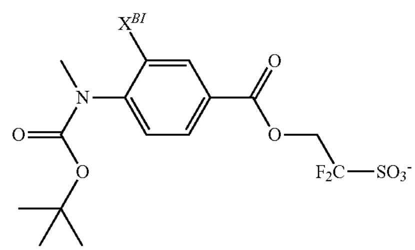
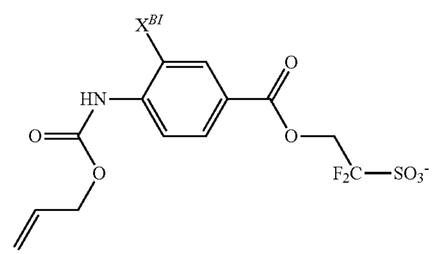
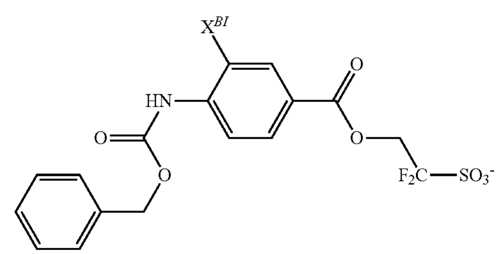
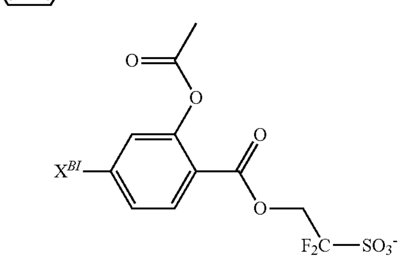

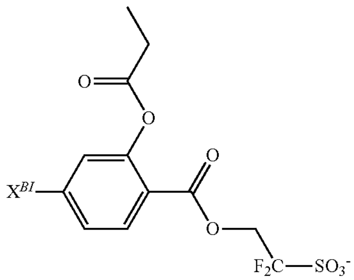
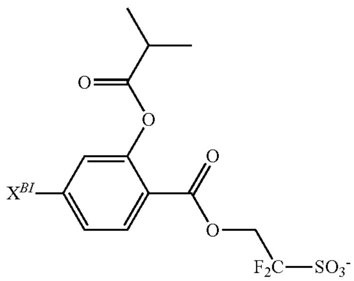
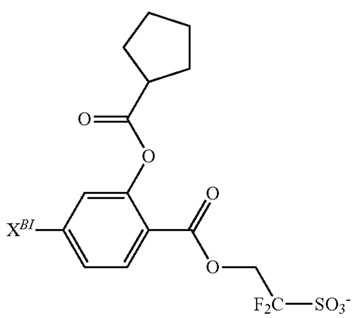
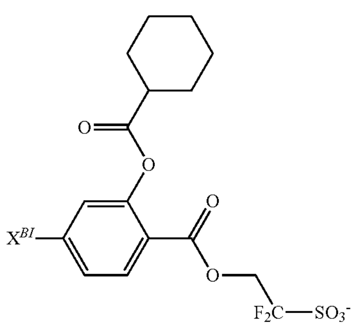
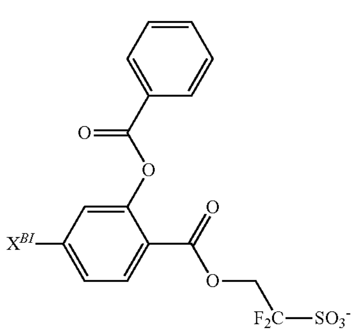
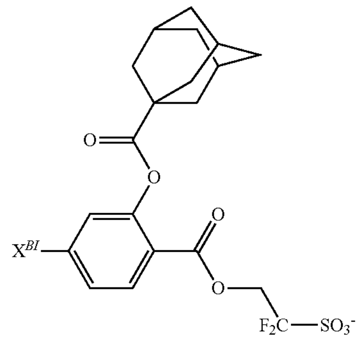
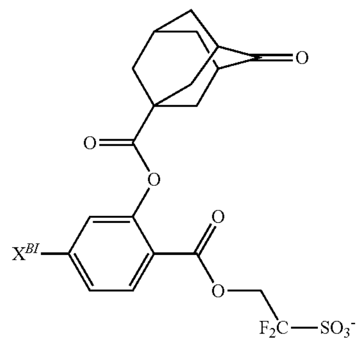
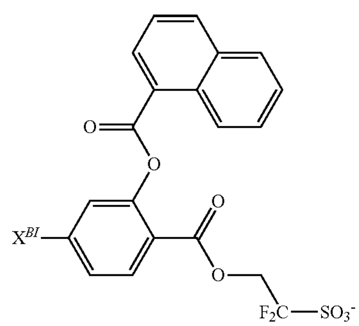
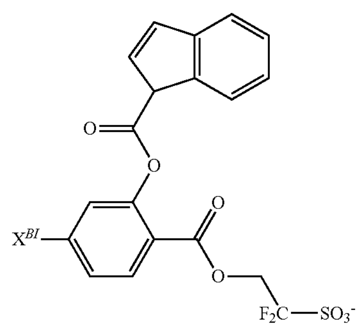
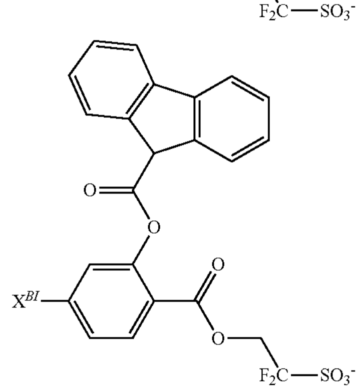

-continued
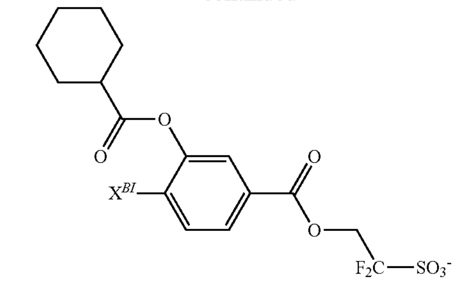
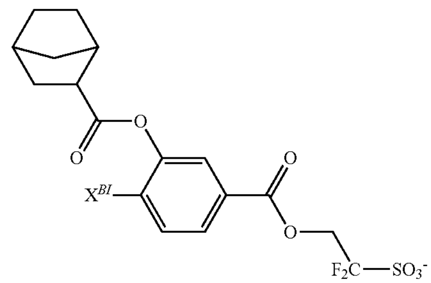
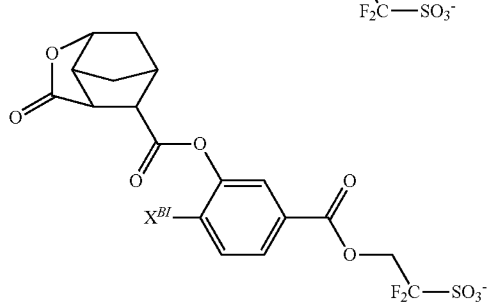
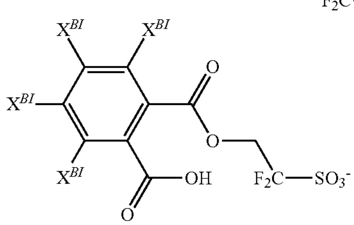
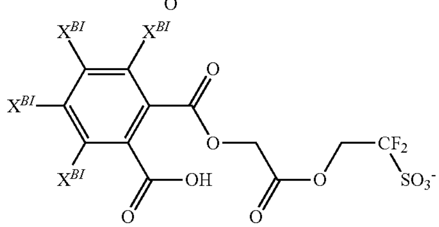
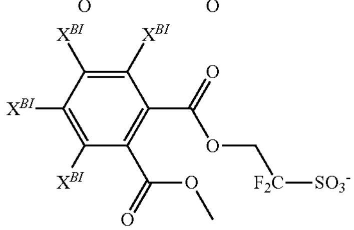
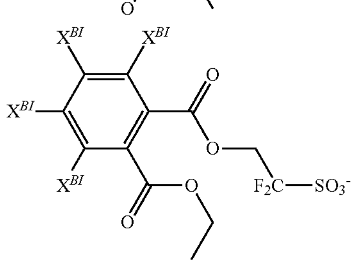
-continued
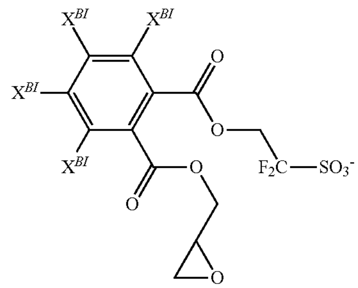
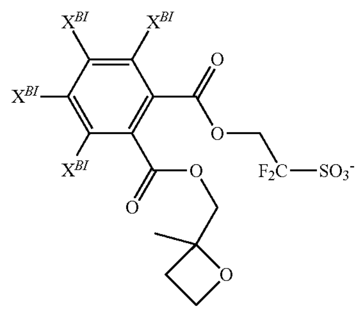
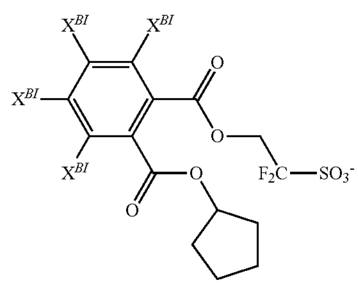
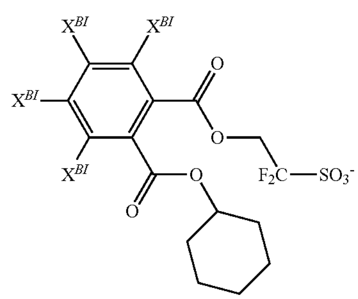
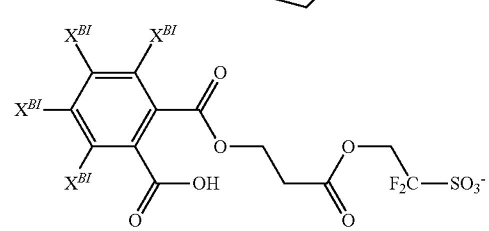
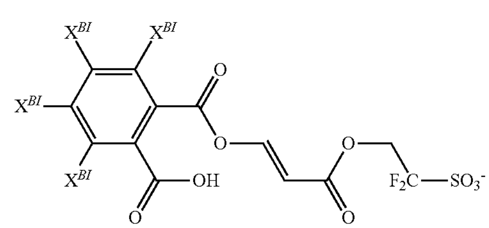

-continued
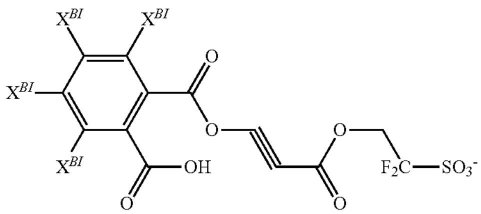
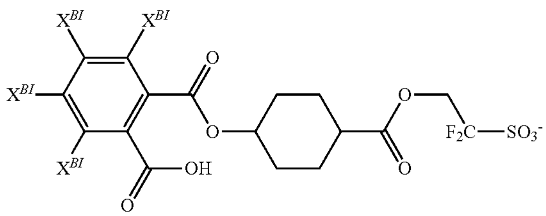
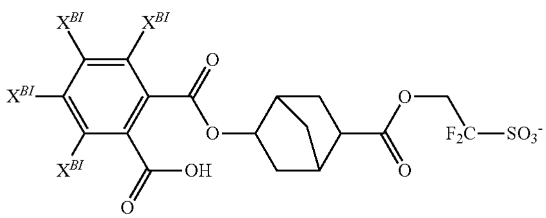
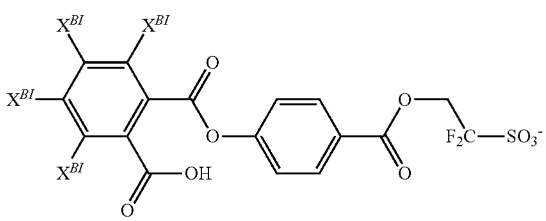
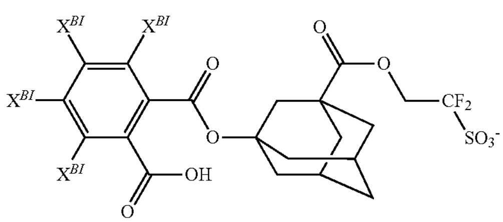
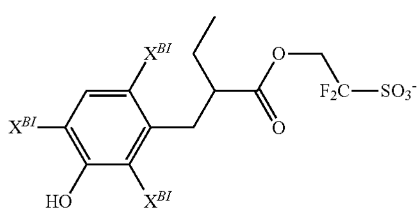
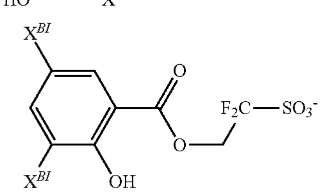
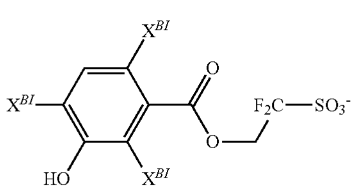
-continued
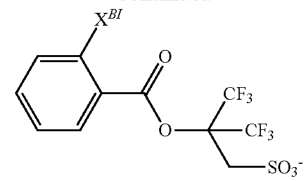
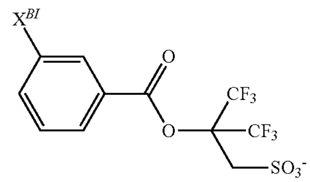
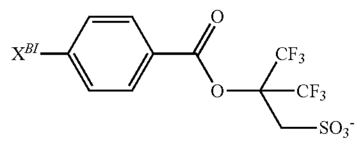
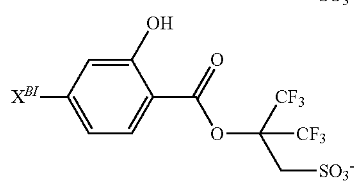
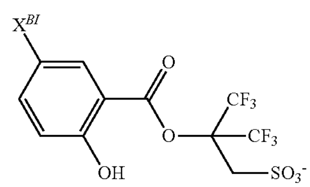
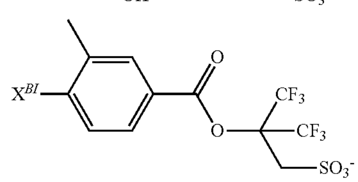
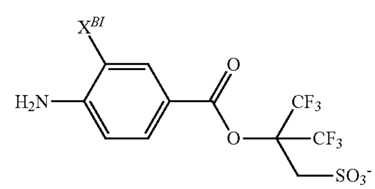
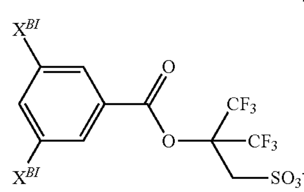
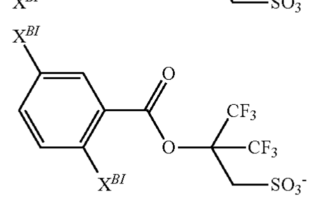
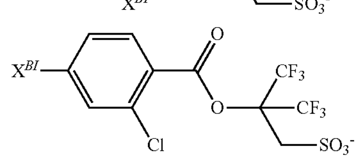

-continued
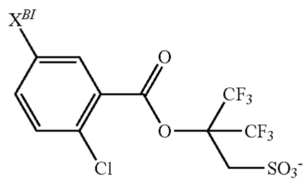
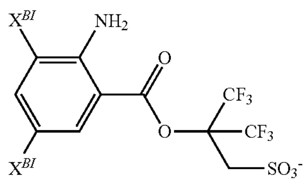
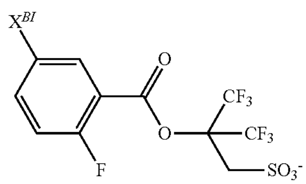
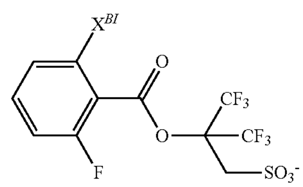
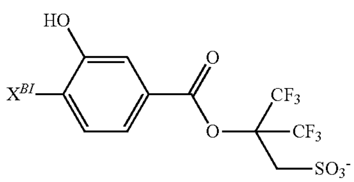
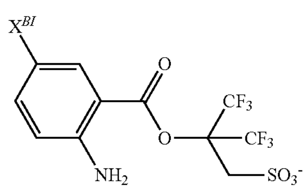
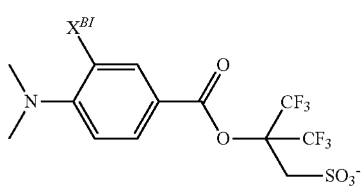
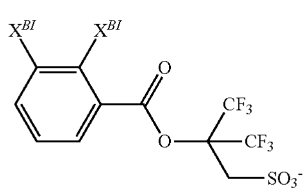
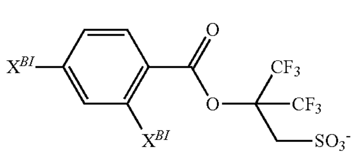
-continued
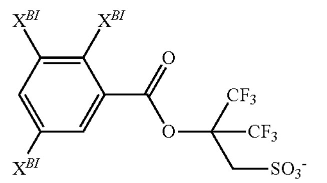
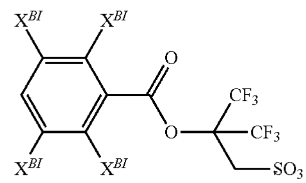
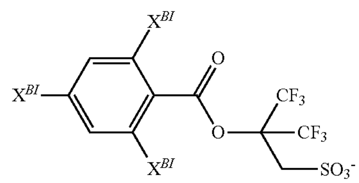
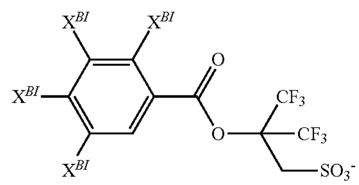
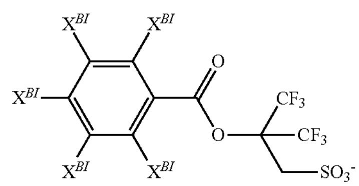
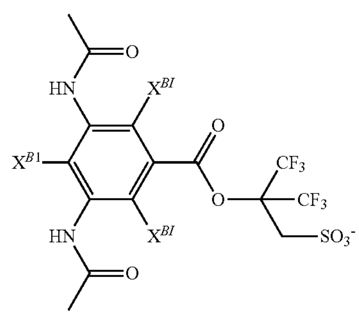
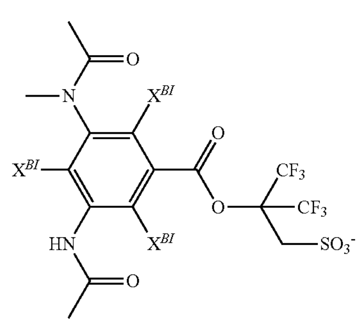

-continued
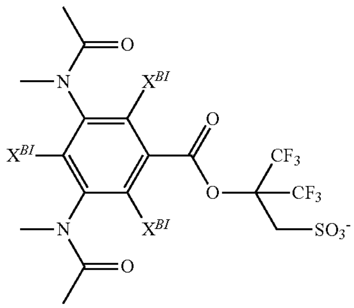
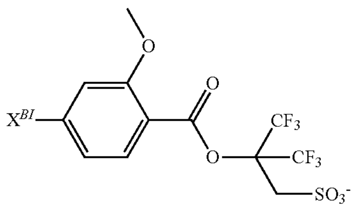
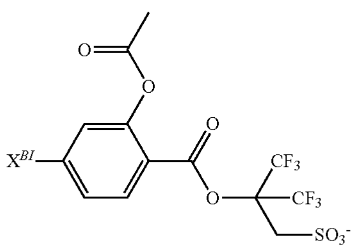
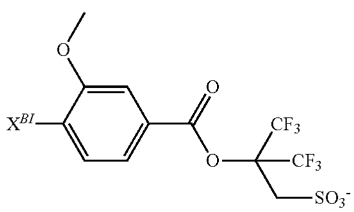
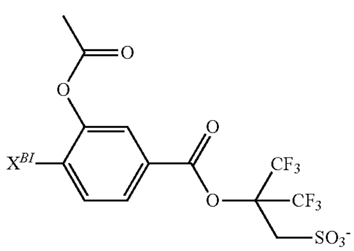
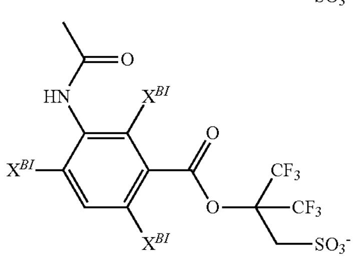
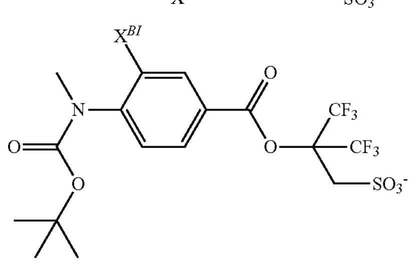
-continued
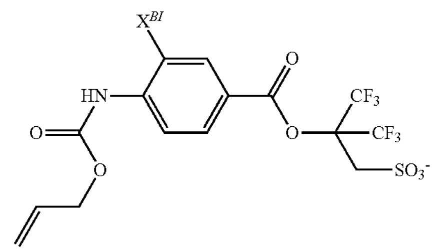
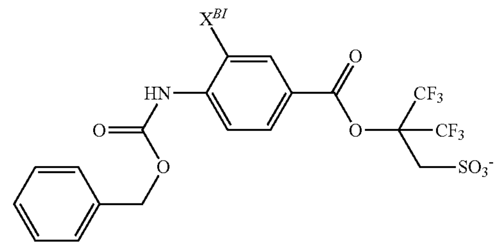
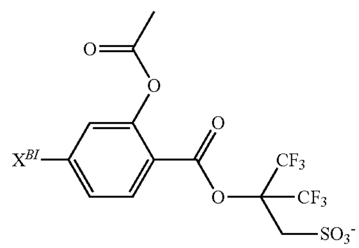
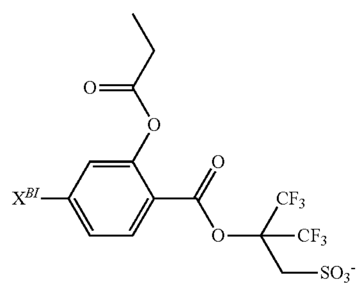
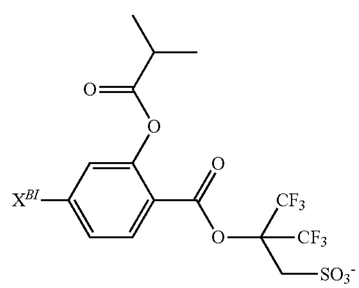
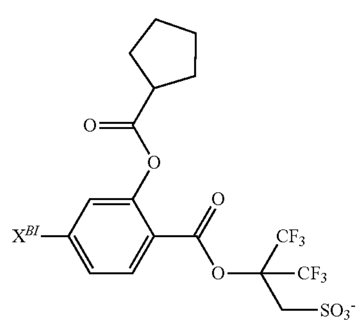

-continued
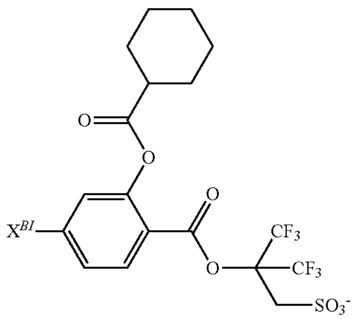
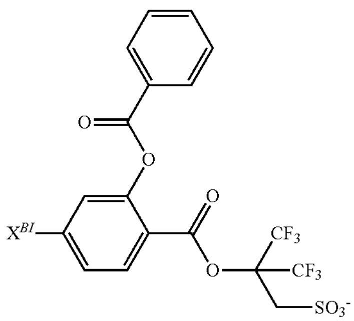
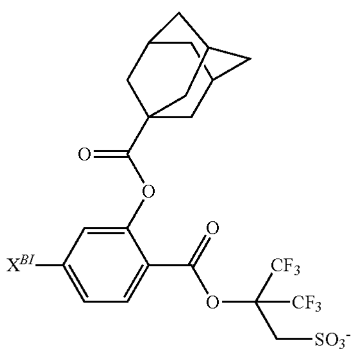
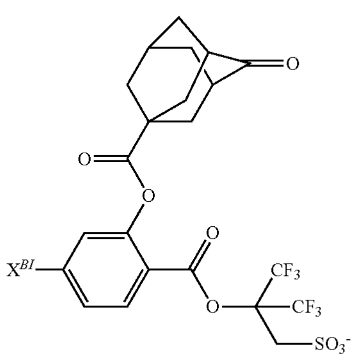
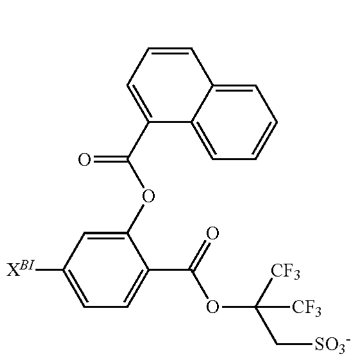
-continued
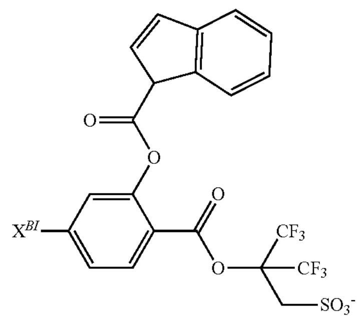
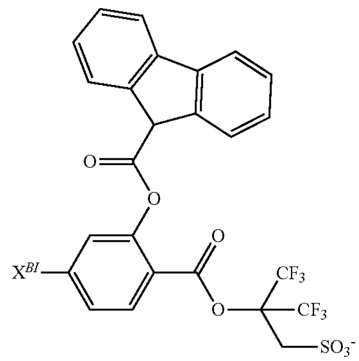
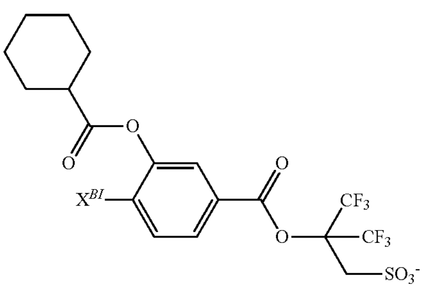
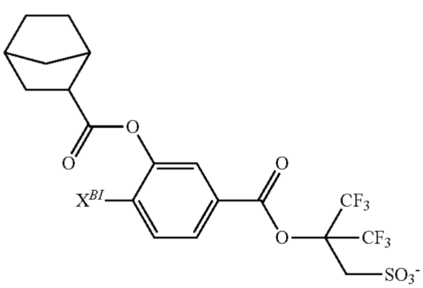
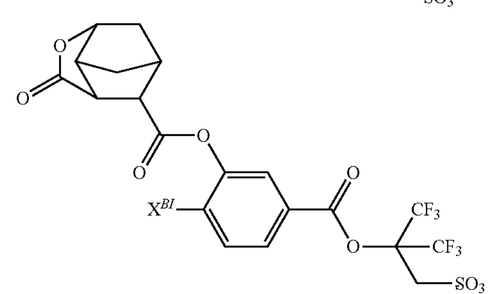
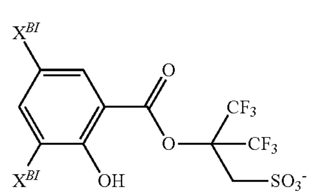

-continued
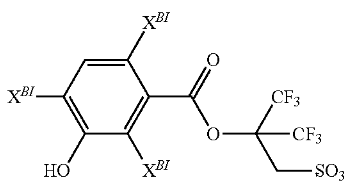
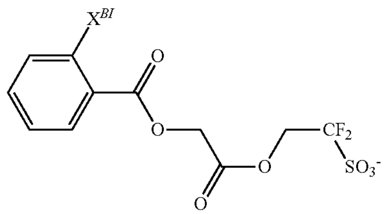
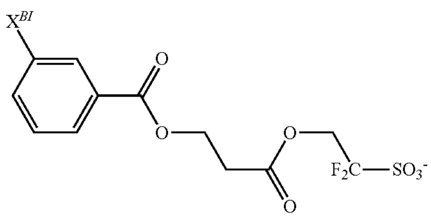
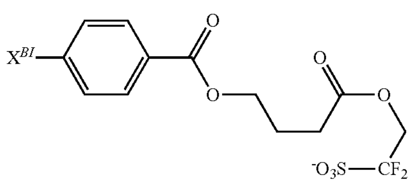
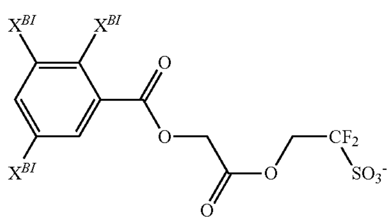
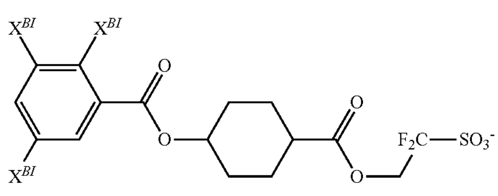
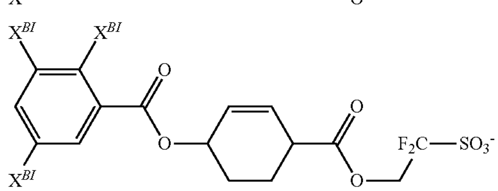
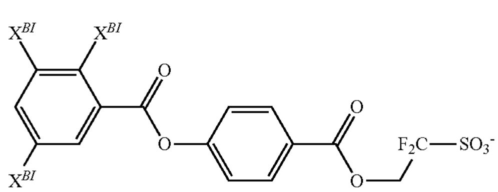
-continued
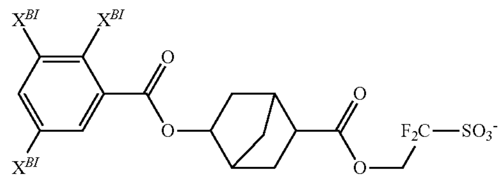
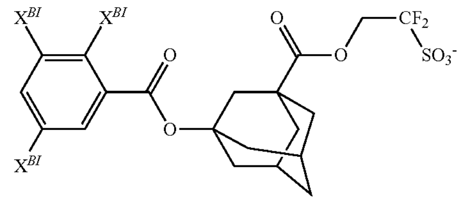
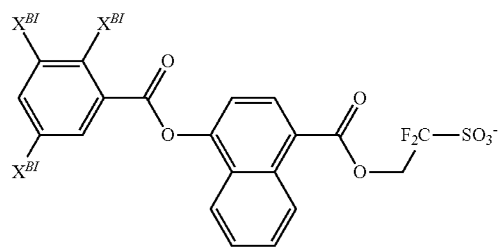
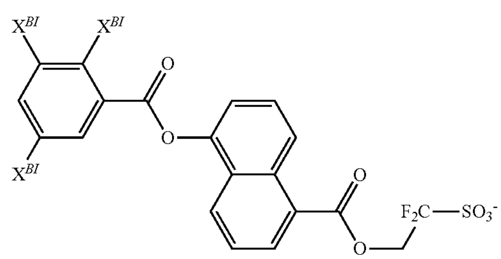
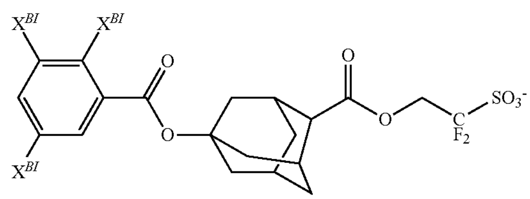
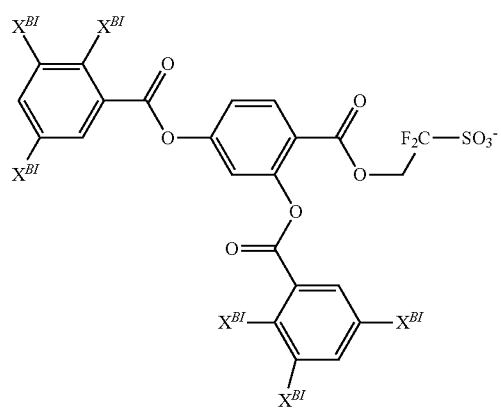

-continued
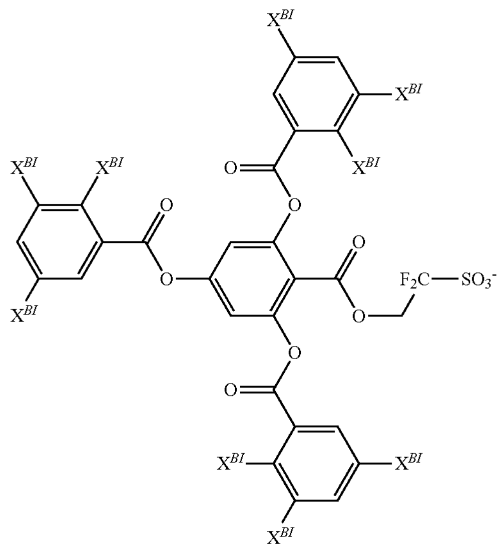
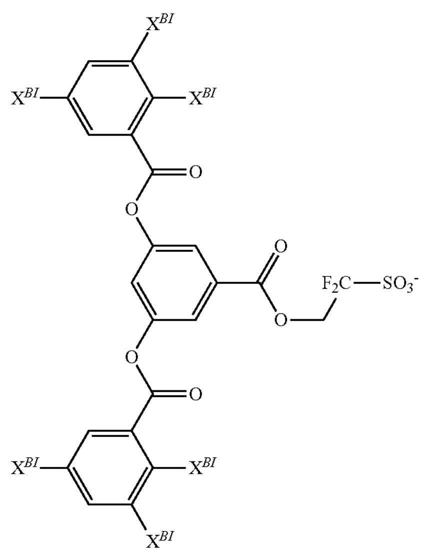
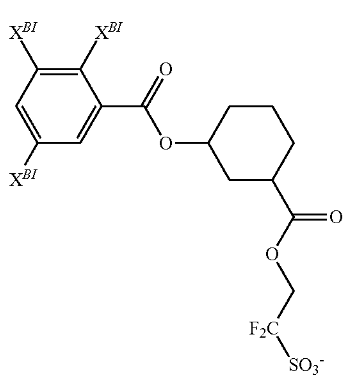
-continued
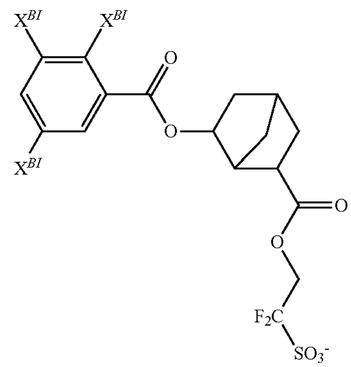
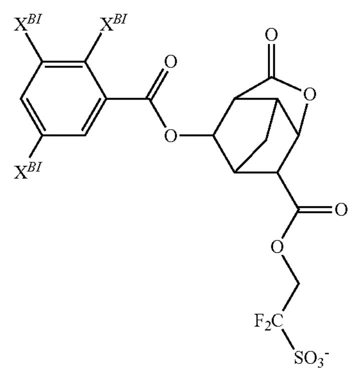
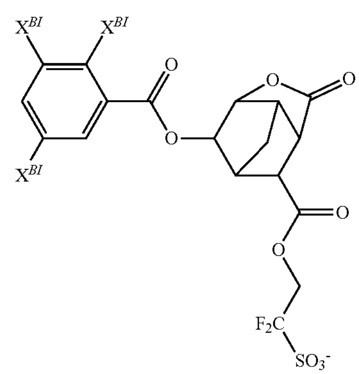
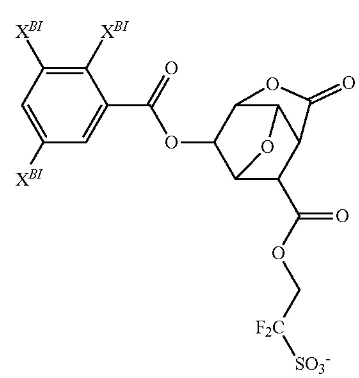

-continued
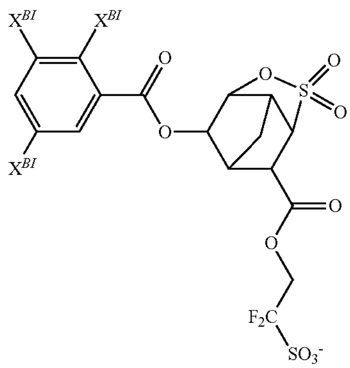
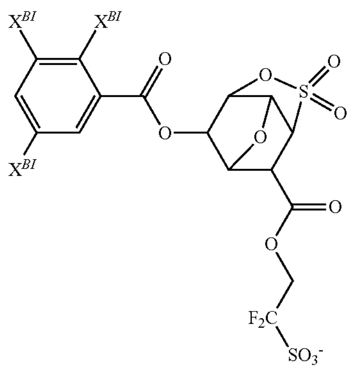
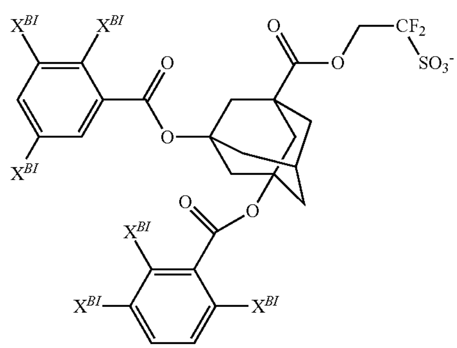
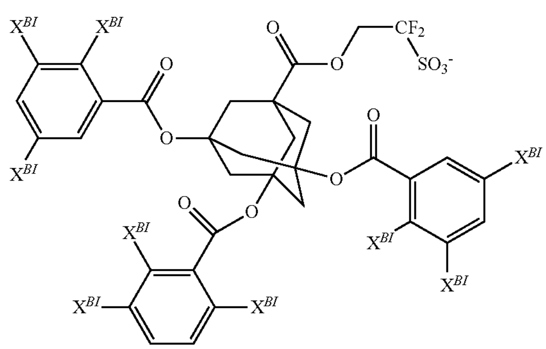
-continued
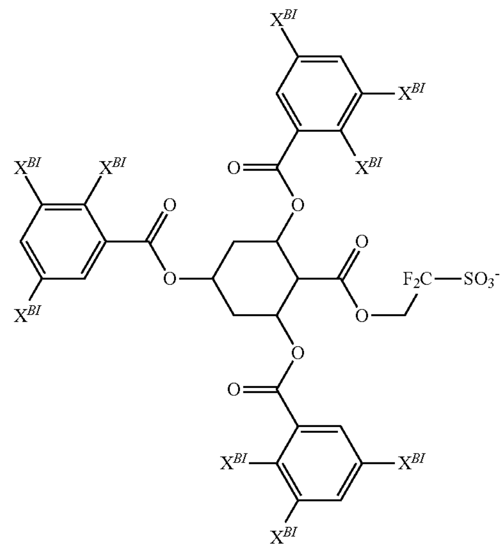
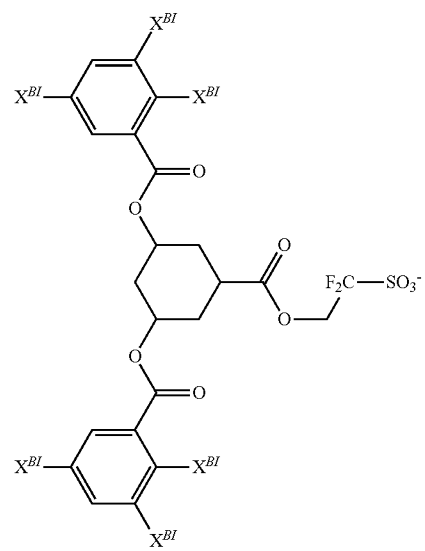
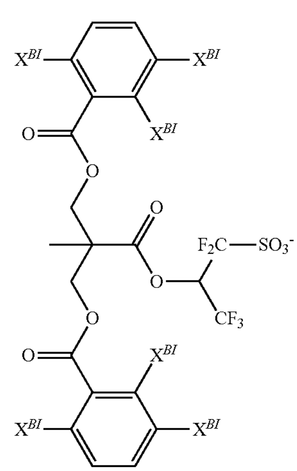

-continued
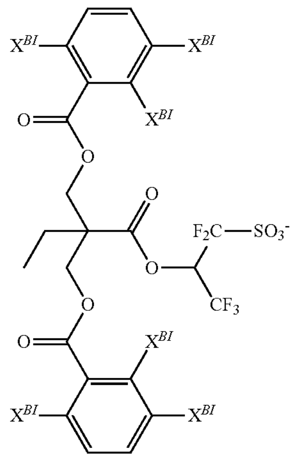
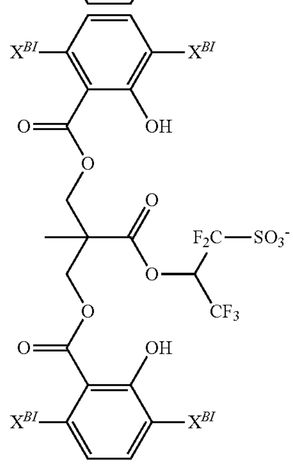
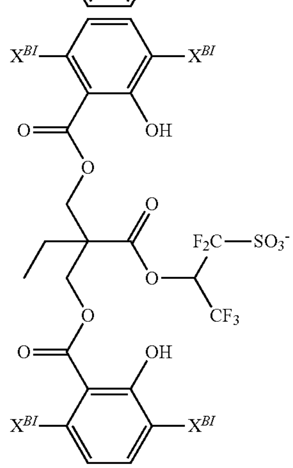
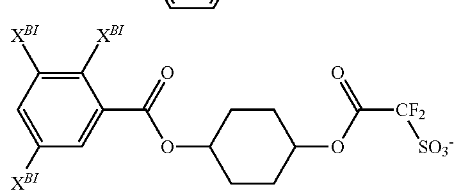
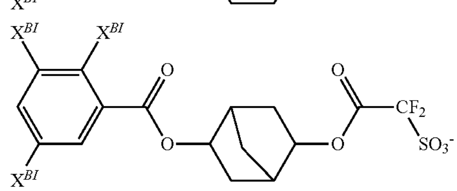
-continued
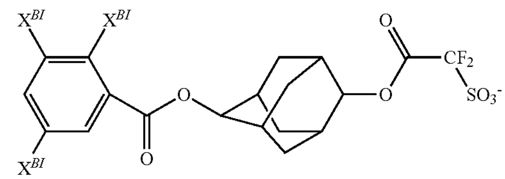
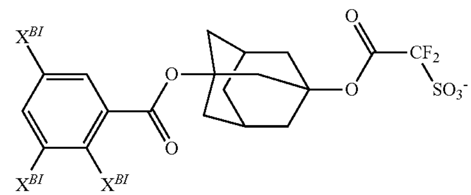
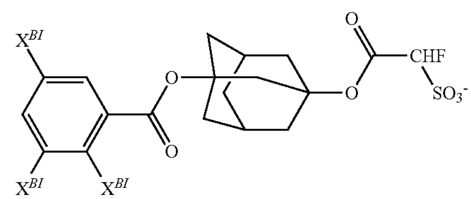
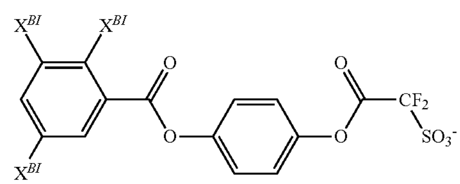
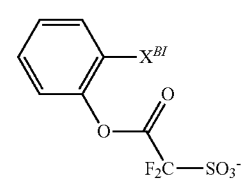
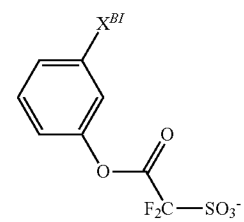
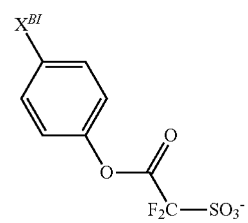
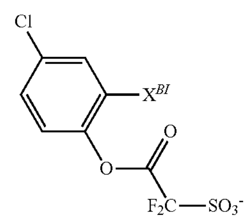
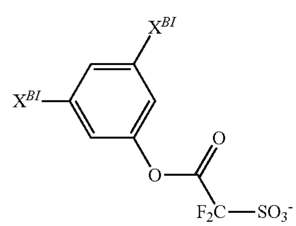
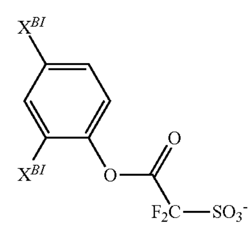
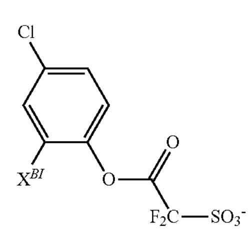
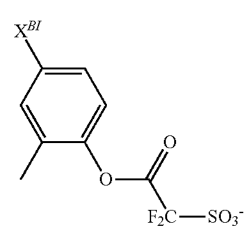

-continued
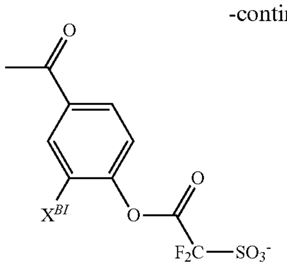
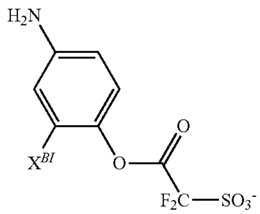
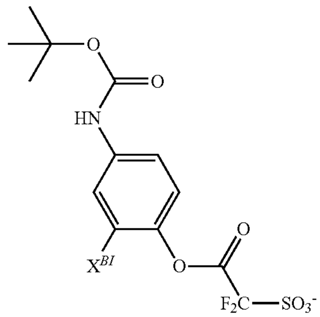
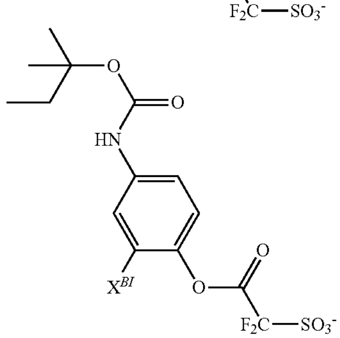
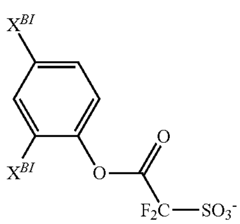
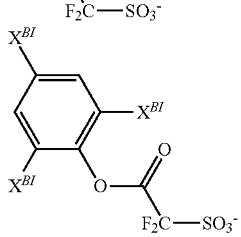
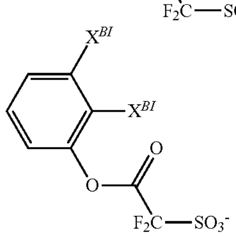
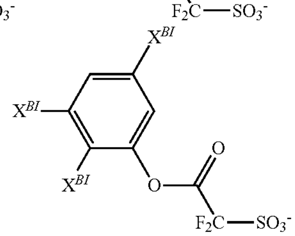
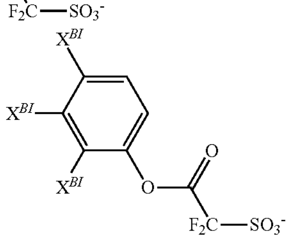
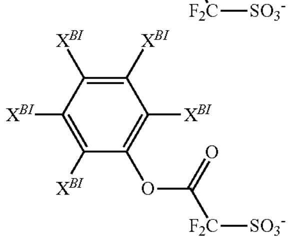
-continued
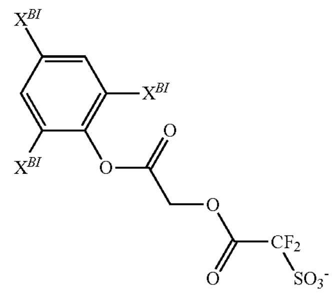
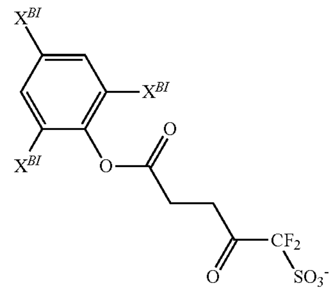
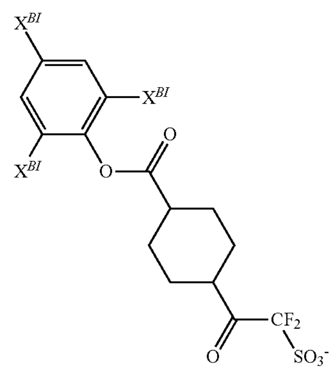
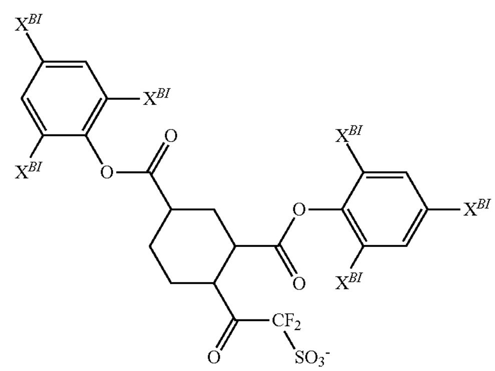
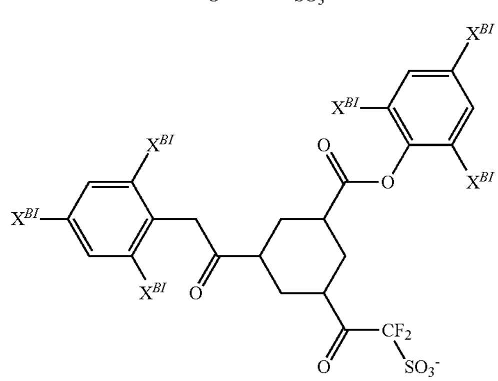

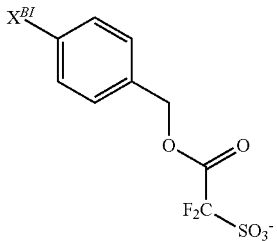
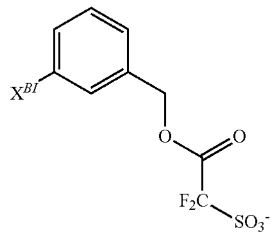
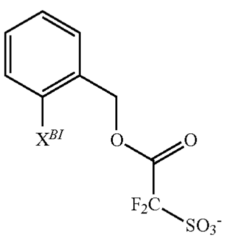
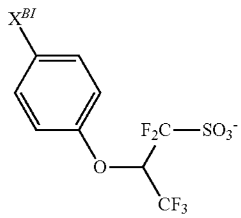
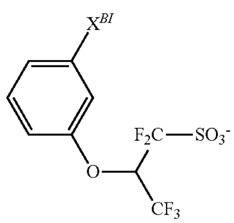
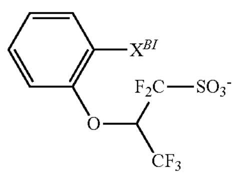
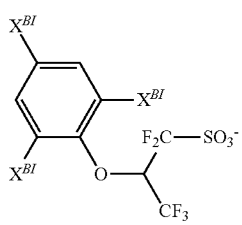
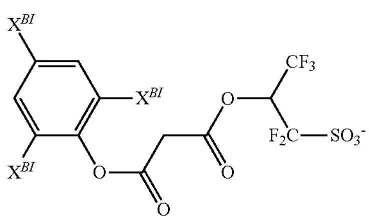
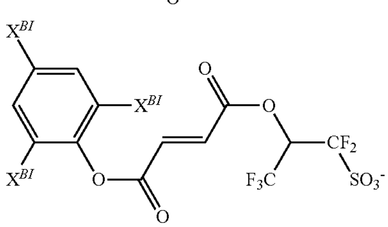
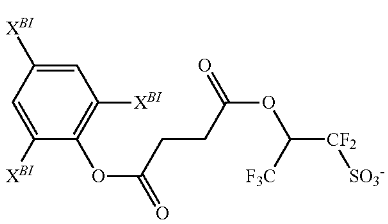
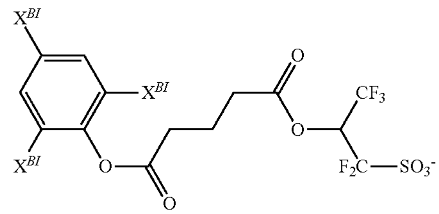
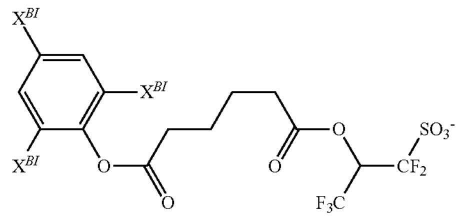
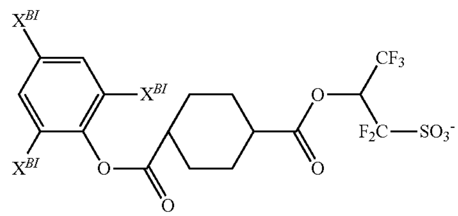
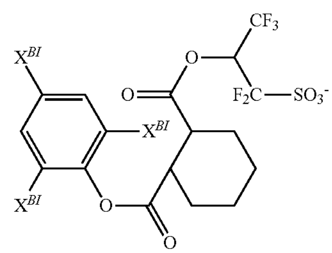
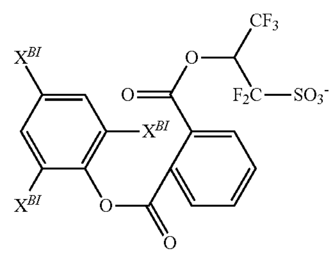
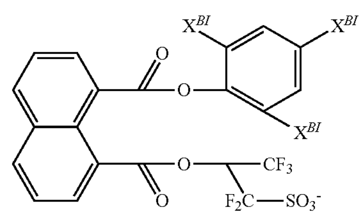
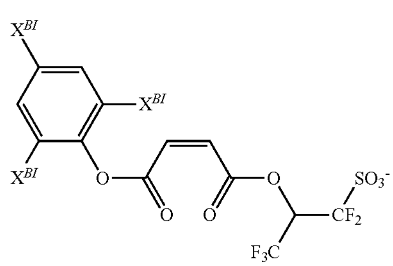

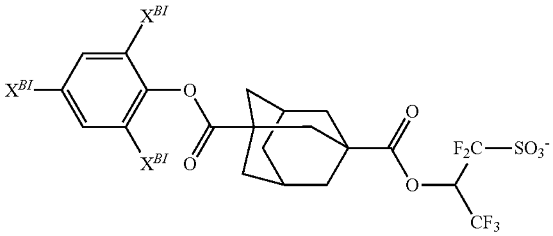
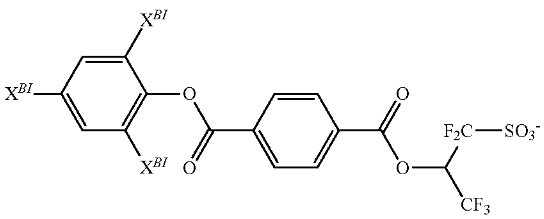
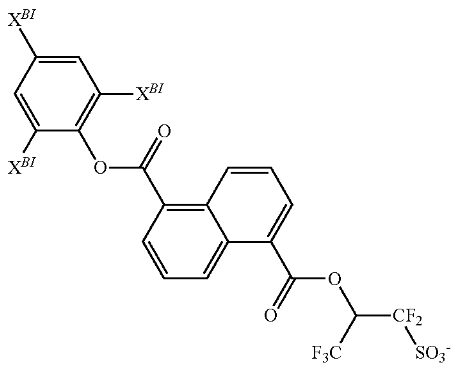
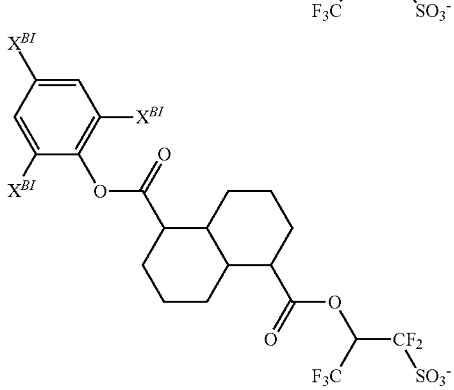
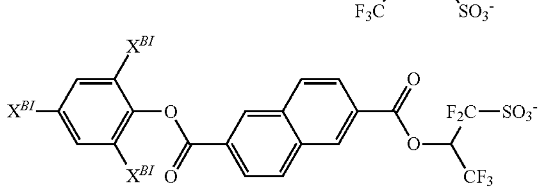
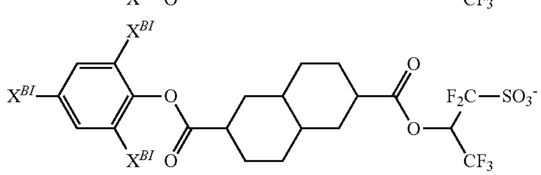
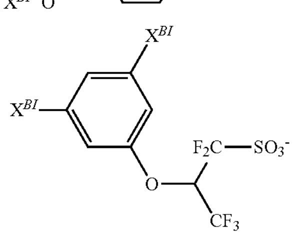
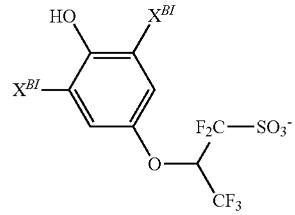
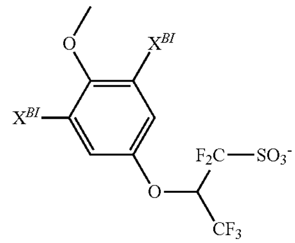
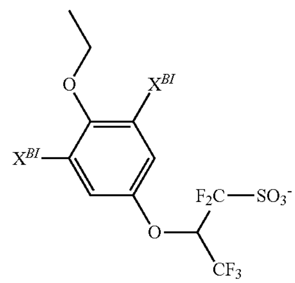
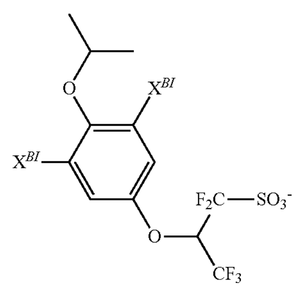
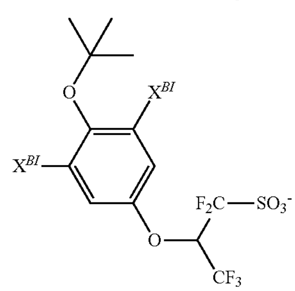
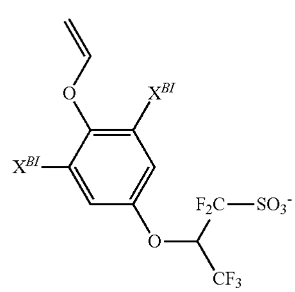

-continued
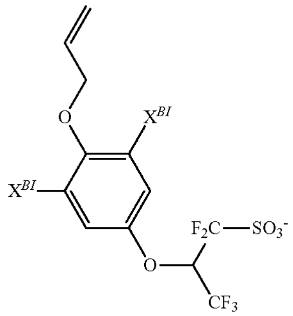
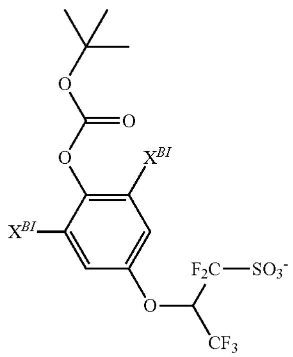
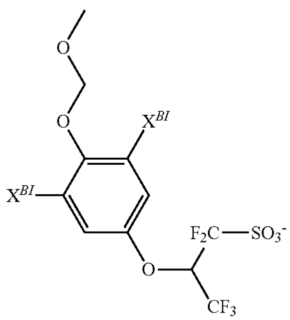
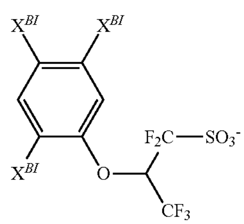
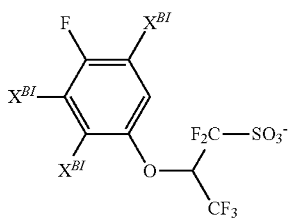
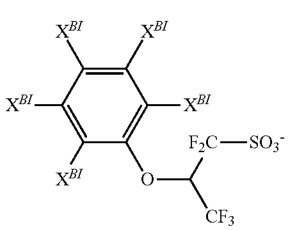
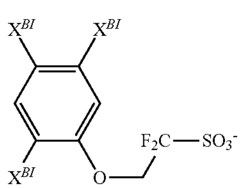
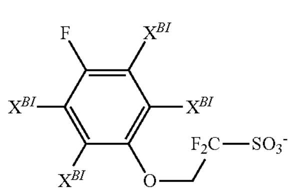
-continued
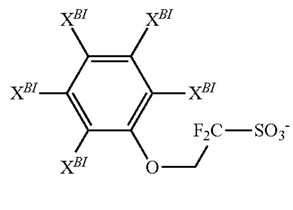
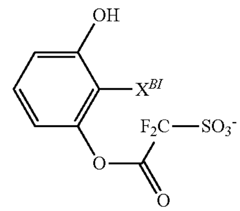
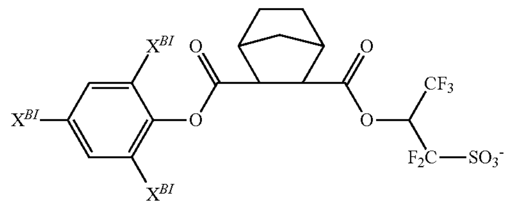
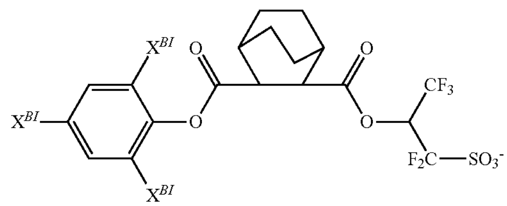
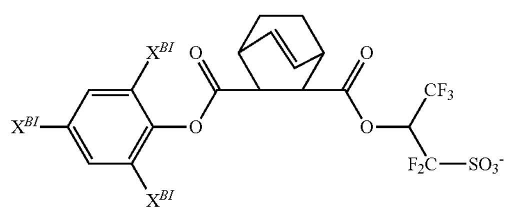
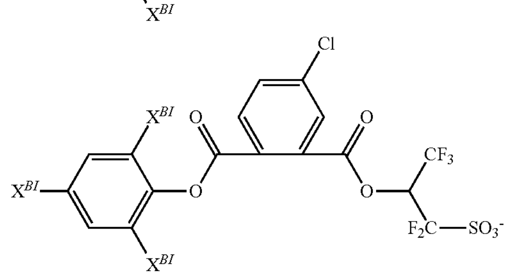
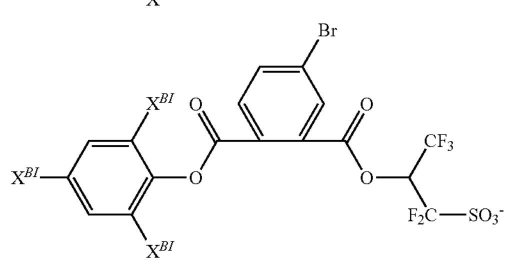
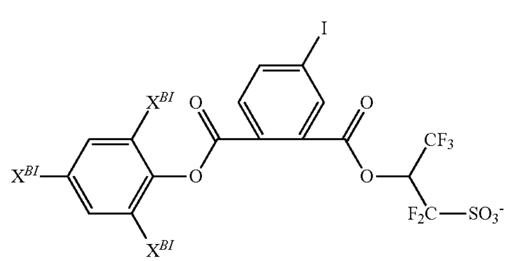

-continued
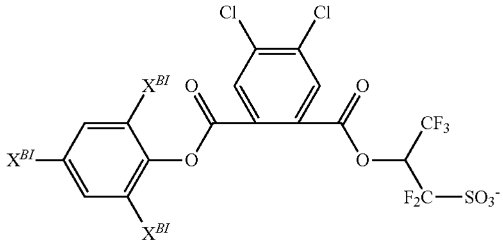
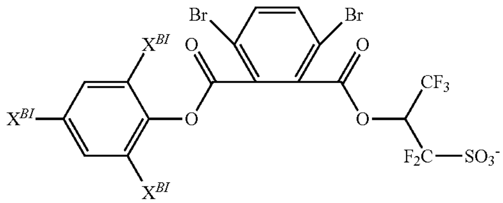
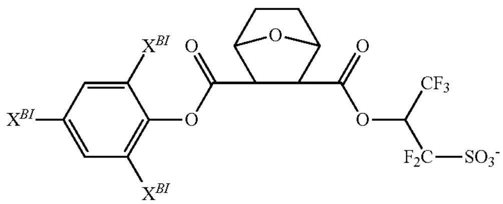
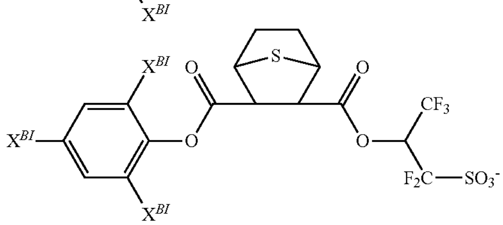
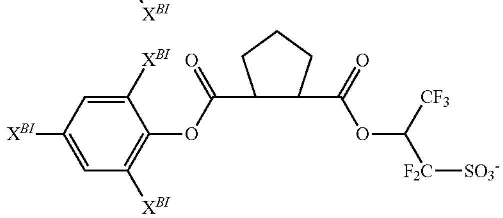
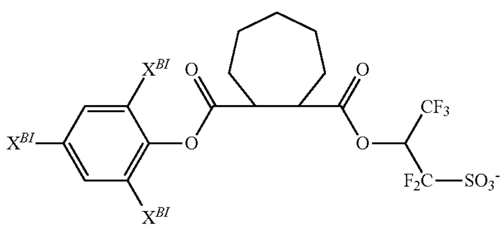
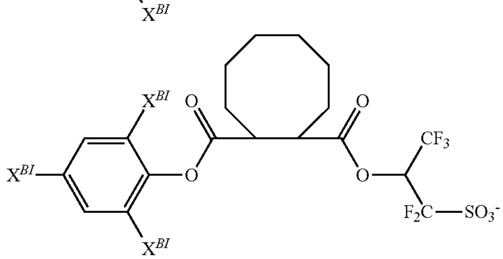
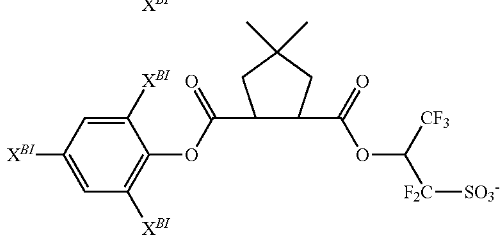
-continued
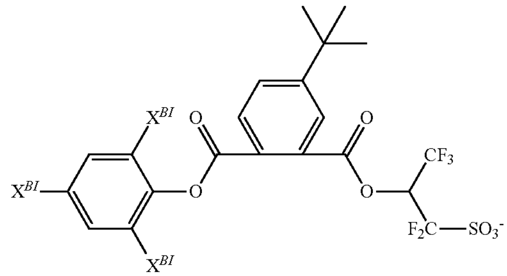
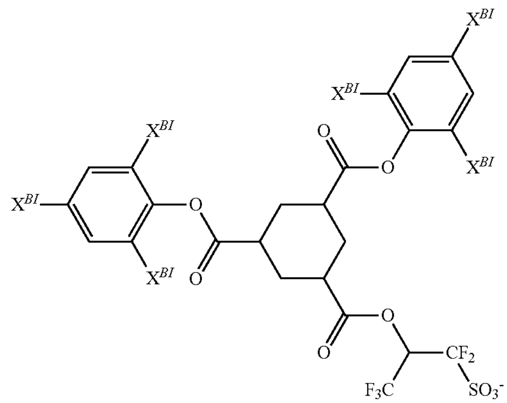
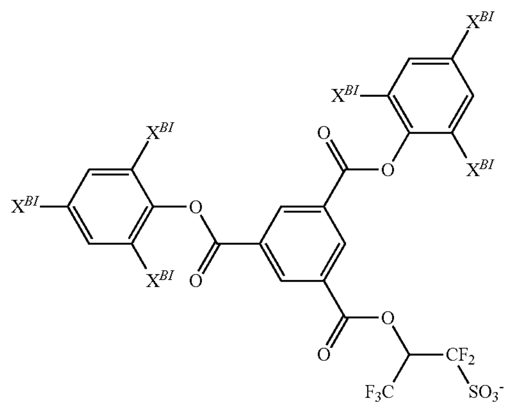
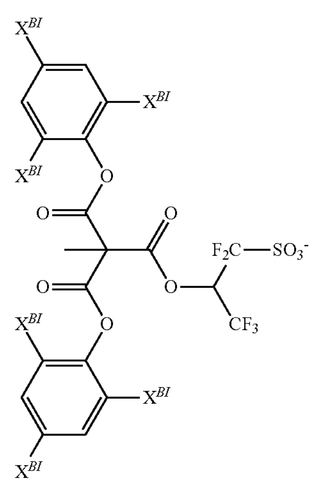

-continued
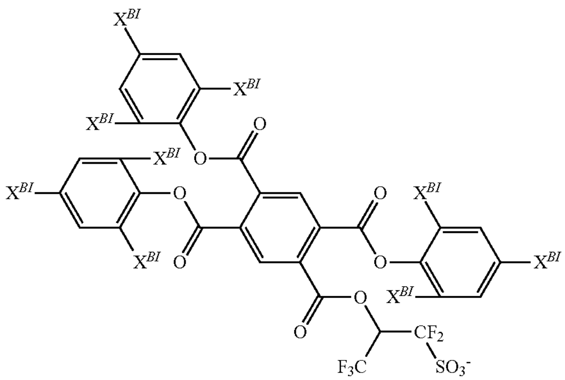
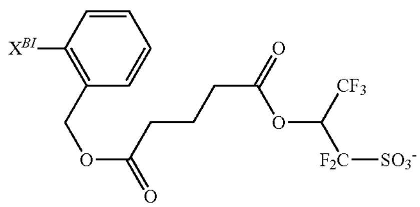
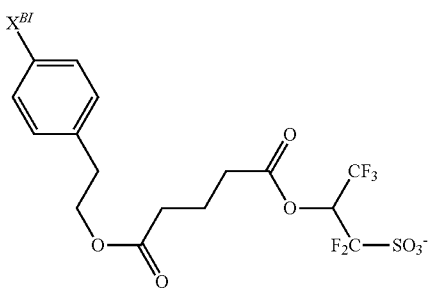
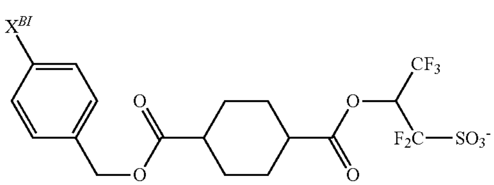
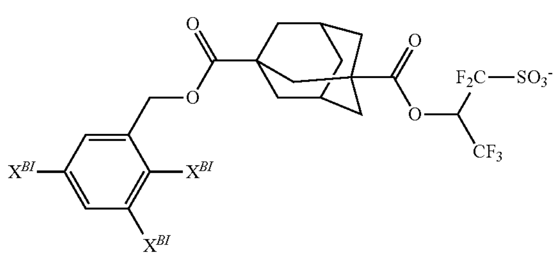
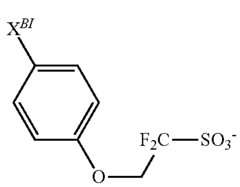
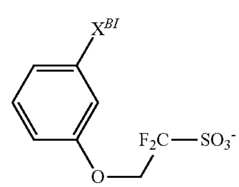
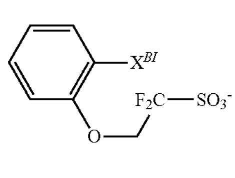
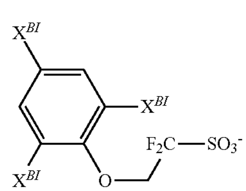
-continued
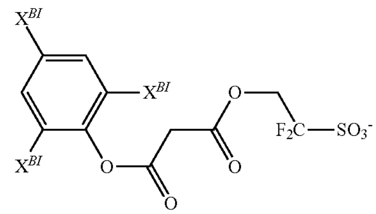
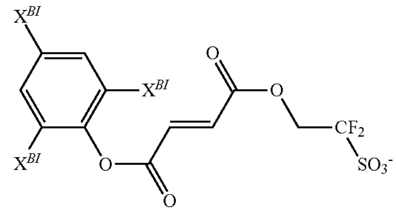
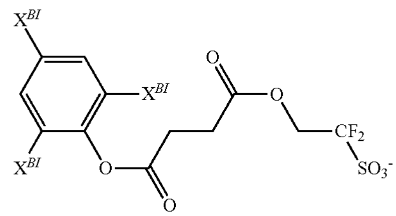
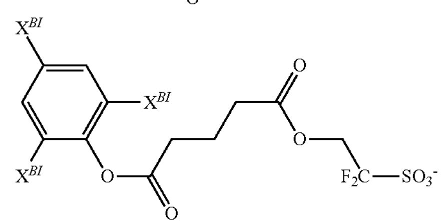
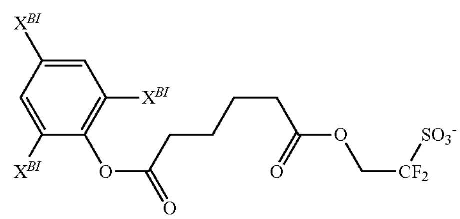
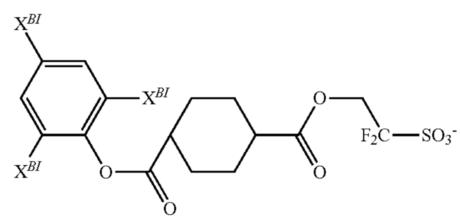
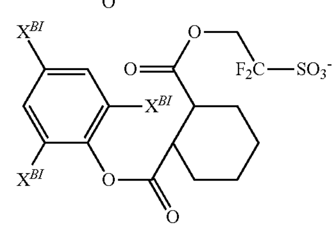
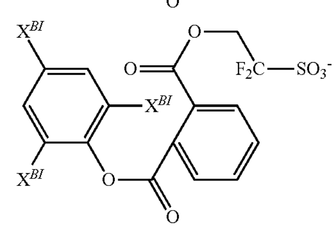

-continued
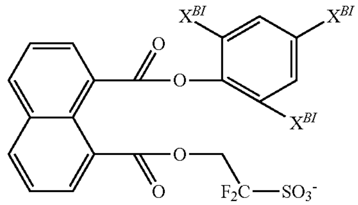
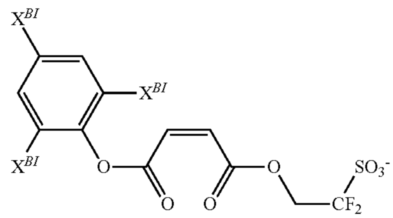
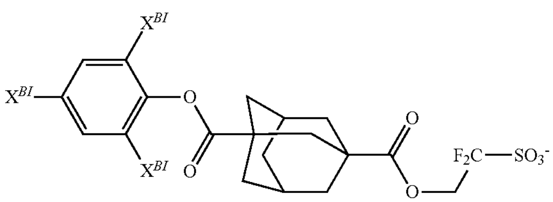
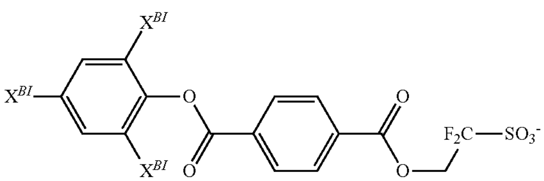
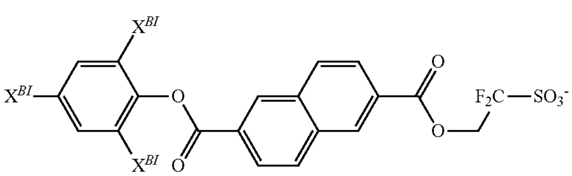
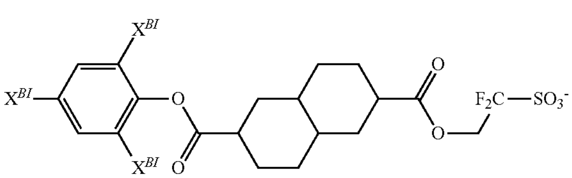
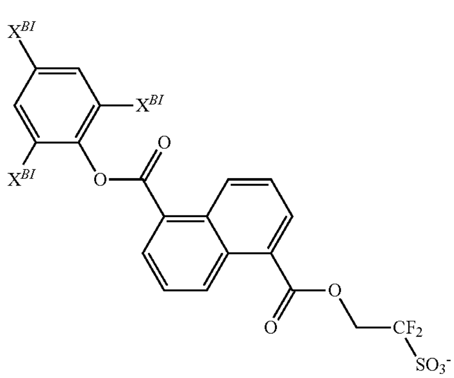
-continued
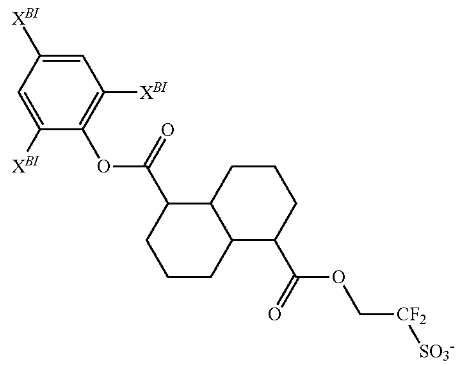
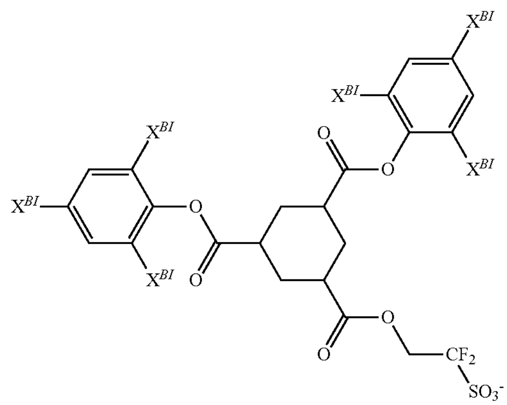
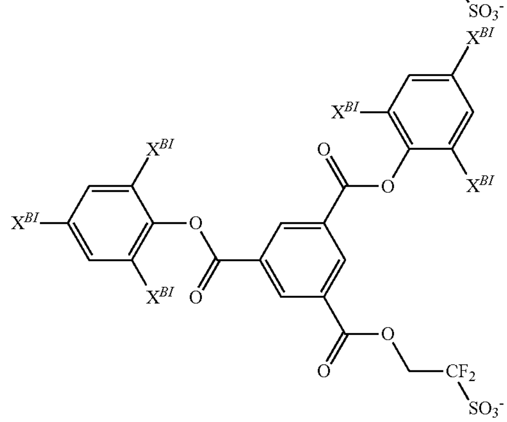
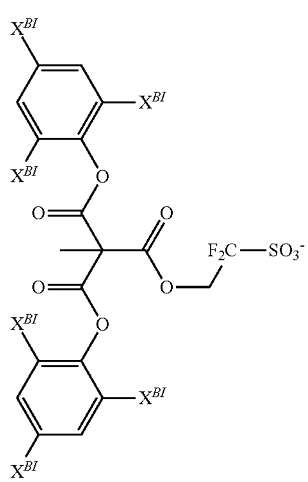

-continued
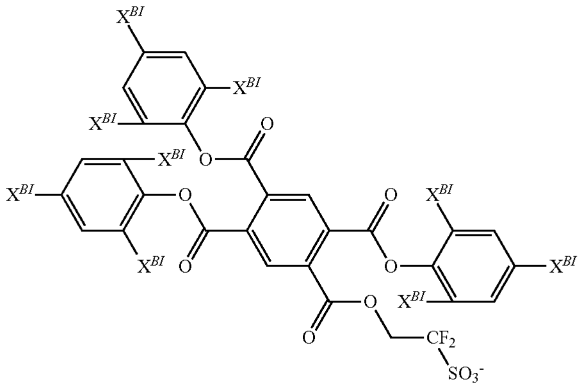
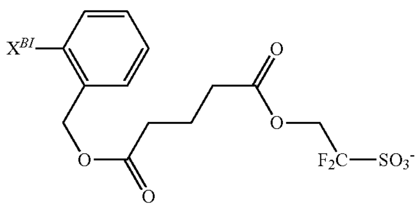
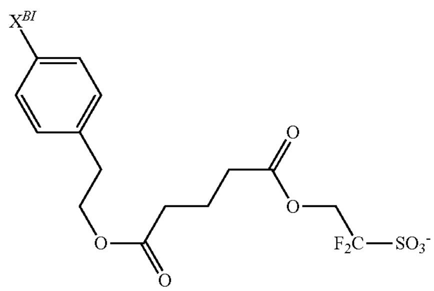
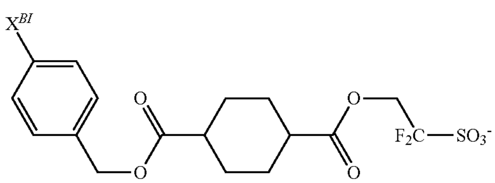
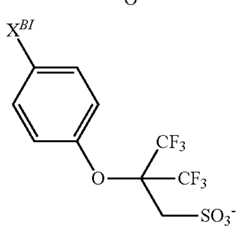
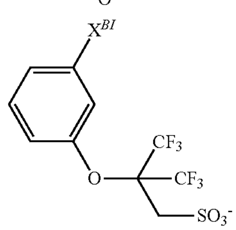
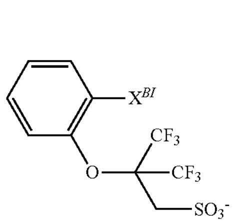
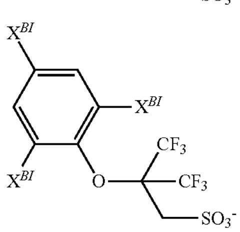
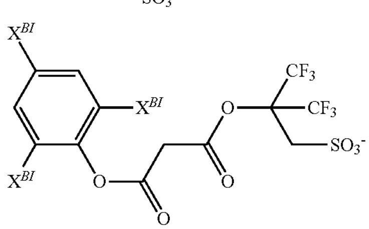
-continued
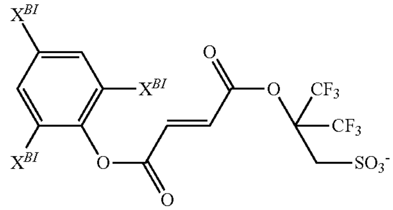
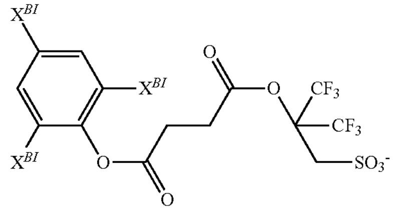
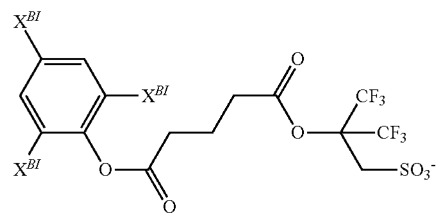
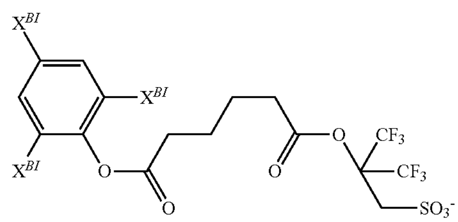
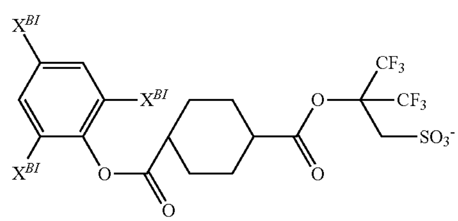
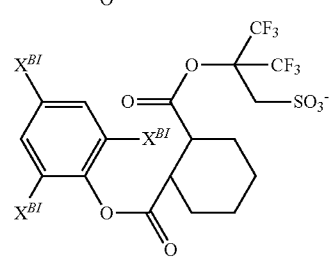
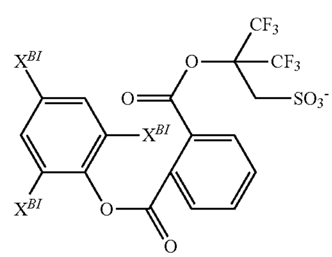

-continued
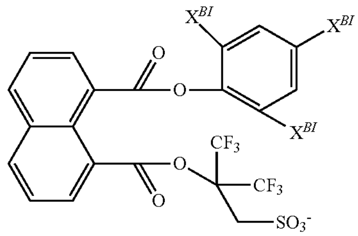
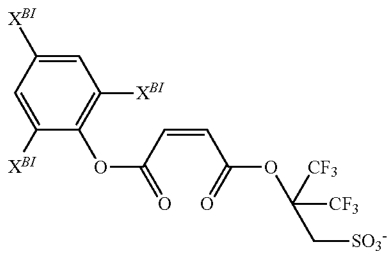
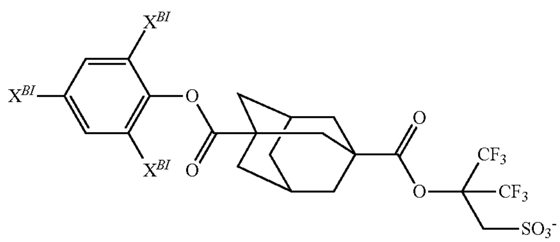
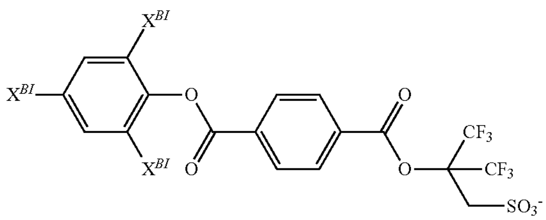
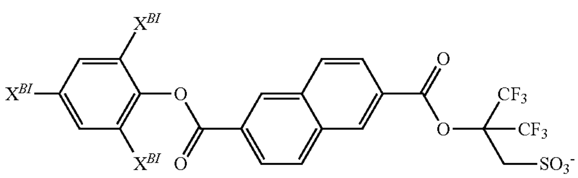
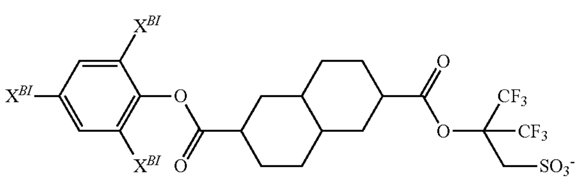
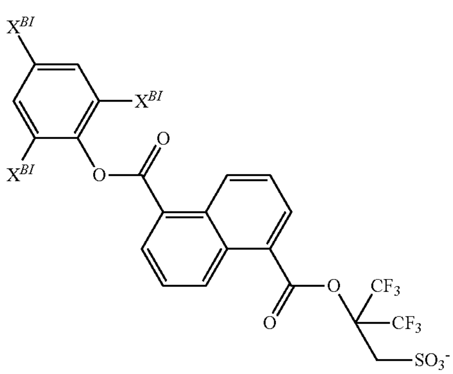
-continued
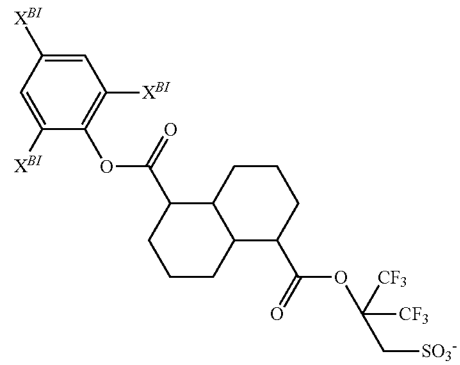
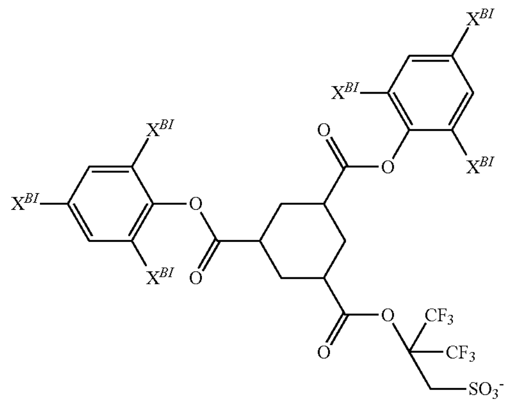
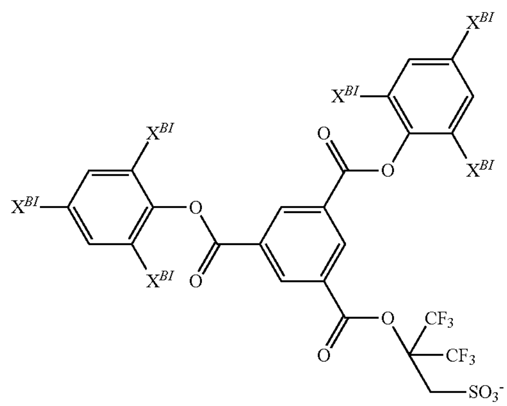
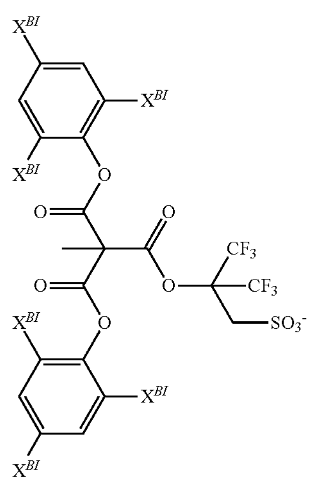

-continued

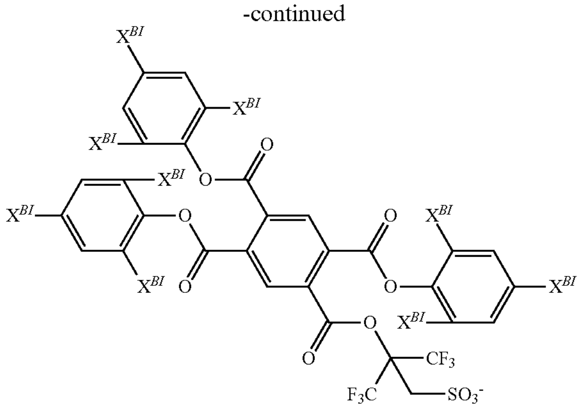

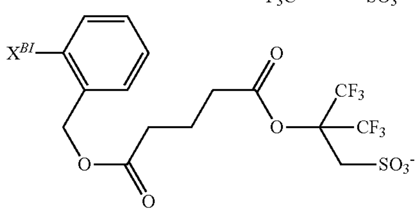

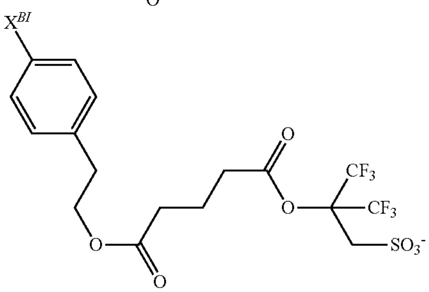

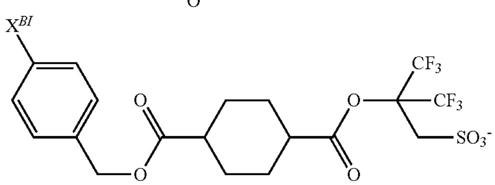

When used, the acid generator of addition type is preferably added in an amount of 0.1 to 50 parts, and more preferably 1 to 40 parts by weight per 100 parts by weight of the base polymer. When the base polymer has recurring units (f) incorporated therein and/or the acid generator of addition type is added, the resist composition functions as a chemically amplified resist composition.

Organic Solvent

The resist composition may further comprise an organic solvent, which is not particularly limited as long as the foregoing and other components are soluble therein. Examples of the organic solvent used herein are described in JP-A 2008-111103, paragraphs [0144]-[0145] (U.S. Pat. No. 7,537,880). Exemplary solvents include ketones such as cyclohexanone, cyclopentanone and methyl-2-n-pentyl ketone; alcohols such as 3-methoxybutanol, 3-methyl-3-methoxybutanol, 1-methoxy-2-propanol, 1-ethoxy-2-propanol and diacetone alcohol (DAA); ethers such as propylene glycol monomethyl ether (PGME), ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

Other Components

With the foregoing components, other components such as a surfactant, dissolution inhibitor, and crosslinker may be blended in any desired combination to formulate a chemically amplified positive or negative resist composition. This positive or negative resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs.

Exemplary surfactants are described in JP-A 2008-111103, paragraphs [0165]-[0166]. Inclusion of a surfactant may improve or control the coating characteristics of the resist composition. While the surfactant may be used alone or in admixture, it is preferably added in an amount of 0.0001 to 10 parts by weight per 100 parts by weight of the base polymer.

In the case of positive resist compositions, inclusion of a dissolution inhibitor may lead to an increased difference in dissolution rate between exposed and unexposed areas and a further improvement in resolution. The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in U.S. Pat. No. 7,771,914 (JP-A 2008-122932, paragraphs [0155]-[0178]).

In the positive resist composition, the dissolution inhibitor is preferably added in an amount of 0 to 50 parts, more preferably 5 to 40 parts by weight per 100 parts by weight of the base polymer. The dissolution inhibitor may be used alone or in admixture.

In the case of negative resist compositions, a negative pattern may be formed by adding a crosslinker to reduce the dissolution rate of a resist film in exposed area. Suitable crosslinkers which can be used herein include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyl ether group. These compounds may be used as an additive or introduced into a polymer side chain as a pendant. Hydroxy-containing compounds may also be used as the crosslinker. The crosslinker may be used alone or in admixture.

Of the foregoing crosslinkers, suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the negative resist composition, the crosslinker is preferably added in an amount of 0.1 to 50 parts, more preferably 1 to 40 parts by weight per 100 parts by weight of the base polymer.

In the resist composition of the invention, a quencher other than the sulfonium salt of iodized or brominated hydrocarbyl-containing carboxylic acid having formula (A) may be blended. The other quencher is typically selected from conventional basic compounds. Conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl, ether, ester, lactone ring, cyano, or sulfonic acid ester group as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Onium salts such as sulfonium salts, iodonium salts and ammonium salts of sulfonic acids which are not fluorinated at α-position as described in U.S. Pat. No. 8,795,942 (JP-A 2008-158339) and similar onium salts of carboxylic acid may also be used as the other quencher. While an α-fluorinated sulfonic acid, imide acid, and methide acid are necessary to deprotect the acid labile group of carboxylic acid ester, an α-non-fluorinated sulfonic acid and a carboxylic acid are released by salt exchange with an α-non-fluorinated onium salt. An α-non-fluorinated sulfonic acid and a carboxylic acid function as a quencher because they do not induce deprotection reaction.

Also useful are quenchers of polymer type as described in U.S. Pat. No. 7,598,016 (JP-A 2008-239918). The polymeric quencher segregates at the resist surface after coating and thus enhances the rectangularity of resist pattern. When a protective film is applied as is often the case in the immersion lithography, the polymeric quencher is also effective for preventing a film thickness loss of resist pattern or rounding of pattern top.

The other quencher is preferably added in an amount of 0 to 5 parts, more preferably 0 to 4 parts by weight per 100 parts by weight of the base polymer. The other quencher may be used alone or in admixture.

To the resist composition, a water repellency improver may also be added for improving the water repellency on surface of a resist film as spin coated. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB, thus preventing any hole pattern opening failure after development. The water repellency improver may be used alone or in admixture. An appropriate amount of the water repellency improver is 0 to 20 parts, more preferably 0.5 to 10 parts by weight per 100 parts by weight of the base polymer.

Also, an acetylene alcohol may be blended in the resist composition. Suitable acetylene alcohols are described in JP-A2008-122932, paragraphs [0179]-[0182]. An appropriate amount of the acetylene alcohol blended is 0 to 5 parts by weight per 100 parts by weight of the base polymer.

Pattern Forming Process

The resist composition is used in the fabrication of various integrated circuits. Pattern formation using the resist composition may be performed by well-known lithography processes. The process generally involves coating, exposure, and development. If necessary, any additional steps may be added.

For example, the resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hot plate at a temperature of 60 to 150° C. for 10 seconds to 30 minutes, preferably at 80 to 120° C. for 30 seconds to 20 minutes. The resulting resist film is generally 0.01 to 2 μm thick.

The resist film is then exposed to a desired pattern of high-energy radiation such as UV, deep-UV, EB, EUV, x-ray, soft x-ray, excimer laser light, γ-ray or synchrotron radiation. On use of UV, deep UV, EUV, x-ray, soft x-ray, excimer laser, γ-ray or synchrotron radiation, the resist film is exposed through a mask having a desired pattern, preferably in a dose of about 1 to 200 mJ/cm$^2$, more preferably about 10 to 100 mJ/cm$^2$. On use of EB, a pattern may be written directly or through a mask having a desired pattern, preferably in a dose of about 0.1 to 100 μC/cm$^2$, more preferably about 0.5 to 50 μC/cm$^2$. The resist composition is suited in lithographic micro-patterning processes using i-line of wavelength 365 nm, KrF or ArF excimer laser, EB, EUV, x-ray, soft x-ray, γ-ray, or synchrotron radiation, especially EB or EUV.

The resist film may then be baked (PEB) on a hot plate at 60 to 150° C. for 10 seconds to 30 minutes, preferably at 80 to 120° C. for 30 seconds to 20 minutes.

After the exposure or PEB, the resist film is developed with a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer.

In an alternative embodiment, a negative pattern may be formed via organic solvent development using a positive resist composition comprising a base polymer having an acid labile group. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLES

Examples of the invention are given below by way of illustration and not by way of limitation. The abbreviation "pbw" is parts by weight.

Quenchers 1 to 33 of the following structure are used in resist compositions. Quenchers 1 to 33 were synthesized by ion exchange of an iodized or brominated hydrocarbyl-containing carboxylic acid providing the following anion with a sulfonium chloride providing the following cation.

Quencher 1

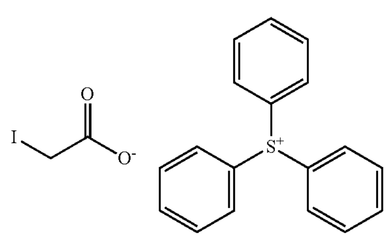

Quencher 2

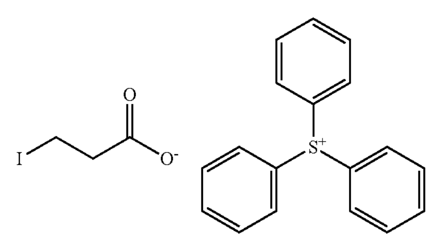

-continued
Quencher 3
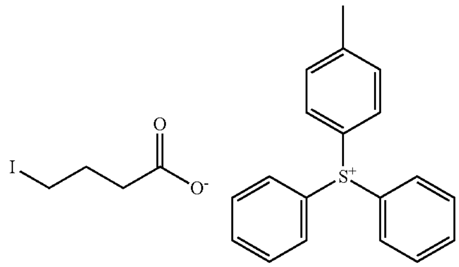
Quencher 4
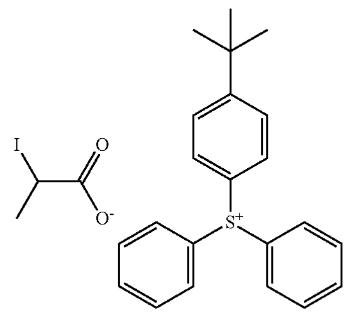
Quencher 5
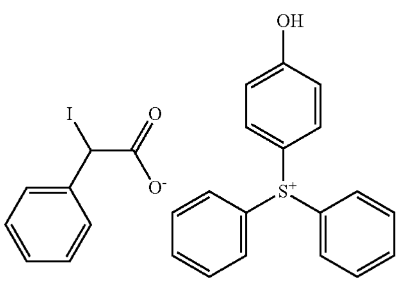
Quencher 6
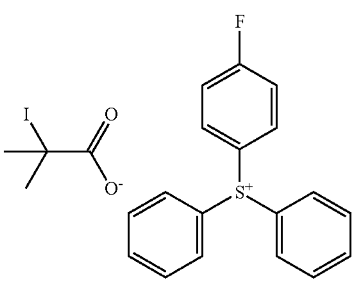
Quencher 7
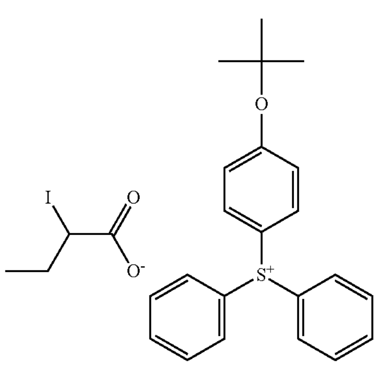
-continued
Quencher 8
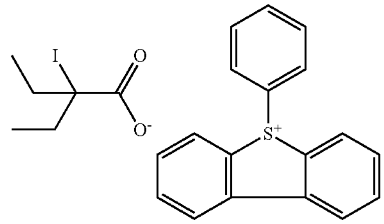
Quencher 9
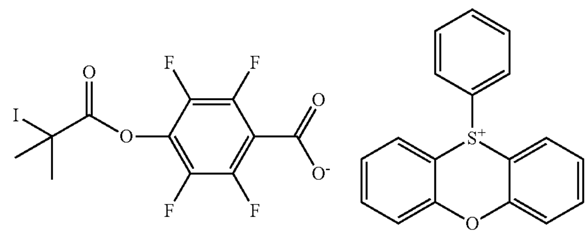
Quencher 10
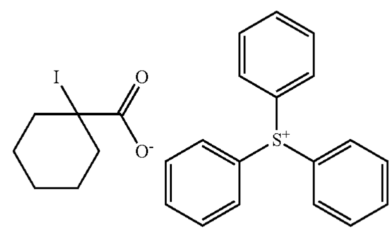
Quencher 11
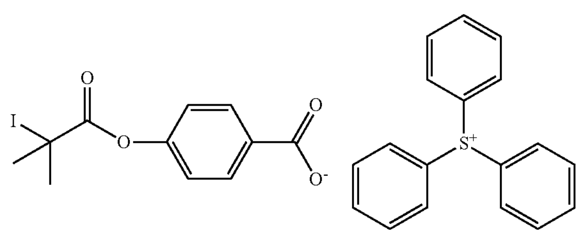
Quencher 12
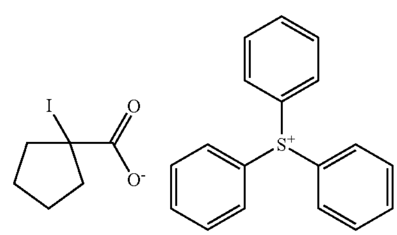
Quencher 13
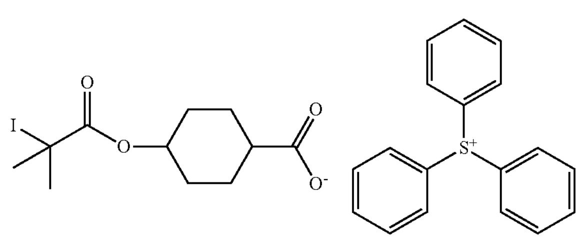

-continued
Quencher 14
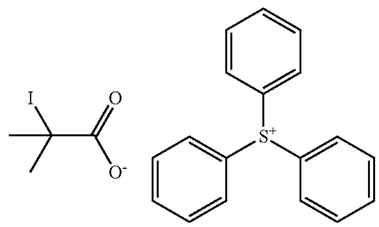
Quencher 15
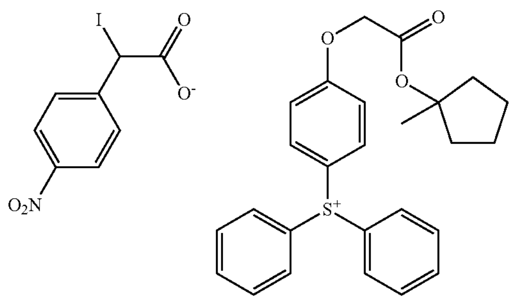
Quencher 16
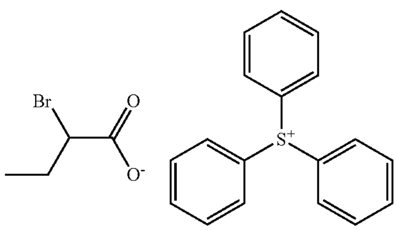
Quencher 17
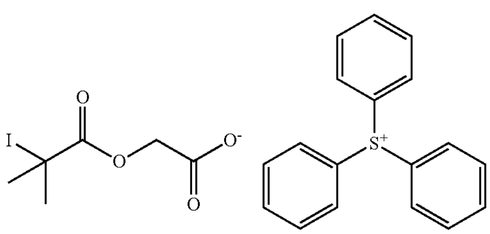
Quencher 18
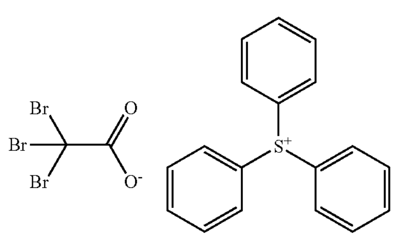
Quencher 19
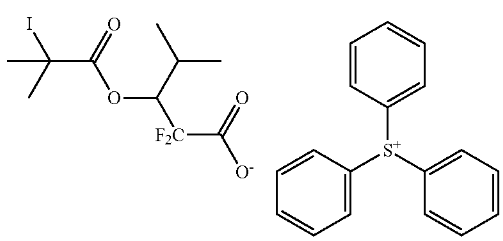
-continued
Quencher 20
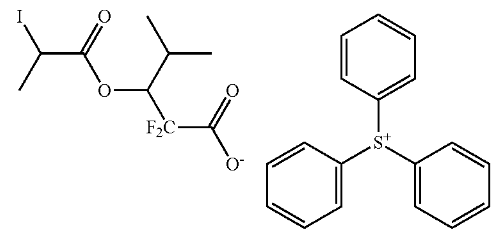
Quencher 21
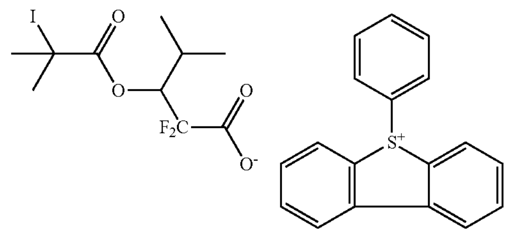
Quencher 22
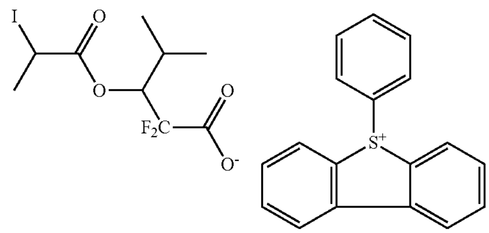
Quencher 23
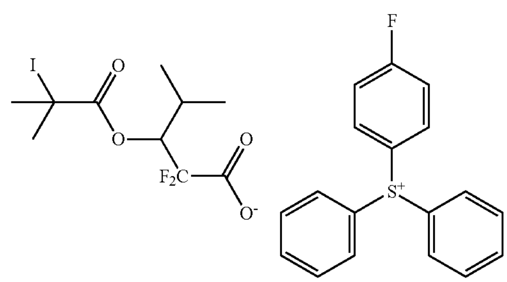
Quencher 24
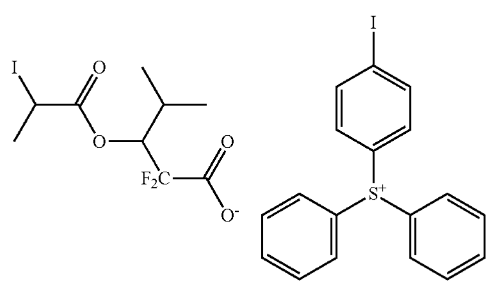
Quencher 25
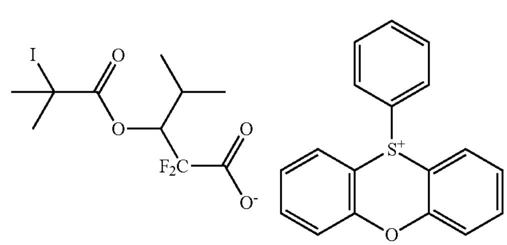

-continued
Quencher 26
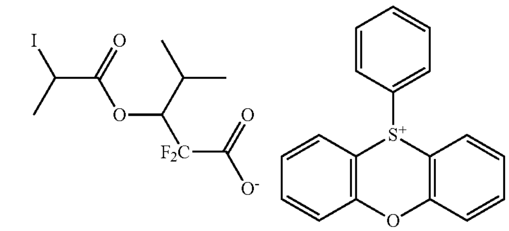
Quencher 27
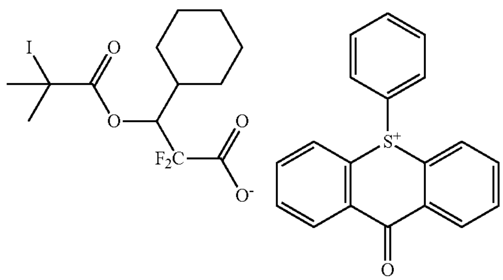
Quencher 28
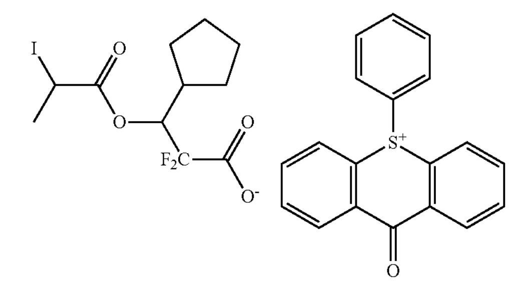
Quencher 29
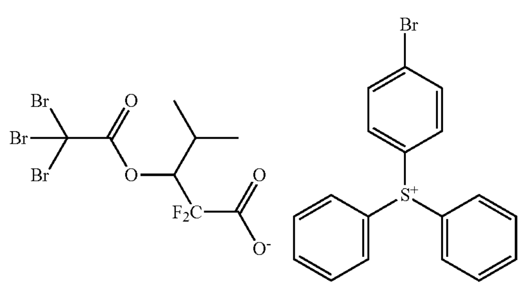
Quencher 30
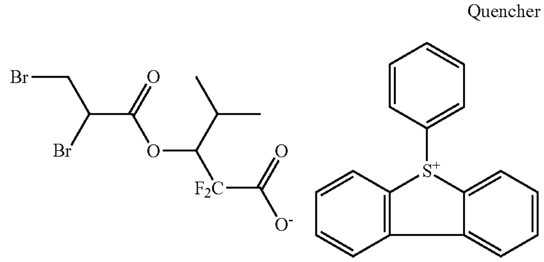
-continued
Quencher 31
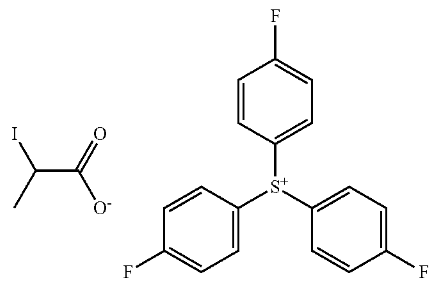
Quencher 32
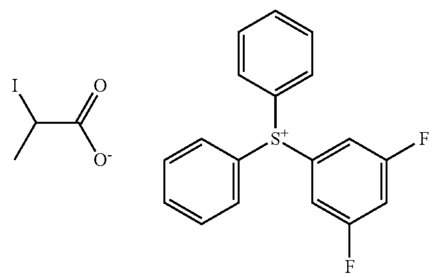
Quencher 33
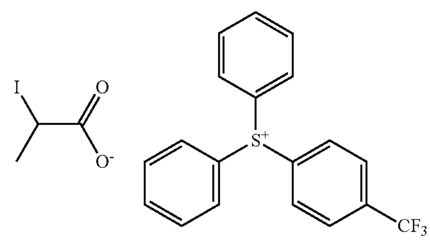
Quencher 34
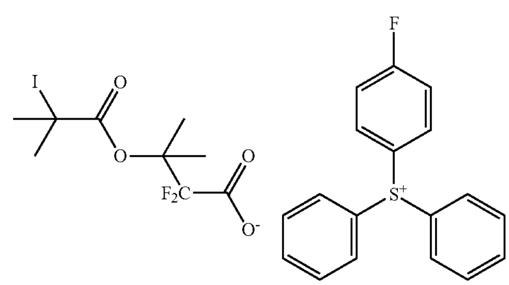
Quencher 35
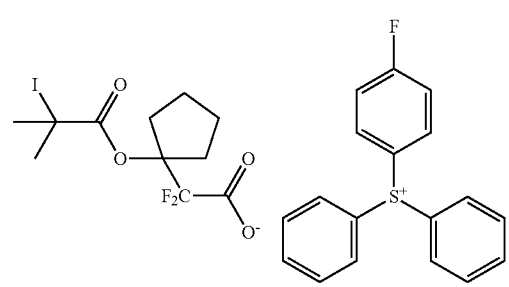
Synthesis Example
Synthesis of Base Polymers (Polymers 1 to 4)
Base polymers were prepared by combining suitable monomers, effecting copolymerization reaction thereof in tetrahydrofuran (THF) solvent, pouring the reaction solution into methanol for crystallization, repeatedly washing with hexane, isolation, and drying. The resulting polymers, designated Polymers 1 to 4, were analyzed for composition by $^{1}$H-NMR spectroscopy, and for Mw and Mw/Mn by GPC versus polystyrene standards using THF solvent.

Polymer 1

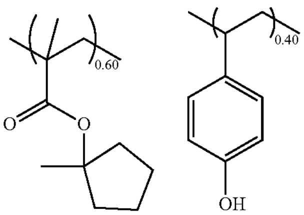

Mw = 8,600
Mw/Mn = 1.73

Polymer 2

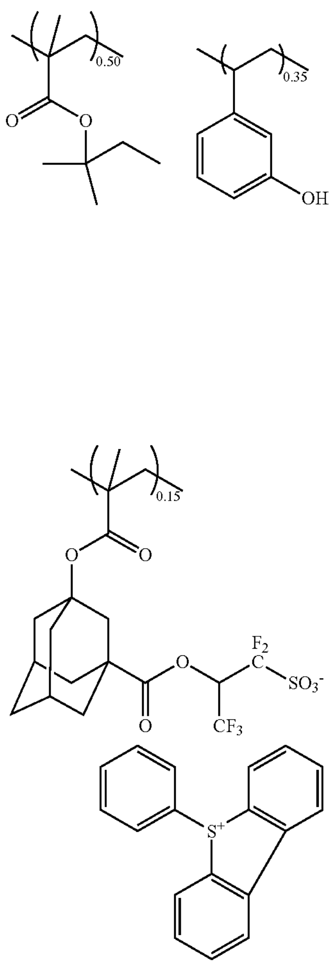

Mw = 8,900
Mw/Mn = 1.89

-continued

Polymer 3

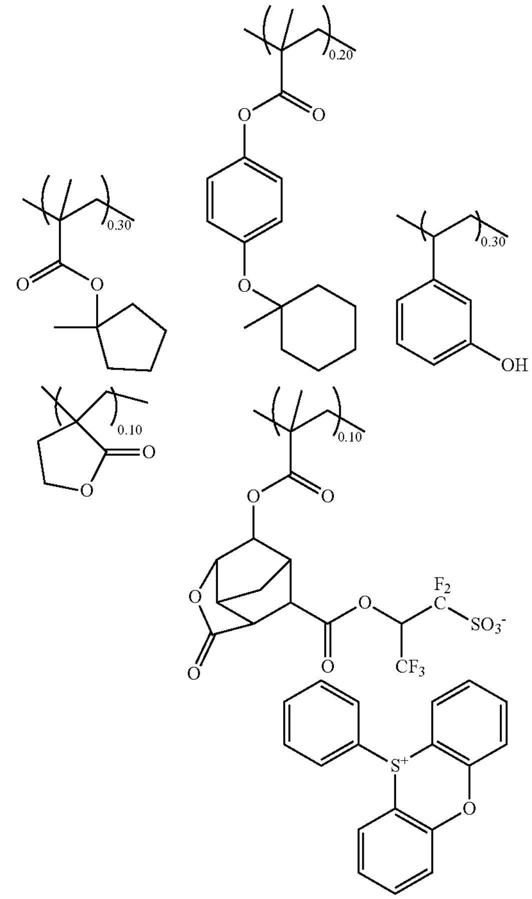

Mw = 7,600
Mw/Mn = 1.73

Polymer 4

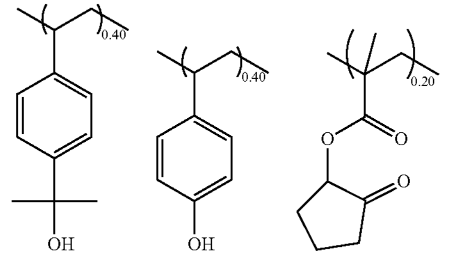

Mw = 6,900
Mw/Mn = 1.62

Examples 1 to 36 and Comparative Examples 1 to 3

(1) Preparation of Resist Composition

Resist compositions were prepared by dissolving the polymer and selected components in a solvent in accordance with the recipe shown in Tables 1 to 3, and filtering through a filter having a pore size of 0.2 μm. The solvent contained 100 ppm of surfactant PolyFox 636 (Omnova Solutions Inc.). The resist compositions of Examples 1 to 35 and Comparative Examples 1 and 2 were of positive tone and the resist compositions of Example 36 and Comparative Example 3 were of negative tone.

The components in Tables 1 to 3 are as identified below.

Organic Solvents:

PGMEA (propylene glycol monomethyl ether acetate)

DAA (diacetone alcohol)

Acid generators: PAG 1 to PAG 6 of the following structural formulae

PAG 1

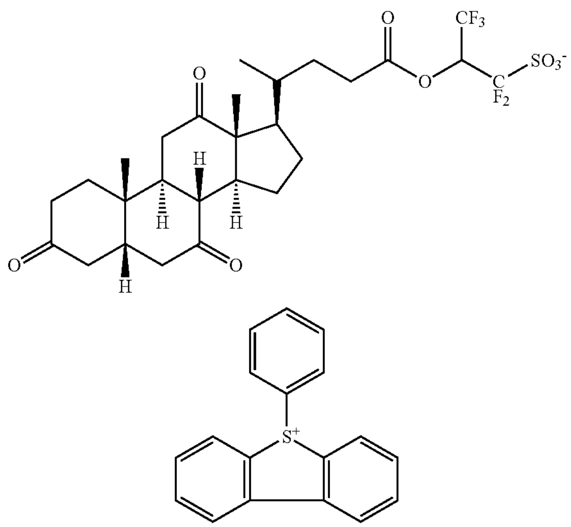

PAG 2

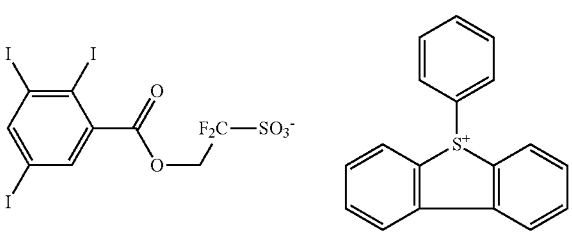

PAG 3

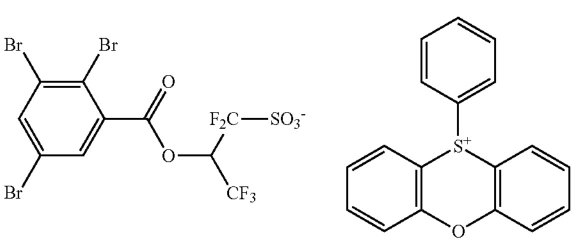

PAG 4

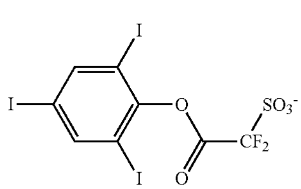

-continued

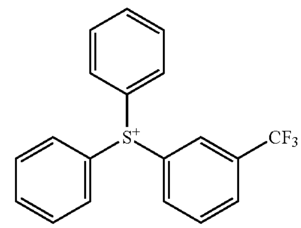

PAG 5

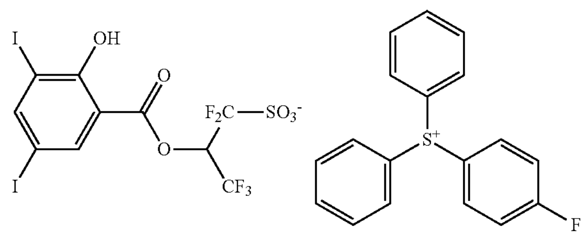

PAG 6

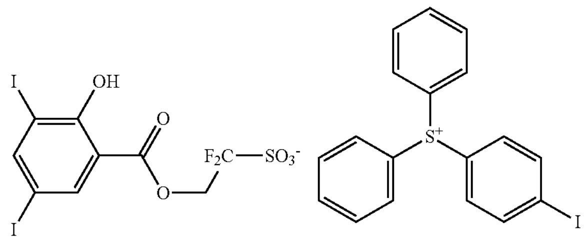

Comparative Quenchers 1 and 2 of the following structural formulae

Comparative Quencher 1

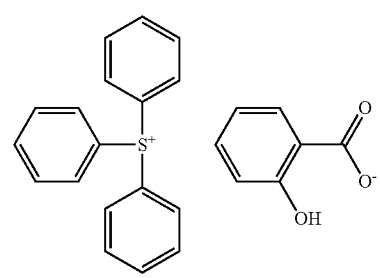

Comparative Quencher 2

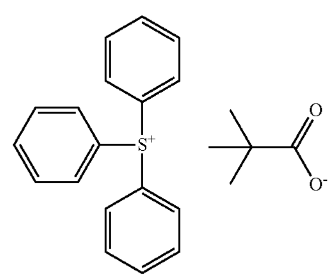

(2) EUV Lithography Test

Each of the resist compositions in Tables 1 to 3 was spin coated on a silicon substrate having a 20-nm coating of silicon-containing spin-on hard mask SHB-A940 (Shin-Etsu Chemical Co., Ltd., Si content 43 wt %) and prebaked on a hotplate at 105° C. for 60 seconds to form a resist film of 50 nm thick. Using an EUV scanner NXE3300 (ASML, NA 0.33, σ 0.9/0.6, quadrupole illumination), the resist film was exposed to EUV through a mask bearing a hole pattern at a pitch 46 nm (on-wafer size) and +20% bias. The resist film was baked (PEB) on a hotplate at the temperature shown in Tables 1 to 3 for 60 seconds and developed in a2.38 wt % TMAH aqueous solution for 30 seconds. In Examples 1 to 35 and Comparative Examples 1 and 2, a hole pattern having a size of 23 nm was formed. In Example 36 and Comparative Example 3, a dot pattern having a size of 23 nm was formed.

The resist pattern was observed under CD-SEM (CG-5000, Hitachi High-Technologies Corp.). The exposure dose that provides a hole or dot pattern having a size of 23 nm is reported as sensitivity. The size of 50 holes or dots was measured, from which a size variation (3σ) was computed and reported as CDU.

The resist composition is shown in Tables 1 to 3 together with the sensitivity and CDU of EUV lithography.

TABLE 1

| | | Polymer (pbw) | Acid generator (pbw) | Quencher (pbw) | Organic solvent (pbw) | PEB temp. (° C.) | Sensitivity ($mJ/cm^2$) | CDU (nm) |
|---|---|---|---|---|---|---|---|---|
| Example | 1 | Polymer 1 (100) | PAG 1 (20) | Quencher 1 (4.48) | PGMEA (3,000) | 80 | 28 | 3.2 |
| | 2 | Polymer 1 (100) | PAG 2 (20) | Quencher 2 (4.62) | PGMEA (3,000) | 80 | 26 | 3.1 |
| | 3 | Polymer 1 (100) | PAG 3 (20) | Quencher 3 (4.90) | PGMEA (3,000) | 80 | 28 | 3.3 |
| | 4 | Polymer 1 (100) | PAG 4 (20) | Quencher 4 (5.18) | PGMEA (3,000) | 80 | 24 | 3.0 |
| | 5 | Polymer 1 (100) | PAG 5 (20) | Quencher 5 (5.40) | PGMEA (3,000) | 80 | 27 | 2.8 |
| | 6 | Polymer 1 (100) | PAG 6 (20) | Quencher 6 (4.94) | PGMEA (3,000) | 80 | 25 | 3.0 |
| | 7 | Polymer 2 (100) | — | Quencher 7 (5.48) | PGMEA (2,500) DAA (500) | 80 | 24 | 2.7 |
| | 8 | Polymer 2 (100) | — | Quencher 8 (5.02) | PGMEA (2,500) DAA (500) | 80 | 25 | 2.7 |
| | 9 | Polymer 2 (100) | — | Quencher 9 (6.81) | PGMEA (2,500) DAA (500) | 80 | 27 | 2.6 |
| | 10 | Polymer 2 (100) | — | Quencher 10 (5.16) | PGMEA (2,500) DAA (500) | 80 | 26 | 2.6 |
| | 11 | Polymer 2 (100) | — | Quencher 11 (5.96) | PGMEA (2,500) DAA (500) | 80 | 28 | 2.6 |
| | 12 | Polymer 2 (100) | — | Quencher 12 (5.02) | PGMEA (2,500) DAA (500) | 80 | 25 | 2.8 |
| | 13 | Polymer 2 (100) | — | Quencher 13 (6.02) | PGMEA (2,500) DAA (500) | 80 | 27 | 2.6 |
| | 14 | Polymer 2 (100) | — | Quencher 14 (4.76) | PGMEA (2,500) DAA (500) | 80 | 27 | 2.6 |
| | 15 | Polymer 2 (100) | — | Quencher 15 (7.25) | PGMEA (2,500) DAA (500) | 80 | 28 | 2.4 |
| | 16 | Polymer 2 (100) | — | Quencher 16 (4.29) | PGMEA (2,500) DAA (500) | 80 | 24 | 2.7 |
| | 17 | Polymer 2 (100) | — | Quencher 17 (5.34) | PGMEA (2,500) DAA (500) | 80 | 26 | 2.5 |
| | 18 | Polymer 2 (100) | — | Quencher 18 (5.59) | PGMEA (2,500) DAA (500) | 80 | 26 | 2.5 |
| | 19 | Polymer 2 (100) | — | Quencher 19 (6.26) | PGMEA (2,500) DAA (500) | 80 | 28 | 2.8 |
| | 20 | Polymer 2 (100) | — | Quencher 20 (6.12) | PGMEA (2,500) DAA (500) | 80 | 25 | 2.8 |

TABLE 2

| | | Polymer (pbw) | Acid generator (pbw) | Quencher (pbw) | Organic solvent (pbw) | PEB temp. (° C.) | Sensitivity ($mJ/cm^2$) | CDU (nm) |
|---|---|---|---|---|---|---|---|---|
| Example | 21 | Polymer 2 (100) | — | Quencher 21 (6.24) | PGMEA (2,500) DAA (500) | 80 | 26 | 2.8 |
| | 22 | Polymer 2 (100) | — | Quencher 22 (6.10) | PGMEA (2,500) DAA (500) | 80 | 25 | 2.3 |
| | 23 | Polymer 2 (100) | — | Quencher 23 (6.44) | PGMEA (2,500) DAA (500) | 80 | 25 | 2.4 |
| | 24 | Polymer 2 (100) | — | Quencher 24 (7.38) | PGMEA (2,500) DAA (500) | 80 | 22 | 2.7 |
| | 25 | Polymer 2 (100) | — | Quencher 25 (6.40) | PGMEA (2,500) DAA (500) | 80 | 23 | 2.8 |
| | 26 | Polymer 2 (100) | — | Quencher 26 (6.26) | PGMEA (2,500) DAA (500) | 90 | 24 | 2.7 |

TABLE 2-continued

| | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|
| 27 | Polymer 3 (100) | — | Quencher 27 (6.92) | PGMEA (2,500) DAA (500) | 90 | 26 | 2.7 |
| 28 | Polymer 3 (100) | — | Quencher 28 (6.64) | PGMEA (2,500) DAA (500) | 90 | 24 | 2.7 |
| 29 | Polymer 3 (100) | — | Quencher 29 (7.88) | PGMEA (2,500) DAA (500) | 90 | 23 | 2.7 |
| 30 | Polymer 3 (100) | — | Quencher 30 (6.42) | PGMEA (2,500) DAA (500) | 90 | 24 | 2.6 |
| 31 | Polymer 3 (100) | — | Quencher 31 (5.15) | PGMEA (2,500) DAA (500) | 90 | 24 | 2.7 |
| 32 | Polymer 3 (100) | — | Quencher 32 (4.98) | PGMEA (2,500) DAA (500) | 90 | 21 | 2.7 |
| 33 | Polymer 3 (100) | — | Quencher 33 (5.30) | PGMEA (2,500) DAA (500) | 90 | 24 | 2.6 |
| 34 | Polymer 3 (100) | — | Quencher 34 (6.30) | PGMEA (2,500) DAA (500) | 90 | 23 | 2.4 |
| 35 | Polymer 3 (100) | — | Quencher 35 (6.56) | PGMEA (2,500) DAA (500) | 90 | 24 | 2.3 |
| 36 | Polymer 4 (100) | PAG 4 (12) | Quencher 6 (4.94) | PGMEA (3,000) | 120 | 29 | 3.2 |

TABLE 3

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| Comparative Example | 1 | Polymer 2 (100) | — | Comparative Quencher 1 (4.00) | PGMEA (2,500) DAA (500) | 80 | 32 | 3.7 |
| | 2 | Polymer 2 (100) | — | Comparative Quencher 2 (3.64) | PGMEA (2,500) DAA (500) | 80 | 34 | 3.6 |
| | 3 | Polymer 4 (100) | PAG 4 (12) | Comparative Quencher 2 (3.64) | PGMEA (3,000) | 120 | 38 | 4.2 |

It is demonstrated in Tables 1 to 3 that resist compositions comprising a sulfonium salt of a carboxylic acid having an iodized or brominated hydrocarbyl group (exclusive of iodized or brominated aromatic ring) offer a high sensitivity and improved CDU.

Japanese Patent Application No. 2019-148857 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition consisting of a sulfonium salt of a carboxylic acid having an iodine or bromine-substituted hydrocarbyl group wherein the hydrocarbyl group is not an aromatic ring, a base polymer, and an acid generator capable of generating a sulfonic acid, imide acid or methide acid, and optionally at least one selected from the group consisting of an organic solvent, surfactant, dissolution inhibitor, crosslinker, a quencher other than the sulfonium salt of the carboxylic acid having the iodine or bromine-substituted hydrocarbyl group having formula (A) which is a conventional basic compound or an onium salt of sulfonic acids which are not fluorinated at α-position, a water repellency improver, and an acetylene alcohol, wherein the sulfonium salt of the carboxylic acid having the iodine or bromine-substituted hydrocarbyl group has the formula (A):

(A)

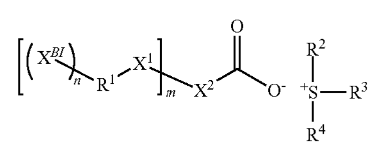

wherein m and n are each independently an integer of 1 to 3, $X^{BI}$ is iodine or bromine, $X^1$ is a single bond, ether bond, ester bond, amide bond, carbonyl group or carbonate group, $X^2$ is a single bond or a $C_1$-$C_{20}$ (m+1)-valent hydrocarbon group which may contain a heteroatom exclusive of iodine and bromine, $R^1$ is a $C_1$-$C_{20}$ (n+1)-valent aliphatic hydrocarbon group which may contain at least one moiety selected from the group consisting of fluorine, chlorine, hydroxyl, carboxyl, $C_6$-$C_{12}$ aryl, ether bond, ester bond, carbonyl, amide bond, carbonate, urethane bond and urea bond, $R^2$, $R^3$ and $R^4$ are each independently fluorine, chlorine, bromine, iodine, or a $C_1$-$C_{20}$ hydrocarbyl group which may contain a heteroatom, $R^2$ and $R^3$ may bond together to form a ring with the sulfur atom to which they are attached, and m is an integer of 1 to 3, and wherein the acid generator has the formula (1), (2), (3-1) or (3-2):

(1)

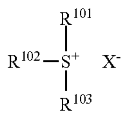

wherein $R^{101}$, $R^{102}$, and $R^{103}$ are each independently fluorine, chlorine, bromine, iodine, or a $C_1$-$C_{20}$ hydrocarbyl group which may contain a heteroatom, any two of $R^{101}$, $R^{102}$, and $R^{103}$ may bond together to form a ring with the sulfur atom to which they are attached, and X" is an anion of the following formula (1A), (1B), (1C) or (1D):

(1A)

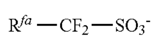

(1B)

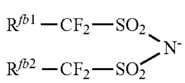

(1C)

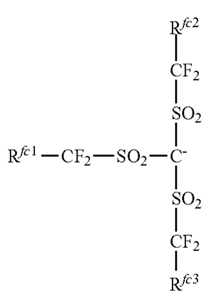

(1D)

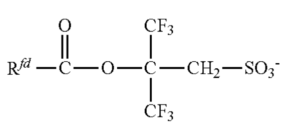

wherein $R^{fa}$ is fluorine or a $C_1$-$C_{40}$ hydrocarbyl group which may contain a heteroatom, $R^{fb1}$ and $R^{fb2}$ are each independently fluorine or a $C_1$-$C_{40}$ hydrocarbyl group which may contain a heteroatom, $R^{fb1}$ and $R^{fb2}$ may bond together to form a ring with the linkage: —$CF_2$—$SO_2$—$N^-$—$SO_2$—$CF_2$— to which they are attached, $R^{fc1}$, $R^{fc2}$, and $R^{fc3}$ are each independently fluorine or a $C_1$-$C_{40}$ hydrocarbyl group which may contain a heteroatom, $R^{fc1}$ and $R^{fc2}$ may bond together to form a ring with the linkage: —$CF_2$—$SO_2$—$N^-$—$SO_2$—$CF_2$— to which they are attached, and $R^{fd}$ is a $C_1$-$C_{40}$ hydrocarbyl group which may contain a heteroatom, (2)

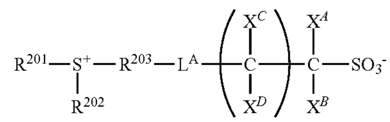

wherein, $R^{201}$ and $R^{202}$ are each independently a $C_1$-$C_{30}$ hydrocarbyl group which may contain a heteroatom, $R^{203}$ is a $C_1$-$C_{30}$ hydrocarbylene group which may contain a heteroatom, any two of $R^{201}$, $R^{202}$, and $R^{203}$ may bond together to form a ring with the sulfur atom to which they are attached, $L^A$ is a single bond, ether bond or a $C_1$-$C_{20}$ hydrocarbylene group which may contain a heteroatom, $X^A$, $X^B$, $X^C$ and $X^D$ are each independently hydrogen, fluorine or trifluoromethyl, with the proviso that at least one of $X^A$, $X^B$, $X^C$ and $X^D$ is fluorine or trifluoromethyl, and k is an integer of 0 to 3, (3-1)

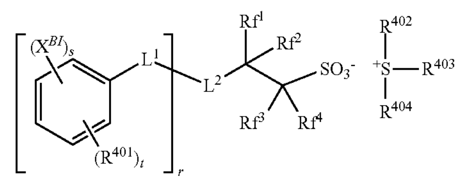

(3-2)

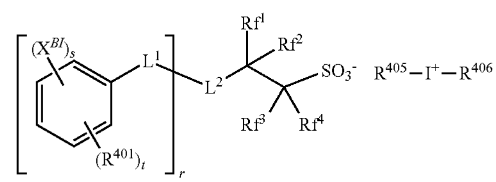

wherein r is an integer of 1 to 3, s is an integer of 1 to 5, t is an integer of 0 to 3, and $1 \leq s+t \leq 5$, $X^{BI}$ is iodine or bromine, and may be identical or different when s and/or r are at least 2, $L^1$ is a single bond, ether bond, ester bond, or a $C_1$-$C_6$ saturated hydrocarbylene group which may contain an ether bond or ester bond, $L^2$ is a single bond or a $C_1$-$C_{20}$ divalent linking group when r=1, or a $C_1$-$C_{20}$ (r+1)-valent linking group when r=2 or 3, $R^{401}$ is hydroxyl, carboxyl, fluorine, chlorine, bromine, amino group, or a $C_1$-$C_{20}$ saturated hydrocarbyl, $C_1$-$C_{20}$ saturated hydrocarbyloxy, $C_2$-$C_{20}$ saturated hydrocarbyloxycarbonyl, $C_2$-$C_{20}$ saturated hydrocarbylcarbonyloxy, or $C_1$-$C_{20}$ saturated hydrocarbylsulfonyloxy group, which may contain fluorine, chlorine, bromine, hydroxyl, amino or ether bond, or —$NR^{401A}$—C(═O)—$R^{401B}$ or —$NR^{401A}$—C(═O)—O—$R^{401B}$, $R^{401A}$ is hydrogen, or a $C_1$-$C_6$ saturated hydrocarbyl group which may contain halogen, hydroxy, $C_1$-$C_6$ saturated hydrocarbyloxy, $C_2$-$C_6$ saturated hydrocarbylcarbonyl or $C_2$-$C_6$ saturated hydrocarbylcarbonyloxy moiety, $R^{401B}$ is a $C_1$-$C_{16}$ aliphatic hydrocarbyl group or $C_6$-$C_{12}$ aryl group, which may contain halogen, hydroxyl, $C_1$-$C_6$ saturated hydrocarbyloxy, $C_2$-$C_6$ saturated hydrocarbylcarbonyl or $C_2$-$C_6$ saturated hydrocarbylcarbonyloxy moiety, groups $R^{401}$ may be identical or different when t and/or r are 2 or 3, $Rf^1$ to $Rf^4$ are each independently hydrogen, fluorine or trifluoromethyl, at least one of $Rf^1$ to $Rf^4$ is fluorine or trifluoromethyl, or $Rf^1$ and $Rf^2$, taken together, may form a carbonyl group, $R^{402}$, $R^{403}$, $R^{404}$, $R^{405}$ and $R^{406}$ are each independently a $C_1$-$C_{20}$ hydrocarbyl group which may contain a heteroatom, any two of $R^{402}$, $R^{403}$ and $R^{404}$ may bond together to form a ring with the sulfur atom to which they are attached.

2. The resist composition of claim 1 wherein the base polymer comprises recurring units having the formula (a1) or recurring units having the formula (a2):

(a1)

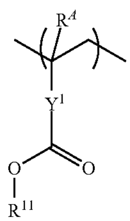

(a2)

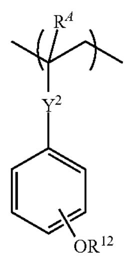

wherein $R^A$ is each independently hydrogen or methyl, $R^{11}$ and $R^{12}$ each are an acid labile group, $Y^1$ is a single bond, phenylene group, naphthylene group, or $C_1$-$C_{12}$ linking group containing ester bond or lactone ring, $Y^2$ is a single bond or ester bond.

3. The resist composition of claim 2 which is a chemically amplified positive resist composition.

4. The resist composition of claim 1 wherein the base polymer is free of an acid labile group.

5. The resist composition of claim 4 which is a chemically amplified negative resist composition.

6. The resist composition of claim 1, further comprising an organic solvent.

7. The resist composition of claim 1, further comprising a surfactant.

8. A process for forming a pattern comprising the steps of applying the resist composition of claim 1 onto a substrate to form a resist film, exposing the resist film to high-energy radiation, and developing the exposed resist film in a developer.

9. The process of claim 8 wherein the high-energy radiation is i-line of wavelength 365 nm, ArF excimer laser radiation of wavelength 193 nm or KrF excimer laser radiation of wavelength 248 nm.

10. The process of claim 8 wherein the high-energy radiation is EB or EUV of wavelength 3 to 15 nm.

11. The resist composition of claim 1 wherein $X^{BI}$ is iodine.

12. A resist composition consisting of a sulfonium salt of a carboxylic acid having an iodine or bromine-substituted hydrocarbyl group wherein the hydrocarbyl group is not an aromatic ring, and a base polymer, and optionally at least one selected from the group consisting of an acid generator capable of generating a sulfonic acid, imide acid or methide acid, an organic solvent, surfactant, dissolution inhibitor, crosslinker, a quencher other than the sulfonium salt of the carboxylic acid having the iodine or bromine-substituted hydrocarbyl group having formula (A) which is a conventional basic compound or an onium salt of sulfonic acids which are not fluorinated at α-position, a water repellency improver, and an acetylene alcohol, wherein the sulfonium salt of the carboxylic acid having the iodine or bromine-substituted hydrocarbyl group has the formula (A):

(A)

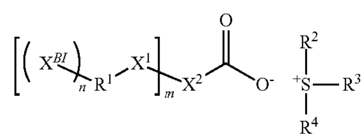

wherein m and n are each independently an integer of 1 to 3, $X^{BI}$ is iodine or bromine, $X^1$ is a single bond, ether bond, ester bond, amide bond, carbonyl group or carbonate group, $X^2$ is a single bond or a $C_1$-$C_{20}$ (m+1)-valent hydrocarbon group which may contain a heteroatom exclusive of iodine and bromine, $R^1$ is a $C_1$-$C_{20}$ (n+1)-valent aliphatic hydrocarbon group which may contain at least one moiety selected from the group consisting of fluorine, chlorine, hydroxyl, carboxyl, $C_6$-$C_{12}$ aryl, ether bond, ester bond, carbonyl, amide bond, carbonate, urethane bond and urea bond, $R^2$, $R^3$ and $R^4$ are each independently fluorine, chlorine, bromine, iodine, or a $C_1$-$C_{20}$ hydrocarbyl group which may contain a heteroatom, $R^2$ and $R^3$ may bond together to form a ring with the sulfur atom to which they are attached, and m is an integer of 1 to 3, and wherein the base polymer comprises recurring units of at least one type selected from recurring units having the formulae ($f^1$) to ($f^3$):

(f1)

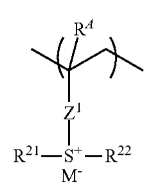

-continued (f2)

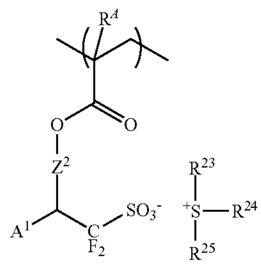

(f3)

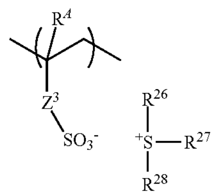

wherein $R^A$ is each independently hydrogen or methyl, $Z^1$ is a single bond, phenylene group, —O—$Z^{11}$—, —C(═O)—O—$Z^{11}$—, or —C(═O)—NH—$Z^{11}$—is a $C_1$-$C_6$ aliphatic hydrocarbylene group or phenylene group, which may contain a carbonyl, ester bond, ether bond or hydroxyl moiety, $Z^2$ is a single bond, —$Z^{21}$—C(═O)—O—, —$Z^{21}$—O— or —$Z^{21}$—O—C(═O)—is a $C_1$-$C_{12}$ saturated hydrocarbylene group which may contain a carbonyl moiety, ester bond or ether bond, $Z^3$ is a single bond, methylene, ethylene, phenylene, fluorinated phenylene, —C(═O)—O—$R^{31}$—, or —C(═O)—NH—$Z^{31}$— is a $C_1$-$C_6$ aliphatic hydrocarbylene group, phenylene group, fluorinated phenylene group, or trifluoromethyl-substituted phenylene group, which may contain a carbonyl moiety, ester bond, ether bond or hydroxyl moiety, $R^{21}$ to $R^{28}$ are each independently a $C_1$-$C_{20}$ hydrocarbyl group which may contain a heteroatom, any two of $R^{23}$, $R^{24}$ and $R^{25}$ or any two of $R^{26}$, $R^{27}$ and $R^{28}$ may bond together to form a ring with the sulfur atom to which they are attached, $A^1$ is hydrogen or trifluoromethyl, and $M^-$is a non-nucleophilic counter ion.

13. The resist composition of claim 12 wherein $X^{BI}$ is iodine.

* * * * *